US010664639B2

(12) United States Patent
Hsieh et al.

(10) Patent No.: US 10,664,639 B2
(45) Date of Patent: May 26, 2020

(54) CELL LAYOUT AND STRUCTURE

(71) Applicant: Taiwan Semiconductor Manufacturing Company, Ltd., Hsinchu (TW)

(72) Inventors: Tung-Heng Hsieh, Zhudong Town (TW); Sheng-Hsiung Wang, Zhubei (TW); Hui-Zhong Zhuang, Kaohsiung (TW); Yu-Cheng Yeh, New Taipei (TW); Tsung-Chieh Tsai, Chu-Bei (TW); Juing-Yi Wu, Hsinchu (TW); Liang-Yao Lee, Taoyuan (TW); Jyh-Kang Ting, Baoshan Township (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 15/971,646

(22) Filed: May 4, 2018

(65) Prior Publication Data

US 2018/0253522 A1 Sep. 6, 2018

Related U.S. Application Data

(62) Division of application No. 14/473,614, filed on Aug. 29, 2014, now Pat. No. 9,984,191.

(51) Int. Cl.
*G06F 17/50* (2006.01)
*G06F 30/392* (2020.01)
(Continued)

(52) U.S. Cl.
CPC .......... *G06F 30/392* (2020.01); *G06F 30/394* (2020.01); *G06F 30/398* (2020.01);
(Continued)

(58) Field of Classification Search
CPC ............. G06F 17/5072; G06F 17/5077; G06F 17/5081; G06F 17/50; G06F 30/392;
(Continued)

(56) References Cited

U.S. PATENT DOCUMENTS 5,229,629 A 7/1993 Koike
6,308,307 B1* 10/2001 Cano ................... G06F 17/5068
257/207

(Continued)

FOREIGN PATENT DOCUMENTS

CN 1838410 A 9/2006
CN 101297399 A 10/2008
(Continued)

*Primary Examiner* — Vuthe Siek
(74) *Attorney, Agent, or Firm* — Slater Matsil, LLP

(57) ABSTRACT

A post placement abutment treatment for cell row design is provided. In an embodiment a first cell and a second cell are placed in a first cell row and a third cell and a fourth cell are placed into a second cell row. After placement vias connecting power and ground rails to the underlying structures are analyzed to determine if any can be merged or else removed completely. By merging and removing the closely placed vias, the physical limitations of photolithography may be by-passed, allowing for smaller structures to be formed.

20 Claims, 136 Drawing Sheets

(51) Int. Cl.
*G06F 30/394* (2020.01)
*H01L 27/118* (2006.01)
*H01L 27/02* (2006.01)
*G06F 30/398* (2020.01)

(52) U.S. Cl.
CPC .... *H01L 27/0207* (2013.01); *H01L 27/11807* (2013.01); *H01L 2027/11874* (2013.01)

(58) Field of Classification Search
CPC ............... G06F 30/398; G06F 30/394; H01L 2027/11874; H01L 27/0207; H01L 27/11807
See application file for complete search history.

(56) References Cited

U.S. PATENT DOCUMENTS

| | | |
|---|---|---|
| 6,410,972 B1 | 6/2002 | Sei et al. |
| 7,687,342 B2 | 3/2010 | Haller et al. |
| 7,761,831 B2 | 7/2010 | Mai et al. |
| 7,969,014 B2 | 6/2011 | Chuang |
| 8,356,262 B1 | 1/2013 | Lu et al. |
| 8,484,599 B2 | 7/2013 | Sundaresan |
| 8,813,016 B1 | 8/2014 | Hsu et al. |
| 8,872,350 B2 | 10/2014 | Sawachi et al. |
| 8,987,914 B2 | 3/2015 | Shih et al. |
| 2003/0229866 A1 | 12/2003 | Allen et al. |
| 2005/0160391 A1* | 7/2005 | Orita ................ G06F 17/5022 326/80 |
| 2008/0022245 A1 | 1/2008 | Tsai et al. |
| 2012/0131533 A1 | 5/2012 | Marinet |
| 2012/0153454 A1 | 6/2012 | Liu et al. |
| 2012/0317531 A1 | 12/2012 | Sundaresan |
| 2012/0331426 A1* | 12/2012 | Lu ........................ G03F 1/70 716/52 |
| 2013/0075818 A1 | 3/2013 | Lee et al. |
| 2016/0055284 A1* | 2/2016 | Baek ................. G06F 17/5072 716/119 |

FOREIGN PATENT DOCUMENTS

| | | |
|---|---|---|
| CN | 101351886 A | 1/2009 |
| CN | 103022103 A | 4/2013 |
| CN | 103247599 A | 8/2013 |
| JP | 2675659 B2 | 11/1997 |
| JP | 3819186 B2 | 9/2006 |
| KR | 20140096942 A | 8/2014 |
| TW | 200744160 A | 12/2007 |
| TW | 200847392 A | 12/2008 |
| TW | 201304064 A1 | 1/2013 |
| TW | 201432853 A | 8/2014 |

* cited by examiner

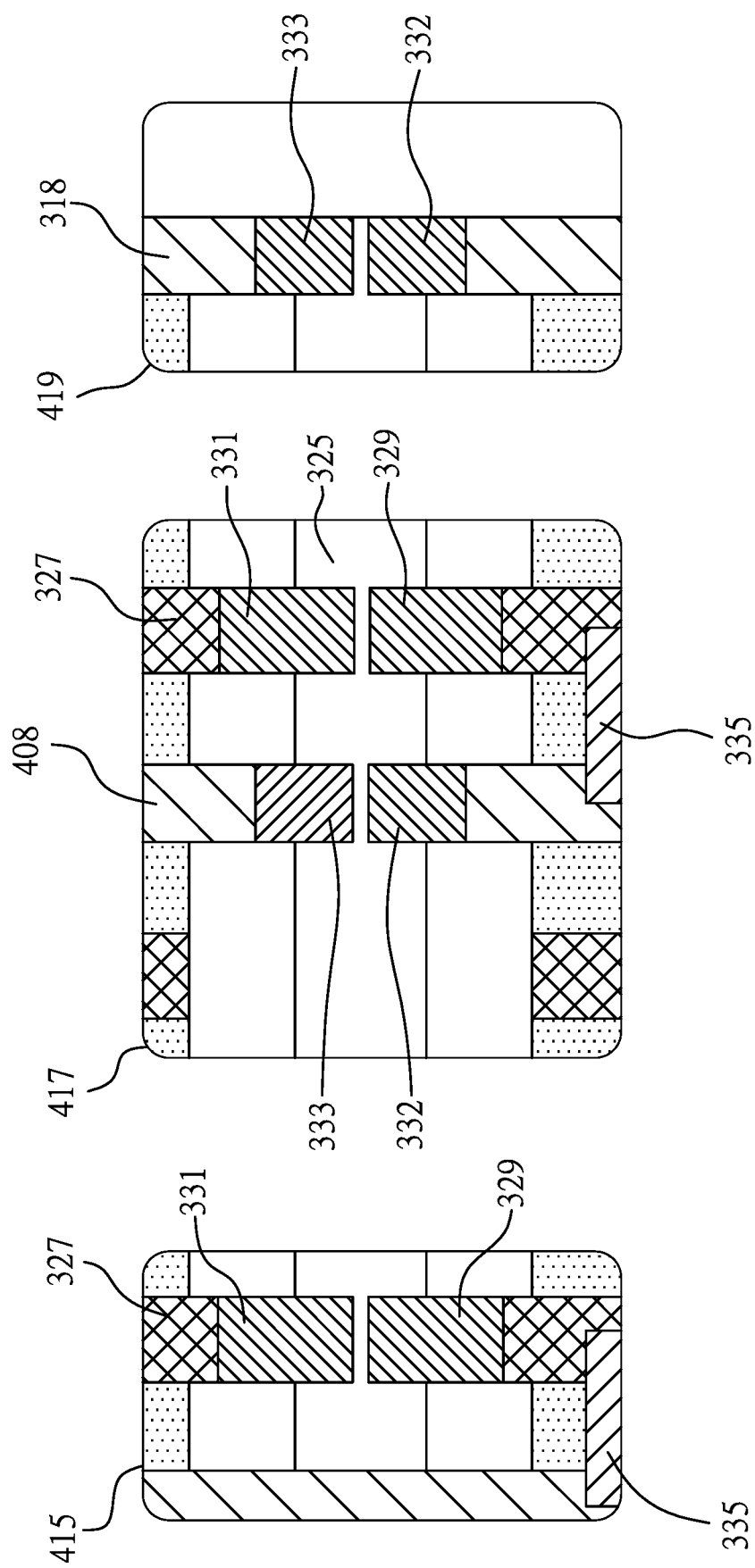

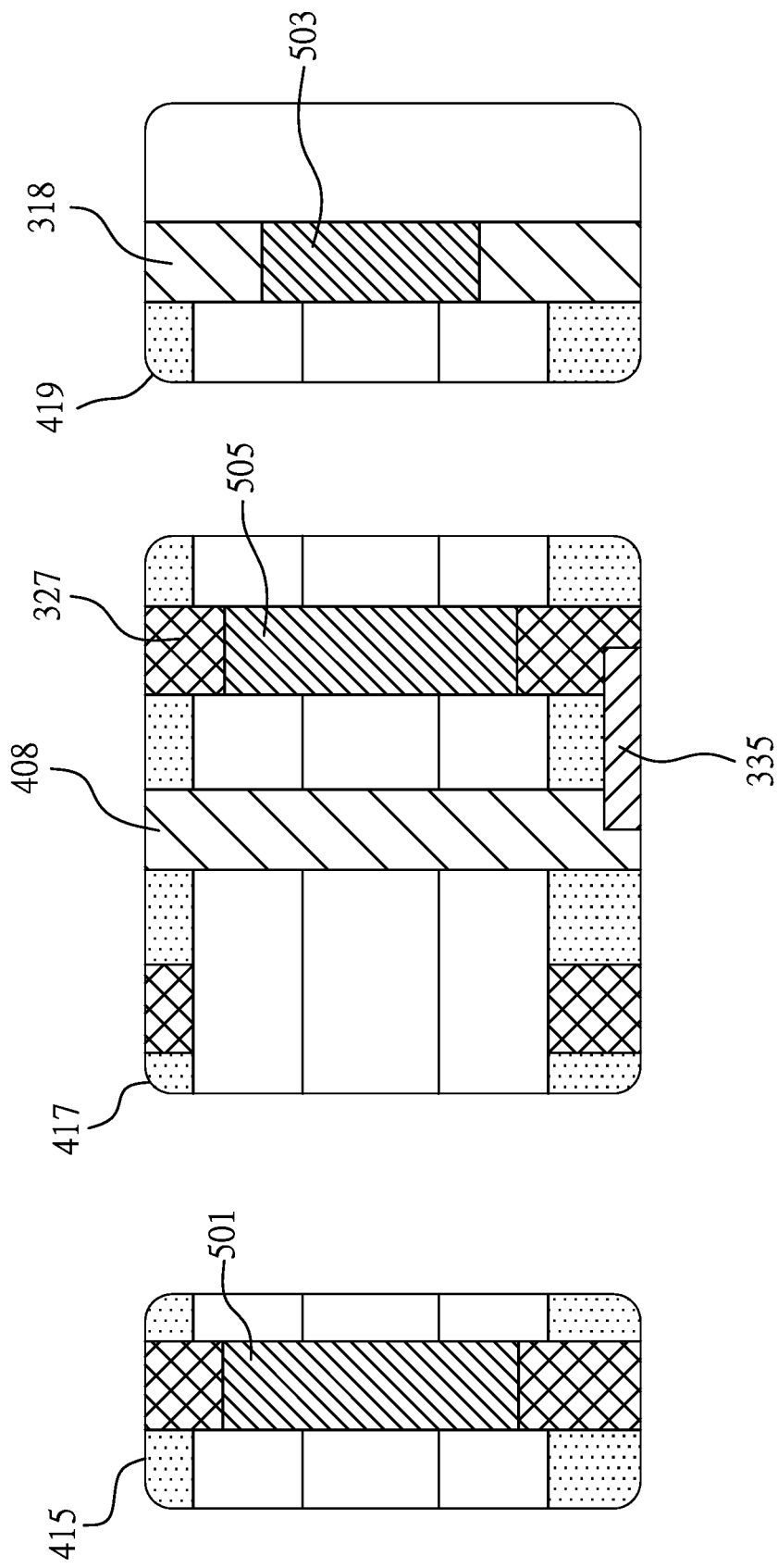

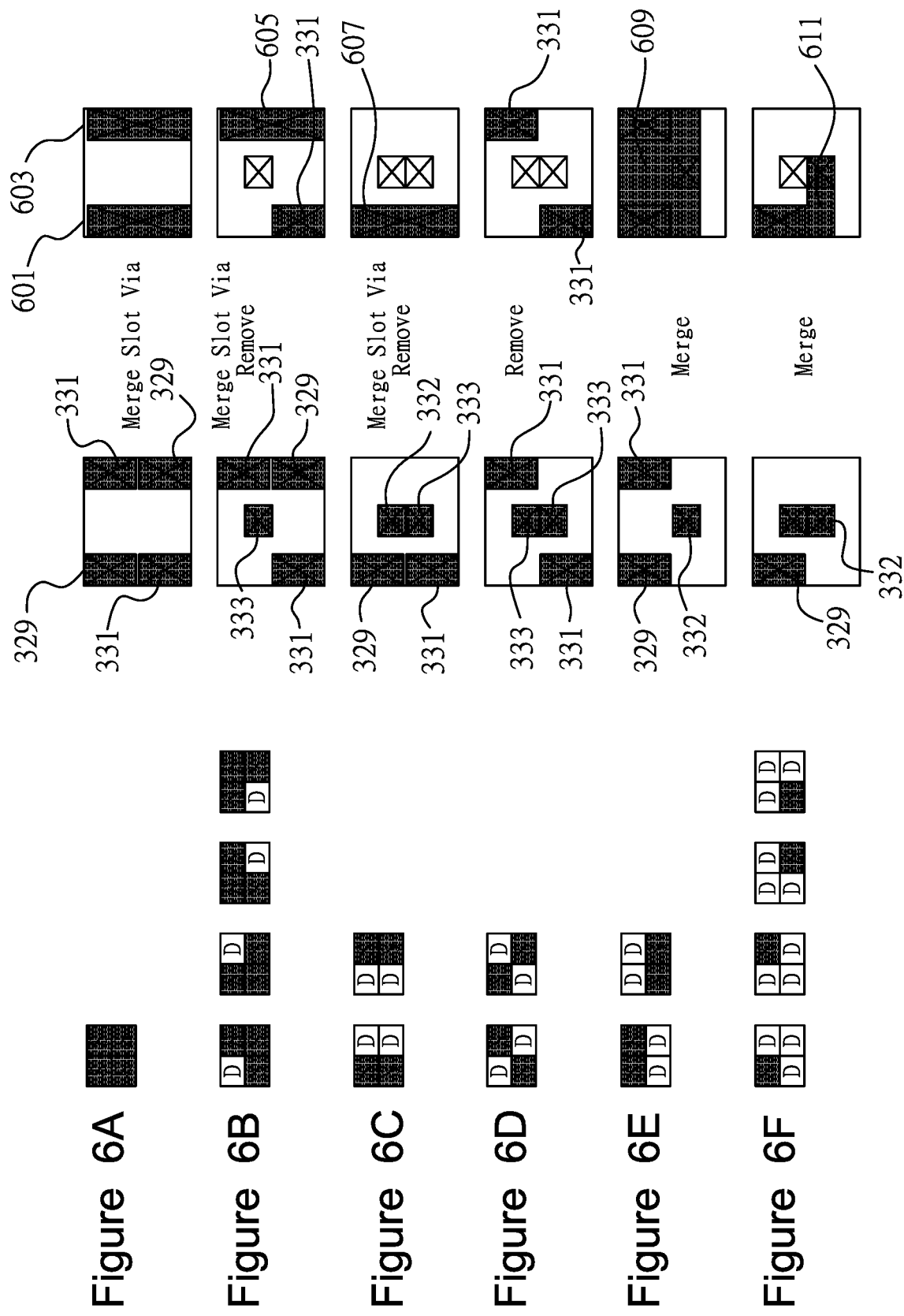

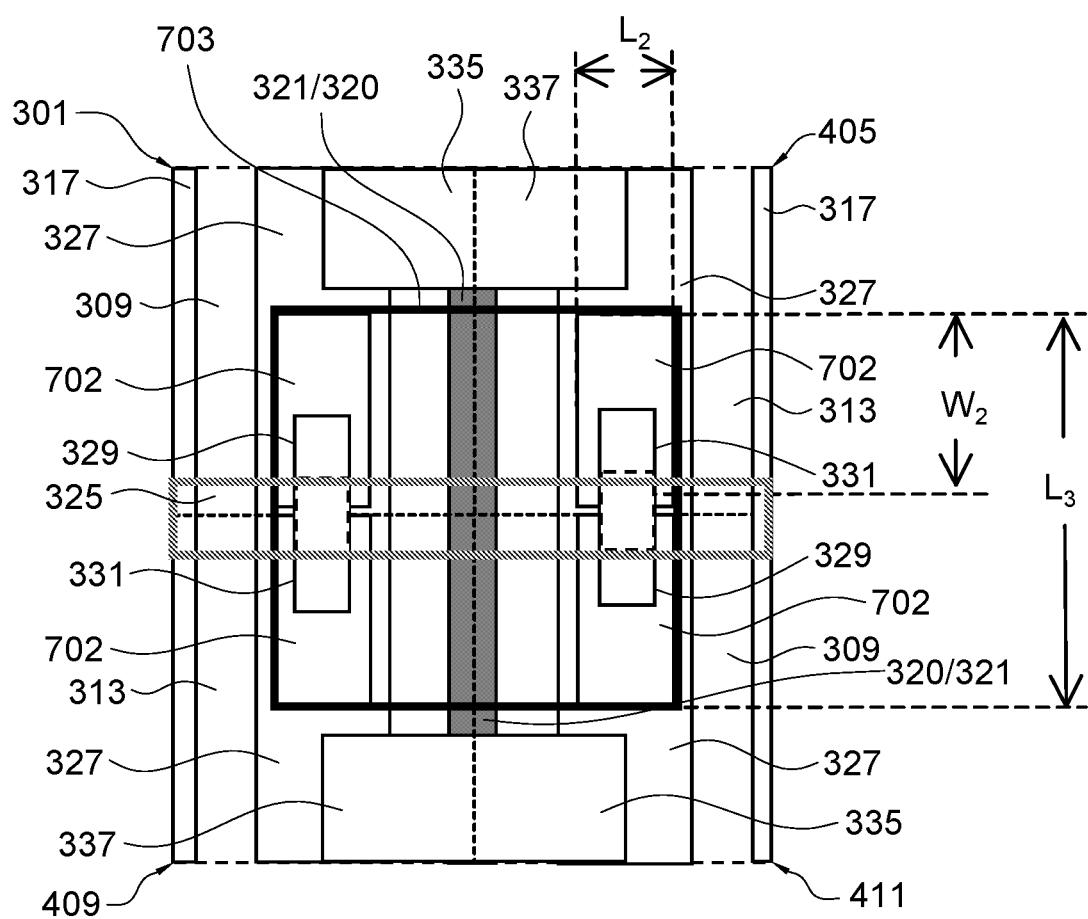
Figure 16A

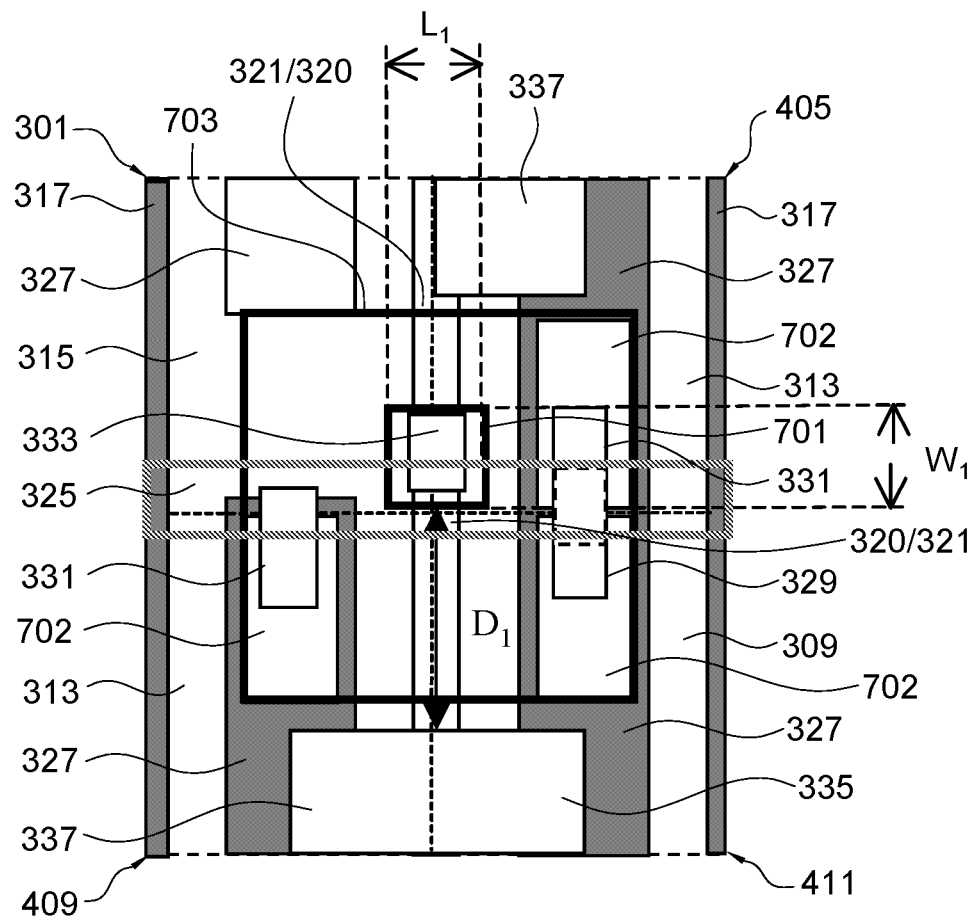
Figure 16B

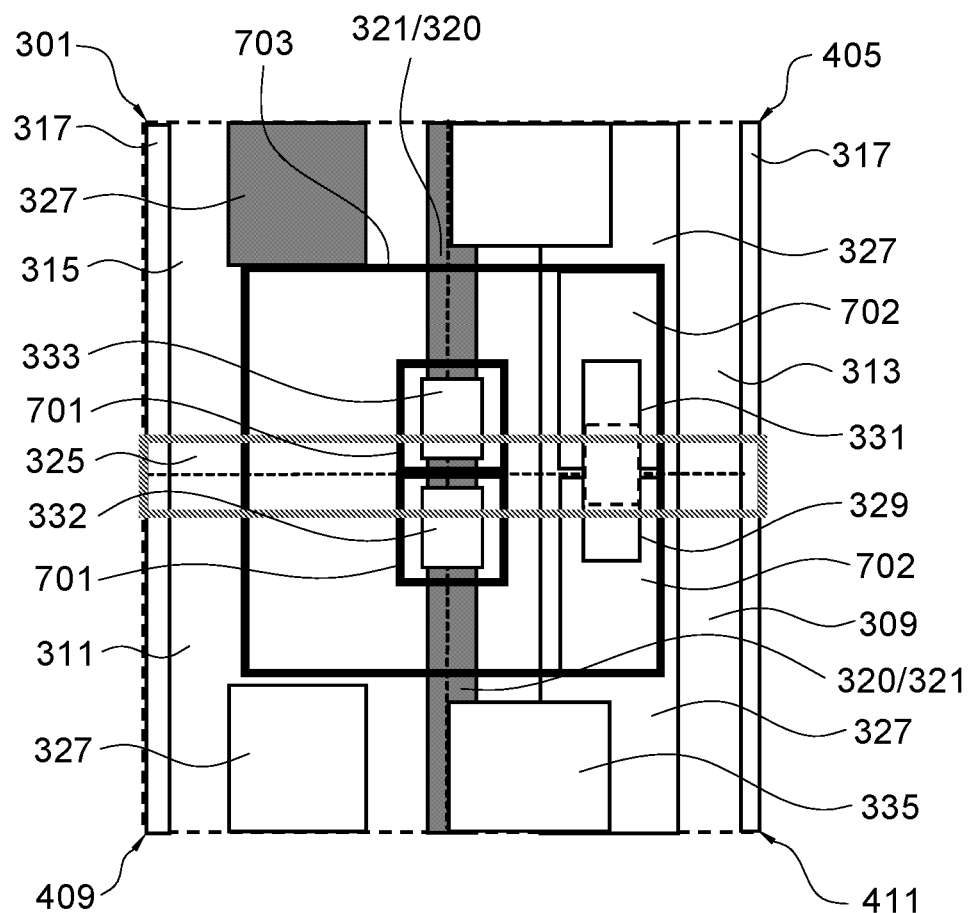
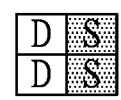
Figure 16D

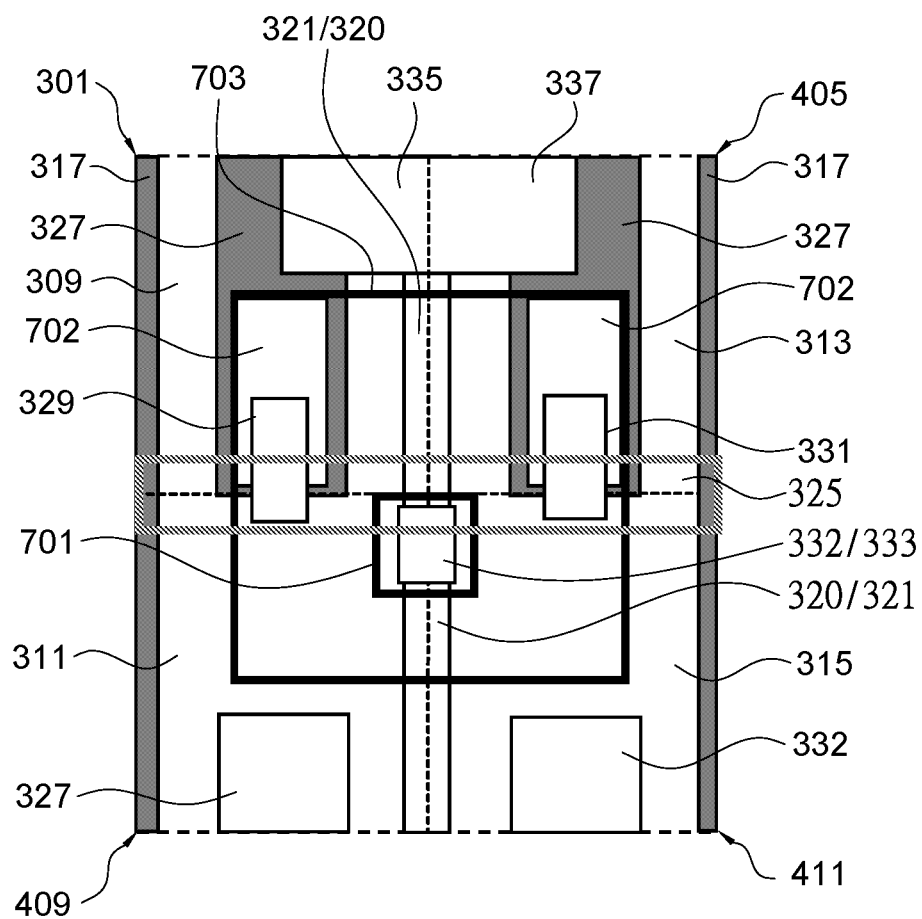
Figure 16E

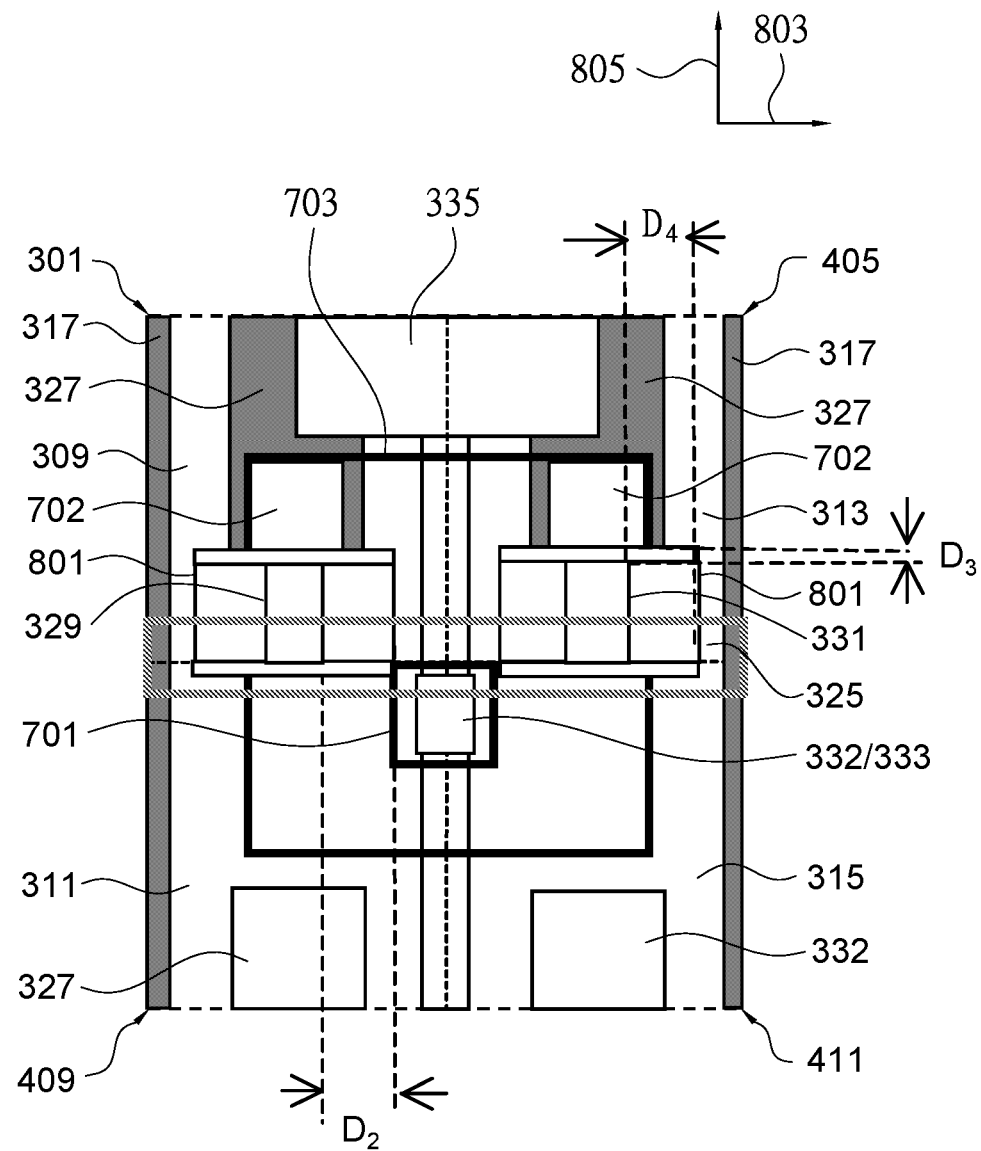
Figure 17E

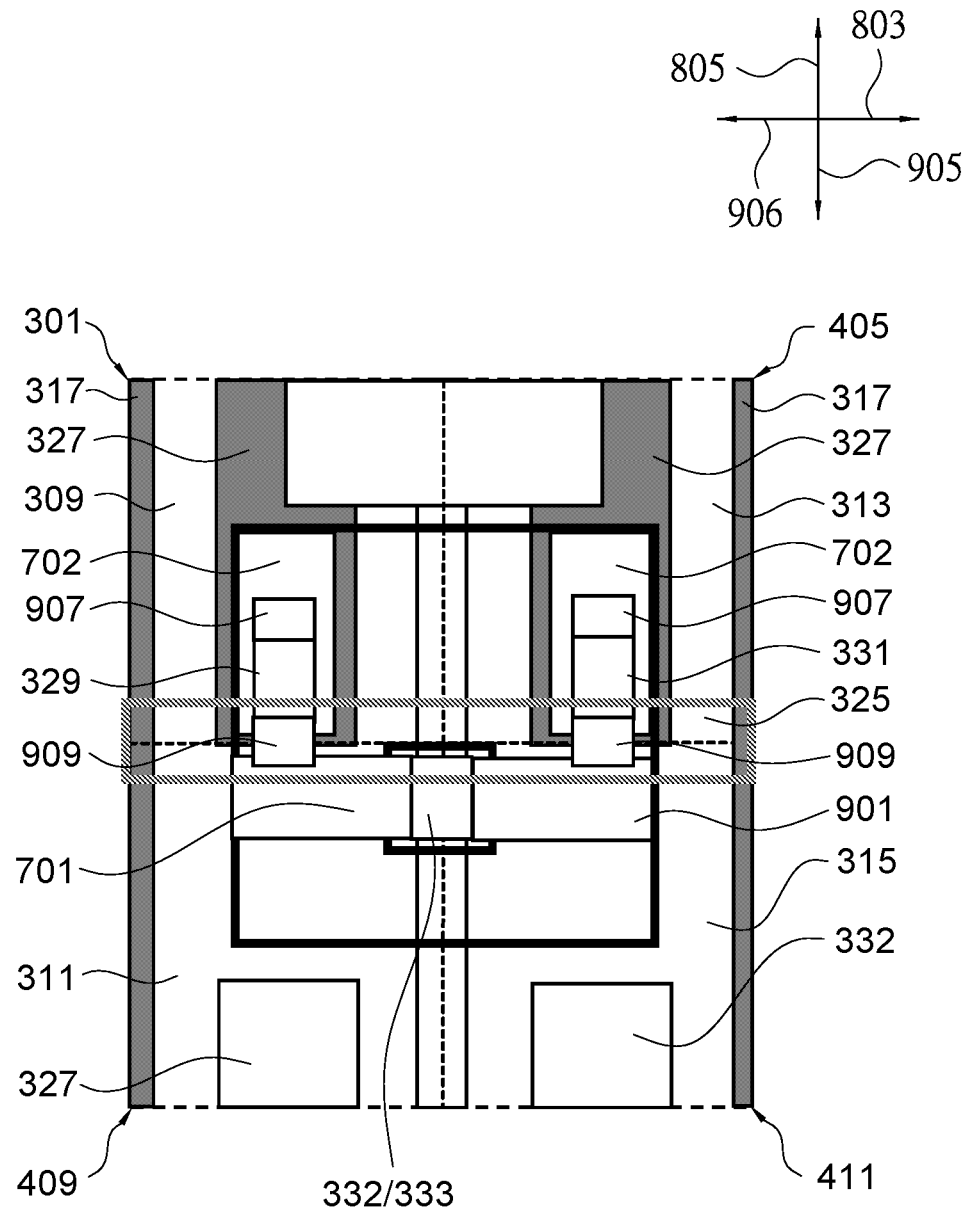
Figure 19E

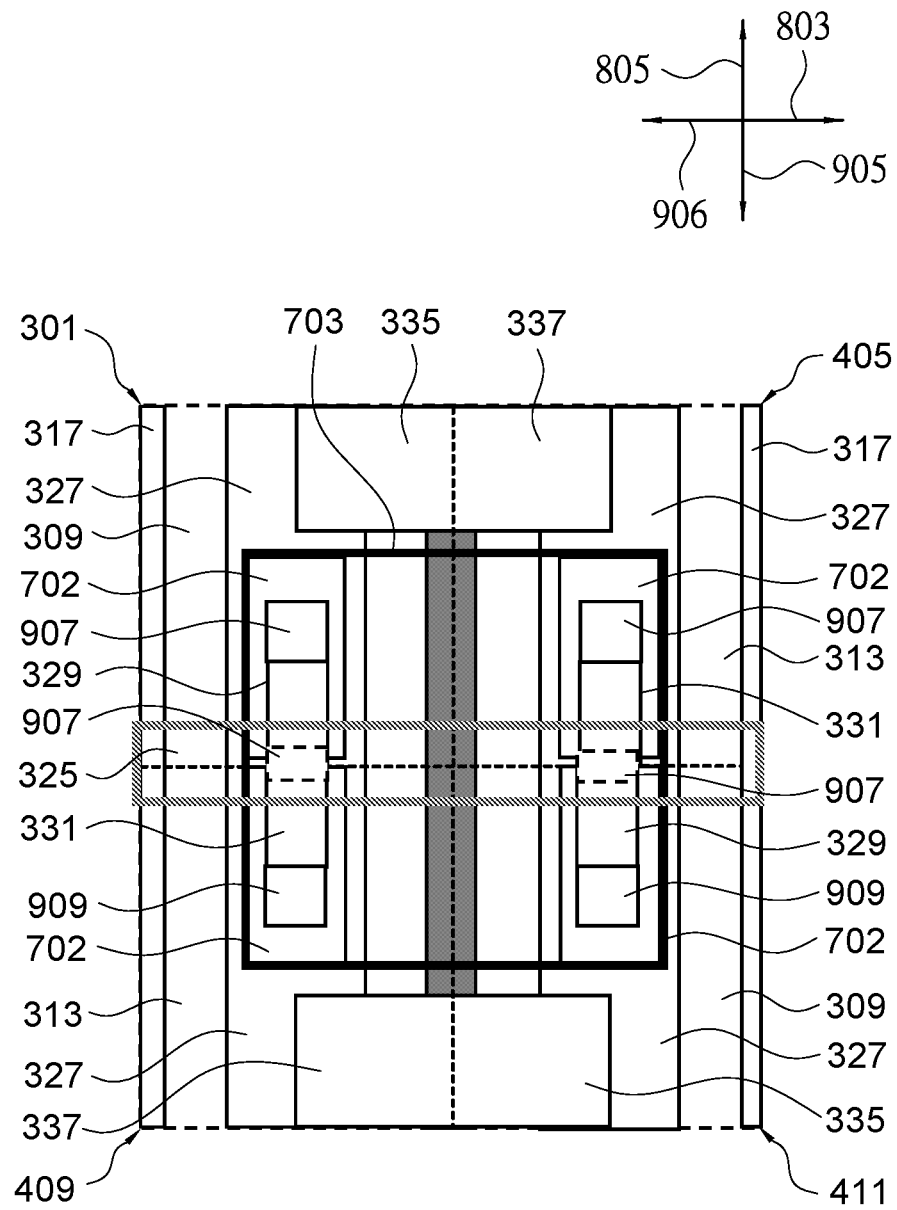
Figure 20A

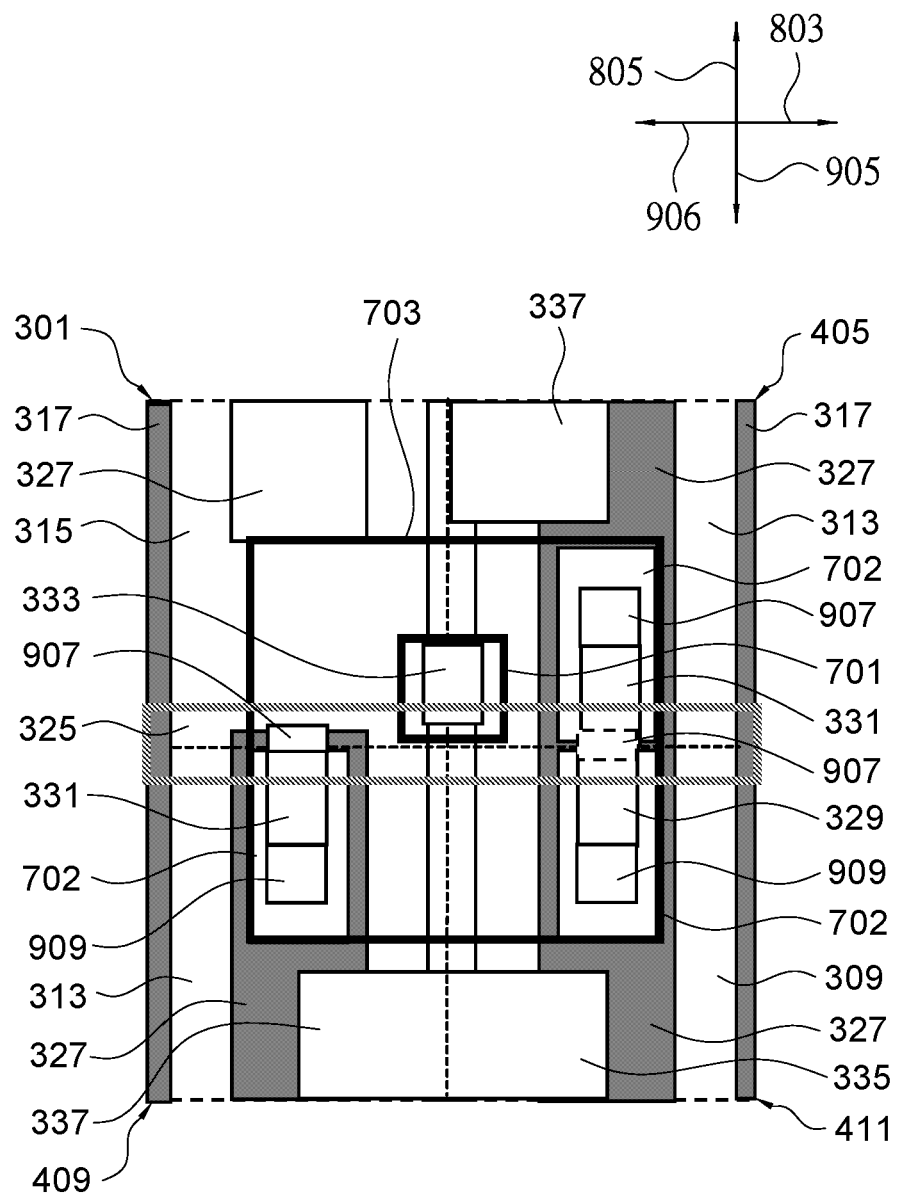
Figure 20B

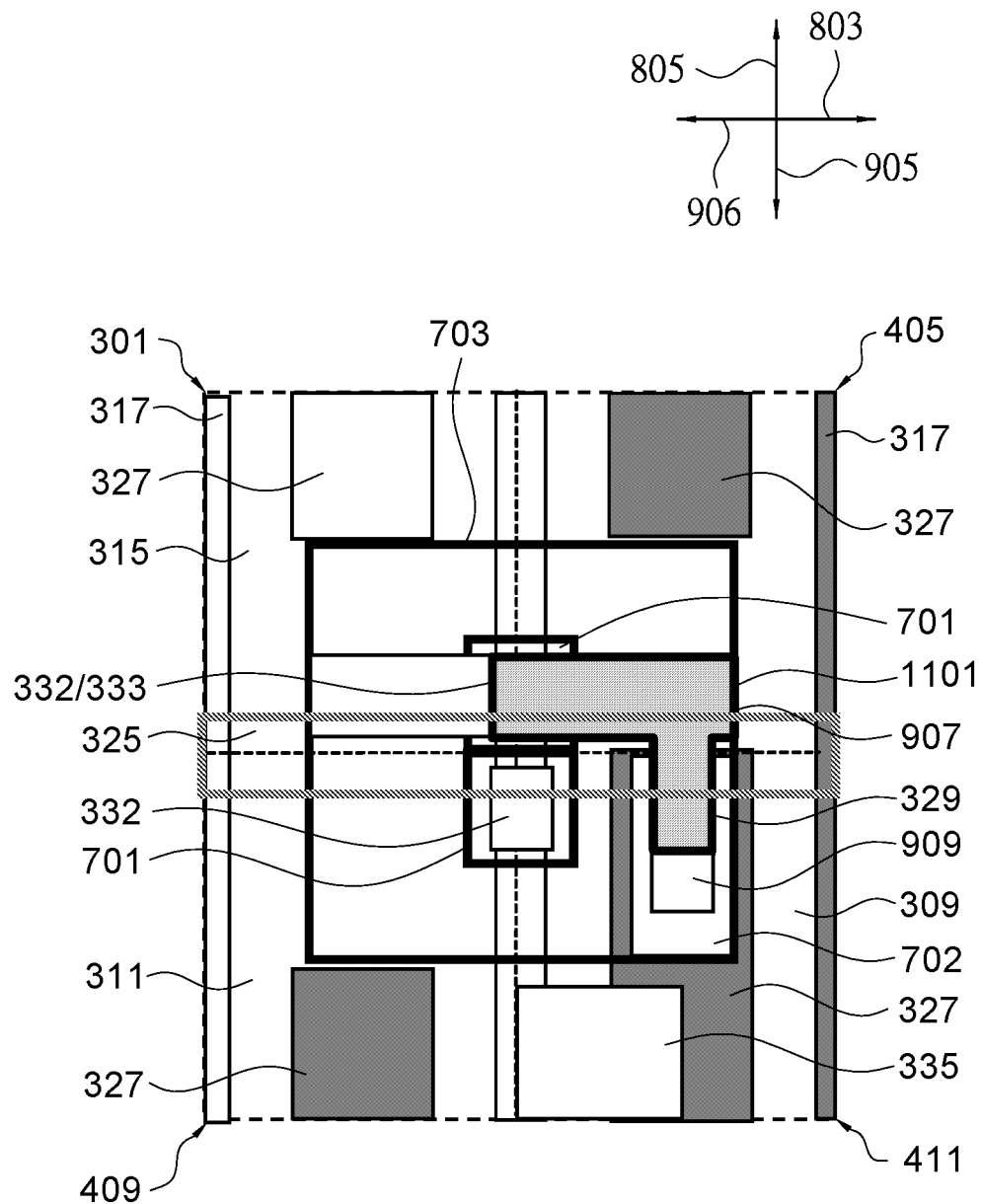
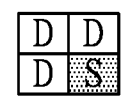
Figure 20F

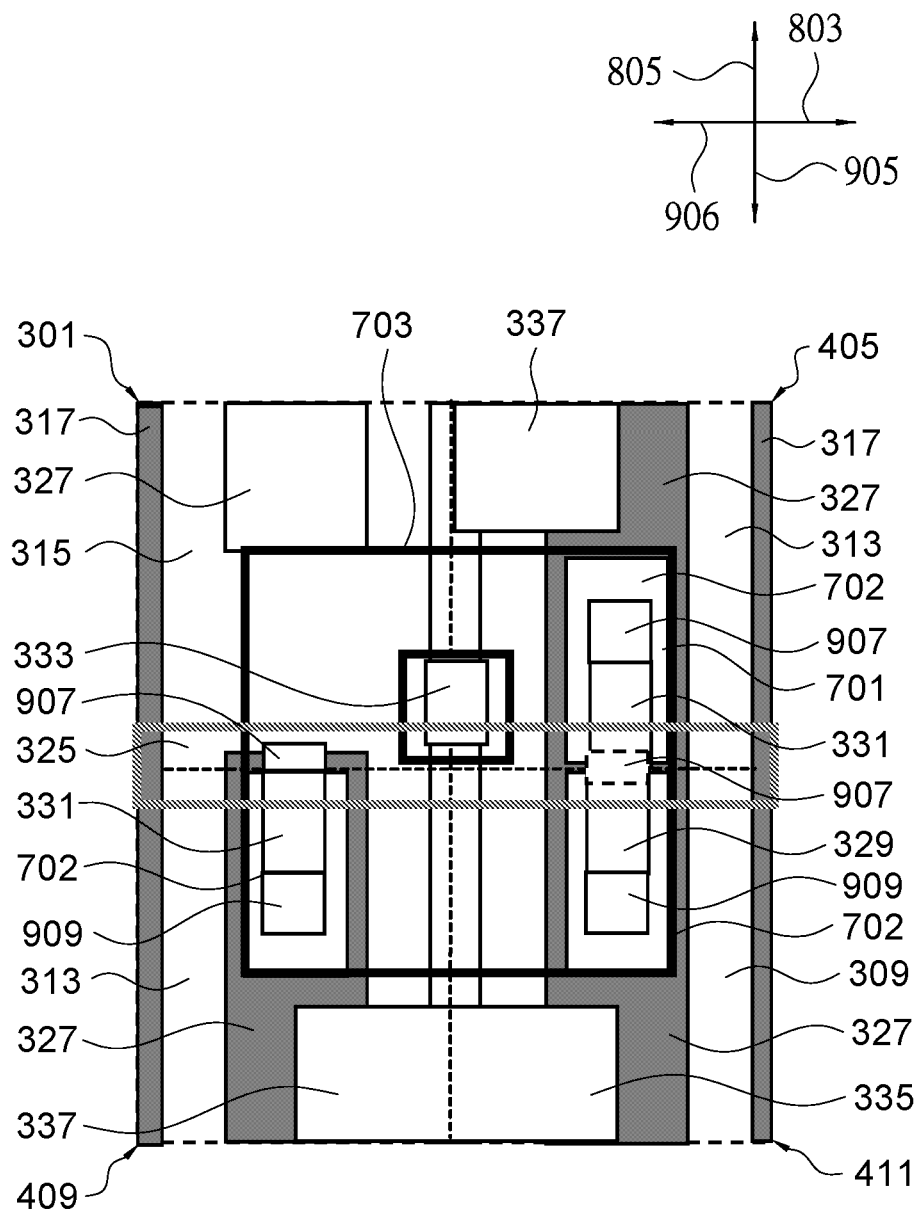
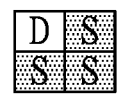
Figure 21B

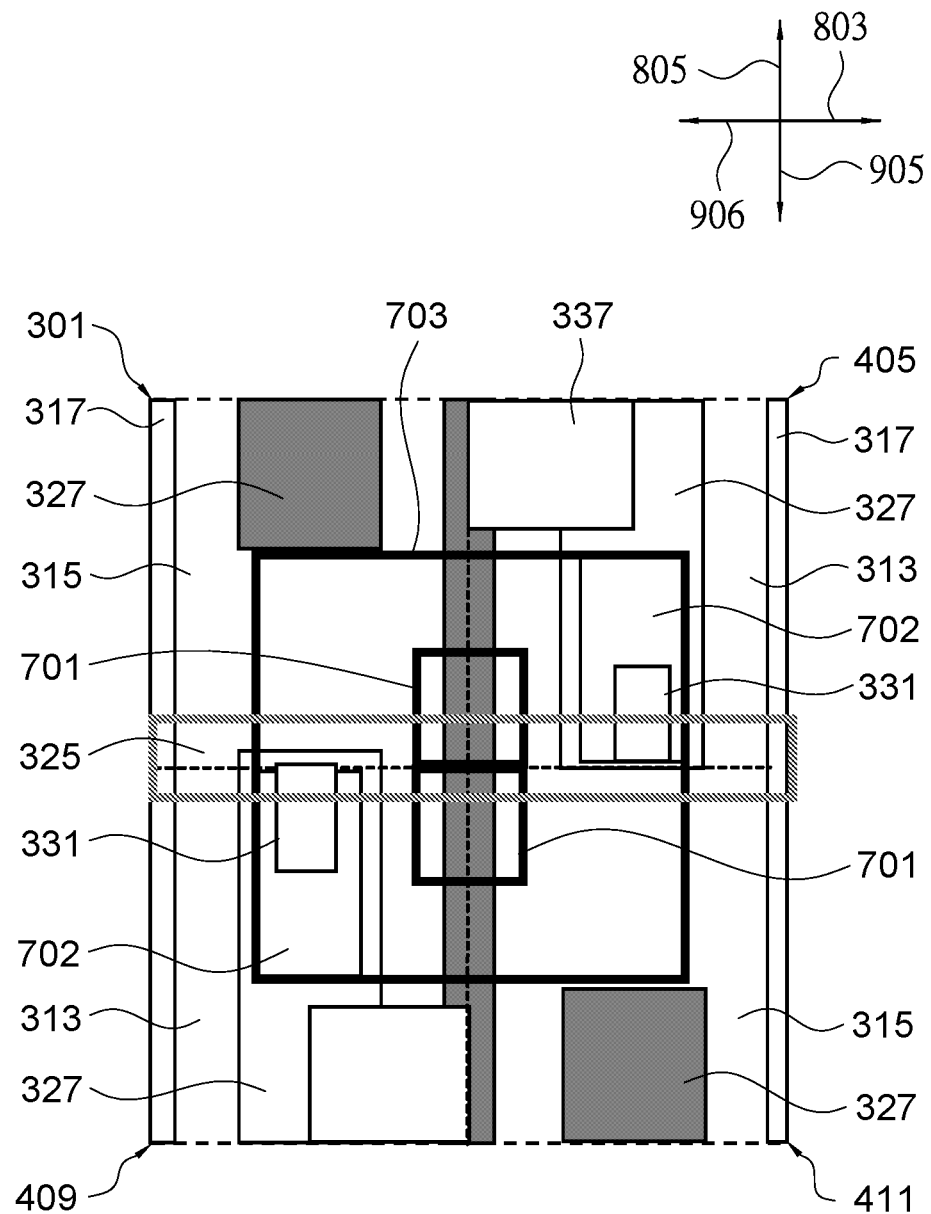
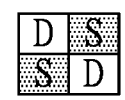
Figure 23C

CELL LAYOUT AND STRUCTURE

PRIORITY CLAIM AND CROSS-REFERENCE

This application is a division of and claims priority to U.S. patent application Ser. No. 14/473,614, filed on Aug. 29, 2014, and entitled "Cell Layout and Structure," which application is incorporated herein by reference.

BACKGROUND

Generally, electronic design automation (EDA) tools assist semiconductor designers to take a purely behavioral description of a desired circuit and work to fashion a finished layout of the circuit ready to be manufactured. This process usually takes the behavioral description of the circuit and turns it into a functional description, which is then decomposed into thousands of Boolean functions and mapped into rows of cells using a standard cell library. Once mapped, a synthesis is performed to turn the structural design into a physical layout.

However, as semiconductor devices in general become smaller and smaller, technical problems have arisen within the field of electronic design automation. Such issues can arise when structural designs reach the physical limitations of the manufacturing processes that will be used to turn the designs into the physical semiconductor device. Such problems need to be addressed and overcome in order to continue to reduce the overall size of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D illustrate a first cell row and a second cell row in accordance with some embodiments.

FIGS. 5A-5D illustrate a result of a post-placement treatment in accordance with some embodiments.

FIGS. 6A-6F illustrate results of the post-placement treatment in accordance with some embodiments.

DETAILED DESCRIPTION

Figure 1:
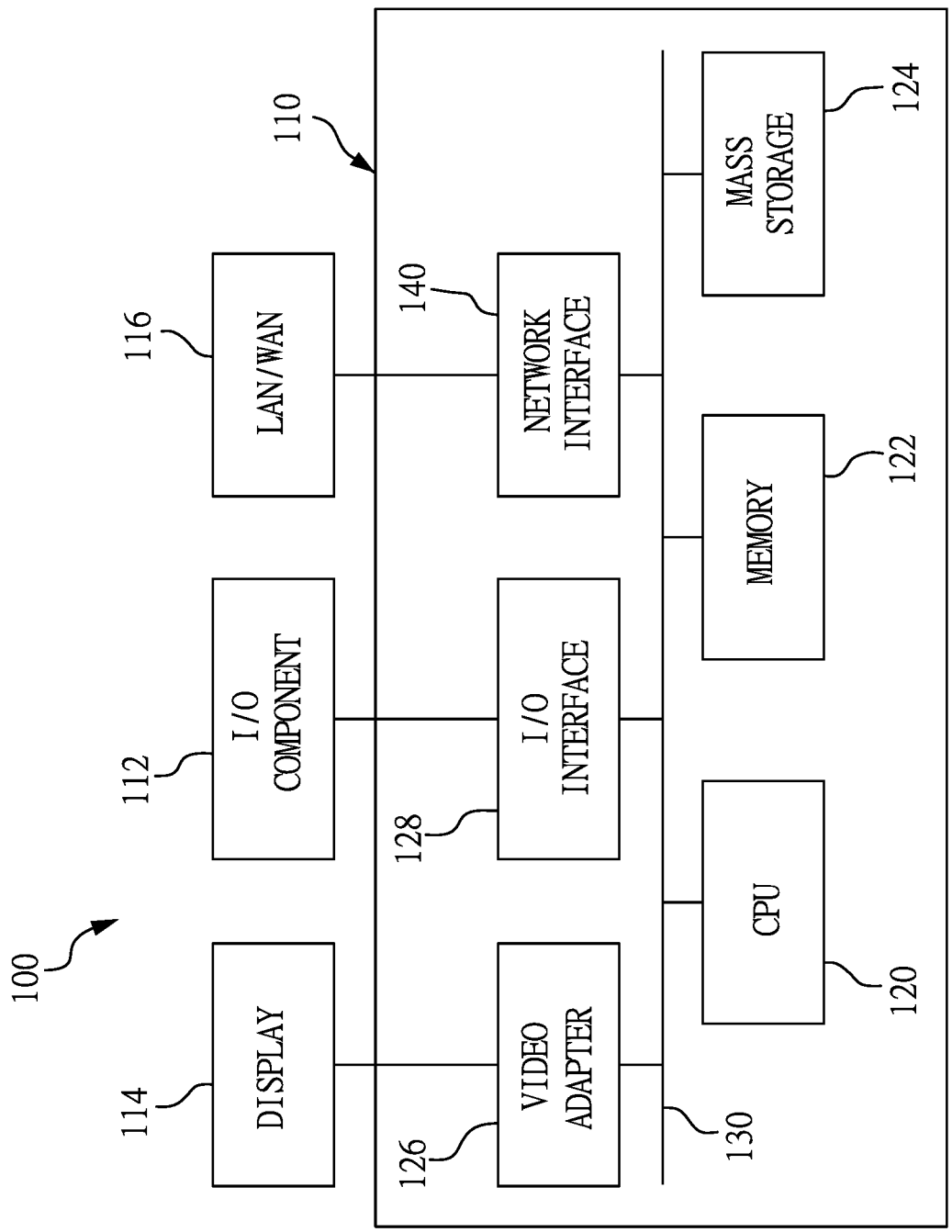
FIG. 1 illustrates a block diagram of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present embodiments will be described with respect to specific embodiments in a specific context, namely using an electronic design automation (EDA) tool to place cells and then perform a post abutment via treatment in order to obtain a higher density cell structure. The embodiments, however, may also be applied to other methods of design as well.

Referring now to FIG. 1, a block diagram of a processing system 100, such as an EDA processing system, is provided in accordance with an embodiment. The processing system 100 is a general purpose computer platform and may be used to implement any or all of the processes discussed herein or is a dedicated computer platform for performing electronic design. The processing system 100 may comprise a processing unit 110, such as a desktop computer, a workstation, a laptop computer, or a dedicated unit customized for a particular application. The processing system 100 may be equipped with a display 114 and one or more input/output devices 112, such as a mouse, a keyboard, or printer. The processing unit 110 may include a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, such as a microprocessor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, or the like.

The video adapter 126 and the I/O interface 128 provide interfaces to couple external input and output devices to the processing unit 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

It should be noted that the processing system 100 may include other components. For example, the processing system 100 may include power supplies, cables, a motherboard, removable storage media, cases, and the like. These other components, although not shown, are considered part of the processing system 100.

In an embodiment an EDA is program code that is executed by the CPU 120 to analyze a user file to obtain an integrated circuit layout (described further below with respect to FIG. 2). Further, during the execution of the EDA, the EDA may analyze functional components of the layout, as is known in the art. The program code may be accessed by the CPU 120 via the bus 130 from the memory 122, mass storage device 124, or the like, or remotely through the network interface 140.

Figure 2:
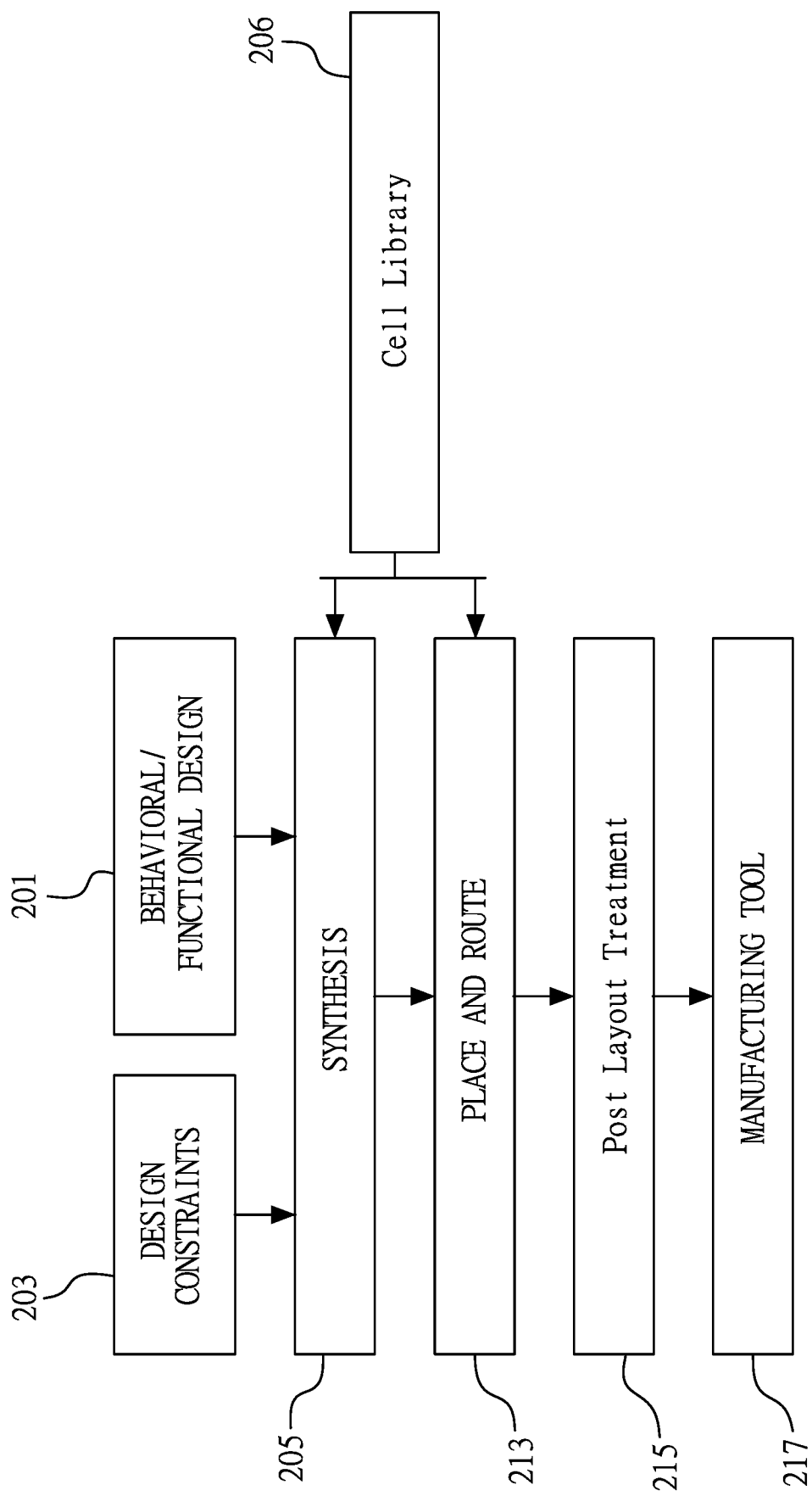
FIG. 2 illustrates a flow diagram used by an electronic design automation system in accordance with some embodiments.

FIG. 2 illustrates one possible flow used by the EDA in an embodiment to automatically generate a physical layout from a user supplied behavioral/functional design 201. The behavioral/functional design 201 specifies the desired behavior or function of the circuit based upon various signals or stimuli applied to the inputs of the overall design, and may be written in a suitable language, such as a hardware description language (HDL). The behavioral/functional design 201 may be uploaded into the processing unit 110 (see FIG. 1) through the I/O interface 128, such as by a user creating the file while the EDA is executing. Alternatively, the behavioral/functional design 201 may be uploaded and/or saved on the memory 122 or mass storage device 124, or the behavioral/functional design 201 may be uploaded through the network interface 140 from a remote user (see FIG. 1). In these instances, the CPU 120 will access the behavioral/functional design 201 during execution of the EDA.

Additionally, the user also provides a set of design constraints 203 in order to constrain the overall design of the physical layout of the behavioral/functional design 201. The design constraints 203 may be input, for example, through the I/O interface 128, downloading through the network interface 140, or the like. The design constraints 203 may specify timing and other suitable constraints with which the behavioral/functional design 201, once physically formed into an integrated circuit, must comply.

The EDA takes the behavioral/functional design 201 and the design constraints 203 and performs a synthesis 205 to create a functionally equivalent logic gate-level circuit description, such as a netlist. The synthesis 205 forms the functionally equivalent logic gate-level circuit description by matching the behavior and/or functions desired from the behavioral/functional design 201 to standard cells from cell libraries 206, which meet the design constraints 203.

The cell libraries 206 may include one or more individual cell libraries. Each of the individual cell libraries contains a listing of pre-designed components, called cells, each of which may perform a discrete logic function on a small scale. The cell is stored in the individual cell libraries as information comprising internal circuit elements, the various connections to these circuit elements, a pre-designed physical layout pattern that includes the height of each cell along with the cells' designed power rails, dopant implants, wells, and the like. Additionally, the stored cell may also comprise a shape of the cell, terminal positions for external connections, delay characteristics, power consumption, and the like.

Once the synthesis 205 creates the functionally equivalent logic gate-level circuit description from the behavioral/functional design 201 and the design constraints 203 by using one or more of the cell libraries 206, a place and route 213 is performed to create an actual physical design for the overall structure. The place and route 213 forms the physical design by taking the chosen cells from the cell libraries 206 and placing them into cell rows (such as a first cell row 401 and a second cell row 403, both of which are not illustrated in FIG. 2 but illustrated and described below with respect to FIG. 4A). The placement of each individual cell within the cell rows, and the placement of each cell row in relation to other cell rows, may be guided by cost functions in order to minimize wiring lengths and area desires of the resulting integrated circuit. This placement may be done either automatically by the place and route 213, or else may alternatively be performed partly through a manual process, whereby a user may manually insert one or more cells into a row.

After the initial placement of the individual cells within, e.g., the first cell row 401 and the second cell row 403, a post layout treatment 215 is performed. In an embodiment the post layout treatment 215 is a treatment that occurs after the placement of the individual cells into the first cell row 401 and the second cell row 403 and is a treatment which analyzes the vias along the abutments between the individual cells (e.g., the abutment between a first cell 301 and a second cell 405, not illustrated in FIG. 2 but illustrated and discussed in FIGS. 3 and 4A, respectively, below) and modifies these vias along the abutment in order to overcome restraints related to the physical limitations of lithography processes and which help generate a higher density cell. The post layout treatment 215 is described further below with respect to FIGS. 5A-13G.

Once a physical design layout has been generated by the place and route 213 and the post layout treatment 215 has occurred, the physical design may be sent to a manufacturing tool 217 to generate, e.g., photolithographic masks, that may be used in the physical manufacture of the desired design. The physical design layout may be sent to the manufacturing tool 217 through that LAN/WAN 166 or other suitable forms of transmission from the EDA to the manufacturing tool 217.

Figure 3:
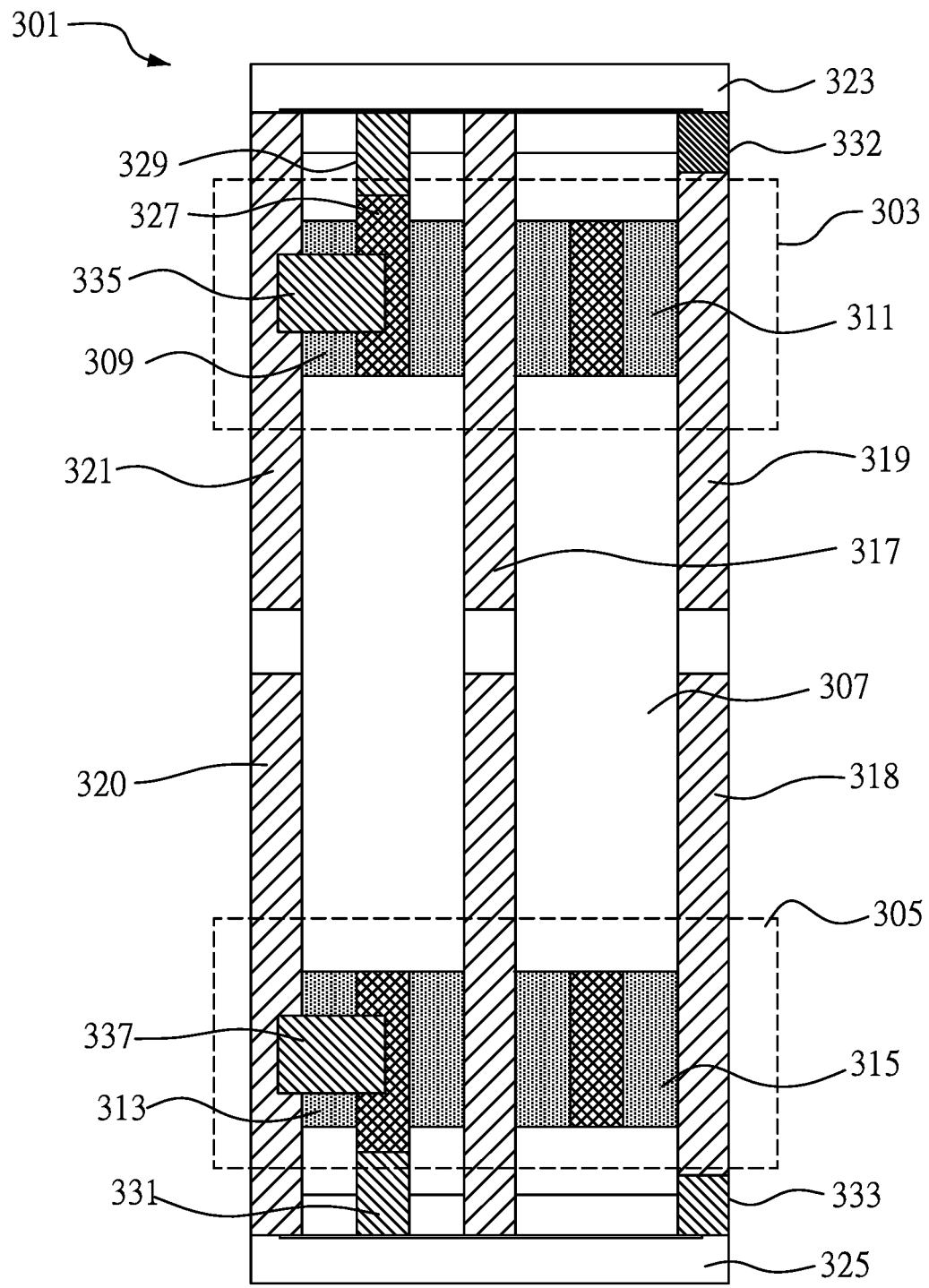
FIG. 3 illustrates a single cell in accordance with some embodiments.

Returning now to the place and route 213 and the post layout treatment 215, FIG. 3 illustrates one embodiment of the first cell 301 that may be stored in the cell libraries 206. In an embodiment the first cell 301 may be a cell that represents an inverter, with a first transistor 303 and a second transistor 305 separated by, e.g., an isolation structure 307 such as a shallow trench isolation (STI). Within the first transistor 303 is a first source region 309 and a first drain region 311, while the second transistor 305 has a second source region 313 and a second drain region 315.

Additionally, as an inverter, the first transistor 303 and the second transistor 305 share a common gate electrode 317 (e.g., polysilicon or other conductive material) that extends over the isolation structure 307 and separates the first source region 309 from the first drain region 311 and also separates the second source region 313 from the second drain region 315. The gate electrode 317 has a gate dielectric (not separately illustrated in FIG. 3) between the gate electrode 317 and the underlying substrate (which encompasses the first source region 309, the first drain region 311, the second source region 313, and the second drain region 315).

In addition to the gate electrode 317, a first cell boundary conductor 319, a second cell boundary conductor 321, a third cell boundary conductor 318, and a fourth cell boundary conductor 320 may also be located in a similar level (e.g., directly over the substrate) as the gate electrode 317. The first cell boundary conductor 319, the second cell boundary conductor 321, the third cell boundary conductor 318, and the fourth cell boundary conductor 320 are located along the outside perimeter of the first cell 301 and are formed to provide a bias to the cell and assist in preventing cross-talk and interference between neighboring cells. The first cell boundary conductor 319, the second cell boundary conductor 321, the third cell boundary conductor 318, and the fourth cell boundary conductor 320 may be formed from a similar material as the gate electrode 317 (e.g., polysilicon or other conductive material).

To make electrical contact with e.g., a power rail 323 (located on a first side of the first cell 301) or a ground rail 325 (located on a second side of the first cell 301), contacts 327 may be formed over the first source region 309, the first drain region 311, the second source region 313, and the second drain region 315. These contacts 327 allow for the routing of electrical connections to the outer perimeter of the first cell 301 so that vias (described further below) can make electrical contact to the contacts 327 and the overlying conductive traces (e.g., the power rail 323 or the ground rail 325).

The power rail 323 and the ground rail 325 are located in the metallization layers over the substrate and provide power and ground connections for the first transistor 303 and the second transistor 305. The power rail 323 and the ground rail 325 (from the top down view of FIG. 3) are located along a top and bottom edge, respectively, of the first cell 301. As such, when the first cell 301 is placed into a cell row, e.g., the first cell row 401 (illustrated and described below with respect to FIG. 4A), the power rail 323 and the ground rail 325 in the first cell 301 will align with power rails and ground rails in adjacent cells to form a continuous power rail and a continuous ground rail.

Vias may be formed to connect the various pieces of the first cell 301 to the power rail 323 and the ground rail 325. For example, a first via 329 may be formed to connect the power rail 323 with the first source region 309 through one of the contacts 327. A second via 331 may be formed to connect the ground rail 325 with the second source region 313 through another one of the contacts 327.

Additionally, a third via 332 may be formed to connect the first cell boundary conductor 319 to the power rail 323 and a fourth via 333 may be formed to connect the second cell boundary conductor 321 to the ground rail 325. By connecting the first cell boundary conductor 319 to an electrical potential, the first cell boundary conductor 319 is better able to prevent cross-talk and interference between neighboring cells.

Finally, there is illustrated in FIG. 3 a first metal-zero connection 335 and a second metal-zero connection 337. These connections are conductive connections that run along the surface of the substrate. For example, the first metal-zero connection 335 may be in physical contact with the first source region 309, with the contact 327 over the first source region 309, as well as by being in physical contact with the second cell boundary conductor 321. As such, the first metal-zero connection 335 provides an electrical connection between the power rail 323 and the second cell boundary conductor 321. Similarly, the second metal-zero connection 337 provides an electrical connection between the fourth cell boundary conductor 320 and the ground rail 325.

Figure 4A:
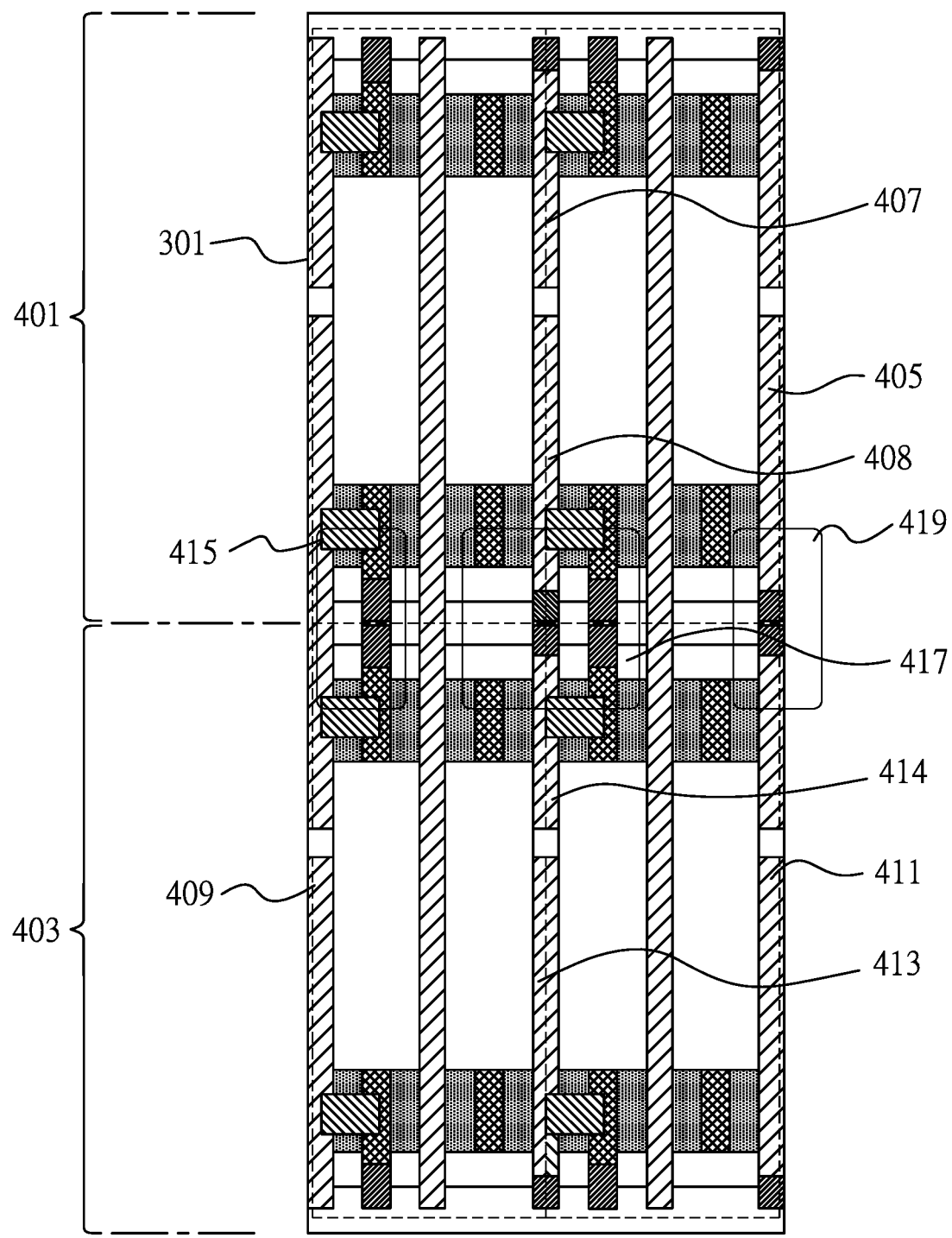

FIG. 4A illustrates that the first cell 301 may be placed during the place and route 213 into the first cell row 401. Additionally, a second cell 405 may be placed in the first cell row 401 adjacent to the first cell 301. In an embodiment the second cell 405 may be structurally similar to the first cell 301, such as by being a cell for an inverter. However, when placed adjacent to each other and in the same orientation, the first cell boundary conductor 319 of the first cell 301 (see FIG. 3) and the second cell boundary conductor 321 of the second cell 405 may be merged into a fifth boundary conductor 407 and a sixth boundary conductor 408 that separates the first cell 301 from the second cell 405.

FIG. 4A also illustrates the placement of a third cell 409 and a fourth cell 411 into the second cell row 403, wherein the second cell row 403 is an adjacent cell row to the first cell row 401. As such, the third cell 409 is adjacent to both the first cell 301 as well as the fourth cell 411. Additionally, the fourth cell 411 is adjacent to the third cell 409 and the second cell 405.

In an embodiment the third cell 409 and the fourth cell 411 may be similar to the first cell 301, such that the first cell 301, the second cell 405, the third cell 409 and the fourth cell 411 are all identical to each other at this stage (with the first cell 301 and the second cell 405 sharing the fifth boundary conductor 407 and the sixth boundary conductor 408 along with the third cell 409 and the fourth cell 411 sharing a seventh boundary conductor 413 and an eighth boundary conductor 414.

FIG. 4B illustrates one of three areas of interest in FIG. 4A after the place and route 213 has placed the first cell 301 and the second cell 405 into the first cell row 401 and has placed the third cell 409 and the fourth cell 411 into the second cell row 403. In the first area of interest (represented in FIG. 4A by the circle labeled 415), there are two vias (e.g., the second via 331 from the first cell 301 and the first via 329 from the third cell 409) that are adjacent to each other. The second via 331 from the first cell 301 and the first via 329 from the third cell 409 also connect to similar contacts 327, and connect to the ground rail 325. In other words, in the first area of interest 415 there are multiple vias that electrically connect the same structures together and are physically located in close proximity to each other.

FIG. 4C illustrates a second area of interest (represented in FIG. 4A by the circle labeled 417), in which there are multiple sets of vias that connect the same structures. For example, in the second area of interest 417, there are the fourth via 333 from the first cell 301, the second via 331 from the second cell 405, the third via 332 from the third cell 409, and the first via 329 from the fourth cell 411. However, all of these vias provide a connection between the ground rail 325, the contacts 327, the sixth boundary conductor 408 and the eighth boundary conductor 414.

FIG. 4D illustrates a third area of interest (represented in FIG. 4A by the circle labeled 419), in which there are another two vias (e.g., the fourth via 333 from the second cell 405 and the third via 332 from the fourth cell 411) that are adjacent to each other, connect to the third cell boundary conductor 318 in the second cell 405 and also connect to the first cell boundary conductor 319 in the fourth cell 411.

Figure 5A:
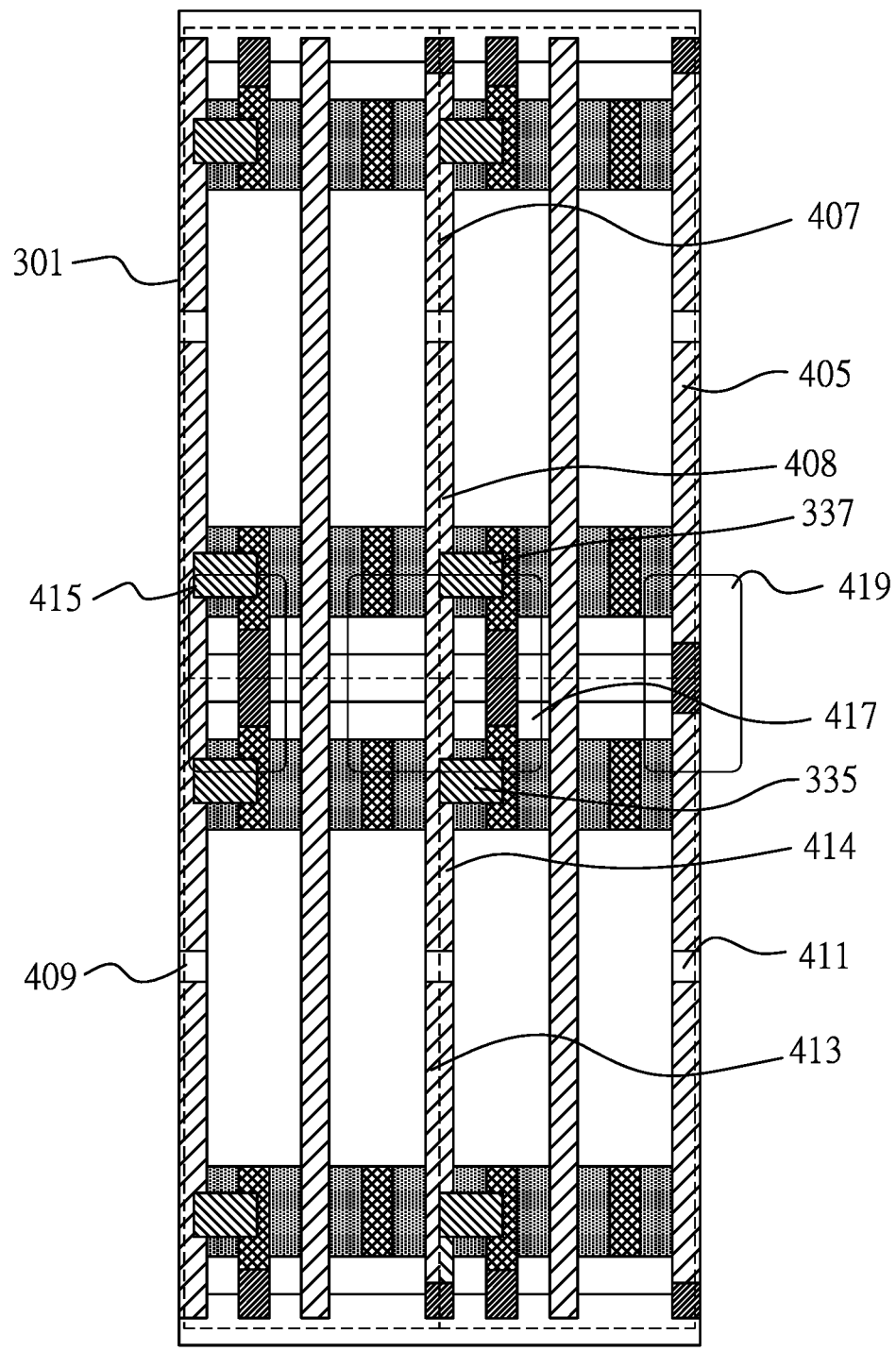

FIGS. 5A-5D illustrate a layout of the first cell 301, the second cell 405, the third cell 409, and the fourth cell 411 after the post layout treatment 215 has been performed on the initial design. In particular, FIG. 5A illustrates an overview of the first cell 301, the second cell 405, the third cell 409, and the fourth cell 411. Additionally, FIG. 5B illustrates an enlarged view of the first area of interest 415, FIG. 5C illustrates an enlarged view of the second area of interest 417, and FIG. 5D illustrates an enlarged view of the third area of interest 419 after the post layout treatment 215.

In an embodiment the post layout treatment 215 recognizes that the multiple vias located within the first area of interest 415, the second area of interest 417, and the third area of interest 419 may either be combined or else completely removed. For example, in the first area of interest 415, the second via 331 from the first cell 301 and the first via 329 from the third cell 409 may be combined or merged into a single fifth via 501. Similarly, in the third area of interest 419, the fourth via 333 from the second cell 405 and the third via 332 from the fourth cell 411 may be combined into a single sixth via 503. Finally, in the second area of interest 417, the second via 331 from the second cell 405 and the first via 329 from the fourth cell 411 may be combined into a single seventh via 505.

Additionally, because the sixth boundary conductor 408 is connected to the contacts 327 through the second metal-zero connection 337 in the second cell 405, and because the eighth boundary conductor 414 is connected to the contacts 327 through the first metal-zero connection 335 in the fourth cell 411, the fourth via 333 in the first cell 301 connected to the sixth boundary conductor 408 and the third via 332 in the third cell 409 connected to the eighth boundary conductor 414 are redundant connections. As such, the fourth via 333 and the third via 332 may be removed severing any electrical connections and without significant impact to the overall design.

Prior to performing the post layout treatment 215, the vias such as the fourth via 333 connected to the sixth boundary conductor 408 and the third via 332 connected to the eighth boundary conductor 414 are in very close physical proximity to each other. In fact, as sizes are reduced, the distance between the vias may become so small that it is below the ability of photolithographic processes to reliably obtain. However, by performing the post layout treatment 215 to either combine vias or else remove redundant vias, the overall design is simplified and the physical limitations of the photolithography process are avoided, thereby allowing for a further reduction in size.

FIGS. 6A-6F illustrate views of alternate embodiments of the post layout treatment 215 that may be performed within the second area of interest 417 for various placements and orientations of the first cell 301, the second cell 405, the third cell 409, and the fourth cell 411. For example, in FIG. 6A, the first cell 301, the second cell 405, the third cell 409, and the fourth cell 411 are arranged such that the transistors located adjacent to each other each have a source region (represented in FIG. 6A by the letter "S", wherein drain regions within FIGS. 6A-6F are represented by the letter "D") located within the second area of interest 417. In this embodiment the second cell 405 and the fourth cell 411 may be oriented as illustrated in FIG. 4A above, but the first cell 301 and the third cell 409 may be rotated 180° within the first cell row 401 and the second cell row 403.

In this embodiment, the post layout treatment 215 will start by analyzing the first via 329 in the first cell 301 and the second via 331 in the third cell 409. Once the post layout treatment 215 determines that the first via 329 in the first cell 301 and the second via 331 in the third cell 409 both connect similar structures, the post layout treatment 215 will combine and merge the first via 329 in the first cell 301 and the second via 331 in the third cell 409 into a first slot via 601.

The post layout treatment 215 will similarly analyze the second via 331 in the second cell 405 and the first via 329 in the fourth cell 411. Once the post layout treatment 215 determines that the second via 331 in the second cell 405 and the first via 329 in the fourth cell 411 connect similar structures, the post layout treatment 215 will combine these two vias into a second slot via 603.

FIG. 6B illustrates another embodiment in which the first cell 301, the second cell 405, and the fourth cell 411 are arranged as illustrated in FIG. 4A above, such that the third area of interest 419 comprises source regions from each of the second cell 405 and the fourth cell 411 and a drain region from the first cell 301. In this embodiment, however, the third cell 409 is rotated 180° within the second cell row 403 such that the second area of interest 417 comprises a source region from the third cell 409.

In this embodiment the post layout treatment 215 will analyze the second via 331 within the third cell 409 to see if it interacts with any other vias to which it may be merged. However, because the contact 327 over the drain in the first cell 301 does not have a via connecting to the ground rail 325 or the power rail 323, there is no via to which the post layout treatment 215 can merge the second via 331 within the third cell 409. As such, the post layout treatment 215 will not modify the second via 331.

Additionally, the post layout treatment 215 will analyze the first via 329 in the fourth cell 411 and the second via 331 in the second cell 405 to see if they interact with each other. Because they do, the post layout treatment 215 will merge the first via 329 in the fourth cell 411 and the second via 331 in the second cell 405 into a third slot via 605.

The post layout treatment 215 will also analyze the fourth via 333 in the first cell 301 and see that it is redundant. In particular, the post layout treatment 215 will recognize that the third slot via 605 provides the desired connections of the fourth via 333 through, e.g., the second metal-zero connection 337 of the second cell 405 and the first metal-zero connection 335 of the fourth cell 411. As such, the post layout treatment 215 will remove the fourth via 333 from the design (represented in FIG. 6B by the unshaded box).

This analysis is also useful for other situations as illustrated in FIG. 6B. For example, a similar analysis may be performed for when the second area of interest 417 comprises a source region from the first cell 301, a drain region from the second cell 405, a source region from the third cell 409, and a source region from the fourth cell 411. Similarly, a similar analysis may be performed for when the cells are arranged such that the second area of interest 417 comprises a source region from each one of the first cell 301, the second cell 405, and the third cell 409, and a drain region from the fourth cell 411, and also when the second area of interest 417 comprises source regions from each of the first cell 301, the second cell 405, and the fourth cell 411, and a drain region from the third cell 409.

FIG. 6C illustrates another embodiment in which the second area of interest 417 comprises a source region from the first cell 301, a drain region from the second cell 405, a source region from the third cell 409, and a drain region from the fourth cell 411. In this embodiment the post layout treatment 215 will analyze the first via 329 in the first cell 301 and the second via 331 in the third cell 409 to see if they interact. Because they do, the post layout treatment 215 will merge the first via 329 in the first cell 301 and the second via 331 in the third cell 409 into a fourth slot via 607.

Additionally, the post layout treatment 215 will analyze the third via 332 in the second cell 405 and the fourth via 333 in the fourth cell 411 to see if they interact with each other or with the first via 329 in the first cell 301 and the second via 331 in the third cell 409. Because the third via 332 in the second cell 405 and the fourth via 333 in the fourth cell 411 are electrically connected to the second via 331 in the third cell and the first via 329 in the first cell 301 (e.g., through the first metal-zero connection 335 and the second metal-zero connection 337), the post layout treatment 215 will remove the third via 332 in the second cell 405 and the fourth via 333 in the fourth cell 411.

This embodiment is also useful for additional situations. For example, in an embodiment in which the second area of interest 417 comprises a drain from the first cell 301, a source from the second cell 405, a drain from the third cell 409, and a source from the fourth cell 411, a similar analysis of merging and removing may be performed.

FIG. 6D illustrates another embodiment in which the second area of interest 417 comprises a drain from the first cell 301, a source from the second cell 405, a source from the third cell 409, and a drain from the fourth cell 411. In this embodiment the post layout treatment 215 will analyze the second via 331 from the second cell 405 and the second via 331 from the third cell 409 and determine that there are no other vias with which to merge these vias. As such it will leave them alone.

Additionally, the post layout treatment 215 will analyze the fourth via 333 in the first cell 301 and the fourth via 333 in the fourth cell 411. Because the fourth via 333 in the first cell 301 is electrically connected to the second via 331 in the second cell 405 (e.g., through the second metal-zero connection 337) and because the fourth via 333 in the fourth cell 411 is electrically connected to the second via in the third cell 409 (e.g., through the second metal-zero connection 337 in the third cell), the fourth via 333 in the first cell 301 and the fourth via 333 in the third cell 409 are removed from the design.

This embodiment as well is also useful for additional situations. For example, in an embodiment in which the second area of interest 417 comprises a source from the first cell 301, a drain from the second cell 405, a drain from the third cell 409, and a source from the fourth cell 411, a similar analysis of removing may be performed.

FIG. 6E illustrates another embodiment of the post layout treatment 215 performed when the second area of interest comprises a source from the first cell 301, a source from the second cell 405, a drain from the third cell 409, and a drain from the fourth cell 411. In this embodiment the post layout treatment 215 will analyze the first via 329 in the first cell 301, the second via 331 in the second cell 405, and the third via 332 in the third cell 409 and determine that all of these interact with each other. As such, one large via 609 that crosses into all of the cells may be used to replace the first via 329 in the first cell 301, the second via 331 in the second cell, and the third via 332 in the third cell 409.

This embodiment is also useful for additional situations. For example, in an embodiment in which the second area of interest 417 comprises a drain from the first cell 301, a drain from the second cell 405, a source from the third cell 409, and a source from the fourth cell 411, a similar analysis of merging the vias into one large via 609 may be performed.

FIG. 6F illustrates yet another embodiment in which the post layout treatment 215 is performed on a layout in which the second area of interest 417 comprises a source from the first cell 301, a drain from the second cell 405, a drain from the third cell 409, and a drain from the fourth cell 411. In this embodiment the post layout treatment 215 will analyze the first via 329 in the first cell 301 and the third via 332 in the third cell 409 and determine that they will interact. As such, the post layout treatment 215 will merge these two vias into an "L" shaped via 611.

Additionally, the post layout treatment 215 will also analyze the third via 332 in the second cell 405. In its analysis, the post layout treatment 215 will determine that the third via 332 in the second cell 405 interacts with the third via 332 in the third cell 409 (through, e.g., the first metal-zero connection 335 in the first cell 301) and, as such, is redundant. Accordingly, the post layout treatment 215 will remove the third via 332 in the second cell 405 from the design.

This embodiment is also useful for additional situations. For example, such an analysis may be used in embodiments in which the second area of interest 417 comprises a drain from the first cell 301, a source from the second cell 405, a drain from the third cell 409, and a drain from the fourth cell 411; in which the second area of interest 417 comprises a drain from the first cell 301, a drain from the second cell 405, a drain from the third cell 409, and a source from the fourth cell 411; and in which the second area of interest 417 comprises a drain from the first cell 301, a drain from the second cell 405, a source from the third cell 409, and a drain from the fourth cell 411.

Figure 7A:
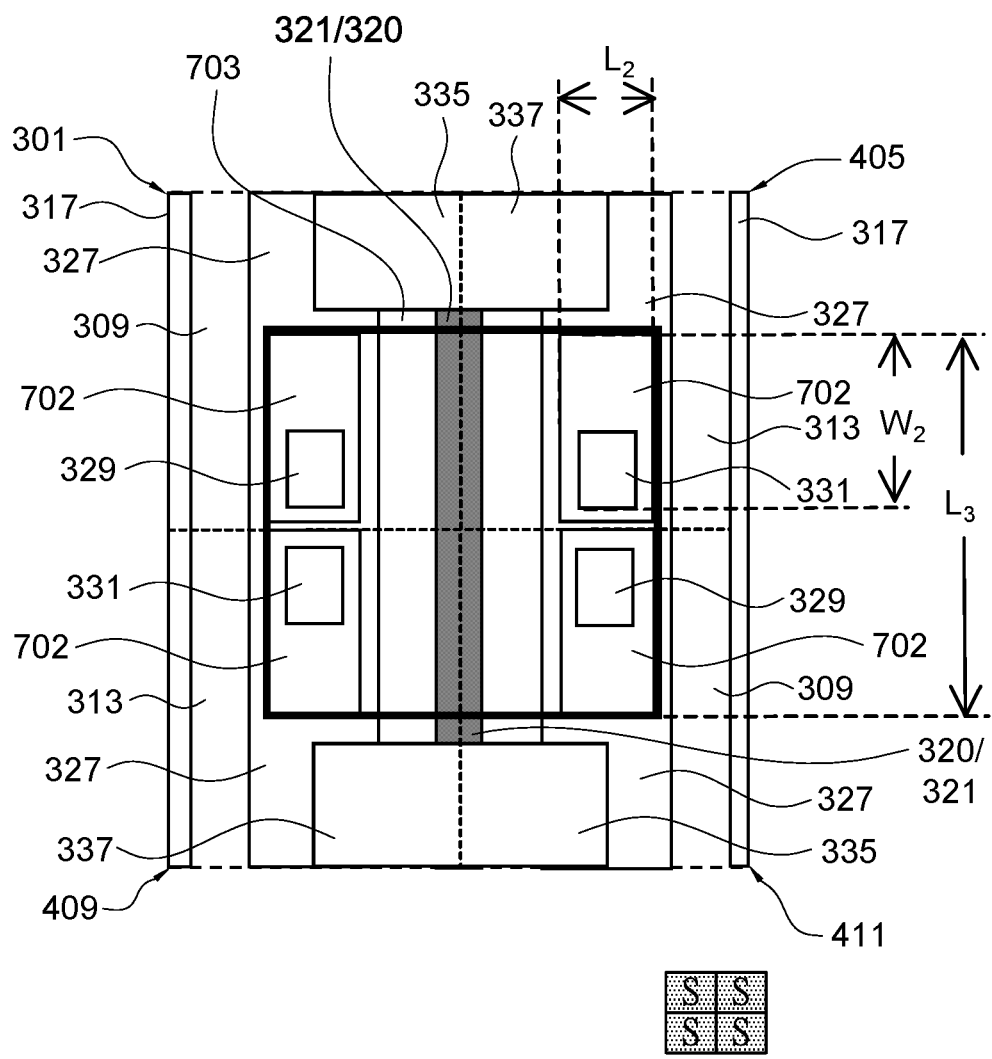
FIGS. 7A-14G illustrate a process flow for the post-placement treatment in accordance with some embodiments.
Figure 7B:
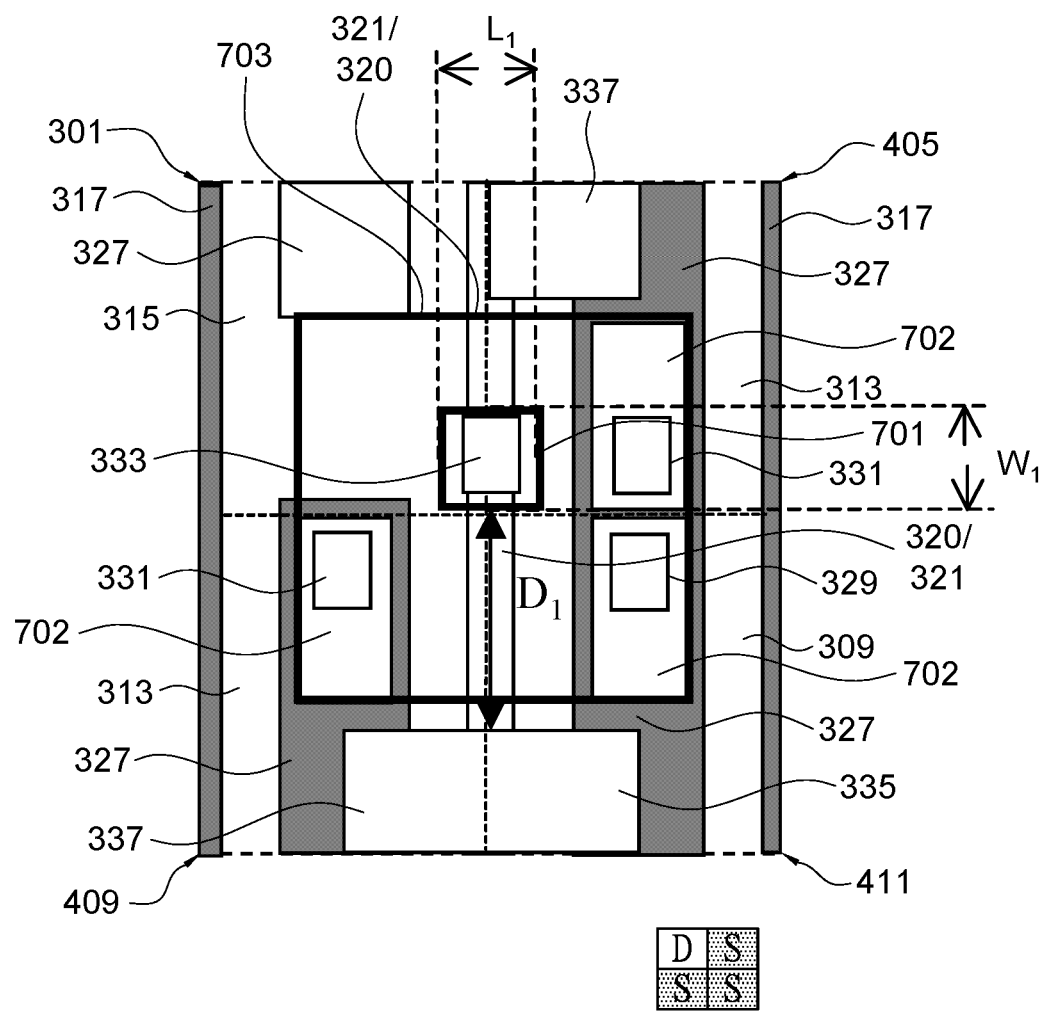
Figure 7C:
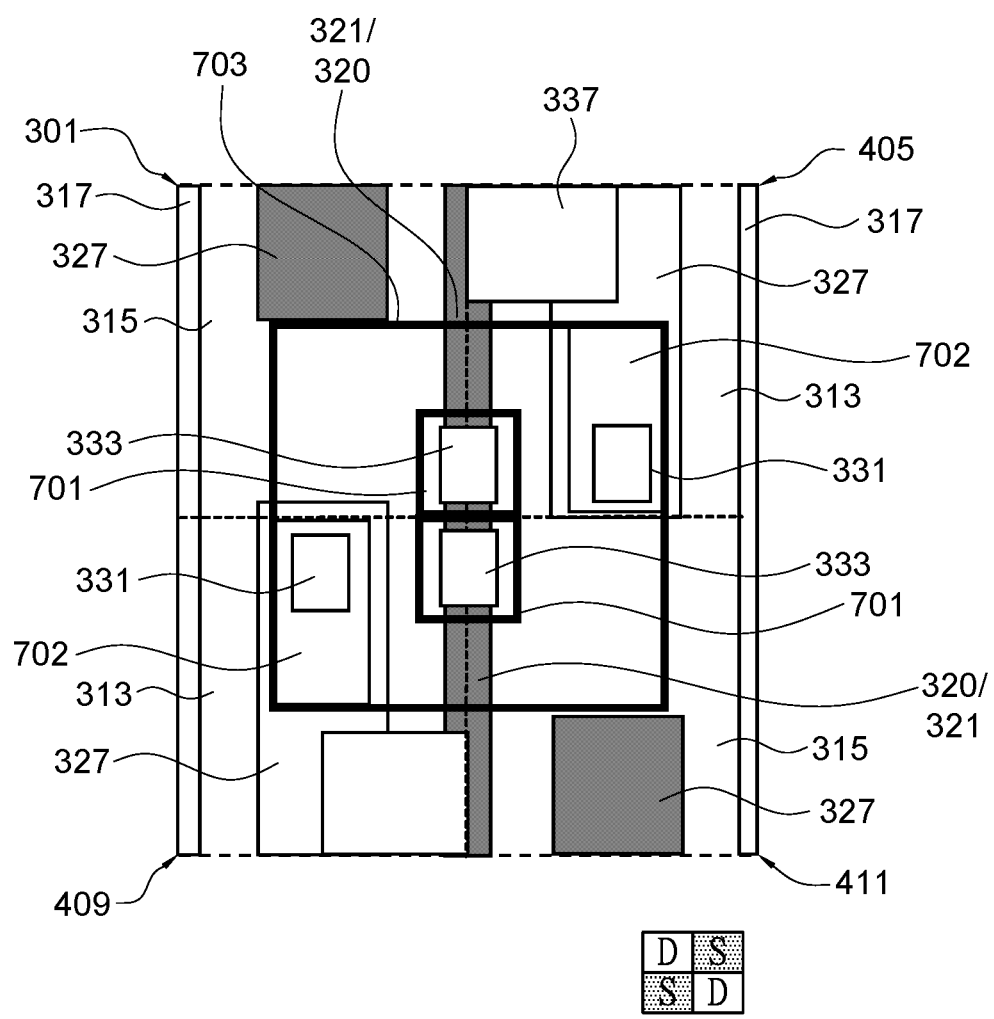
Figure 7D:
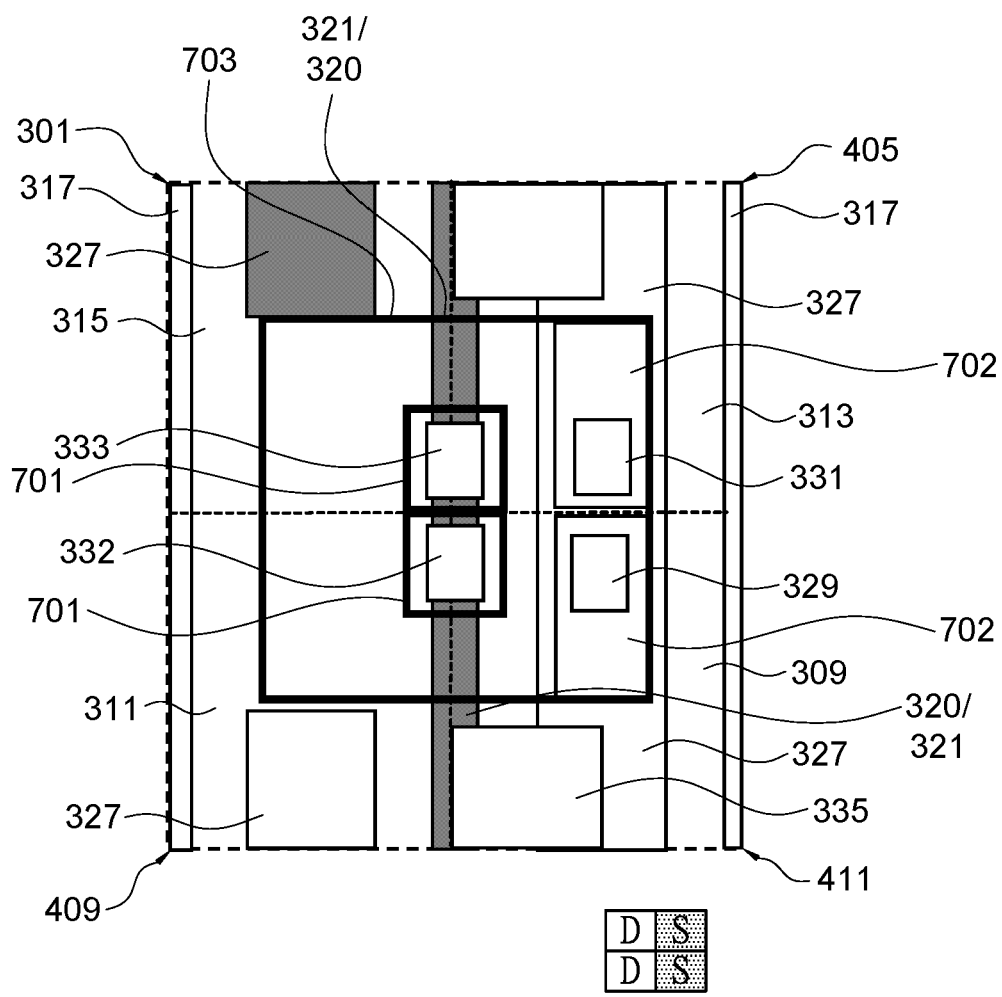
Figure 7E:
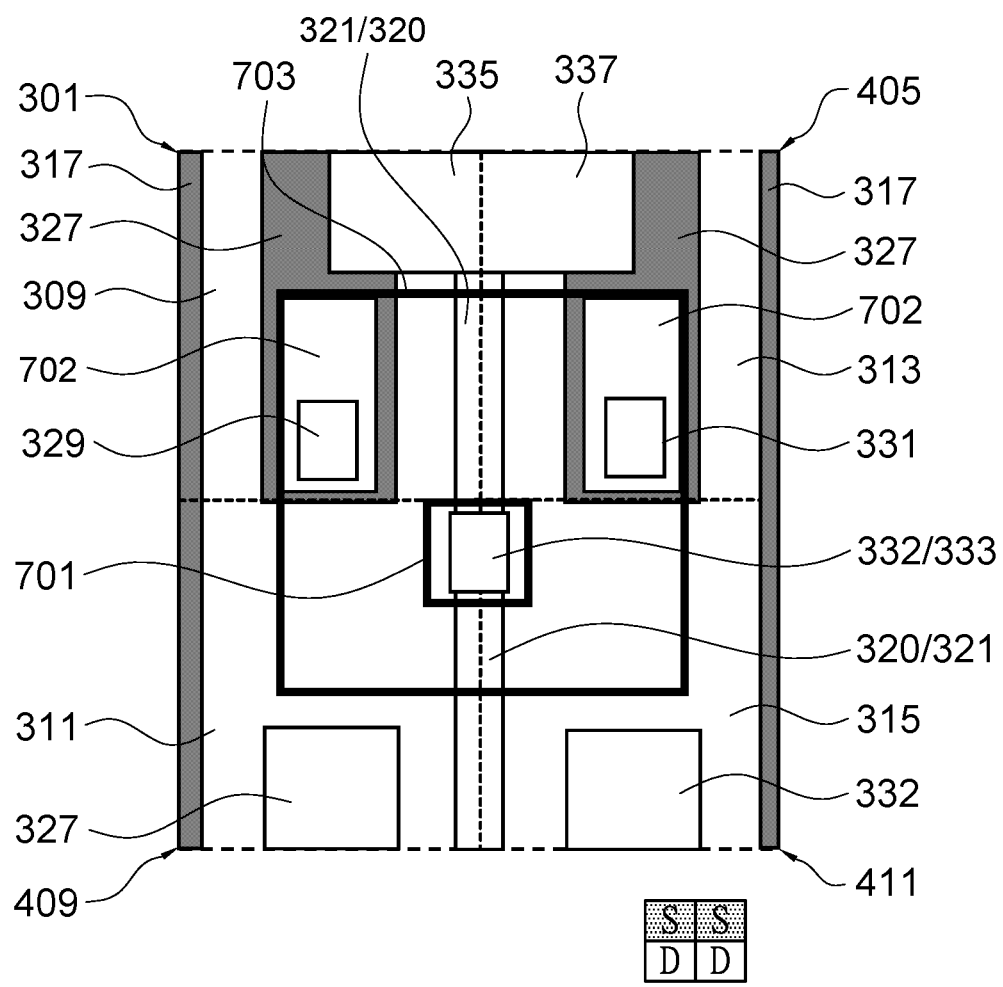
Figure 7F:
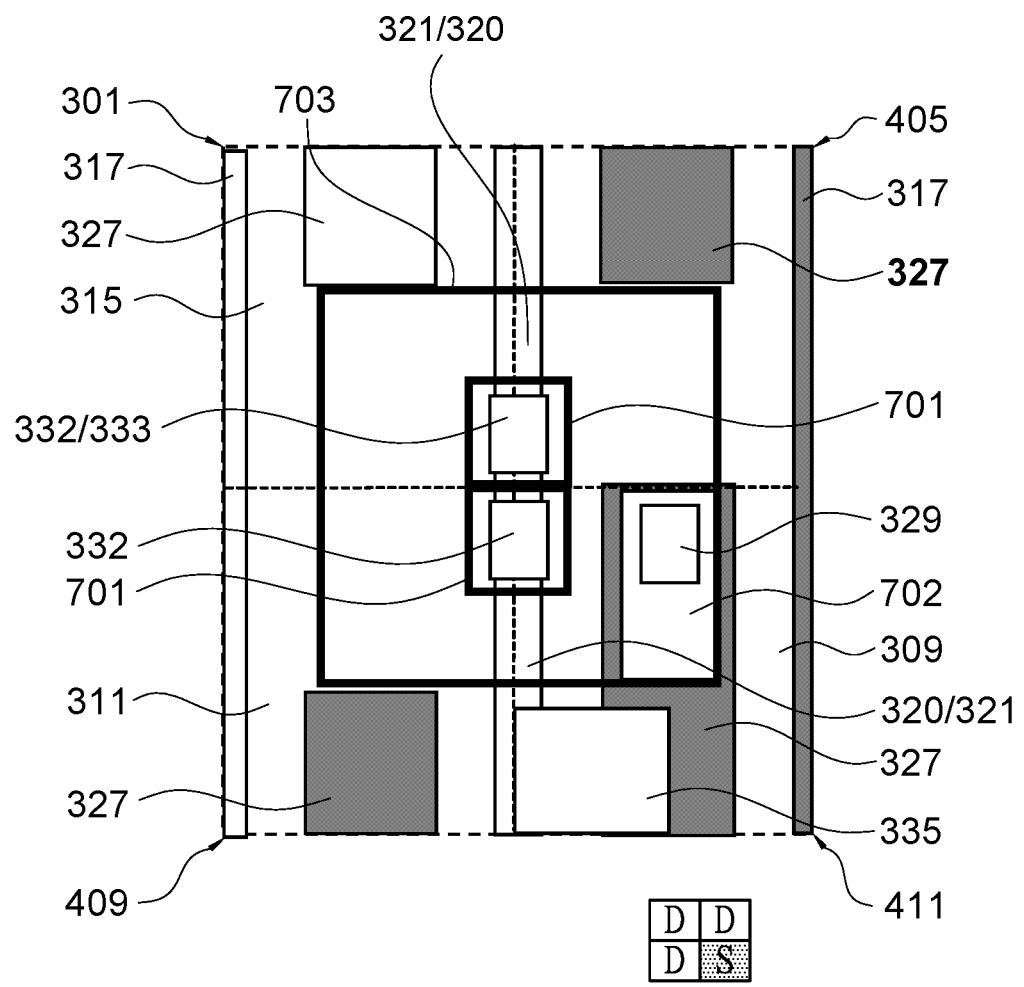
Figure 7G:
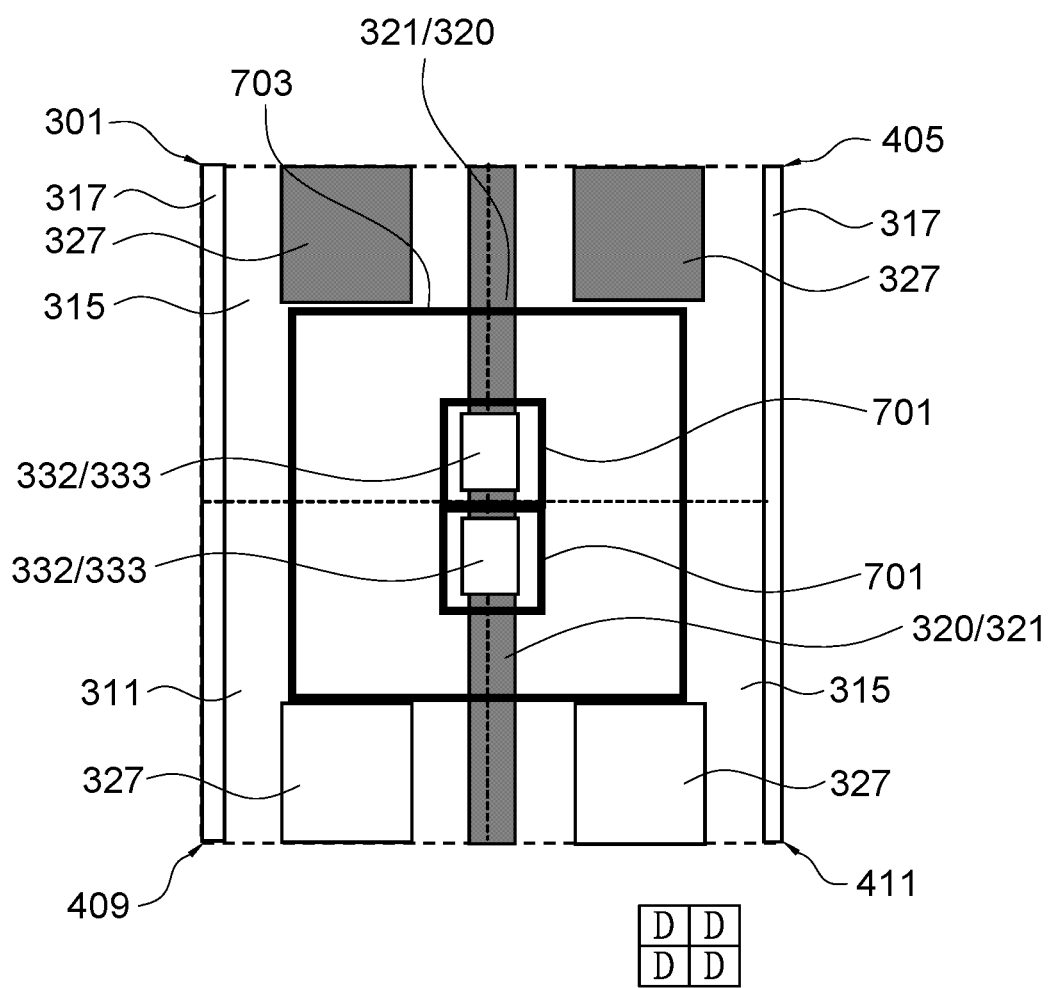

FIGS. 7A through 7G begin to illustrate one embodiment of a step by step process that may be used by the post layout treatment 215 to generate the above described mergers and removals. Each of the different letters in the Figures (e.g., 7A, 7B, 7C, etc.) represents different combinations for the second area of interest 417, with the different cells being differentiated by the dashed lines. For example, FIG. 7A illustrates the starting point wherein the second area of interest 417 comprises a source from the first cell 301, a source from the second cell 405, a source from the third cell 409, and a source from the fourth cell 411; FIG. 7B illustrates the starting point wherein the second area of interest 417 comprises a drain from the first cell 301, a source from the second cell 405, a source from the third cell 409, and a source from the fourth cell 411; FIG. 7C illustrates the starting point wherein the second area of interest 417 comprises a drain from the first cell 301, a source from the second cell 405, a source from the third cell 409, and a drain from the fourth cell 411; FIG. 7D illustrates the starting point wherein the second area of interest 417 comprises a drain from the first cell 301, a source from the second cell 405, a drain from the third cell 409, and a source from the fourth cell 411; FIG. 7E illustrates the starting point wherein the second area of interest 417 comprises a source from the first cell 301, a source from the second cell 405, a drain from the third cell 409, and a drain from the fourth cell 411; FIG. 7F illustrates the starting point wherein the second area of interest 417 comprises a drain from the first cell 301, a drain from the second cell 405, a drain from the third cell 409, and a source from the fourth cell 411; and FIG. 7G illustrates the starting point wherein the second area of interest 417 comprises a drain from the first cell 301, a drain from the second cell 405, a drain from the third cell 409, and a drain from the fourth cell 411.

In an embodiment the process flow 1500 (summarized in process flow diagram form below with respect to FIG. 15) starts with a first step 1501 which places portions of a first marker layer 701, portions of a second marker layer 702, and portions of a third marker layer 703 over the design. The first marker layer 701, the second marker layer 702, and the third marker layer 703 are not physical layers but instead represent design layers that allow a user to determine (as described below) the interactions around the various vias so that the vias can be analyzed for mergers or removals. The placement of the portions of the first marker layer 701, the portions of the second marker layer 702, and the portions of the third marker layer 703 are performed by overlying (in a top down view) the portions of the first marker layer 701, the portions of the second marker layer 702, and the portions of the third marker layer 703 over their respective elements.

In an embodiment the first marker layer 701 is sized to be able to indicate an interaction between the vias within the first marker layer 701 and vias within the second marker layer 702. In an embodiment the first marker layer 701 may be sized to have a first width $W_1$ of between about 15 nm and about 25 nm, such as about 20 nm, and a first length $L_1$ of between about 15 nm and about 25 nm. In a particular embodiment the first marker layer 701 has the first length $L_1$ of 20 nm and the first width $W_1$ of 20 nm. However, any suitable dimensions may alternatively be used for the first marker layer 701.

The first marker layer 701 is placed over the via lands (e.g., where the vias contact the underlying structure) that are located on the gate electrode 317, the first cell boundary conductor 319, the second cell boundary conductor 321, the third cell boundary conductor 318, and the fourth cell boundary conductor 320 under the power rail 323 and the ground rail 325. For the sake of consistency and clarity, the ground rail 325 and the power rail 323 are not illustrated in FIGS. 7A-7G (although they can clearly be seen in FIG. 4A, for example), and the terminology of the first cell boundary conductor 319, the second cell boundary conductor 321, the third cell boundary conductor 318, and the fourth cell boundary conductor 320 is maintained to indicate which cell they are located within even though these boundaries have already been merged during the placement of the first cell row 401 and the second cell row 403.

Looking at the second area of interest 417 illustrated in FIG. 7A (with four source regions located within the second area of interest 417), there are no via landings located on the gate electrode 317, the first cell boundary conductor 319, the second cell boundary conductor 321, the third cell boundary conductor 318, and the fourth cell boundary conductor 320 under the power rail 323 and the ground rail 325. As such, there is no placement of the first marker layer 701 on any of the structures within the second area of interest 417 in this configuration.

Looking at FIG. 7B, which has a single drain and three source regions located within the second area of interest 417, there is a single via (e.g., the fourth via 333 from the first cell 301) which is located on the gate electrode 317, the first cell boundary conductor 319, the second cell boundary conductor 321, the third cell boundary conductor 318, and the fourth cell boundary conductor 320 under the power rail 323 and the ground rail 325. As such, the first marker layer 701 is placed over the fourth via 333.

Looking at FIG. 7C, which has a drain region, a source region, a source region, and a drain region, there are two vias (e.g., the fourth via 333 from the first cell 301 and the fourth via 333 from the fourth cell 411) which are located on the gate electrode 317, the first cell boundary conductor 319, the second cell boundary conductor 321, the third cell boundary conductor 318, and the fourth cell boundary conductor 320 under the power rail 323 and the ground rail 325. As such, a first one of the first marker layer 701 is placed on the fourth via 333 in the first cell 301 and a second one of the first marker layer 701 is placed on the fourth via 333 in the fourth cell 411.

Looking at FIG. 7D, which has a drain region, a source region, a drain region, and a source region, there are two vias (e.g., the fourth via 333 from the first cell 301 and the third via 332 from the third cell 409) which are located on the gate electrode 317, the first cell boundary conductor 319, the second cell boundary conductor 321, the third cell boundary conductor 318, and the fourth cell boundary conductor 320 under the power rail 323 and the ground rail 325. As such, a first one of the first marker layer 701 is placed on the fourth via 333 in the first cell 301 and a second one of the first marker layer 701 is placed on the third via 332 in the third cell 409.

Looking at FIG. 7E, which illustrates the second area of interest 417 comprising a source region, a source region, a drain region, and a drain region, there is a single via (e.g., the combined via from the third via 332 in the third cell and the fourth via 333 in the fourth cell 411) which is located on the gate electrode 317, the first cell boundary conductor 319, the second cell boundary conductor 321, the third cell boundary conductor 318, and the fourth cell boundary conductor 320 under the power rail 323 and the ground rail 325. As such a single one of the first marker layer 701 is placed over the combined via from the third via 332 in the third cell and the fourth via 333 in the fourth cell 411.

Looking at FIG. 7F, which illustrates the second area of interest 417 with a drain region, a drain region, a drain region, and a source region, there are two vias (e.g., the third via 332 in the third cell 409 and the combined third via in the second cell 405 and fourth via 333 in the first cell 301) which are located on the gate electrode 317, the first cell boundary conductor 319, the second cell boundary conductor 321, the third cell boundary conductor 318, and the fourth cell boundary conductor 320 under the power rail 323 and the ground rail 325. As such, a first one of the first marker layers 701 is placed over the third via 332 in the third cell 409 and a second one of the first marker layers 701 is placed over the combined third via in the second cell 405 and fourth via 333 in the first cell 301.

Looking at FIG. 7G, which illustrates the second area of interest 417 with four drain regions, there are two vias (e.g., the combined fourth via 333 in the first cell 301 and the third via 332 in the second cell 405, and the combined third via 332 in the third cell 409 and fourth via 333 in the fourth cell 411) which are located on the gate electrode 317, the first cell boundary conductor 319, the second cell boundary conductor 321, the third cell boundary conductor 318, and the fourth cell boundary conductor 320 under the power rail 323 and the ground rail 325. As such, a first one of the first marker layers 701 is placed over the combined fourth via 333 in the first cell 301 and the third via 332 in the second cell 405 and a second one of the first marker layers 701 is placed over the combined third via 332 in the third cell 409 and fourth via 333 in the fourth cell 411.

Once the first marker layer 701 has been applied to the overall design, the second marker layer 702 is applied to the design. In an embodiment the second marker layer 702 is sized such that the following analysis will indicate an interaction between the vias overlaid by the first marker layer 701 and the vias overlaid by the second marker layer 702. In an embodiment the second marker layer 702 may be sized to have a second width $W_2$ of between about 35 nm and about 45 nm, such as about 40 nm, and a second length $L_2$ of between about 70 nm and about 90 nm. In a particular embodiment the second marker layer 702 has the second length $L_2$ of 82 nm and the second width $W_2$ of 40 nm. However, any suitable dimensions may alternatively be used for the second marker layer 702.

The second marker layer 702 is placed over the via lands (e.g., where the vias contact the underlying structure) that are located over the first source region 309, the first drain region 311, the second source region 313, and the second drain region 315 within the first cell 301, the second cell 405, the third cell 409, and the fourth cell 411. For example, looking at the second area of interest 417 illustrated in FIG. 7A (with four source regions located within the second area of interest 417), there are four vias (e.g., the first via 329 in the first cell 301, the second via 331 in the second cell 405, the second via 331 in the third cell 409, and the first via 329 in the fourth cell 411) that are located on the first source region 309, the first drain region 311, the second source region 313, and the second drain region 315. As such, a first one of the second marker layer 702 is placed on the first via 329 in the first cell 301, a second one of the second marker layer 702 is placed on the second via 331 in the second cell 405, a third one of the second marker layer 702 is placed on the second via 331 in the third cell 409, and a fourth one of the second marker layer 702 is placed on the first via 329 in the fourth cell 411.

Looking at FIG. 7B, which illustrates the second area of interest 417 comprising a single drain and three source regions, there are three vias (e.g., the second via 331 in the second cell 405, the second via 331 in the third cell 409, and the first via 329 in the fourth cell 411) that are located on the first source region 309, the first drain region 311, the second source region 313, and the second drain region 315. As such a first one of the second marker layer 702 is placed on the second via 331 in the second cell 405, a second one of the second marker layer 702 is placed on the second via 331 in the third cell 409, and a third one of the second marker layer 702 is placed on the first via 329 in the fourth cell 411.

Looking at FIG. 7C, which illustrates the second area of interest 417 comprising a drain region, a source region, a source region, and a drain region, there are two vias (e.g., the second via 331 in the second cell 405 and the second via 331 in the third cell 409) that are located on the first source region 309, the first drain region 311, the second source region 313, and the second drain region 315. As such a first one of the second marker layer 702 is placed on the second via 331 in the second cell 405, and a second one of the second marker layer 702 is placed on the second via 331 in the third cell 409.

Looking at FIG. 7D, which illustrates the second area of interest 417 comprising a drain region, a source region, a drain region, and a source region, there are two vias (e.g., the second via 331 in the second cell 405 and the first via 329 in the fourth cell 411) that are located on the first source region 309, the first drain region 311, the second source region 313, and the second drain region 315. As such a first one of the second marker layer 702 is placed on the second via 331 in the second cell 405, and a second one of the second marker layer 702 is placed on the first via 329 in the fourth cell 411.

Looking at FIG. 7E, which illustrates the second area of interest 417 comprising a source region, a source region, a drain region, and a drain region, there are two vias (e.g., the first via 329 in the first cell 301 and the second via 331 in the second cell 405) that are located on the first source region 309, the first drain region 311, the second source region 313, and the second drain region 315. As such a first one of the second marker layer 702 is placed on the first via 329 in the first cell 301, and a second one of the second marker layer 702 is placed on the second via 331 in the second cell 405.

Looking at FIG. 7F, which illustrates the second area of interest 417 with a drain region, a drain region, a drain region, and a source region, there is only one via (e.g., the first via 329 in the fourth cell 411) that is located on the first source region 309, the first drain region 311, the second source region 313, and the second drain region 315. As such a first one of the second marker layer 702 is placed on the first via 329 in the fourth cell 411.

Looking at FIG. 7G, which illustrates the second area of interest 417 with four drain regions, there are no vias that are located on the first source region 309, the first drain region 311, the second source region 313, and the second drain region 315. As such, the second marker layer 702 is not placed over any vias in FIG. 7G.

Once the first marker layer 701 and the second marker layer 702 have been placed upon their respective structures (as described above), the third marker layer 703 is utilized to determine which of the structures should be further treated in the post layout treatment 215. In an embodiment the third marker layer 703 may be shaped as a square with a third length $L_3$ that is sufficient to indicate that closely related vias interact with each other. In an embodiment the third length $L_3$ may be between about 70 nm and about 90 nm, such as about 82 nm. However, any other suitable length may alternatively be utilized.

The third marker layer 703 is then placed over one of the portions of the first marker layer 701 or the second marker layer 702 that were previously placed. In the embodiment described in FIGS. 7A through 7G, the third marker layer 703 is placed such that the first marker layer 701 located on the conductive cell boundaries are located within a center of the third marker layer 703. However, any suitable placement may alternatively be utilized.

Once in place, an analysis is performed in order to determine which ones of the first marker layer 701 and the second marker layer 702 are located within the third marker layer 703. Those that are co-located within the third marker layer 703 will be further analyzed. In other words, if there are two or more of the first marker layer 701 or the second marker layer 702, then those structures will be further analyzed together. Those that are not located within the third marker layer 703 will not be further analyzed under this process.

In a second step 1502, an analysis is performed to identify those vias that were previously overlaid by the first marker layer 701 and also has an alternate route to the power rail 323 or the ground rail 325. In an embodiment each of the vias overlaid by the first marker layer 701 may be expanded towards either the first metal-zero connection 335 or the second-metal zero connection 337 a first distance $D_1$. In an embodiment the first distance $D_1$ is chosen such that there is not a deleterious effect from performing the post layout treatment 215, such as by being less than about 50 nm, such as about 30 nm, although any suitable distance may alternatively be chosen. If the expanded vias overlaid by the first marker layer 701 extend to either the first metal-zero connection 335 or the second metal-zero connection 337, then there is an alternate route to the power rail 323 or the ground rail 325, and the via is redundant.

For example, looking at FIG. 7B (because FIG. 7A has no first marker layer 701 portions), the first marker layer 701 in FIG. 7B is analyzed to determine if it is within the first distance $D_1$. While the width of the first cell row 401 is at least in part dependent upon the overall design, is continually shrinking with reduced technology, and in some cases may be between about 300 nm to about 500 nm, in an embodiment in which the first cell row 401 has a width of 360 nm, the first marker layer 701 may be located 47 nm away from the second metal-zero connection 337 of the third cell 409 and the first metal-zero connection 335 of the fourth cell 411. As such, the first marker layer 701 in FIG. 7B may be removed as described further below with respect to FIGS. 13A-13G. Looking at FIGS. 7C-7F, a similar analysis is performed and those portions of the first marker layer 701 that are within the first distance $D_1$ of one of the first metal-zero connection 335 or the second metal-zero connection 337 in the first cell 301, the second cell 405, the third cell 409, and the fourth cell 411 are analyzed to determine if they may be removed.

However, in FIG. 7G, the portions of the first marker layer 701 are not within the first distance $D_1$ of one of the first metal-zero connection 335 or the second metal-zero connection 337 in the first cell 301, the second cell 405, the third cell 409, and the fourth cell 411. In particular, when there are four drain regions within the second area of interest 417, all of the first metal-zero connections 335 or the second metal-zero connections 337 in the first cell 301, the second cell 405, the third cell 409, and the fourth cell 411 are located further away than the first distance $D_1$. As such, the portions of the first marker layer 701 are not chosen for removal.

FIGS. 8A-8G illustrate a third step 1503, in which the vias overlaid by the first marker layer 701 that may be merged with the vias overlaid by the second marker layer 702 are identified. In an embodiment each of the vias overlaid by the second marker layer 702 are expanded to form an exclusion zone 801. For example, in the embodiment illustrated in FIG. 8E, the first via 329 in the first cell 301 and the second via 331 in the second cell 405 are expanded to form the exclusion zone 801.

In an embodiment the first via 329 in the first cell 301 and the second via 331 in the second cell 405 may be expanded horizontally (e.g., in a first direction 803 parallel with the first cell row 401) a second distance $D_2$ sized to indicate an interaction between the vias overlaid by the first marker layer 701 and the vias overlaid by the second marker layer 702. In an embodiment in which there is a 63 nm pitch between the portions of the second marker layer 702, the first via 329 in the first cell 301 and the second via 331 in the second cell 405 may be expanded horizontally the second distance $D_2$ of between about 40 nm and about 50 nm, such as about 43 nm. Alternatively, in an embodiment in which there is a 66 nm pitch between the vias overlaid by the second marker layer 702, the second distance $D_2$ may be about 46 nm.

Additionally, the first via 329 in the first cell 301 and the second via 331 in the second cell 405 may be expanded vertically (e.g., in a second direction 805 perpendicular with the first cell row 401) a third distance $D_3$. In an embodiment the third distance $D_3$ may be set as one-half of a distance between the vias in the vertical direction. For example, in the embodiment illustrated in FIG. 8E, in which the second via 331 in the second cell 405 and the first via 329 in the fourth cell 411 are separated from each other by 2 nm, the third distance $D_3$ may be set to 1 nm. As such, while the third distance $D_3$ will be at least partially set by the initial design and placement, in some embodiments the third distance $D_3$ may be between about 0 nm and about 5 nm, such as about 1 nm. However, any suitable distance may be utilized to form the exclusion zone 801.

Figure 8A:
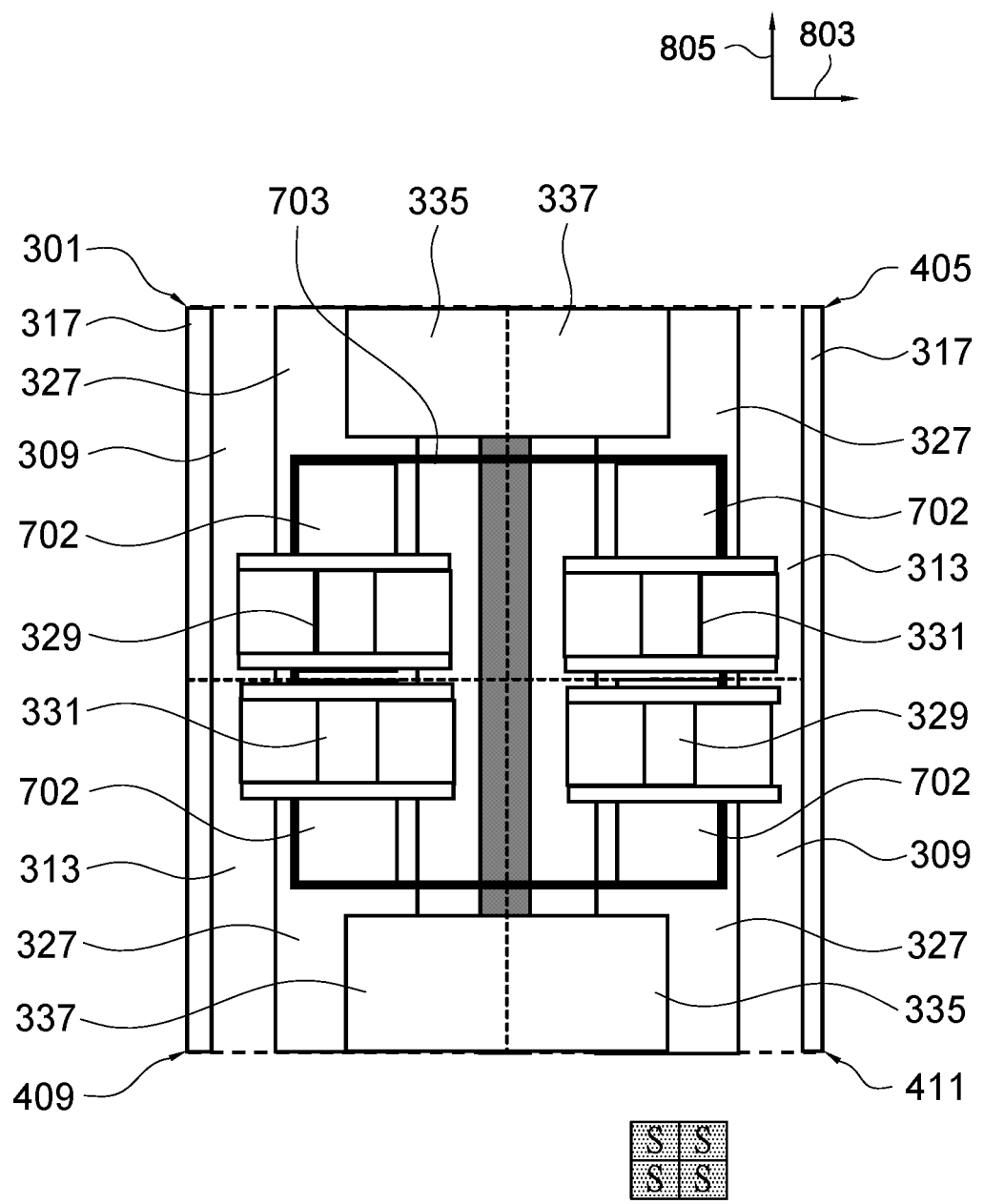
Figure 8B:
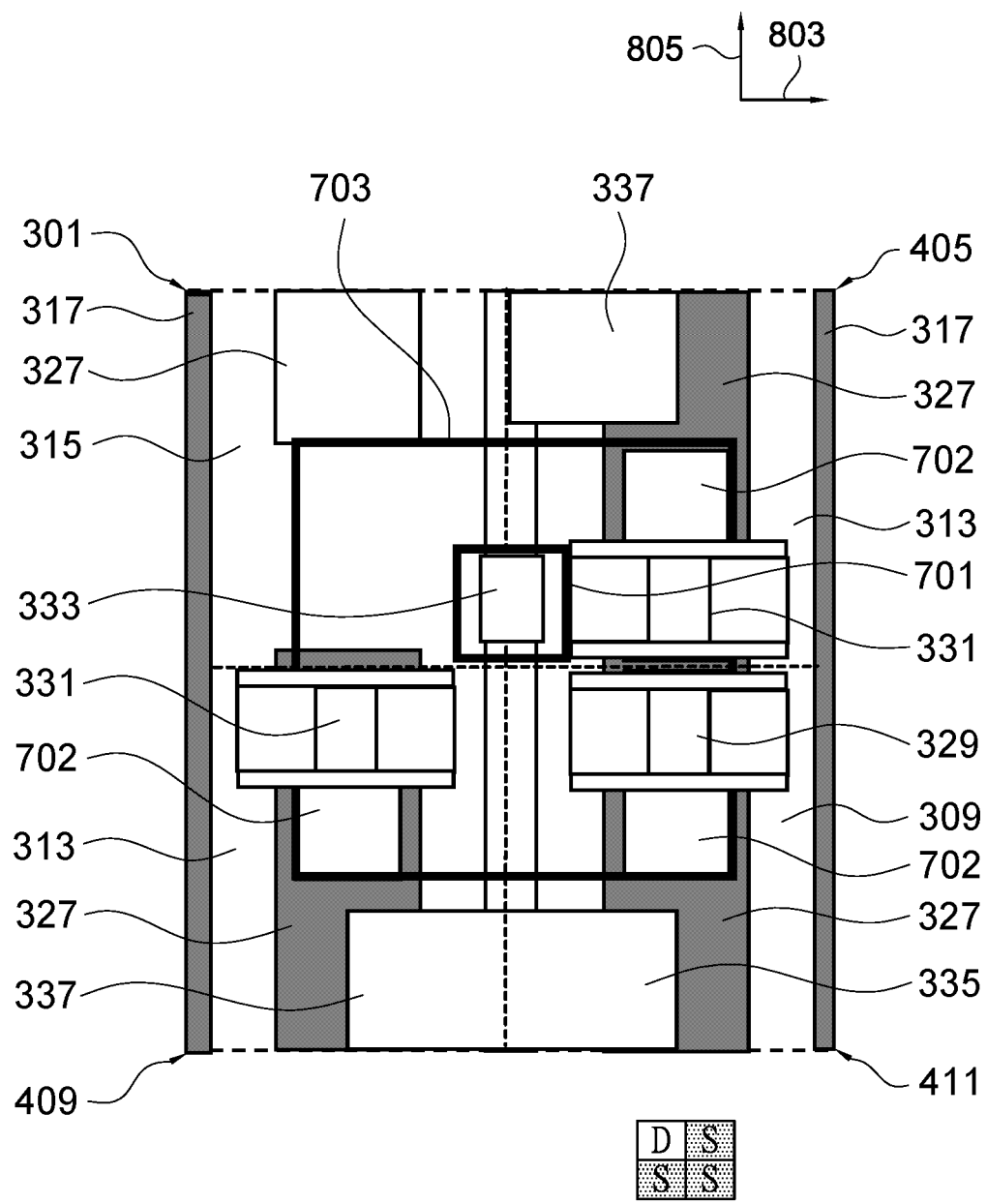
Figure 8C:
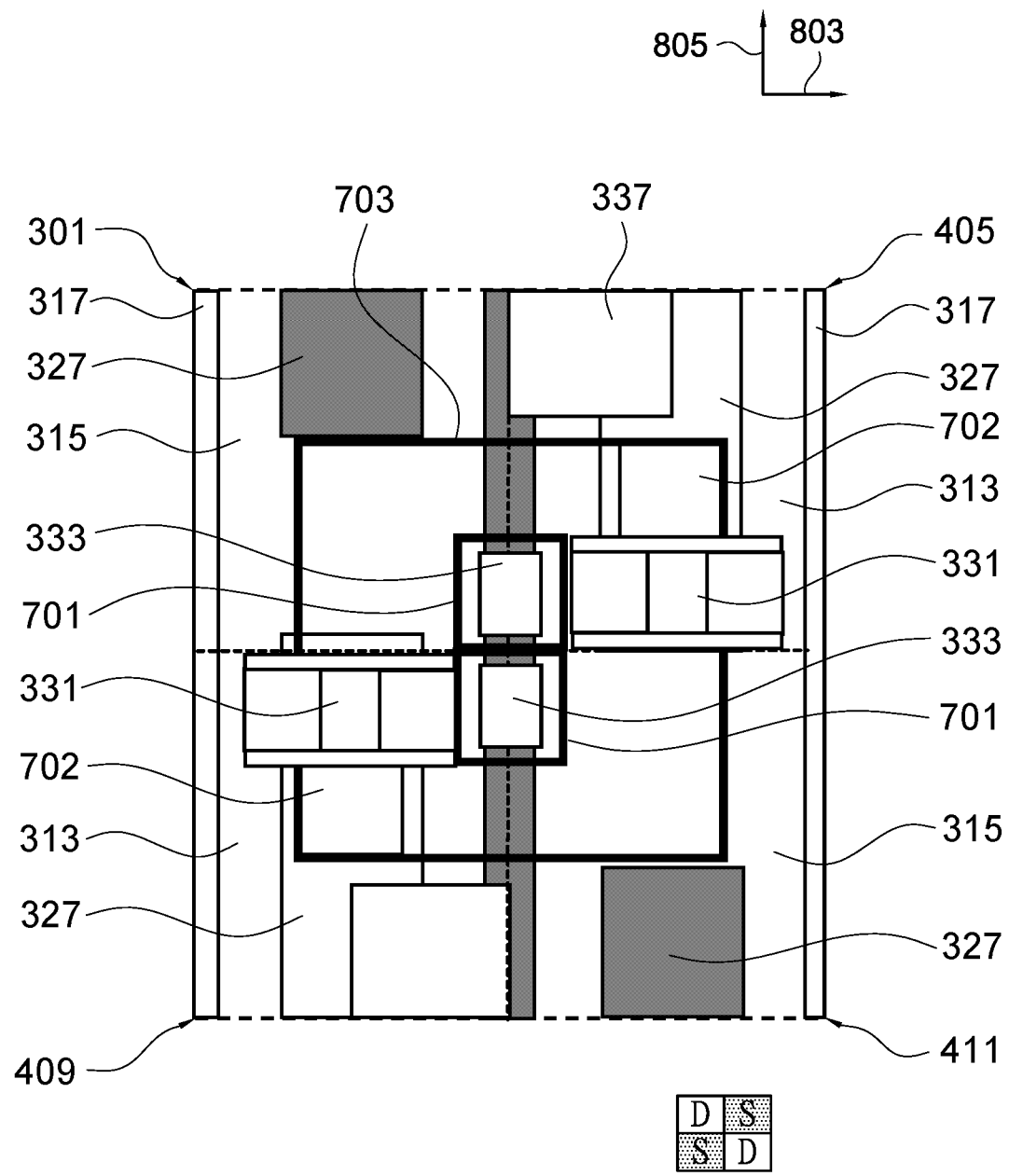
Figure 8D:
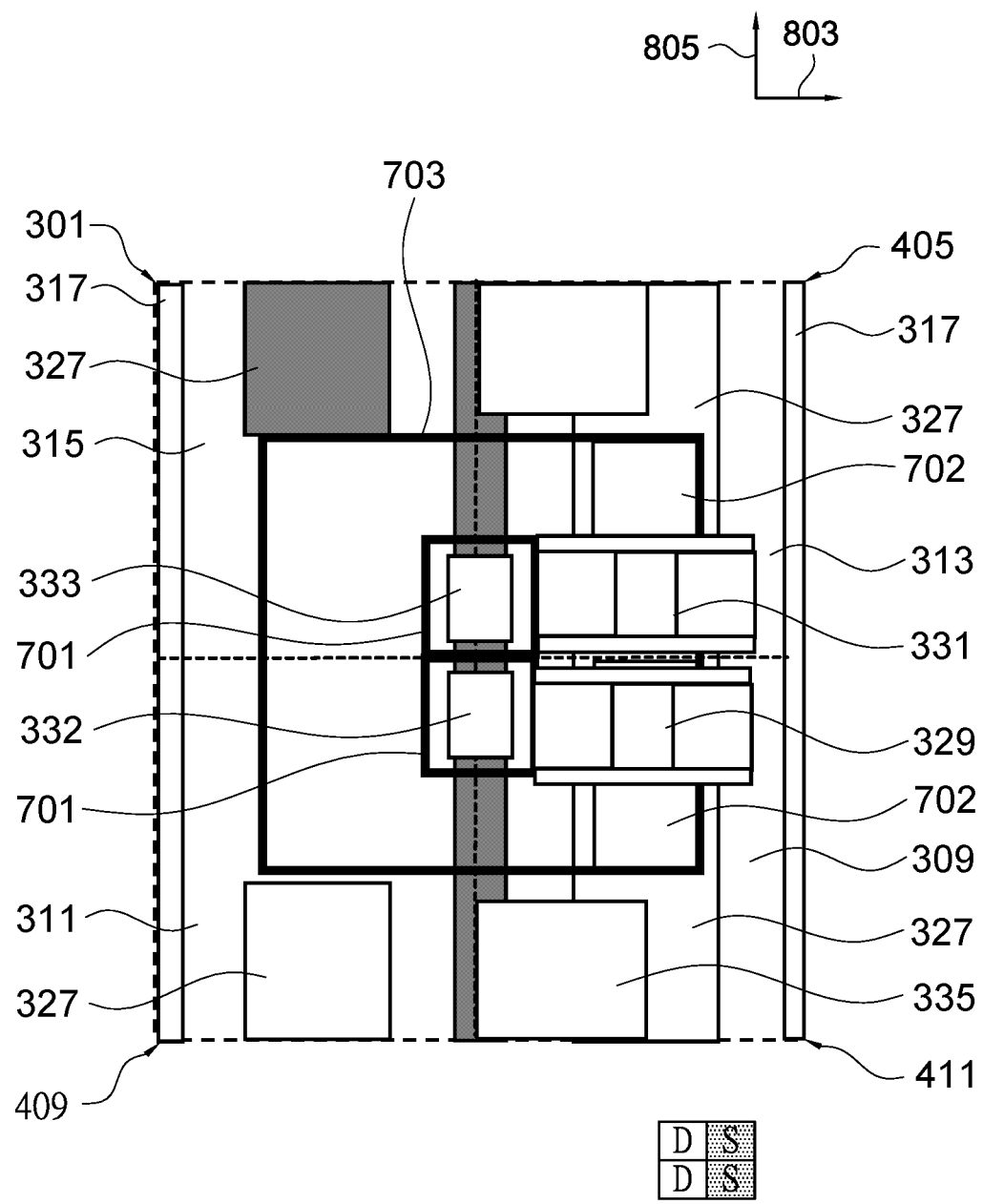
Figure 8E:
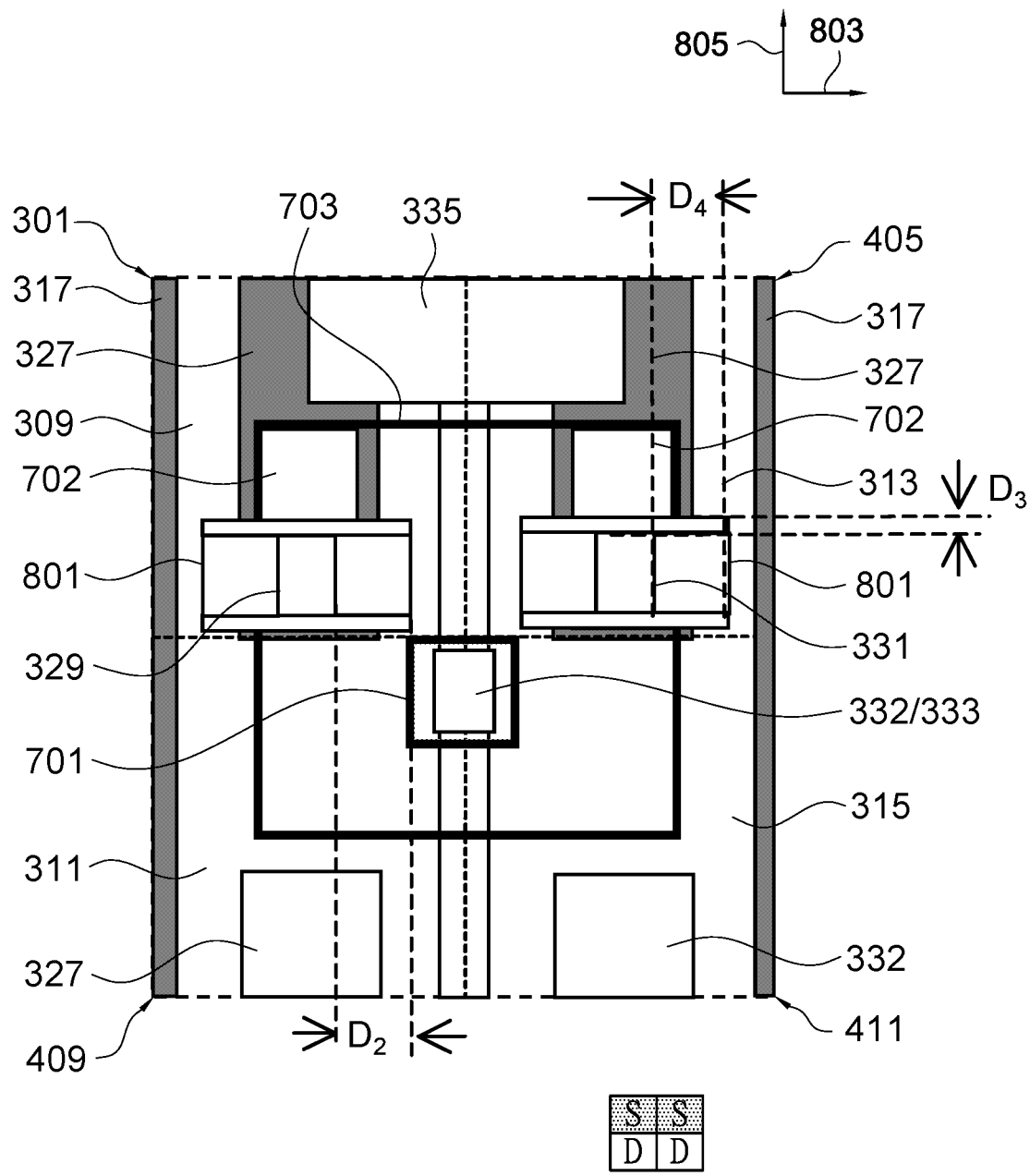

Continuing with the embodiment illustrated in FIG. 8E, once the exclusion zone has been created by the expansion of the first via 329 in the first cell 301 and the second via 331 in the second cell 405, those vias identified by the first marker layer 701 that remain outside of the exclusion zone are identified for further merging. In the embodiment illustrated in FIG. 8E, the combined via from the third via 332 in the third cell 409 and the fourth via 333 in the fourth cell 411 is identified.

Figure 8F:
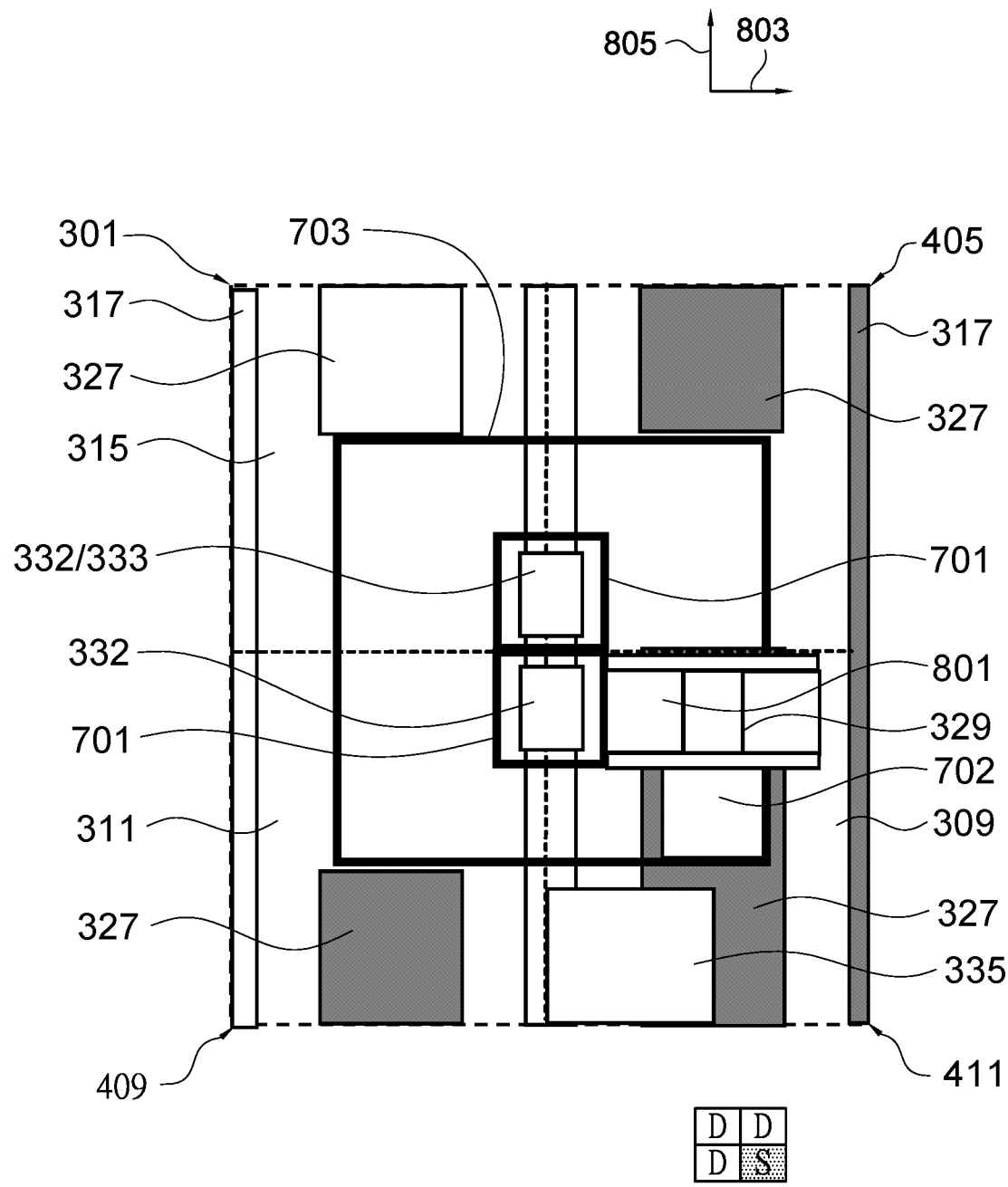
Figure 8G:
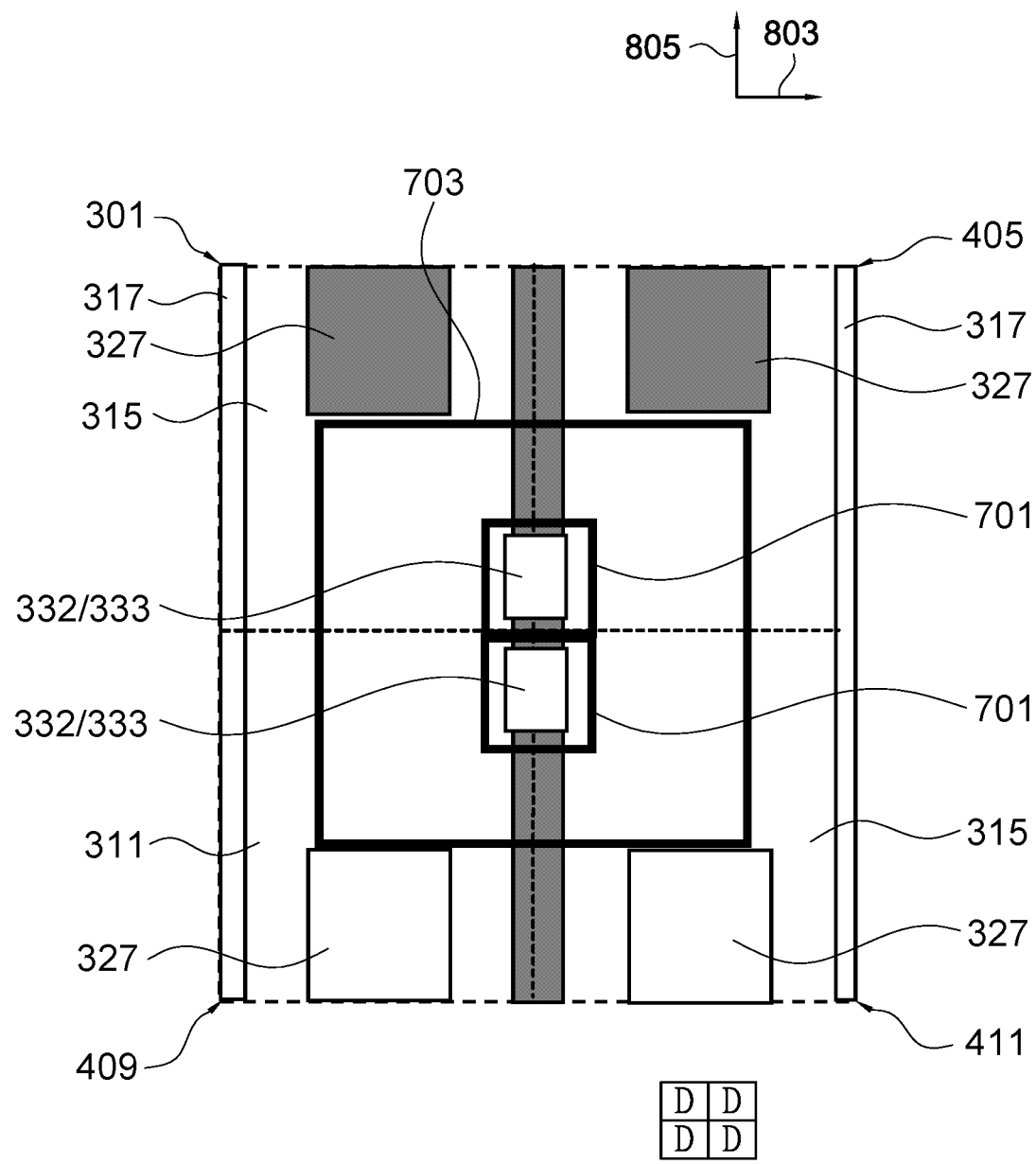

Additionally, in the embodiment of FIG. 8G, there are no vias identified by the second marker layer 702. As such, the vias identified by the first marker layer 701 are outside of any exclusion zone 801 (since there are no exclusion zone 801). Accordingly, the vias identified by the first marker layer 701 are chosen for merging.

Following a similar procedure in the embodiment illustrated in FIG. 8F, only the combined via from the fourth via 333 in the first cell 301 and the third via 332 in the second cell 405 is identified as being outside of the exclusion zone 801 generated by the expansion of the first via 329 in the fourth cell 411. The first marker layer 701 over the third via 332 in the third cell 409 is contacted by the exclusion zone 801 and is not identified as being outside of the exclusion zone 801. Additionally, in the embodiment illustrated in FIG. 8A, there are no vias identified by the first marker layer 701. In the remainder of the embodiments illustrated in FIGS. 8B-8D, all of the vias are located within the exclusion zones generated and, as such, these vias are not chosen for merging. For example, in the embodiment illustrated in FIG. 8B, in which the first marker layer 701 on the fourth via 333 in the first cell 301 is located only 11.5 nm from the second via 331 in the second cell 405 (for an embodiment in which there is a 63 nm pitch between the portions of the second marker layer 702) or 13 nm in which there is a 66 nm pitch between the portions of the second marker layer 702, the exclusion zone 801 makes contact with first marker layer 701 and, as such, these vias are not chosen for merging.

Once the vias have been identified, the exclusion zones 801 have completed their purpose at this time. As such, in an embodiment the exclusion zones 801 are removed from the overall design. The vias which were used to form the exclusion zones 801 are returned to their original size.

FIGS. 9A-9G illustrate a fourth step 1504 in the process in which those vias identified in the third step 1403 (described above) are expanded in the first direction 803 parallel with the first cell row 401 to form first expansion zones 901. Looking at the embodiment illustrated in FIG. 9G, in this step the vias identified in the third step 1403 (e.g., the combined via from the third via 332 in the second cell 405 and fourth via 333 in the first cell 301 and the combined via from the third via 332 in the third cell 409 and the fourth via 333 in the fourth cell 411) are each expanded in the first direction 803 parallel with the first cell row 401 a fourth distance $D_4$ of between about 25 nm and about 35 nm, such as about 31.5 nm.

For example, in an embodiment the size of the fourth distance $D_4$ may be determined by the pitch of the poly, the via size, and the locations. As an example, in the embodiment illustrated in FIG. 9E, in which the via lands on the poly (e.g., the combined third via 332 in the third cell 409 and the fourth via 333 in the fourth cell 411), are located on the center of the combined third cell boundary conductor 318 in the fourth cell 411 and the first cell boundary conductor 319 in the third cell 409. In this embodiment the fourth distance $D_4$ may be set to one-half of the pitch between, e.g., the first cell boundary conductor 319 in the third cell 409 and the gate electrode 317 in the third cell 409. As such, in an embodiment in which the pitch between two polysilicon regions is 63 nm, the fourth distance $D_4$ may be set to 31.5 nm. Alternatively, in an embodiment in which the pitch is 66 nm, the fourth distance $D_4$ may be set to 33 nm. However, any other suitable distance may alternatively be utilized.

Figure 9A:
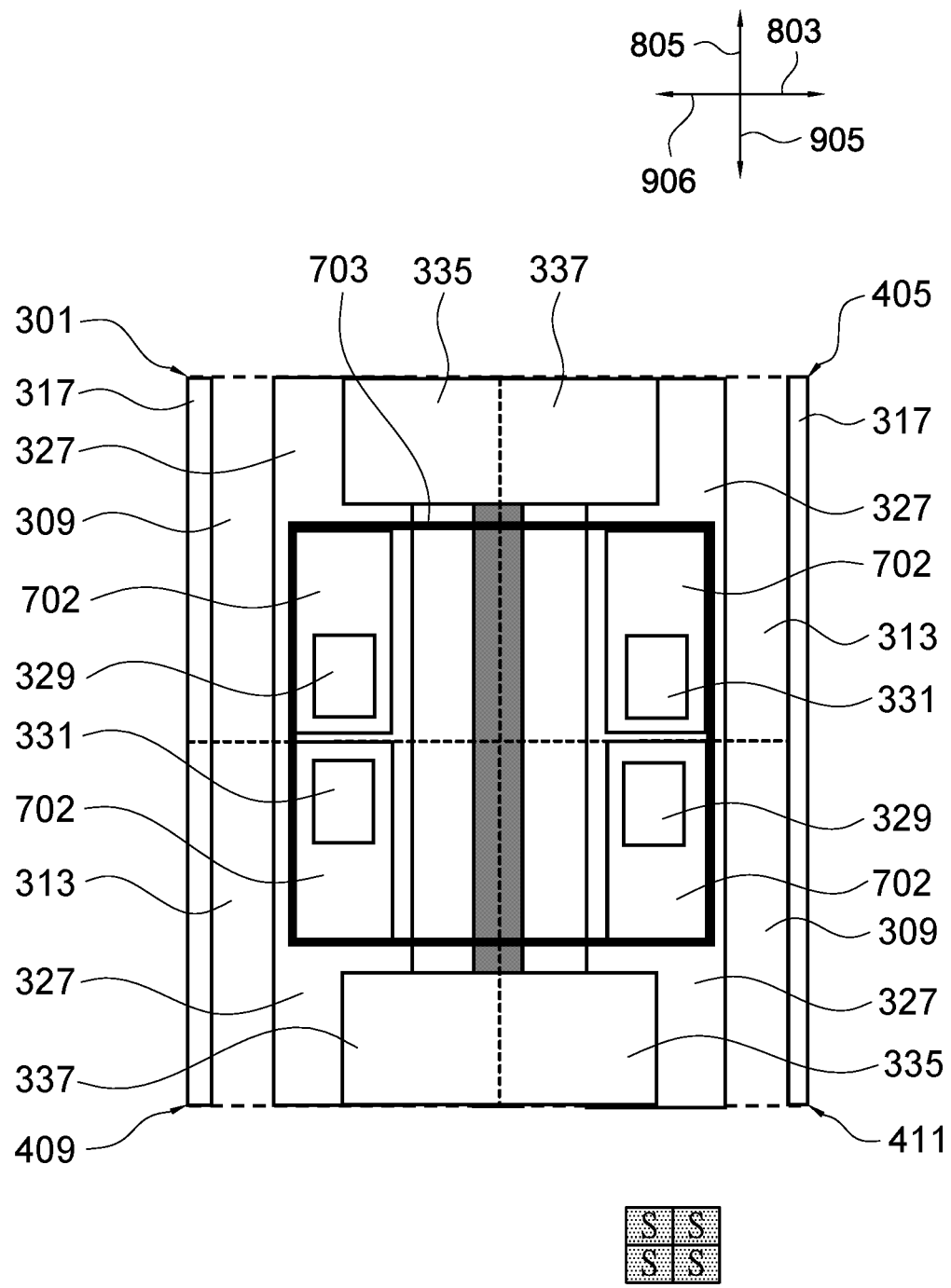
Figure 9B:
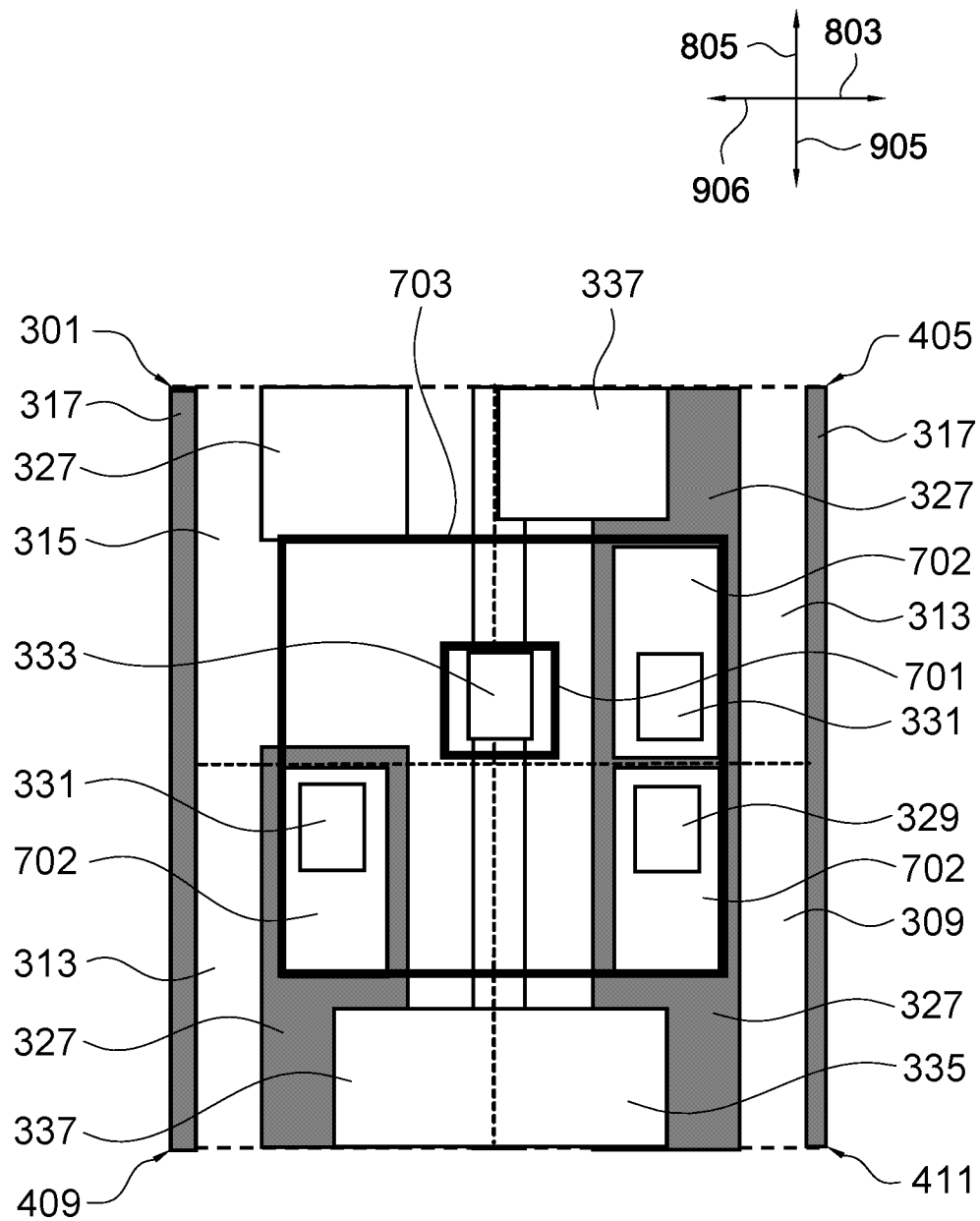
Figure 9C:
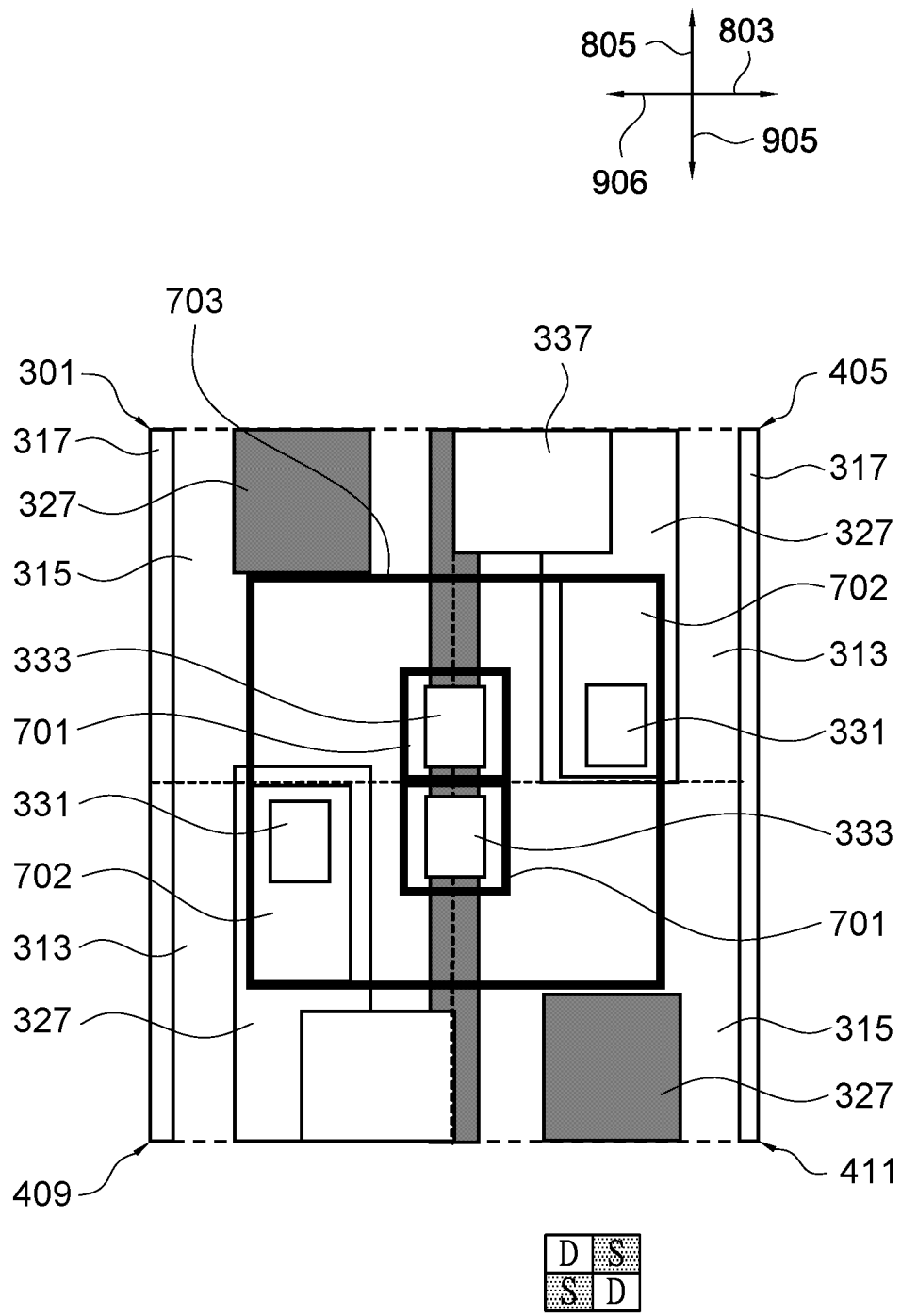
Figure 9D:
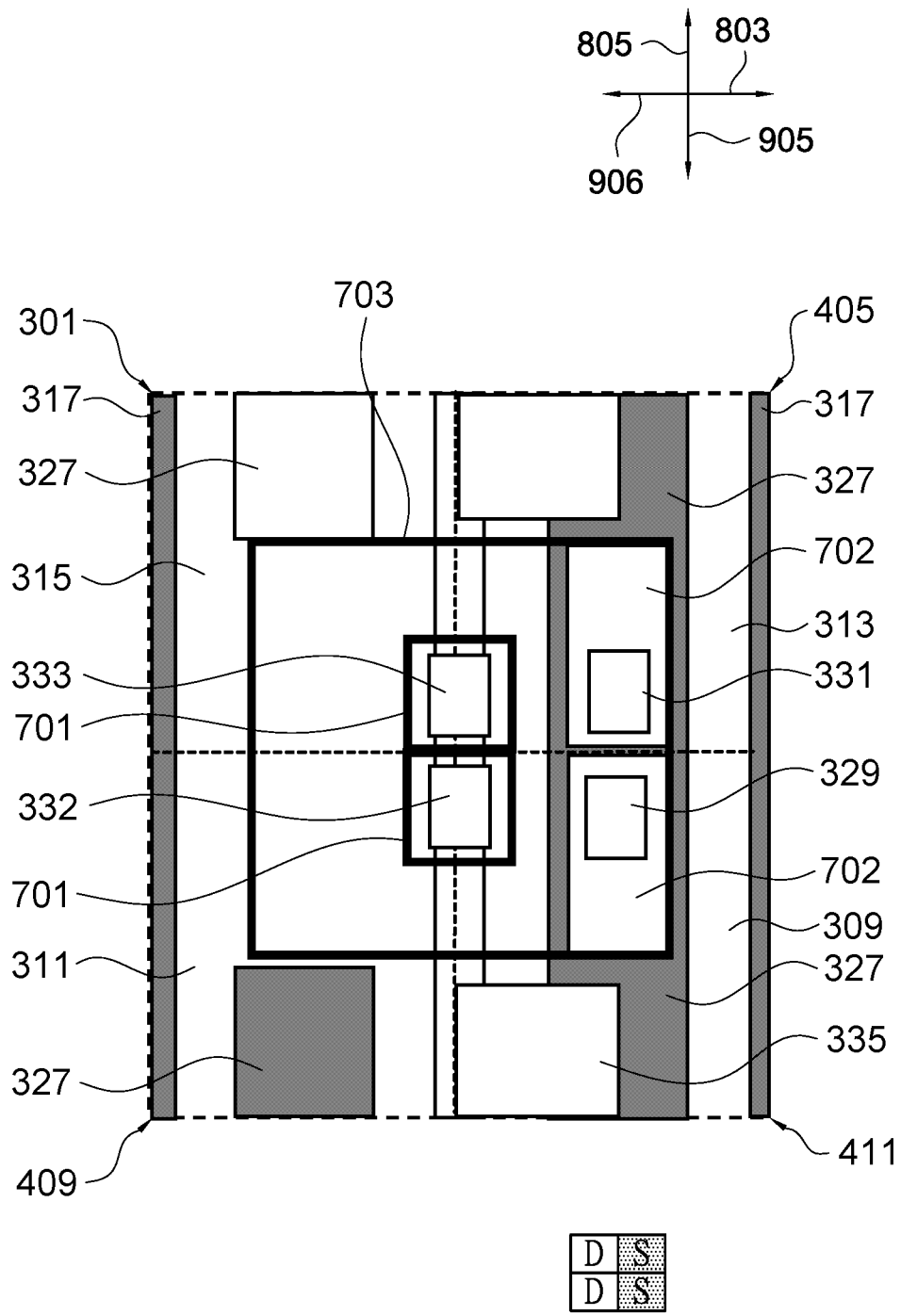
Figure 9E:
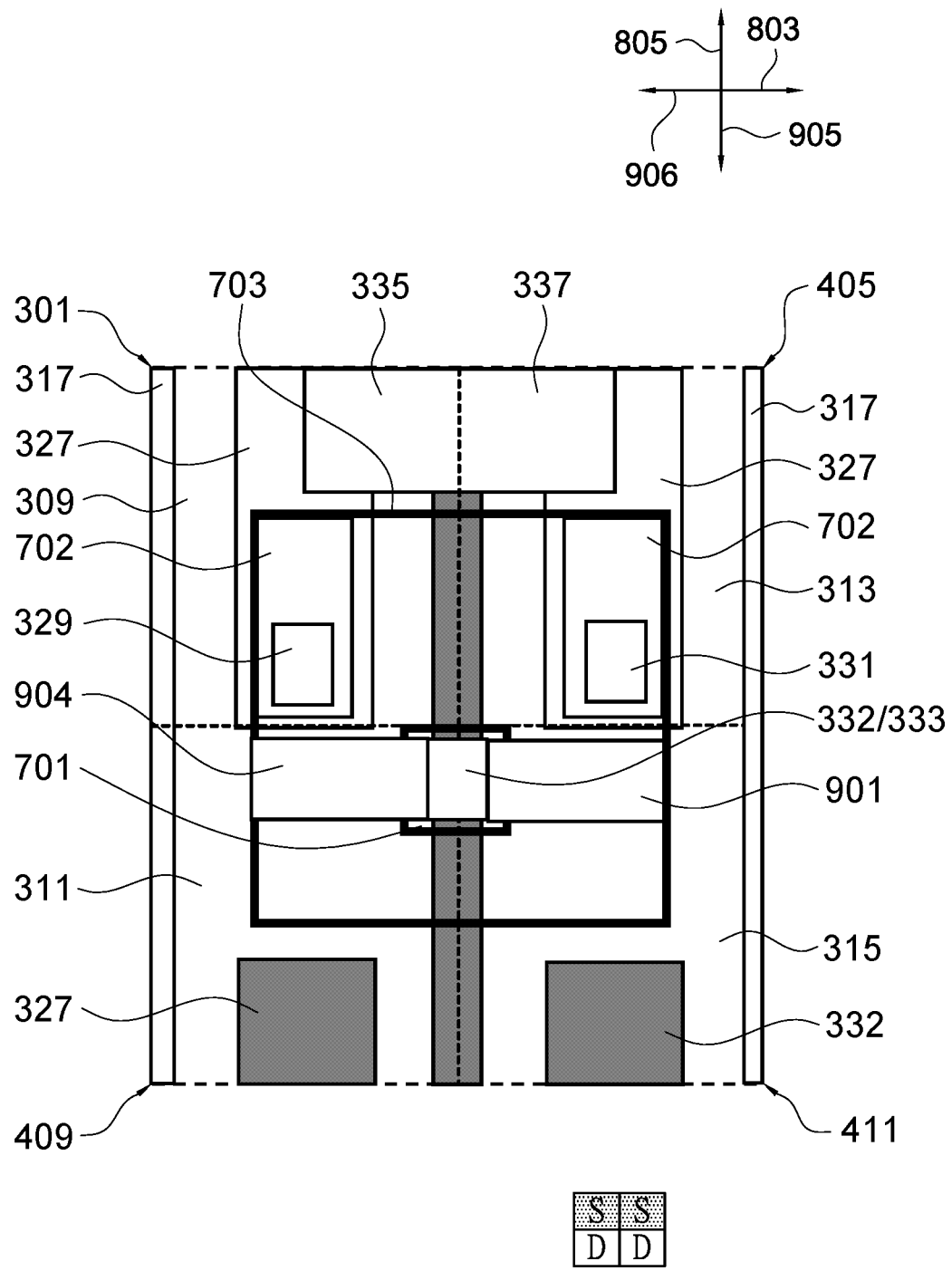
Figure 9F:
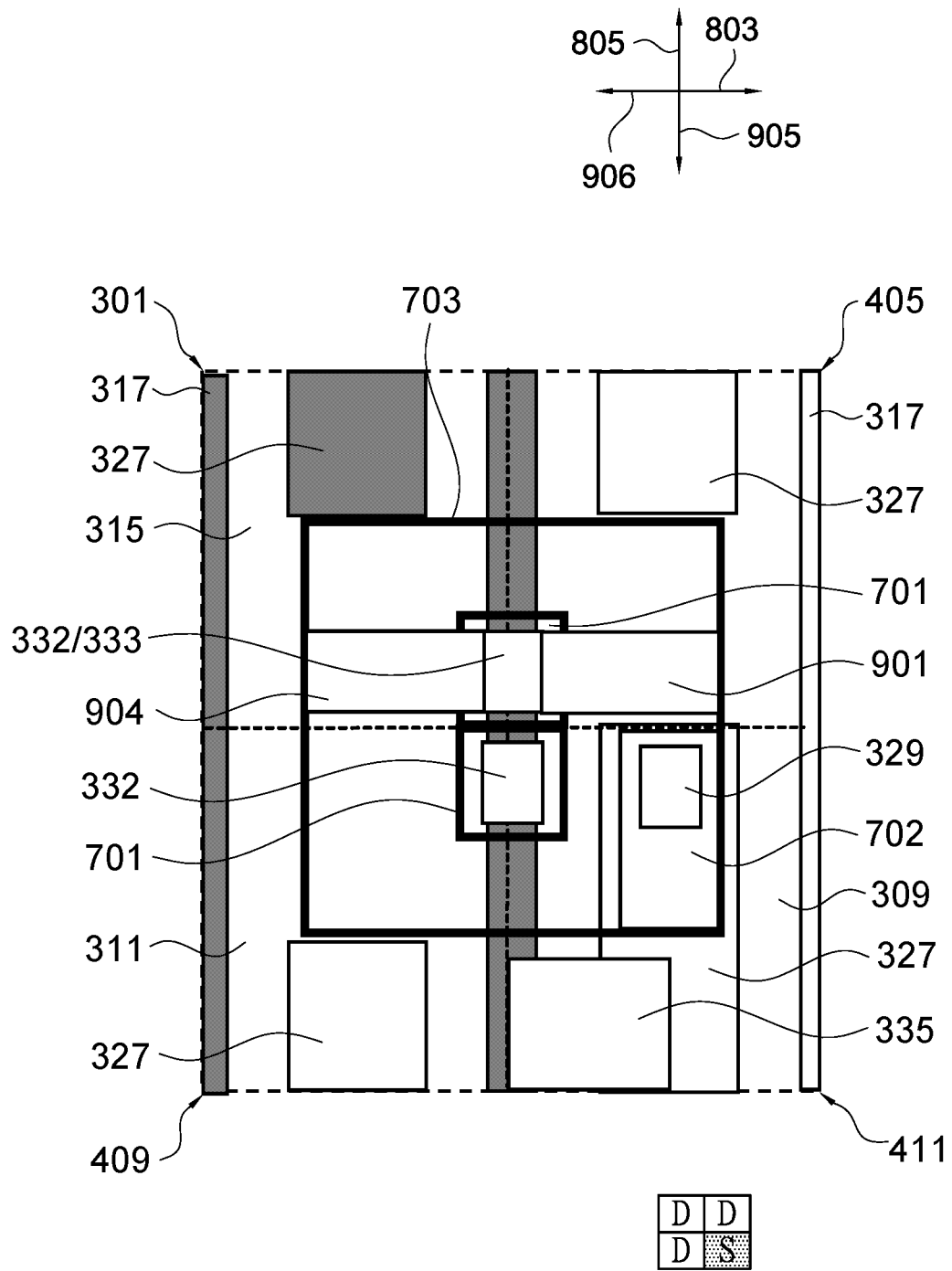
Figure 9G:
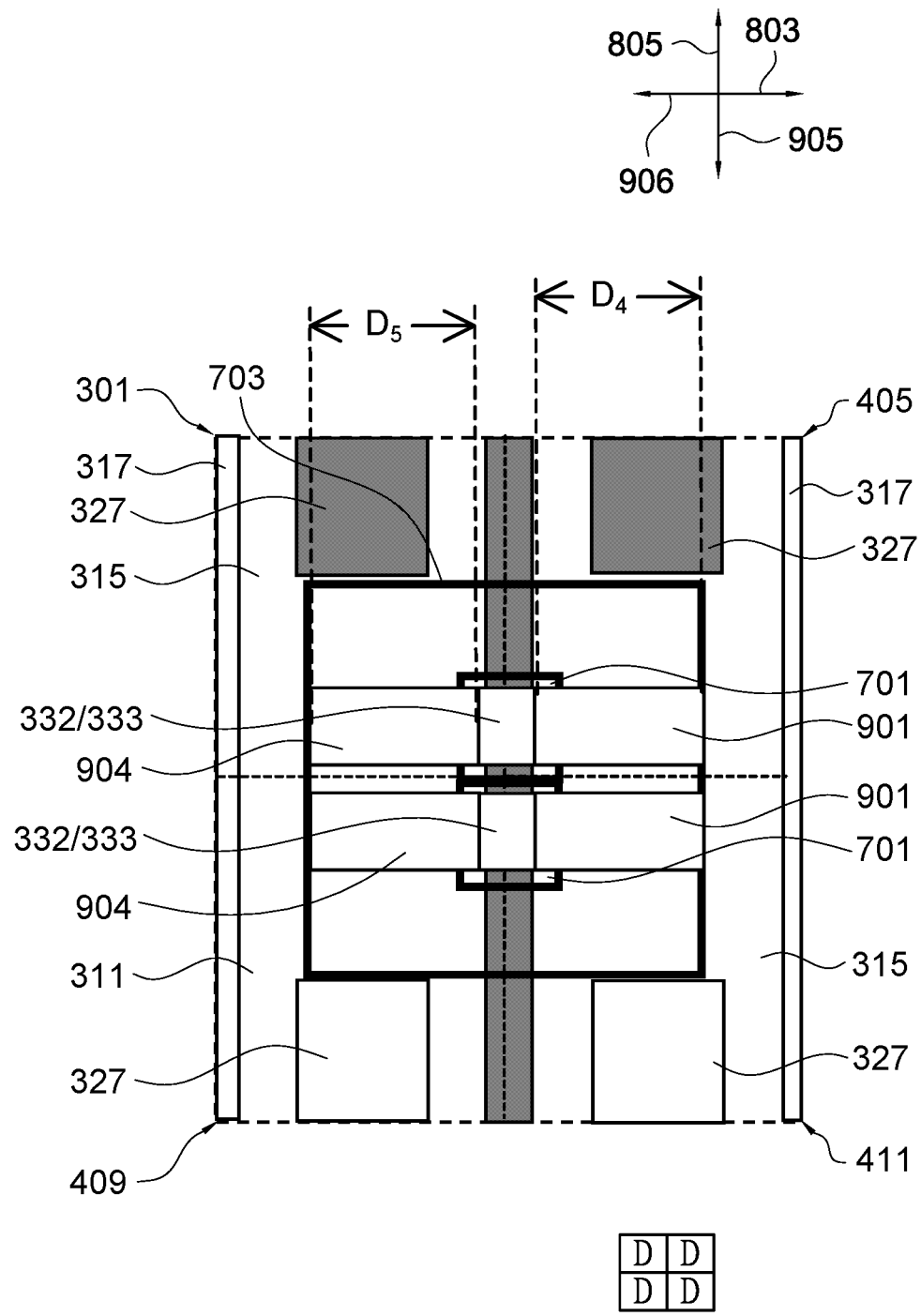

Similarly, in the embodiment illustrated in FIG. 9F, the combined via from the third via in the second cell 405 and the fourth via 333 in the first cell 301 (the via identified in the third step 1403) is also expanded in the first direction 803 parallel with the first cell row 401 the fourth distance $D_4$ to form the first expansion zone 901. Additionally, in the embodiment illustrated in FIG. 9E, the combined via from the fourth via 333 in the fourth cell 411 and the third via 332 in the third cell 409 (the via identified in the third step 1403) is expanded in the first direction 803 parallel with the first cell row 401 by the fourth distance $D_4$.

FIGS. 9A-9G also illustrate a fifth step 1505 in the process in which those vias identified in the third step 1403

(described above) are also expanded in a third direction 906 opposite the first direction 803 and parallel with the first cell row 401 to form a second expansion zone 904. Looking at the embodiment illustrated in FIG. 9G, in this step the via identified in the third step 1403 (e.g., the combined via from the fourth via 333 in the first cell 301 and the third via 332 in the second cell 405 and also the combined via from the third via 332 in the third cell 409 and the fourth via 333 in the fourth cell 411) are each expanded in the third direction 906 opposite the first direction 803 and parallel with the first cell row 401 a fifth distance $D_5$ of between about 25 nm and about 35 nm, such as about 31.5 nm. However, any suitable distance may alternatively be utilized.

Similarly, in the embodiment illustrated in FIG. 9F, the combined via from the third via 332 in the second cell 405 and the fourth via 333 in the first cell 301 (the via identified in the third step 1403) is also expanded in the third direction 906 opposite the first direction 803 and parallel with the first cell row 401 the fifth distance $D_5$ to form the second expansion zone 904. Additionally, in the embodiment illustrated in FIG. 9E, the combined via from the third via 332 in the third cell 409 and the fourth via 333 in the fourth cell 411 (the via identified in the third step 1403) is expanded in the third direction 906 opposite the first direction 803 and parallel with the first cell row 401 by the fifth distance $D_5$.

FIGS. 10A-10G illustrate a sixth step 1506 in which the via lands overlaid by the second marker layer 702 are extended in the second direction 805 perpendicular to the first cell row 401 to form third expansion zones 907 and, in a seventh step 1507, also extended in a fourth direction 905 opposite the second direction 805 and perpendicular to the first cell row 401 to form fourth expansion zones 909. Looking at the embodiment illustrated in FIG. 10A, each of the vias identified by the second marker layer 702 (e.g., the first via 329 in the first cell 301, the second via 331 in the second cell 405, the second via 331 in the third cell 409, and the first via 329 in the fourth cell 411) are expanded in the second direction 805 by a sixth distance $D_6$ of between about 15 nm and about 25 nm, such as about 21 nm. Similarly, the first via 329 in the first cell 301, the second via 331 in the second cell 405, the second via 331 in the third cell 409, and the first via 329 in the fourth cell 411 are also expanded in the fourth direction 905 by a seventh distance $D_7$ of between about 15 nm and about 25 nm, such as about 21 nm. However, any suitable distances may alternatively be utilized.

Figure 10A:
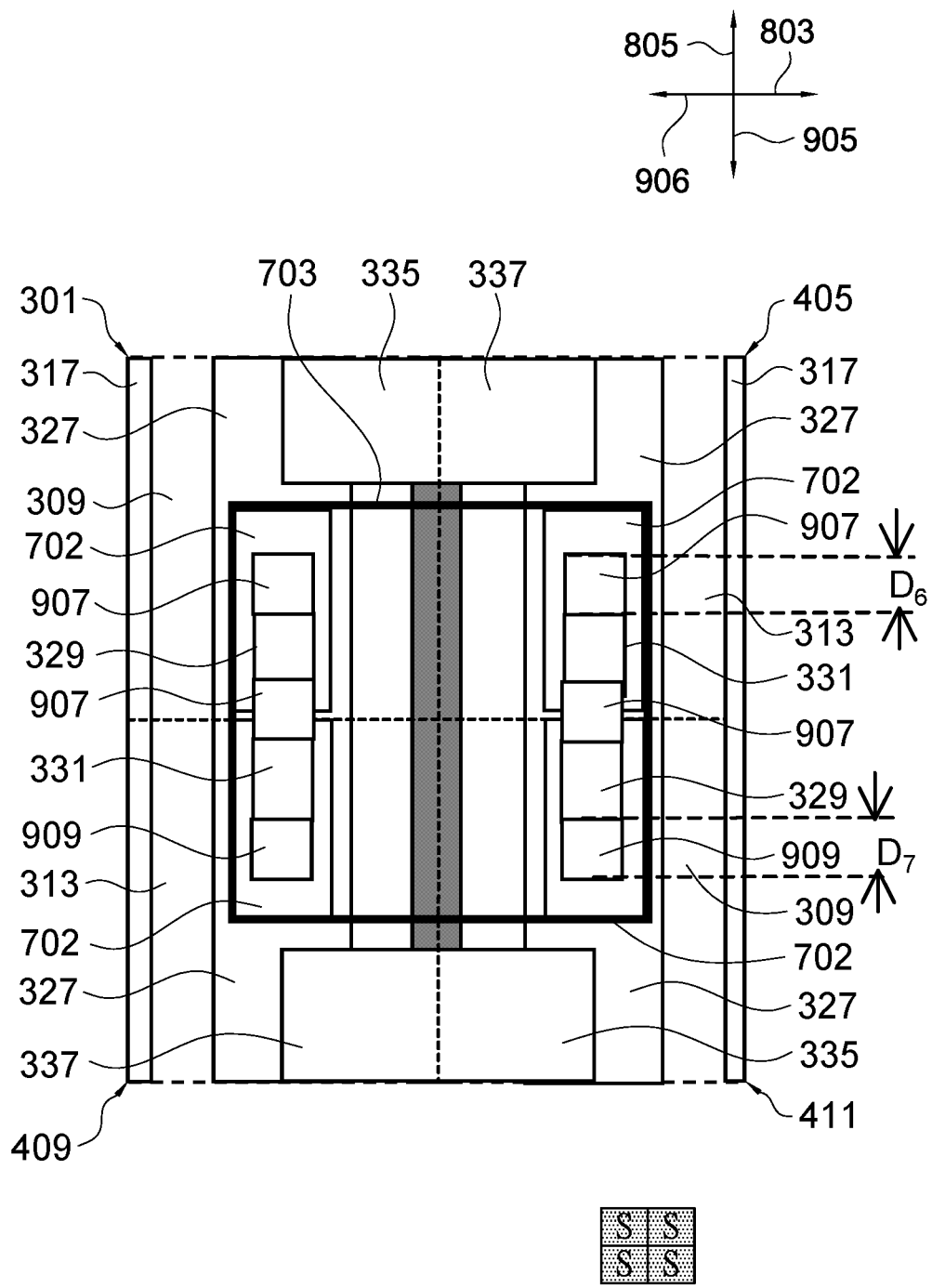
Figure 10B:
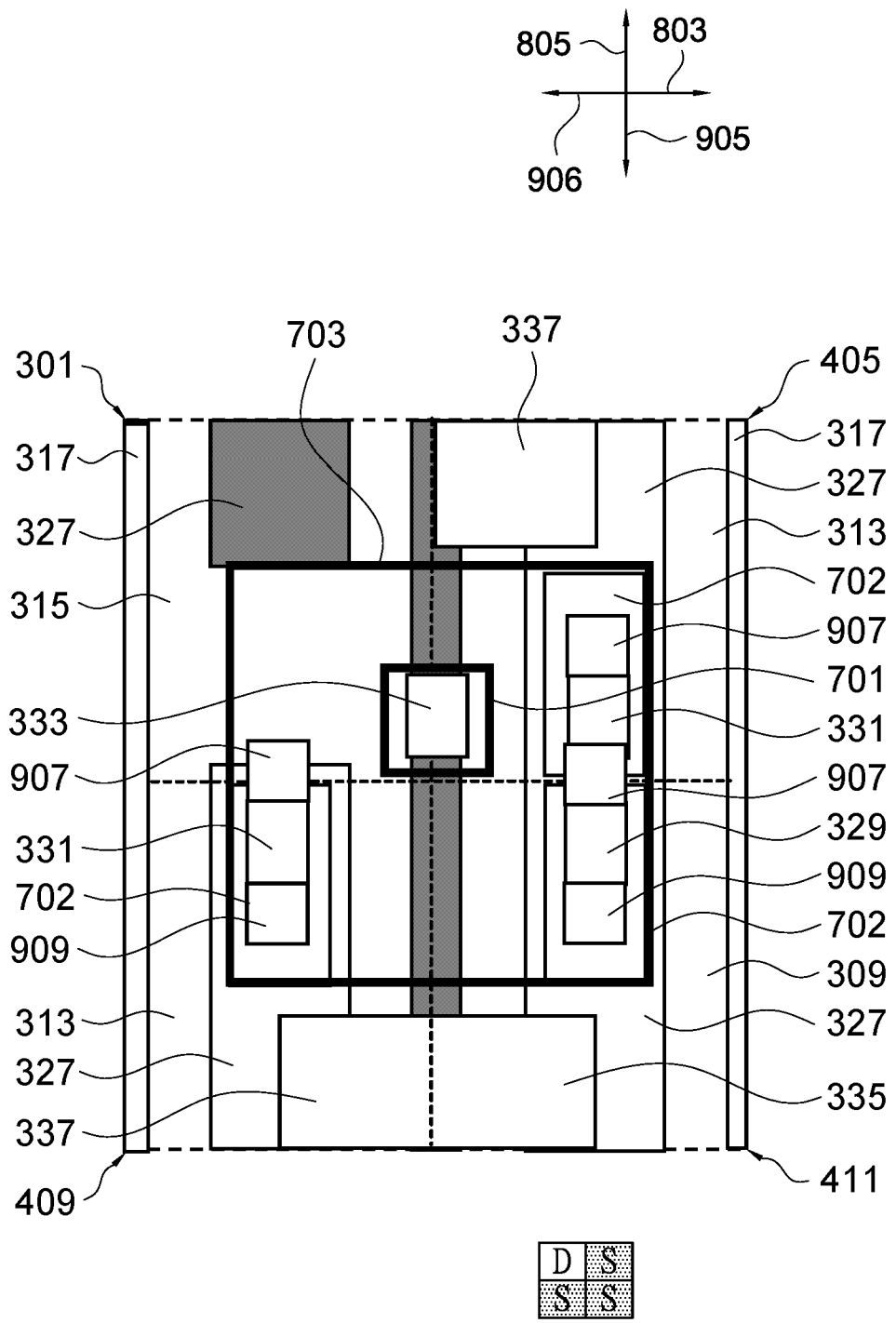
Figure 10C:
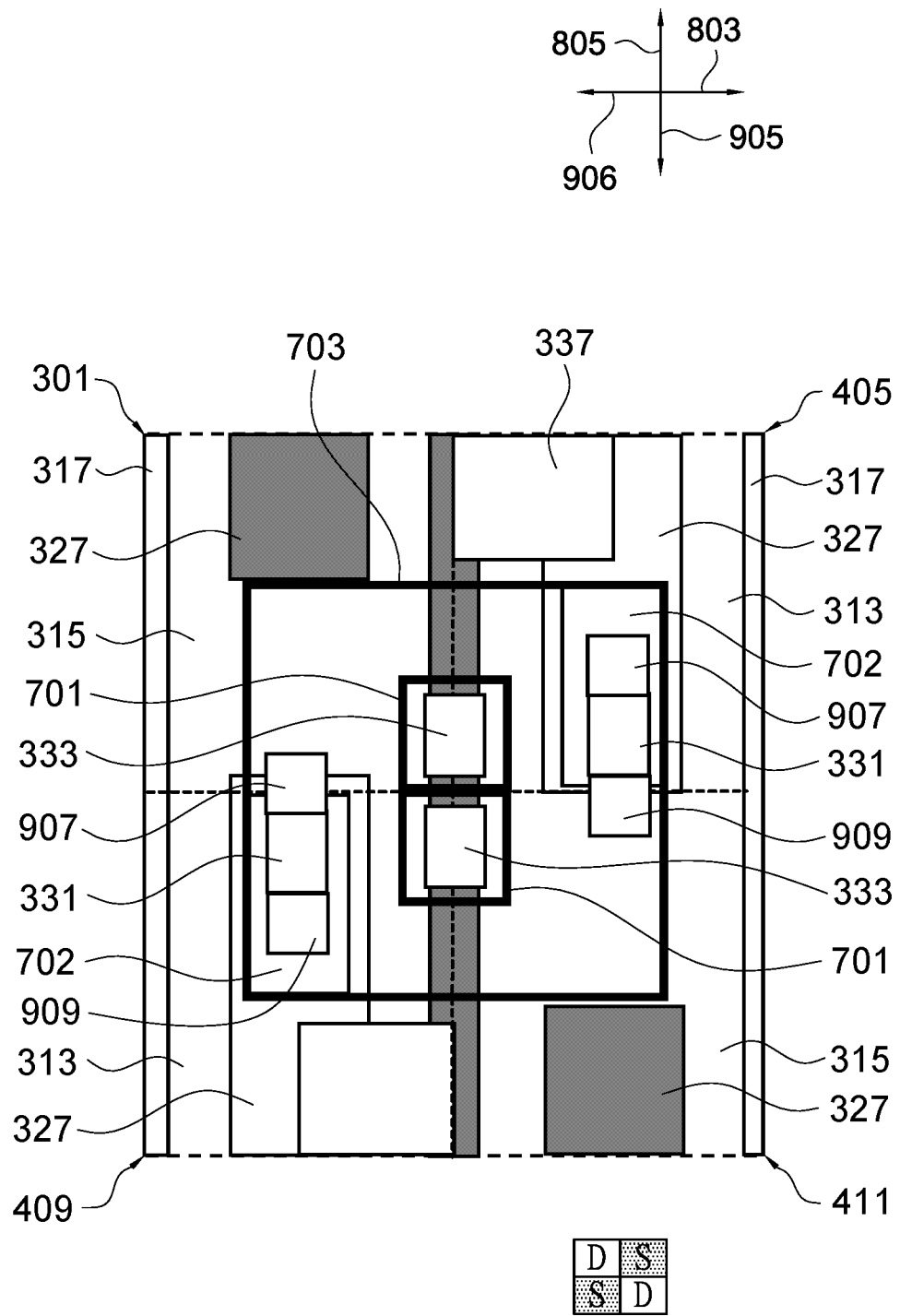
Figure 10D:
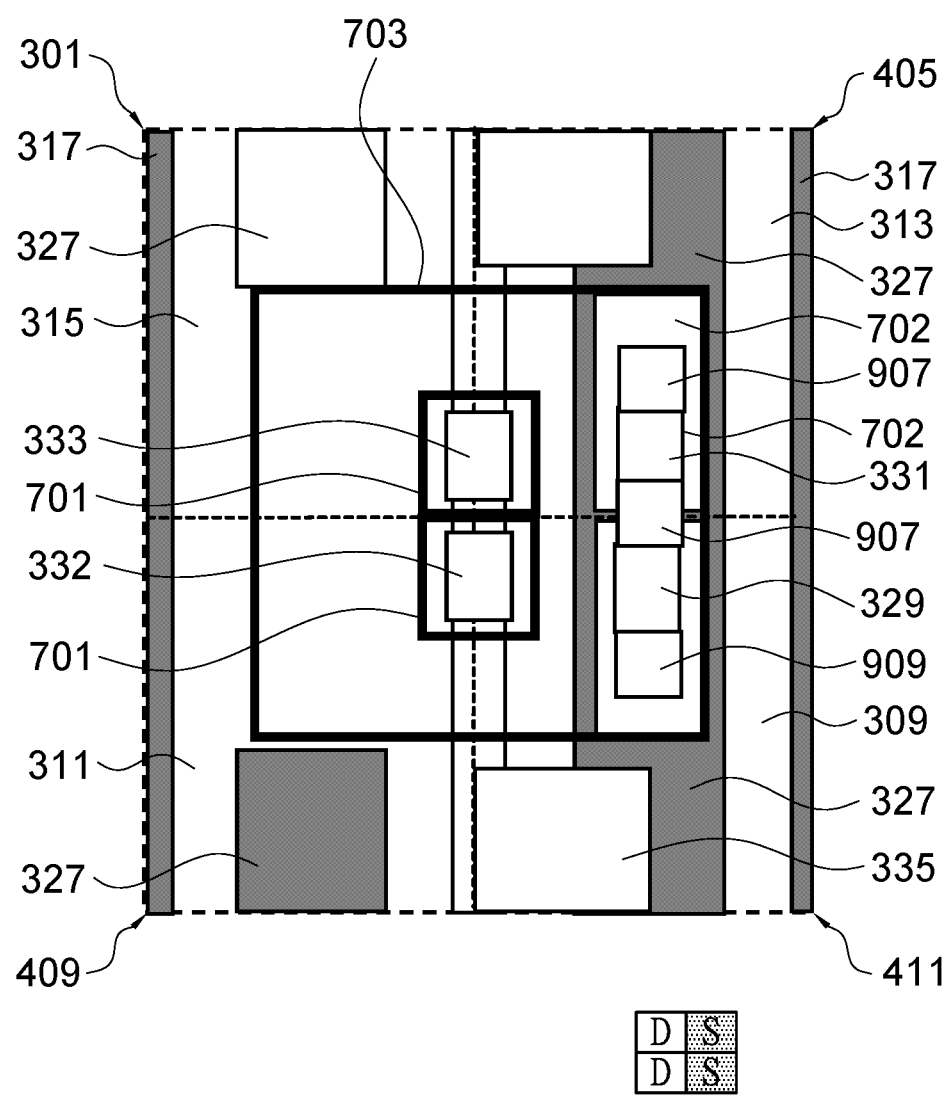
Figure 10E:
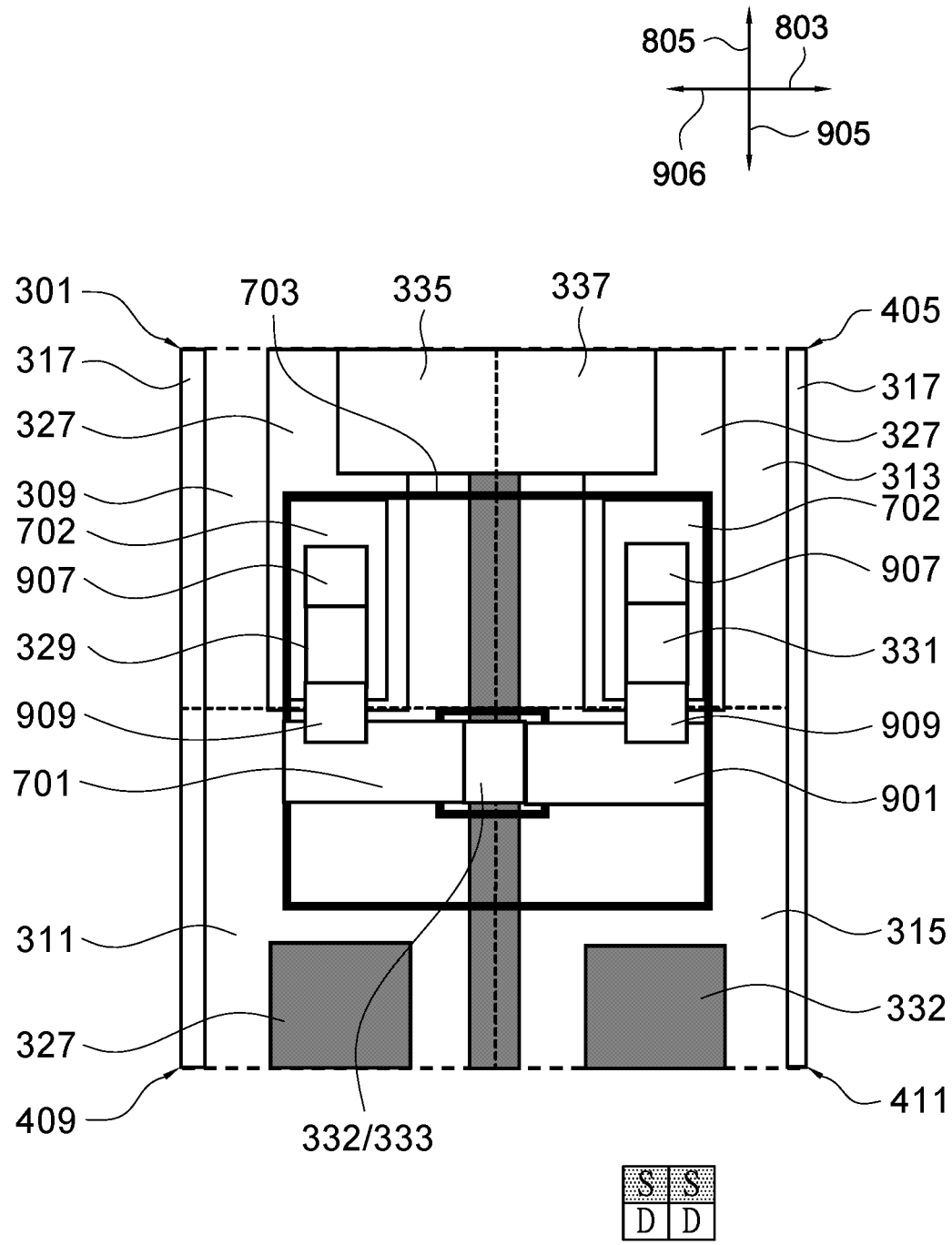

Looking at FIG. 10B, the second via 331 in the second cell 405, the second via 331 in the third cell 409, and the first via 329 in the fourth cell 411 (those vias identified by the second marker layer 702) are also expanded in the second direction 805 and the fourth direction 905. Looking at FIG. 10C, the second via 331 in the second cell 405 and the second via 331 in the third cell 409 (those vias identified by the second marker layer 702) are also expanded in the second direction 805 and the fourth direction 905. Looking at FIG. 10D, the second via 331 in the second cell 405 and the first via 329 in the fourth cell 411 (those vias identified by the second marker layer 702) are also expanded in the second direction 805 and the fourth direction 905. Looking at FIG. 10E, the first via 329 in the first cell 301 and the second via 331 in the second cell 405 (those vias identified by the second marker layer 702) are also expanded in the second direction 805 and the fourth direction 905. Finally, looking at FIG. 10F, the first via 329 in the fourth cell 411 (the via identified by the second marker layer 702) is also expanded in the second direction 805 and the fourth direction 905.

FIGS. 10A-10G also illustrate an eighth step 1508 in the process in which interactions between the expanded vias are analyzed. For example, in the embodiment illustrated in FIG. 10E, the combined via from the third via 332 in the third cell 409 and the fourth via 333 in the fourth cell 411 (which has been expanded in both the first direction 803 and the third direction 906) is analyzed to determine whether it interacts with any of the vias identified by the second marker layer 702 and expanded in the sixth step 1506 or the seventh step 1507. In an embodiment the interaction may be seen by determining whether the expanded combined via from the third via 332 in the third cell 409 and the fourth via 333 in the fourth cell 411 overlaps with either the expanded first via 329 in the first cell 301 and the expanded second via 331 in the second cell 405. In other words, the vias interact if any of the expansion zones (e.g., the first expansion zone 901, the second expansion zone 904, the third expansion zone 907, or the fourth expansion zone 909) overlap.

In an embodiment, the eighth step 1508 may be broken down into a series of sub-steps. For example, in a first sub-step, the expansions of the fourth step 1504 (e.g., the first expansion zones 901) are analyzed to determine if they interact with the expansions of the sixth step 1506 (e.g., the third expansion zones 907). Additionally, the expansions from the fourth step 1504 (e.g., the first expansion zones 901) are analyzed to determine if they interact with the expansions from the seventh step 1507 (e.g., the fourth expansion zones 909).

In a second sub-step the expansions of the fifth step 1505 (e.g., the second expansion zones 903) are analyzed to determine if they interact (e.g., overlap) the expansions of the sixth step 1506 (e.g., the third expansion zones 907). Similarly, the expansions of the fifth step 1505 (e.g., the second expansion zones 903) are analyzed to determine if they interact with the expansions of the seventh step 1507 (e.g., the fourth expansion zones 909).

In a third sub-step the expansions of the sixth step 1506 (e.g., the third expansion zones 907) are analyzed to determine if they interact (e.g., overlap) with the expansions of the fourth step 1504 (e.g., the first expansion zones 901). Similarly, the expansions of the sixth step 1506 (e.g., the third expansion zones 907) are analyzed to determine if they interact with the expansions of the fifth step 1505 (e.g., the second expansion zones 903).

In a fourth sub-step the expansions of the seventh step 1507 (e.g., the fourth expansions zones 909) are analyzed to determine if they interact with the expansions of the fourth step 1504 (e.g., the first expansion zones 901). Similarly, the expansions of the seventh step 1507 (e.g., the fourth expansions zones 909) are analyzed to determine if they interact with the expansions of the fifth step 1505 (e.g., the second expansion zones 903).

Figure 10F:
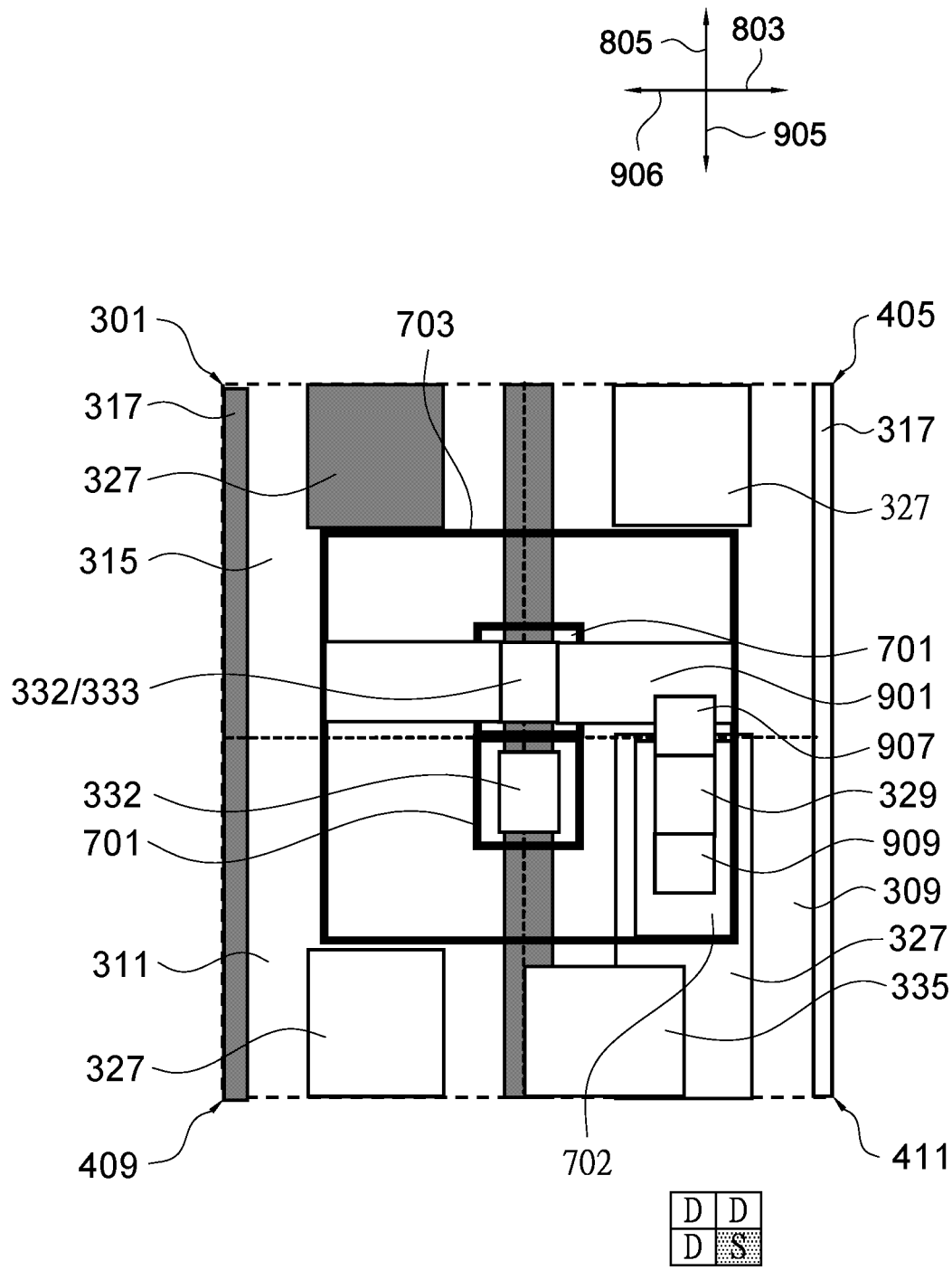
Figure 10G:
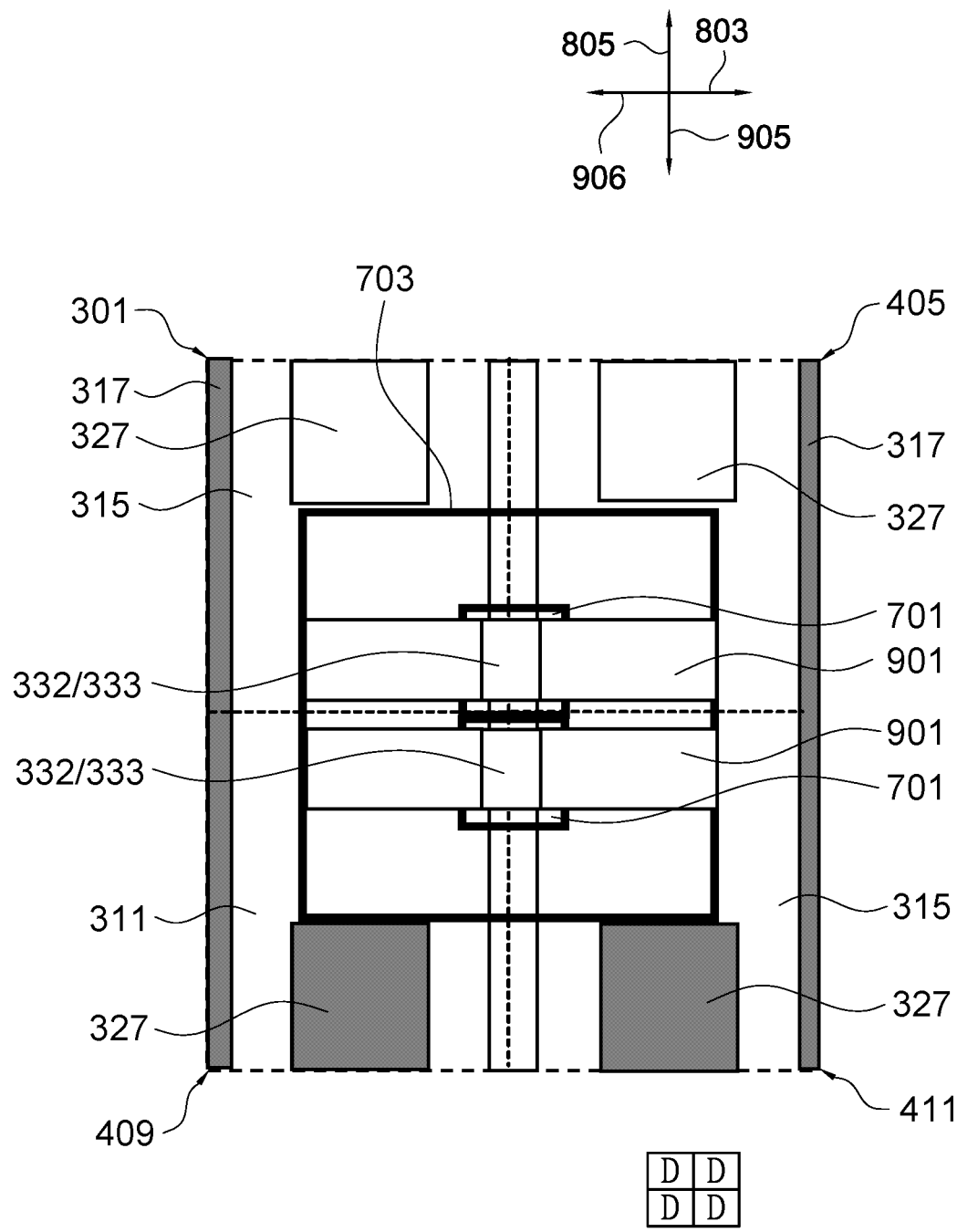

FIG. 10F illustrates this analysis performed on the combined via from the third via 332 in the second cell 405 and the fourth via 333 in the first cell 301. In particular, the combined via from the third via 332 in the second cell 405 and the fourth via 333 in the first cell 301 is analyzed for interactions with, e.g., the first via 329 in the fourth cell 411 by determining whether the first expansion zone 901 from the combined via from the third via 332 in the second cell 405 and the fourth via 333 in the first cell 301 overlaps with the third expansion zone 907 from the first via 329 in the fourth cell 411. As illustrated in FIG. 10F, they do.

A similar process is carried out in the remaining embodiments. In particular, in the embodiments of the remaining figures not previously discussed (FIGS. 10A-10D and 10G), each of the vias (as expanded) are individually analyzed.

However, in these embodiments there are no interactions between the various expansion zones.

FIGS. 11A-11G illustrate a ninth step 1509 in which merged via shapes are identified based off of the interactions identified in the eighth step 1508. For example, in an embodiment in which the first sub-step, the second sub-step, the third sub-step, or the fourth sub-step identifies an interaction (as described above), the vias and their overlapping expansion regions form an "L" shape 1101. However, the merged via shapes are not For example, in the embodiment illustrated in FIG. 11F, both the first sub-step and the third sub-step identify that there is an interaction. In particular, the first sub-step analyzes whether there is an interaction (e.g., overlap) between the expansions of the fourth step 1504 (e.g., the first expansion zones 901) and the expansion of the sixth step 1506 (e.g., the third expansion zones 907). As there is, an "L" shape 1101 is generated, wherein the "L" shape 1101 comprises the interacting vias along with the interacting expansion zones. In the embodiment illustrated in FIG. 11F, the "L" shape comprises the first via 329 in the fourth cell 411, the third expansion zone 907 from the first via 329 in the fourth cell 411, the first expansion zone 901 from the combined via from the third via 332 in the second cell 405 and the fourth via 333 in the first cell 301, along with the combined via from the third via 332 in the second cell 405 and the fourth via 333 in the first cell 301.

Figure 11A:
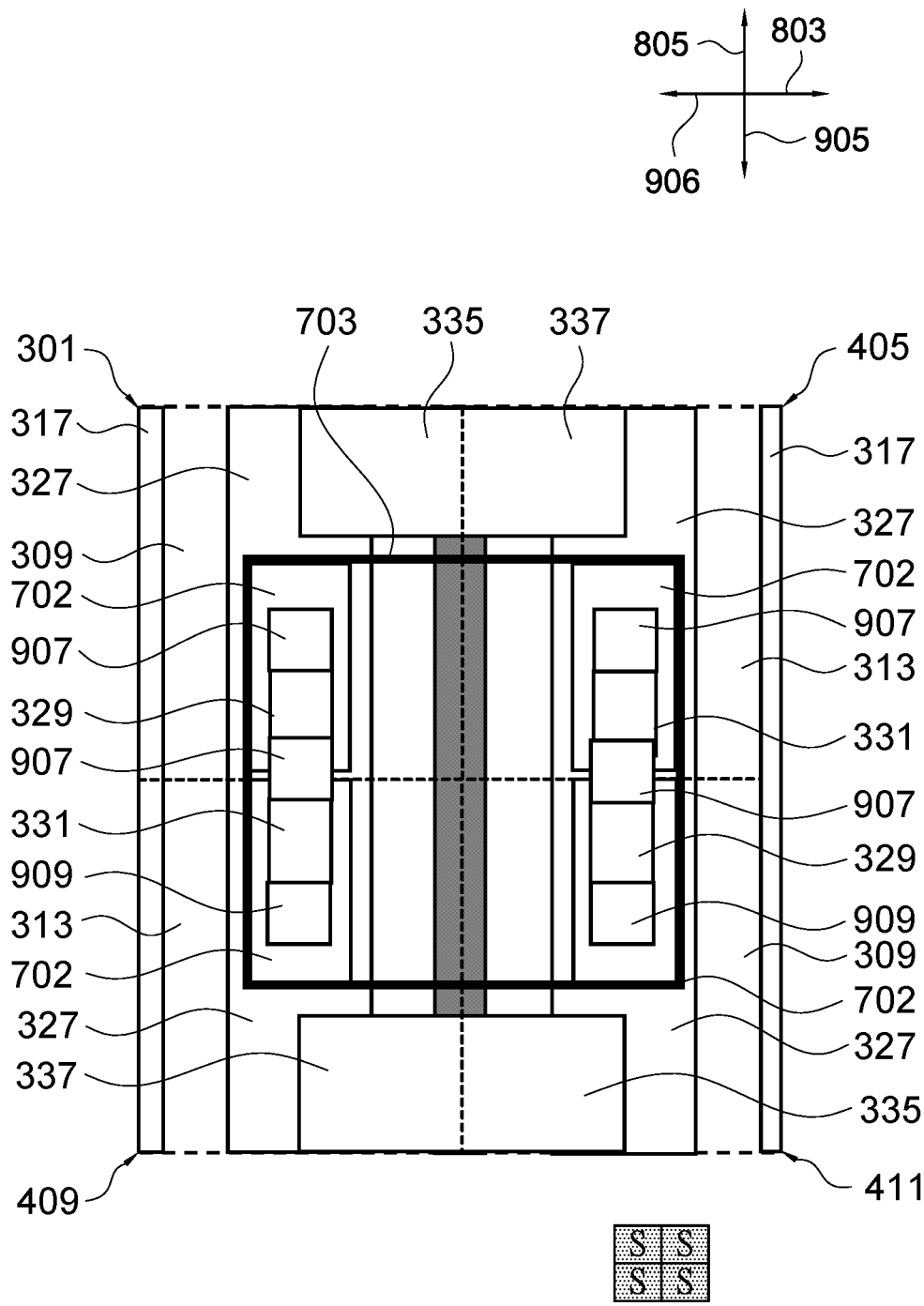
Figure 11B:
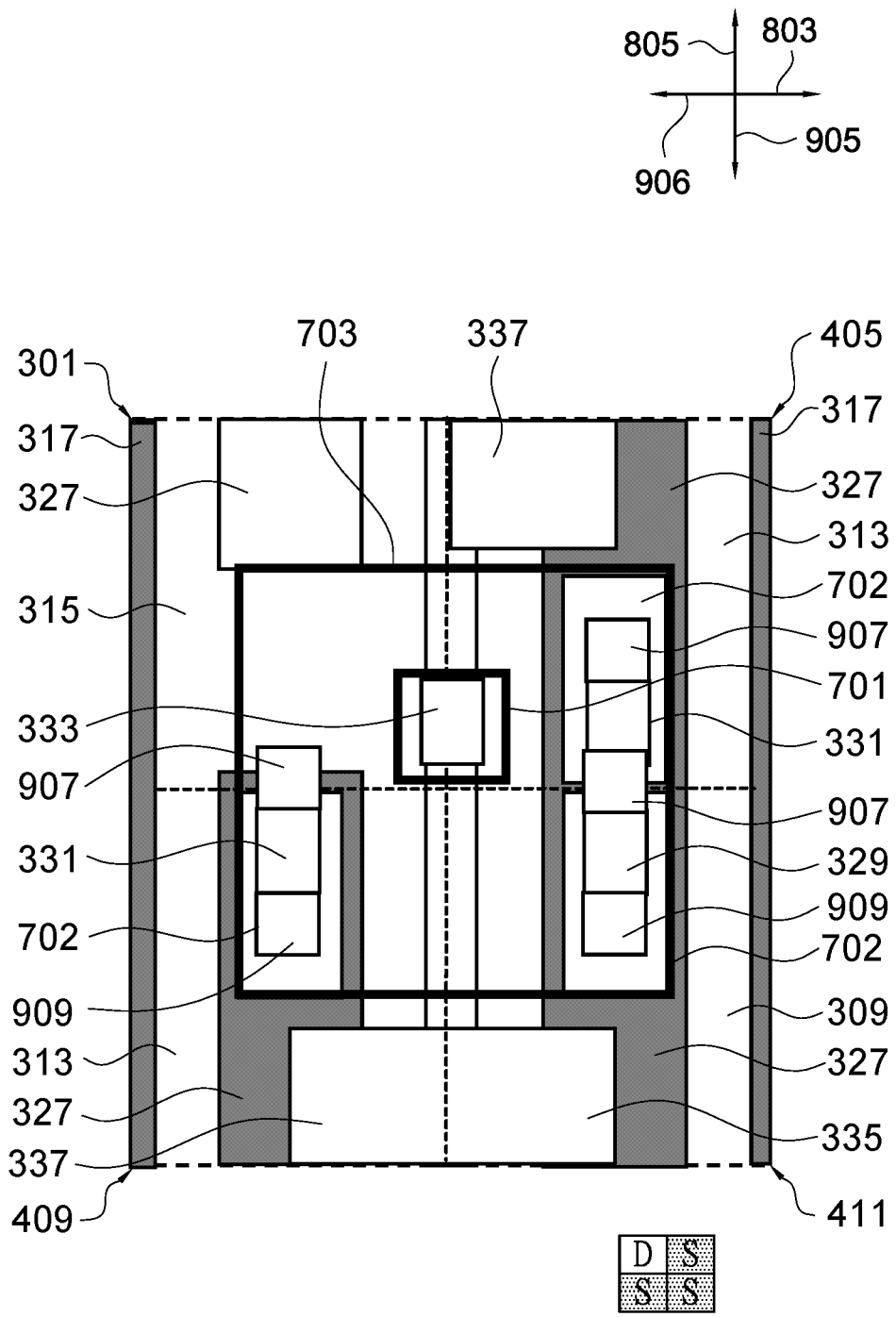
Figure 11C:
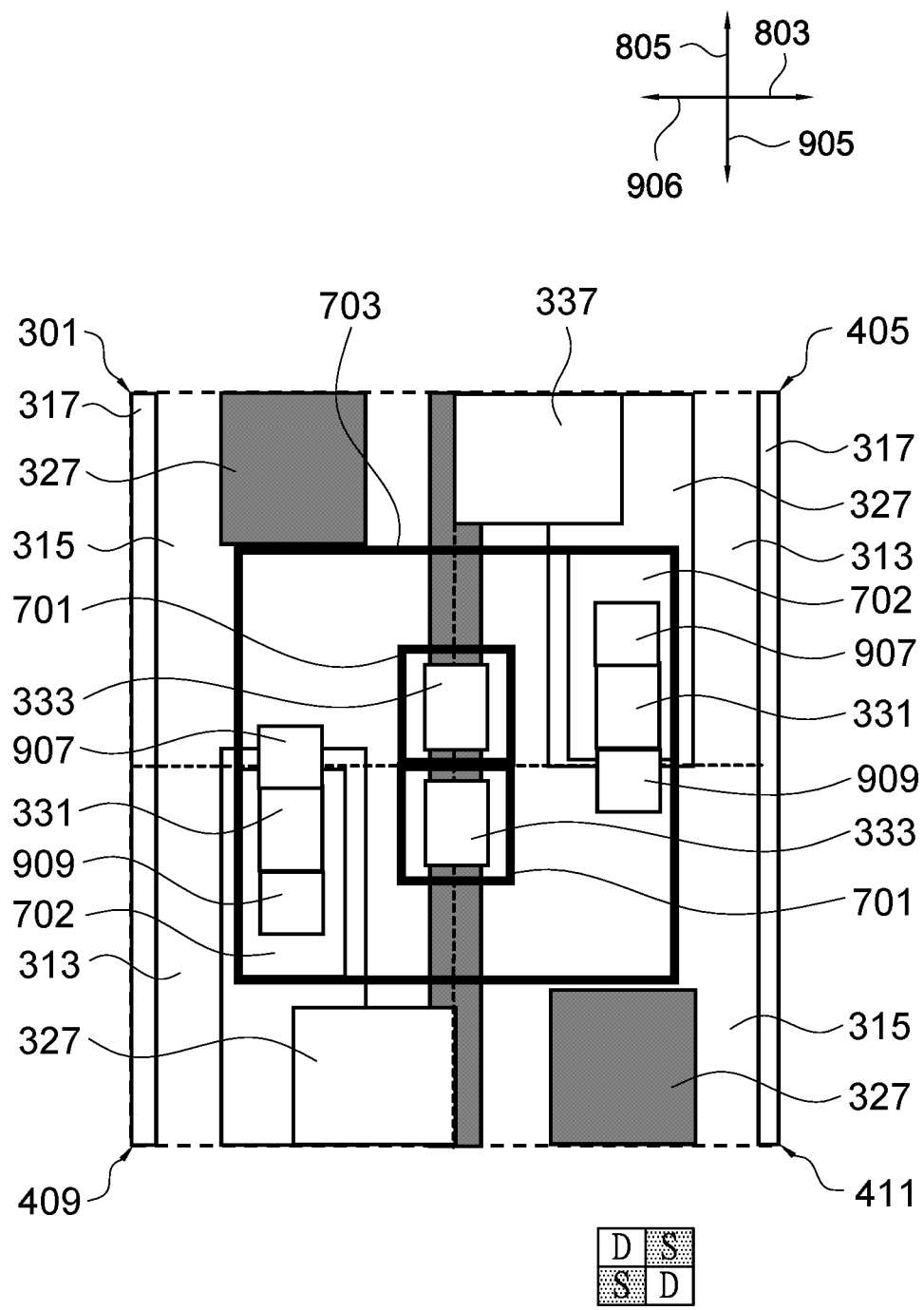
Figure 11D:
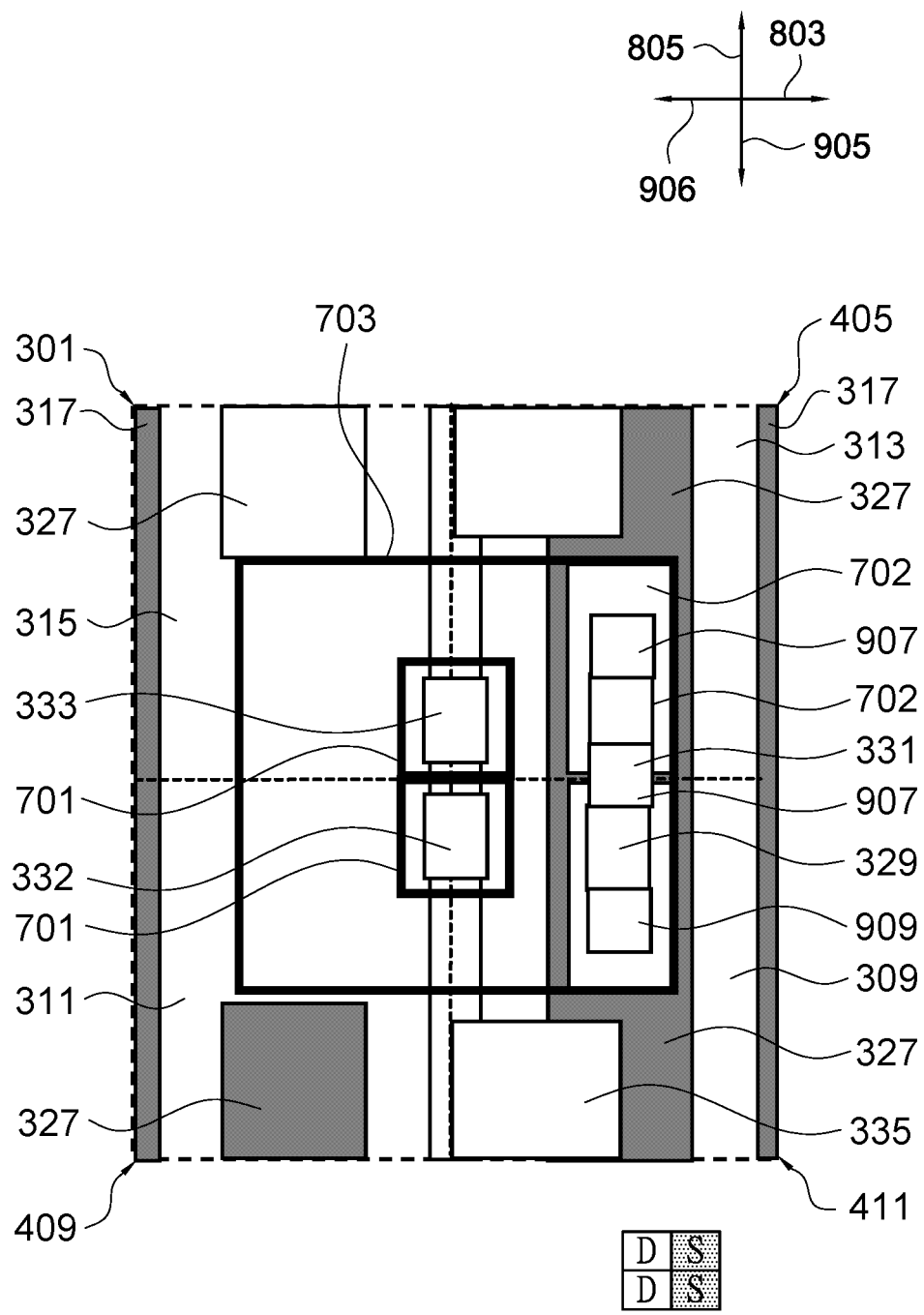
Figure 11E:
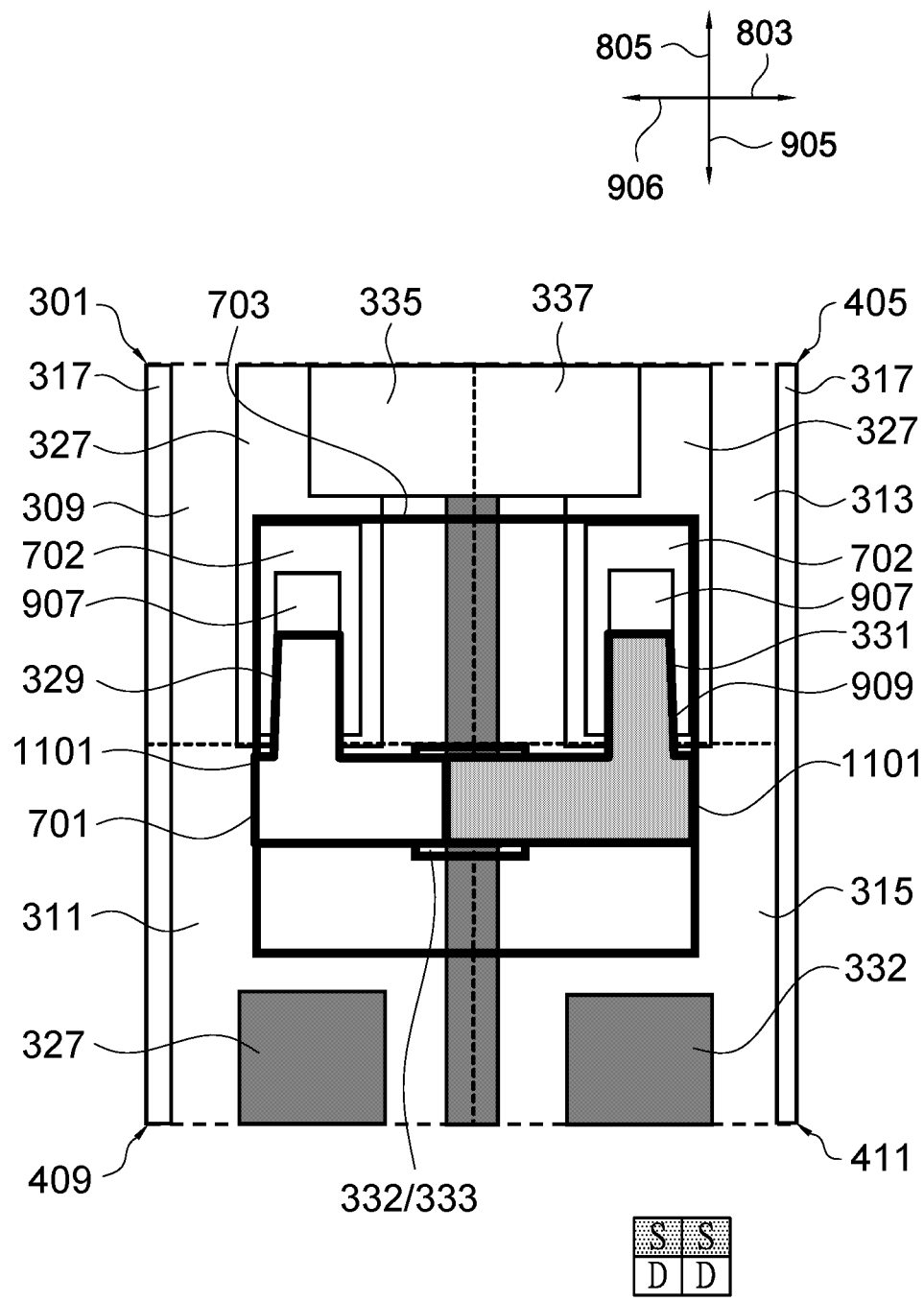
Figure 11F:
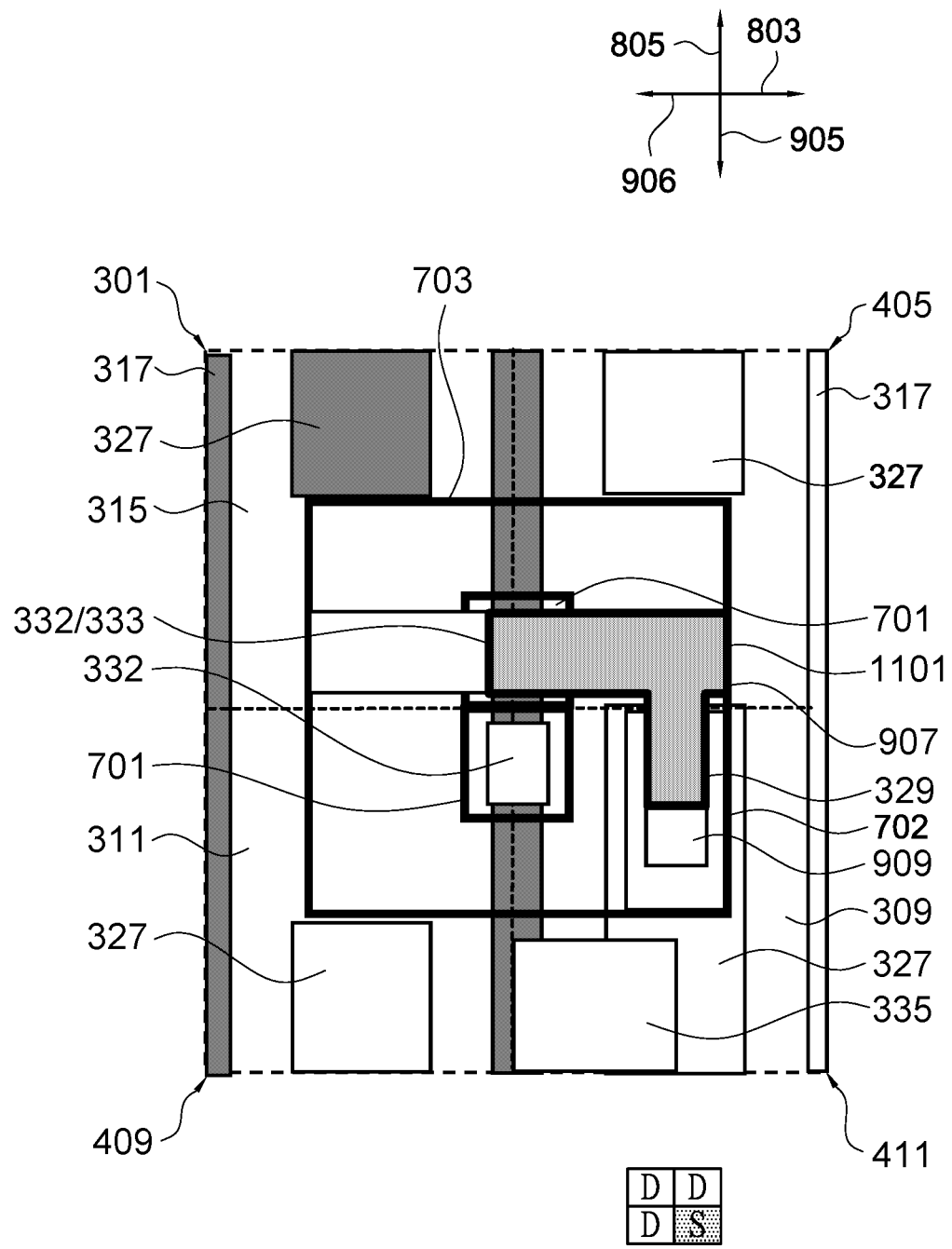
Figure 11G:
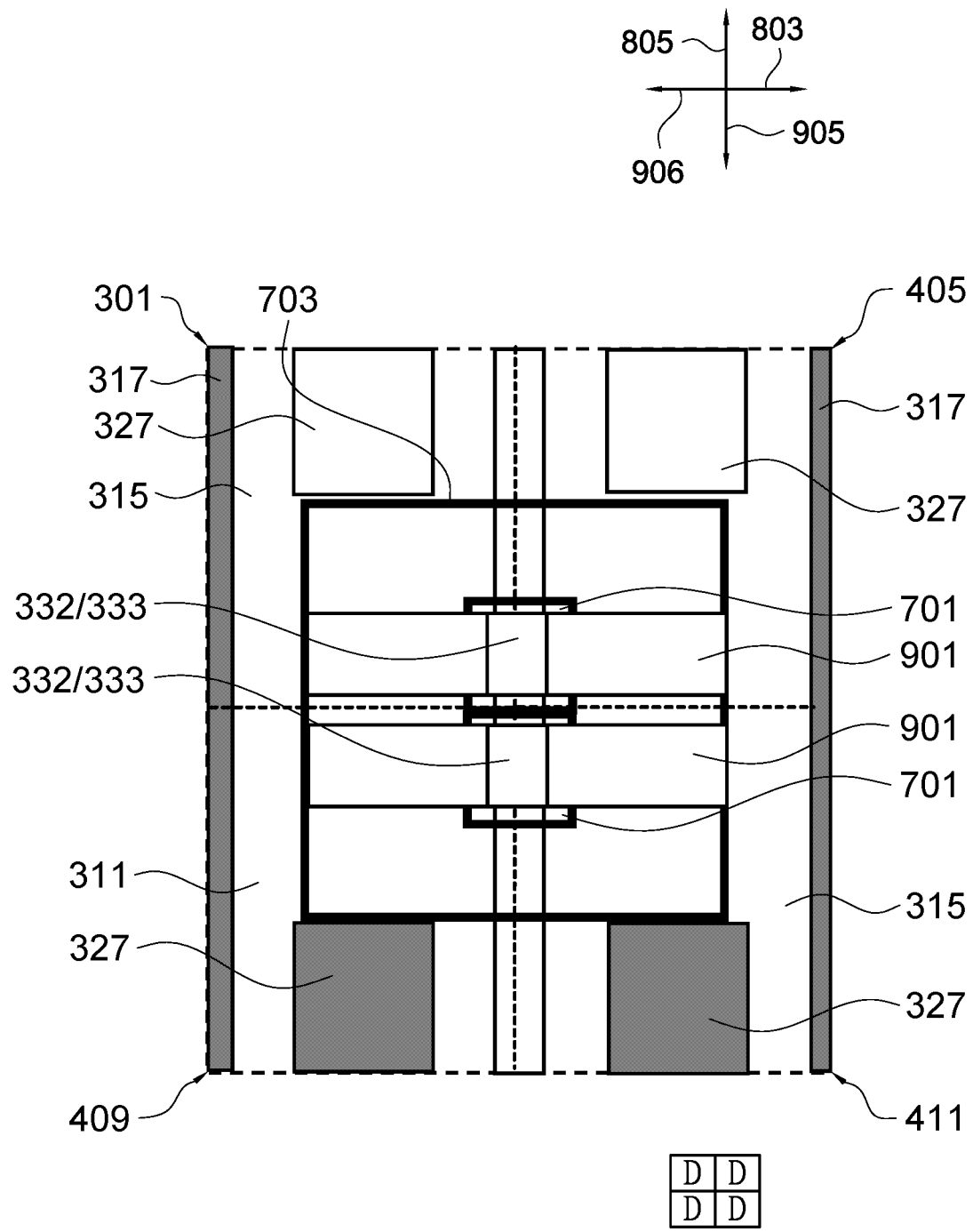

Similarly, looking in FIG. 11E, a similar analysis is performed in the ninth step 1509. For example, looking back at the embodiment illustrated in FIG. 10E, the analysis determines that there is an interaction between the expansion in the fourth step 1504 (e.g., the first expansion zones 901) and the expansion in the seventh step 1507 (the fourth expansion zones 909). Additionally, there is an interaction between the expansion in the fifth step 1505 (e.g., the second expansion zones 903) and the expansion of the seventh step 1507 (e.g., the fourth expansion zones 909). As such, there are multiple "L" shapes 1101 that are generated, with one of the "L" shapes 1101 overlapping another one of the "L" shapes 1101 combined via from the combined via from the third via 332 in the third cell 409 and the fourth via 333 in the fourth cell 411.

FIGS. 12A-12G illustrate a tenth step 1510 to determine if any of the combined shapes (e.g., the "L" shapes 1101) interact with each other. For example, in the embodiment illustrated in FIG. 12E, there are two of the "L" shapes 1101 that are analyzed to determine if they interact, such as by overlapping each other. In this embodiment there are two "L" shapes 1101 that overlap over the combined via from the third via 332 in the third cell 409 and the fourth via 333 in the fourth cell 411.

Figure 12A:
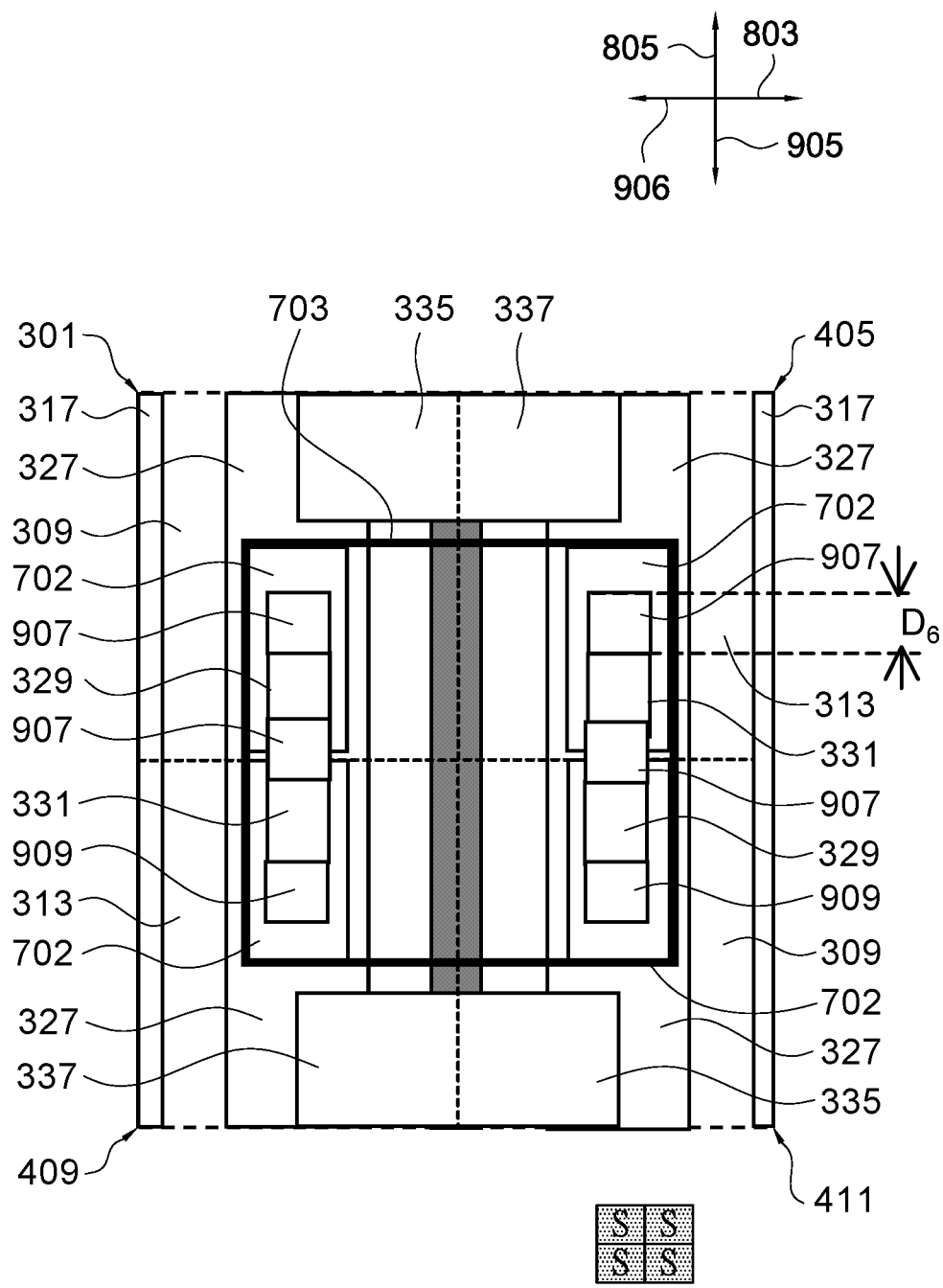
Figure 12B:
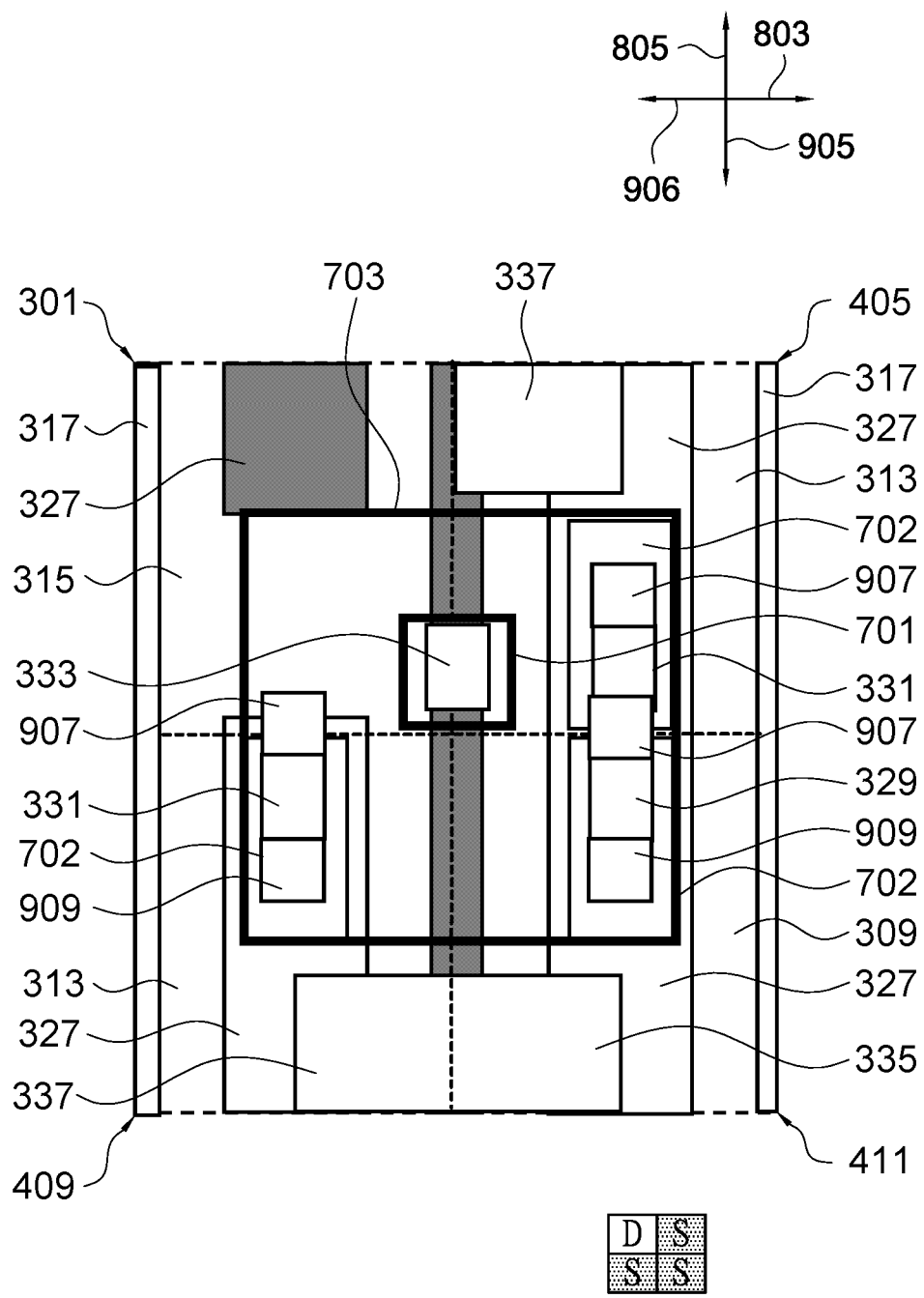
Figure 12C:
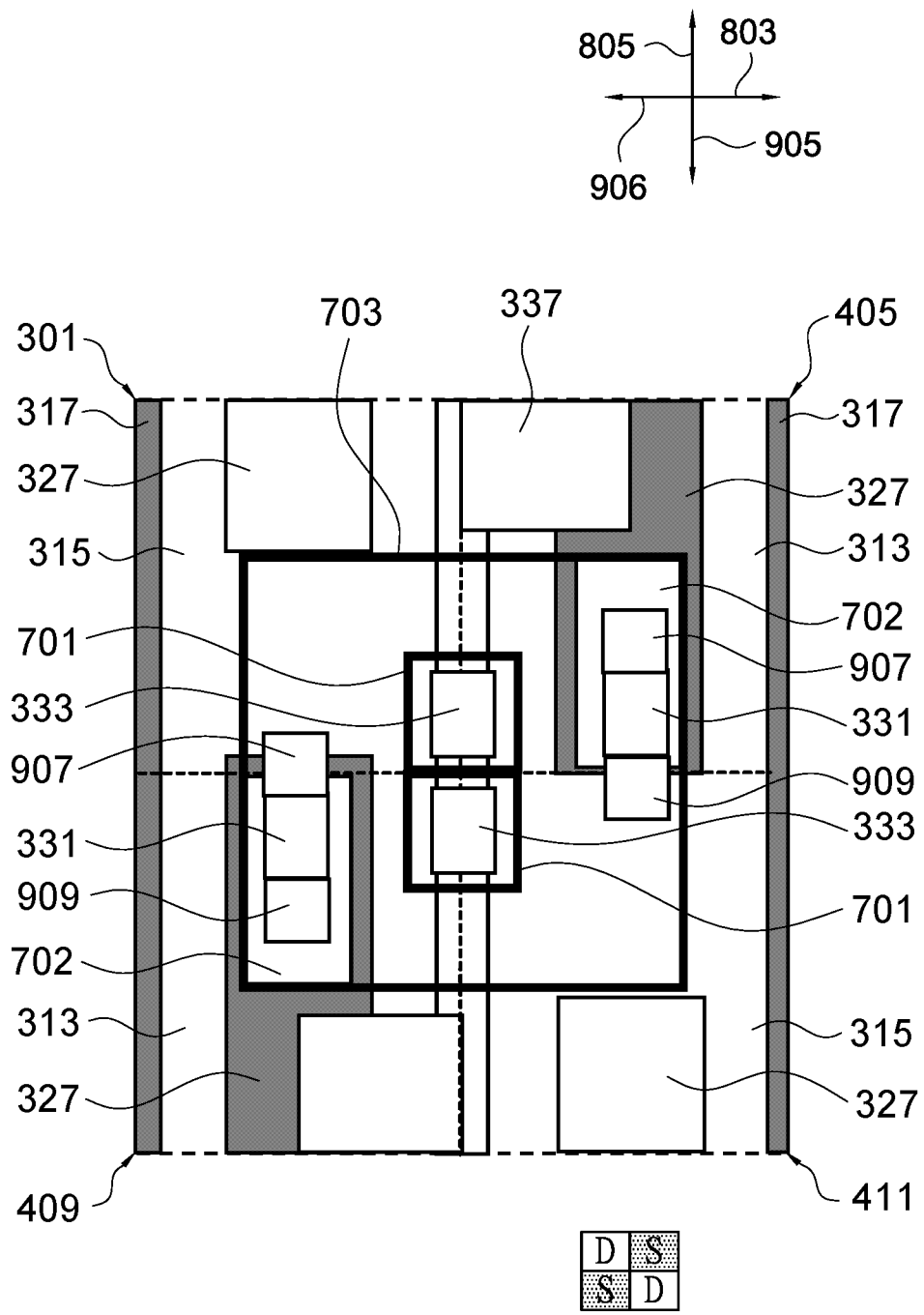
Figure 12D:
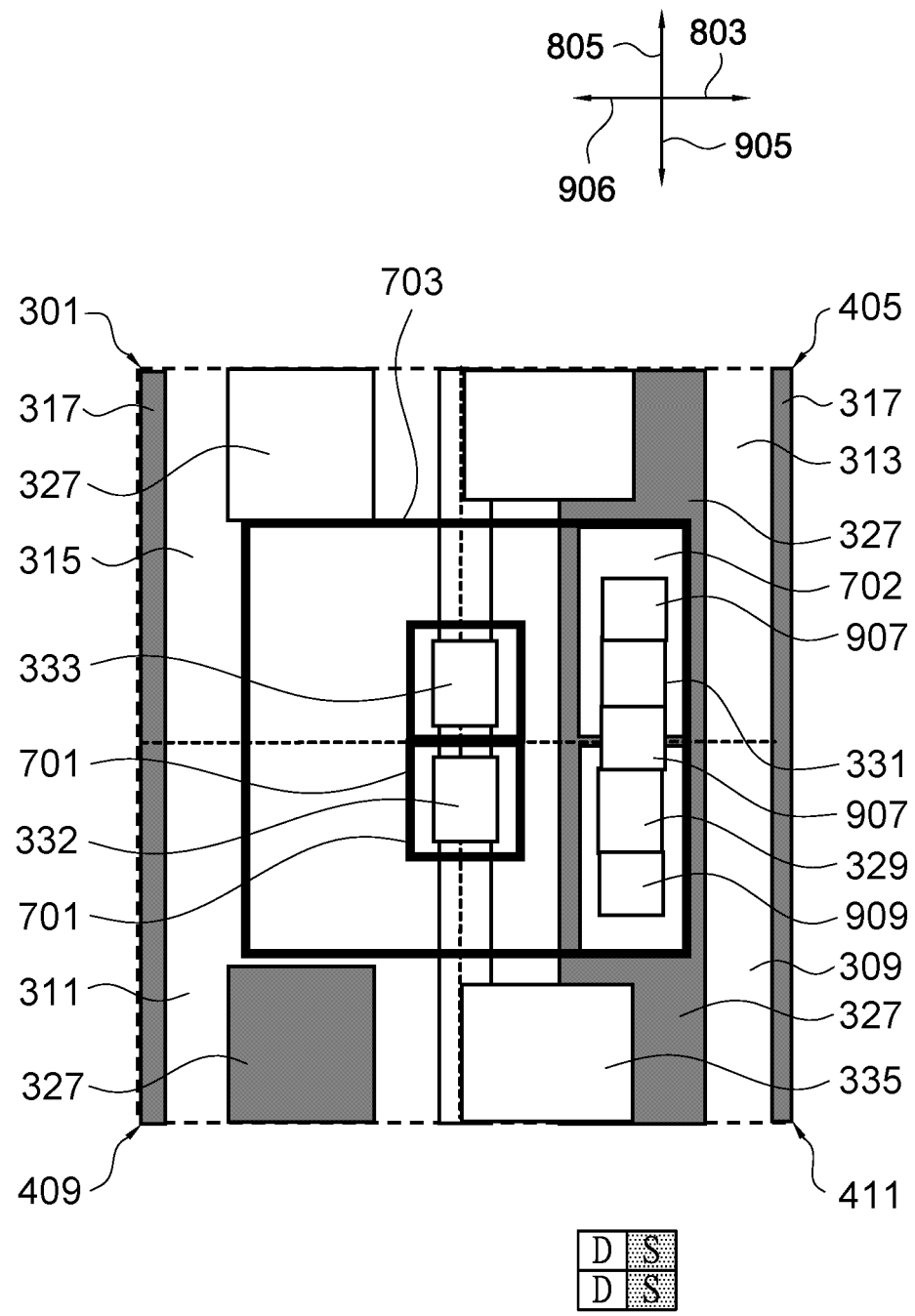
Figure 12E:
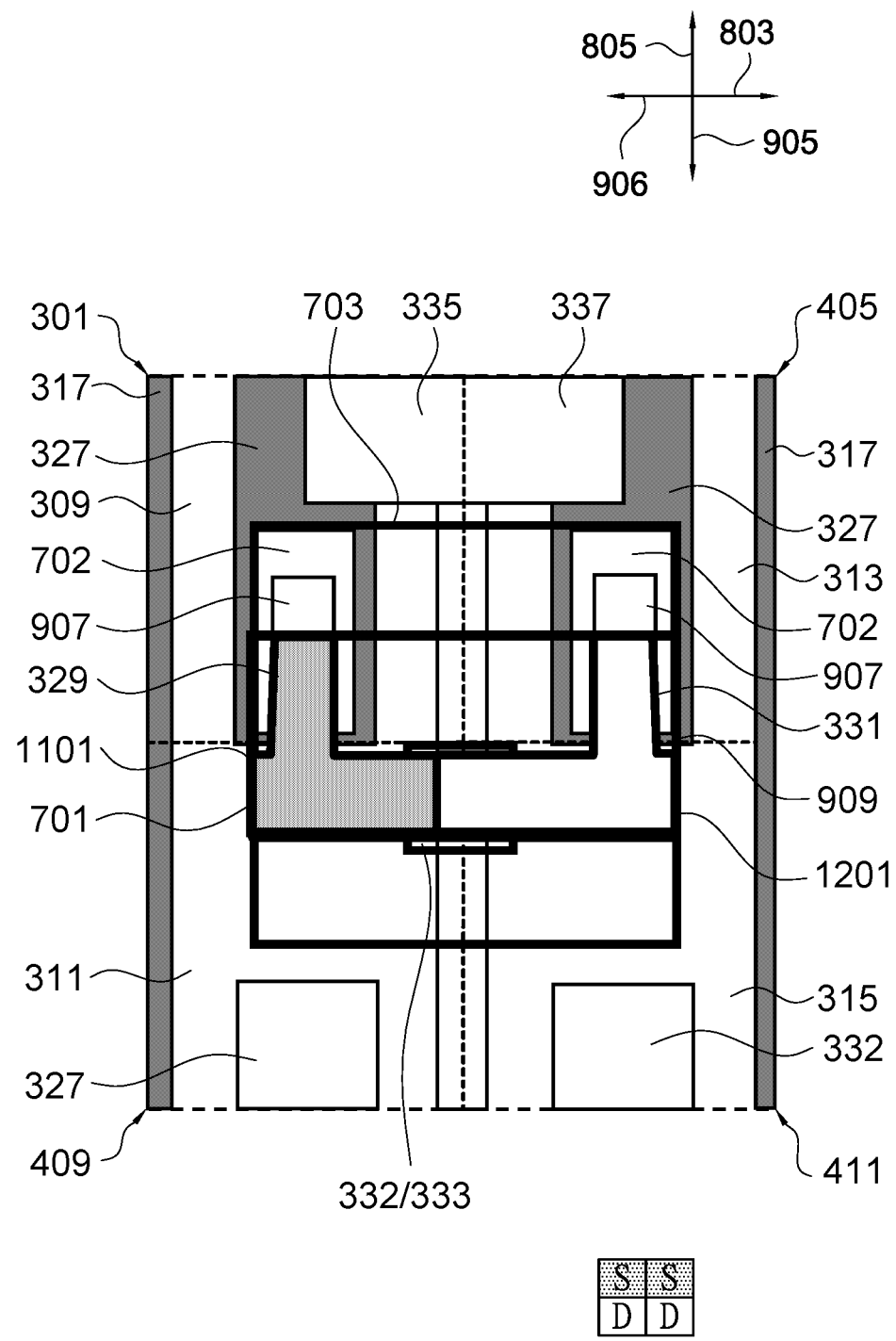
Figure 12F:
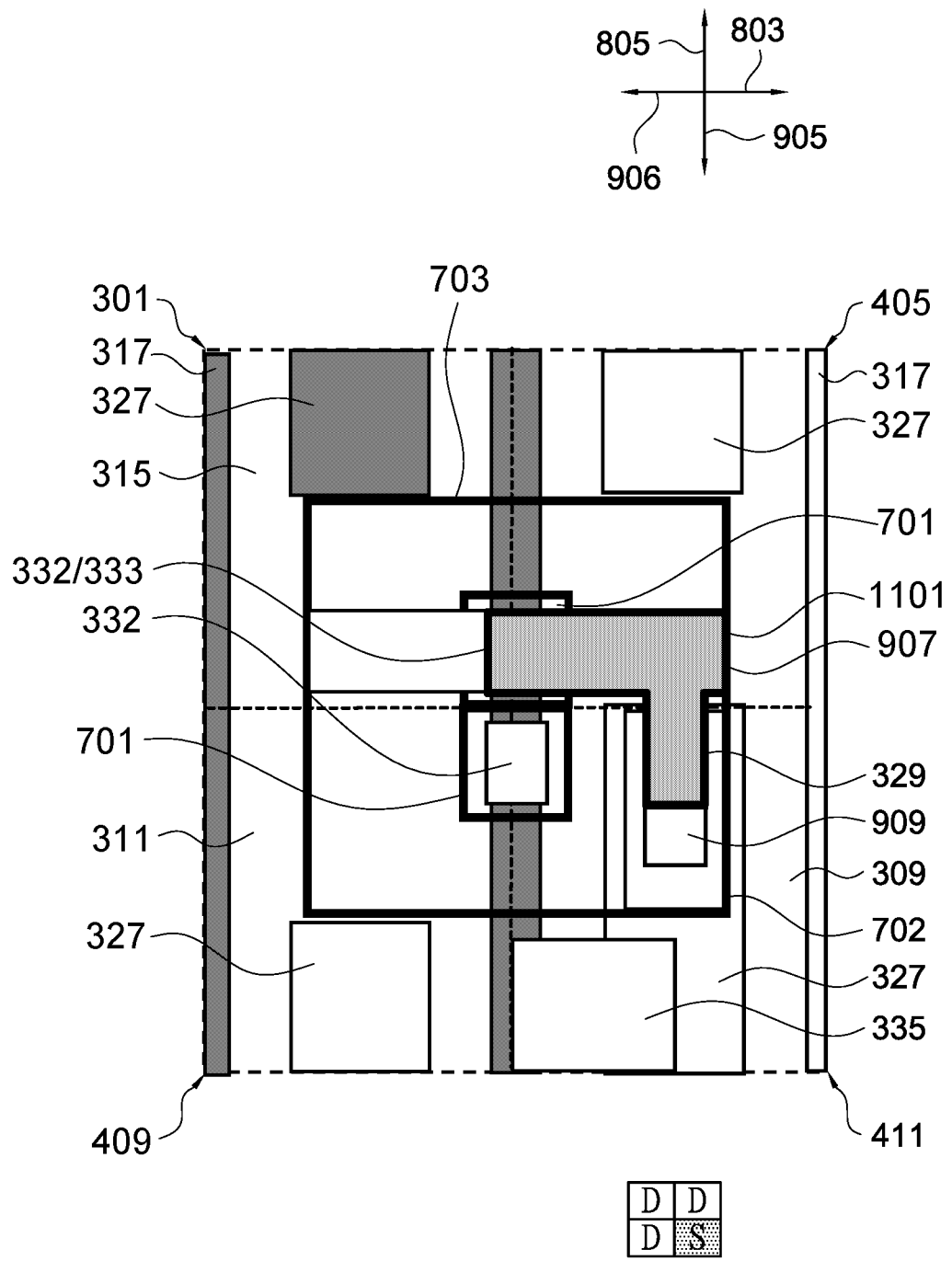
Figure 12G:
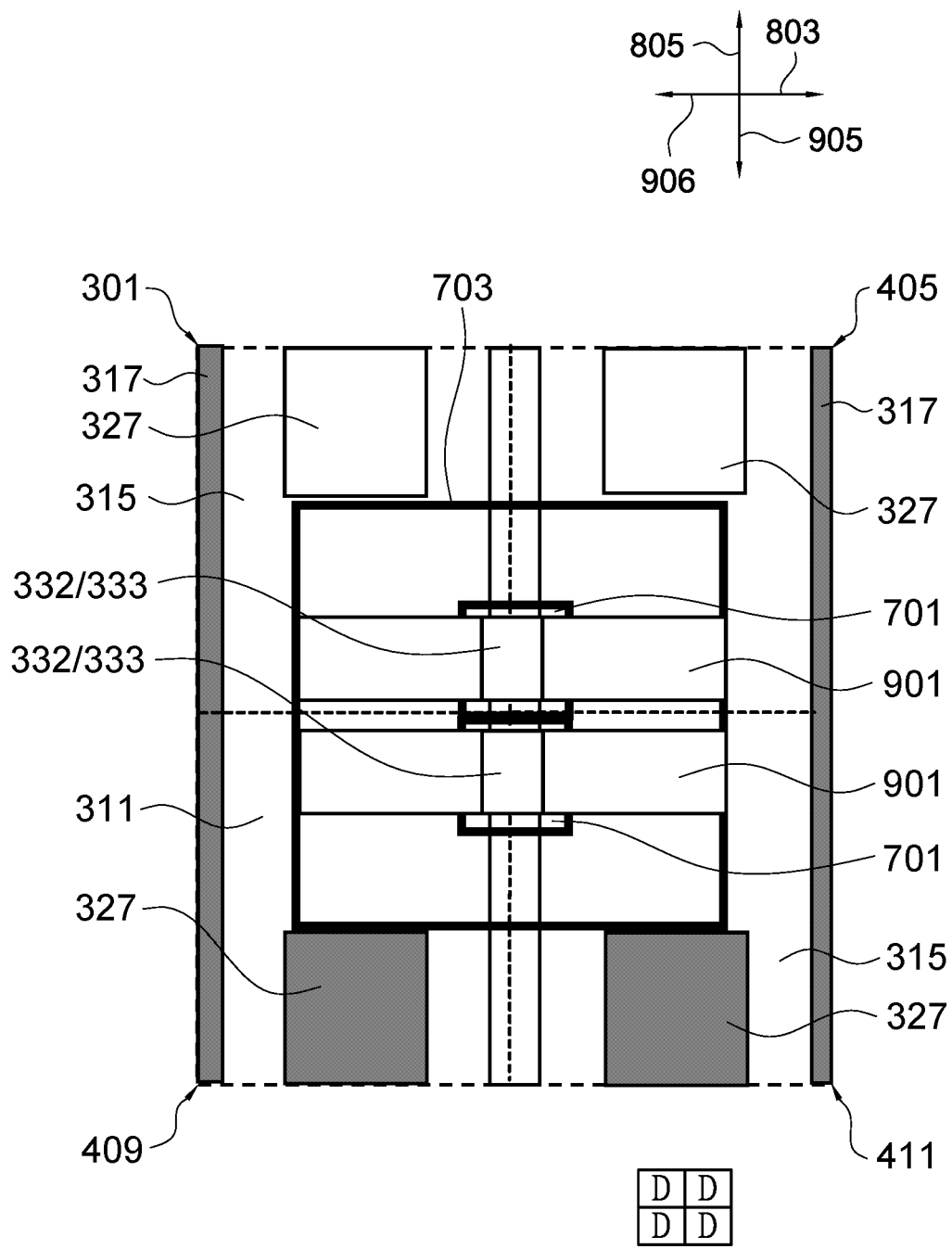

If there are multiple shapes, such as the "L" shapes 1101 illustrated in FIG. 12E, that are determined to interact, an additional step may be taken to make the processing (e.g., photolithographic masking and etching) simpler by merging the multiple shapes into a single shape 1201. In the embodiment illustrated in FIG. 12E, the two "L" shapes 1101 may be merged into the single shape 1201 and any areas that are surrounded by the two "L" shapes 1101 may be filled in. For example, the two "L" shapes 1101 may be merged together and then filled in to form a single shape 1201 which is rectangular (although the two "L" shapes 1101 have been left within FIG. 12E for clarity).

Once this merging process has been finished, the first expansion zone 901, the second expansion zone 903, the third expansion zone 907, and the fourth expansion zone 909 are removed from the design. By removing the first expansion zone 901, the second expansion zone 903, the third expansion zone 907, and the fourth expansion zone 909, the vias that were not merged are returned to their normal shapes for further analysis.

FIGS. 13A-13G illustrate an eleventh step 1511 in which vias identified by the second marker layer 702 (that were not merged in the tenth step 1510) are either left alone, merged together, or removed completely. In an embodiment the eleventh step 1511 may be initiated by first expanding the vias identified by the second marker layer 702 in the second direction 805 by an eight distance $D_8$ to form fifth expansion zones 1301 and also expanding the vias identified by the second marker layer 702 in the fourth direction 905 by a ninth distance $D_9$ to form sixth expansion zones 1303. In an embodiment the eighth distance $D_8$ may be between about 0 nm and about 5 nm, such as about 1 nm, while the ninth distance $D_9$ may be between about 0 nm and about 5 nm, such as about 1 nm.

Figure 13A:
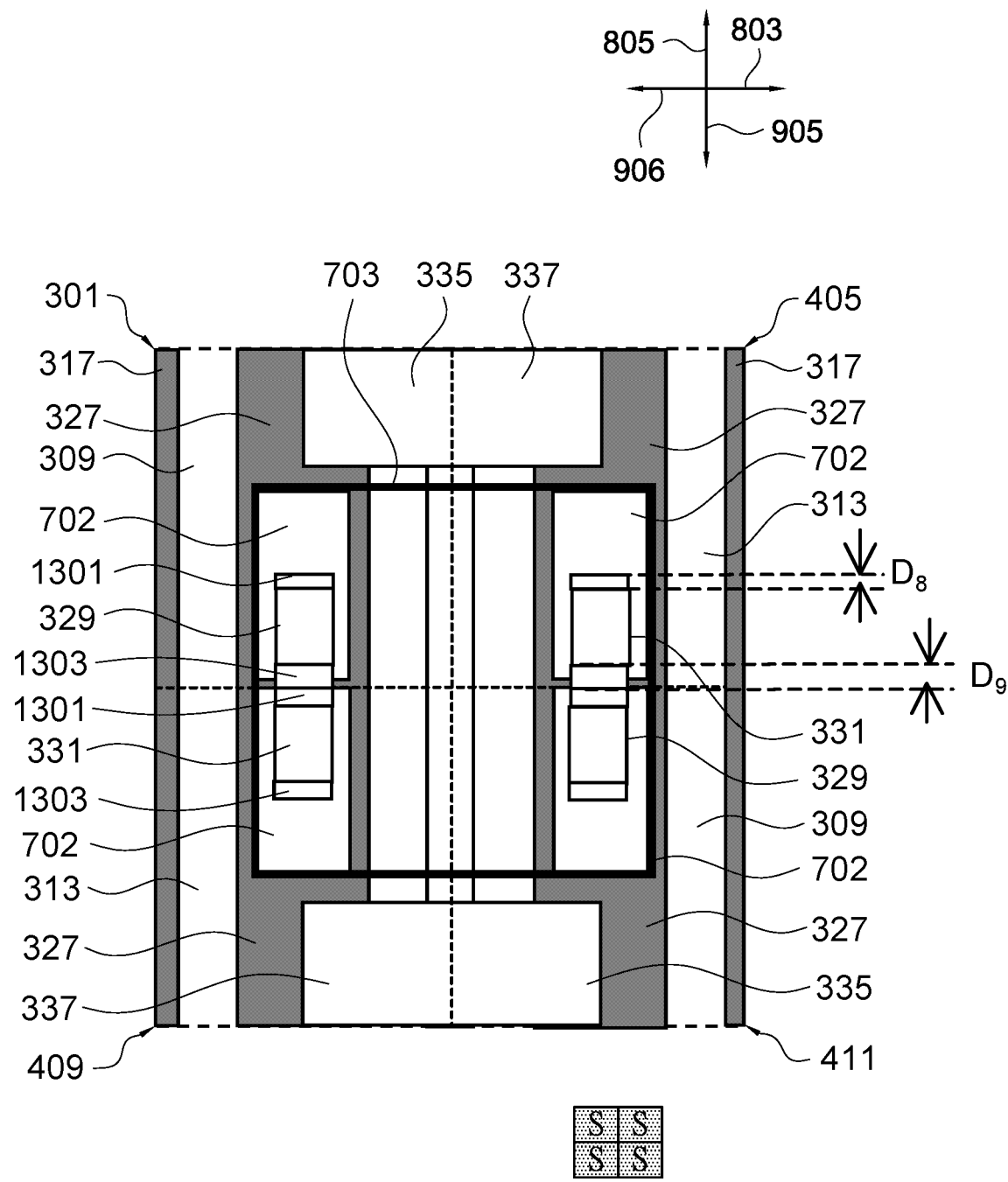

For example, in the embodiment illustrated in FIG. 13A, each of the first via 329 in the first cell 301, the second via 331 in the second cell 405, the second via 331 in the third cell 409, and the first via 329 in the fourth cell 411 are all expanded in the second direction 805 and the fourth direction 905. As the fifth expansion zone 1301 from the first via 329 in the first cell 301 overlaps or connects to the sixth expansion zone 1304 from the second via 331 in the third cell 409, this expansion will close the gap between the first via 329 in the first cell 301 and the second via 331 in the third cell 409 and the first via 329 in the first cell 301 and the second via 331 in the third cell 409 are merged. Similarly, the gap between the second via 331 in the second cell 405 and the first via 329 in the fourth cell 411 is also closed and the second via 331 in the second cell 405 and the first via 329 in the fourth cell 411 are merged. In an embodiment in which the second via 331 in the second cell 405 is 20 nm×40 nm and the first via 329 in the fourth cell 411 is also 20 nm×40 nm, the new merged cell is 20 nm×82 nm.

Figure 13B:
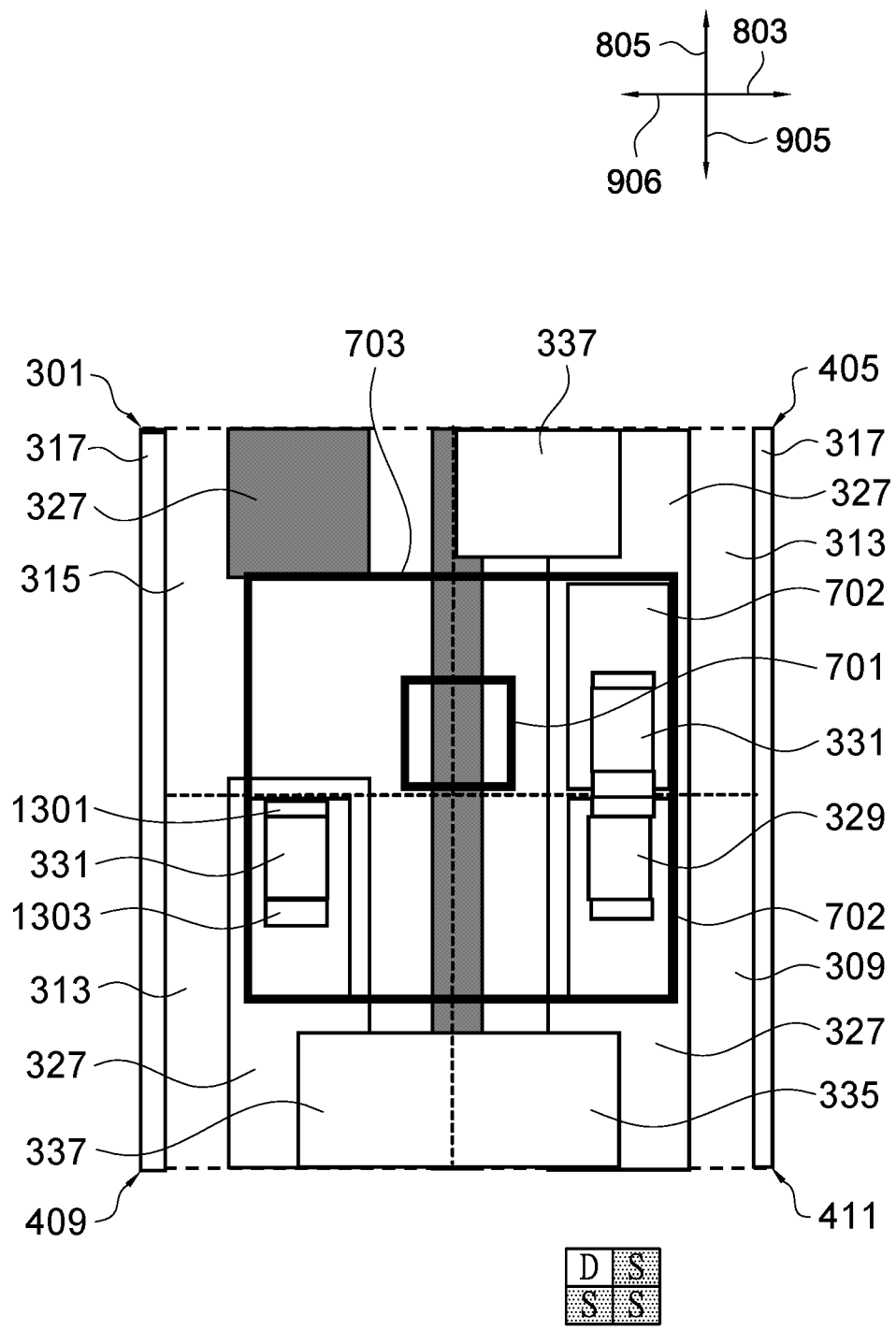

Looking at the embodiment illustrated in FIG. 13B, the second via 331 in the second cell 405, the second via 331 in the third cell 409, and the first via 329 in the fourth cell 411 are all expanded by the eighth distance $D_8$ and the ninth distance $D_9$. As such, the gap between the second via 331 in the second cell 405 and the first via 329 in the fourth cell 411 is closed and the second via 331 in the second cell 405 and the first via 329 in the fourth cell 411 are merged.

Figure 13C:
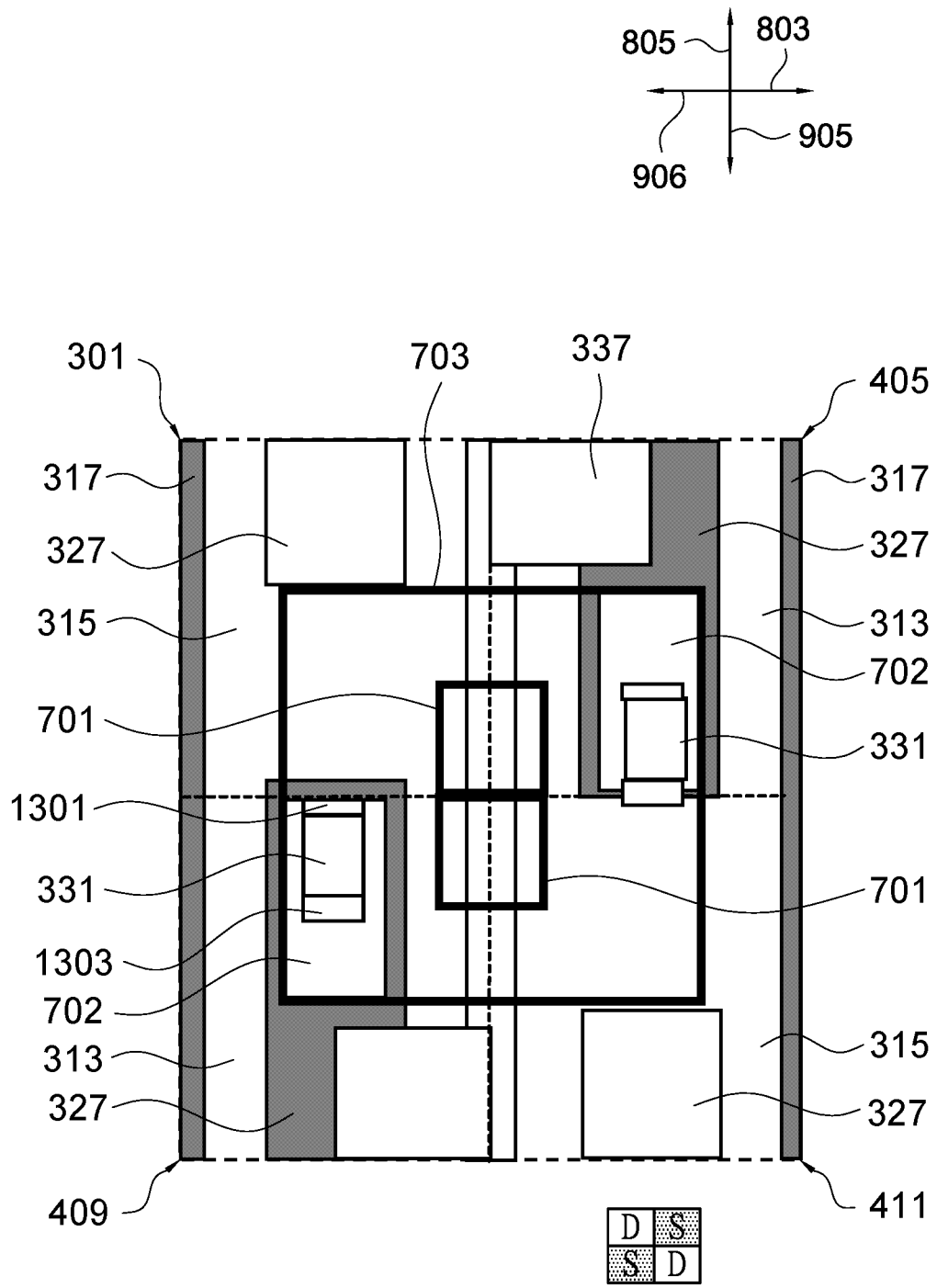

Looking at the embodiment illustrated in FIG. 13C, the second via 331 in the second cell 405 and the second via 331 in the third cell 409 are expanded by the eighth distance $D_8$ and the ninth distance $D_9$. However, because there are no gaps to close, the second via 331 in the second cell 405 and the second via 331 in the third cell 409 are merely expanded without merging.

Figure 13D:
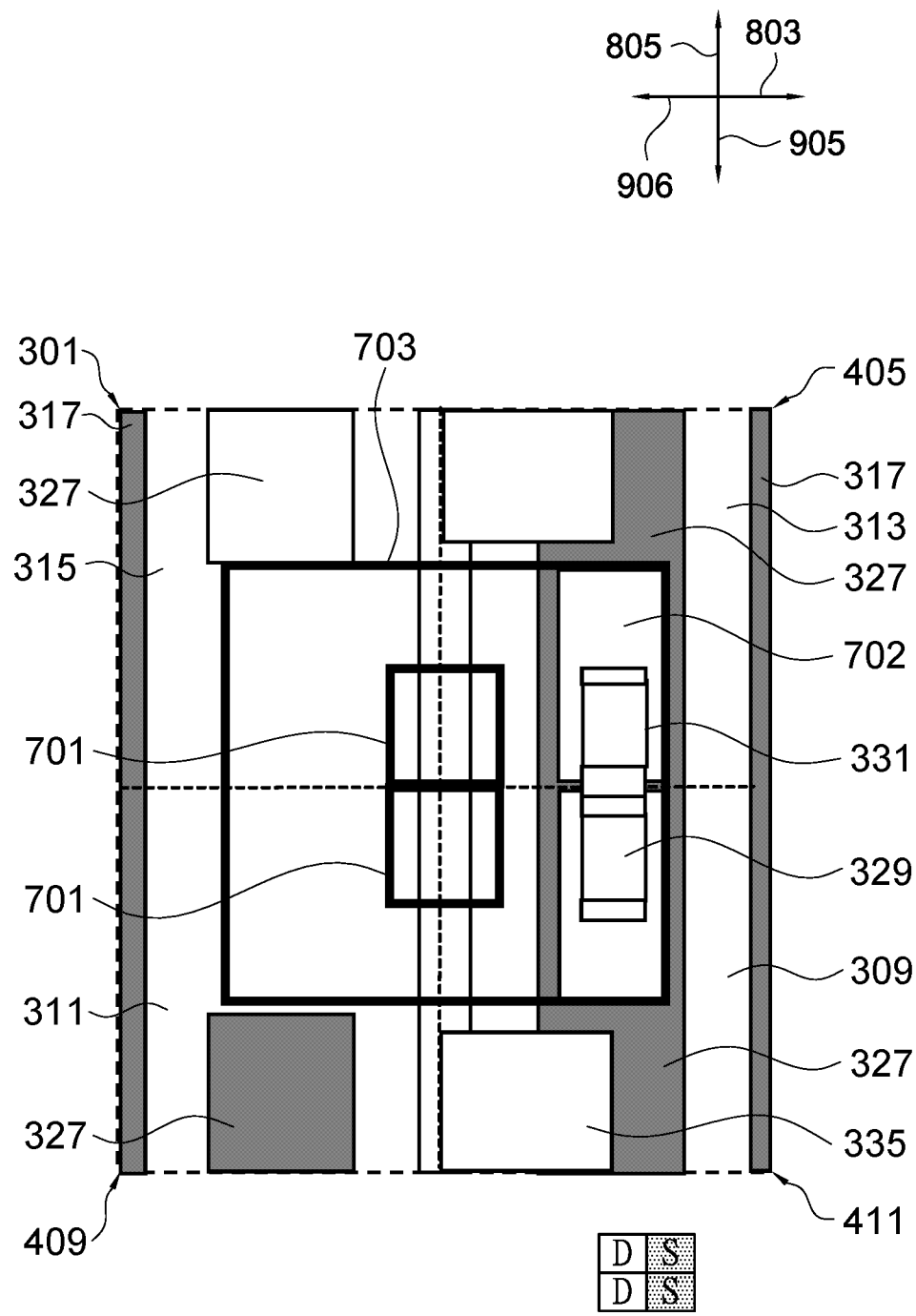
Figure 13E:
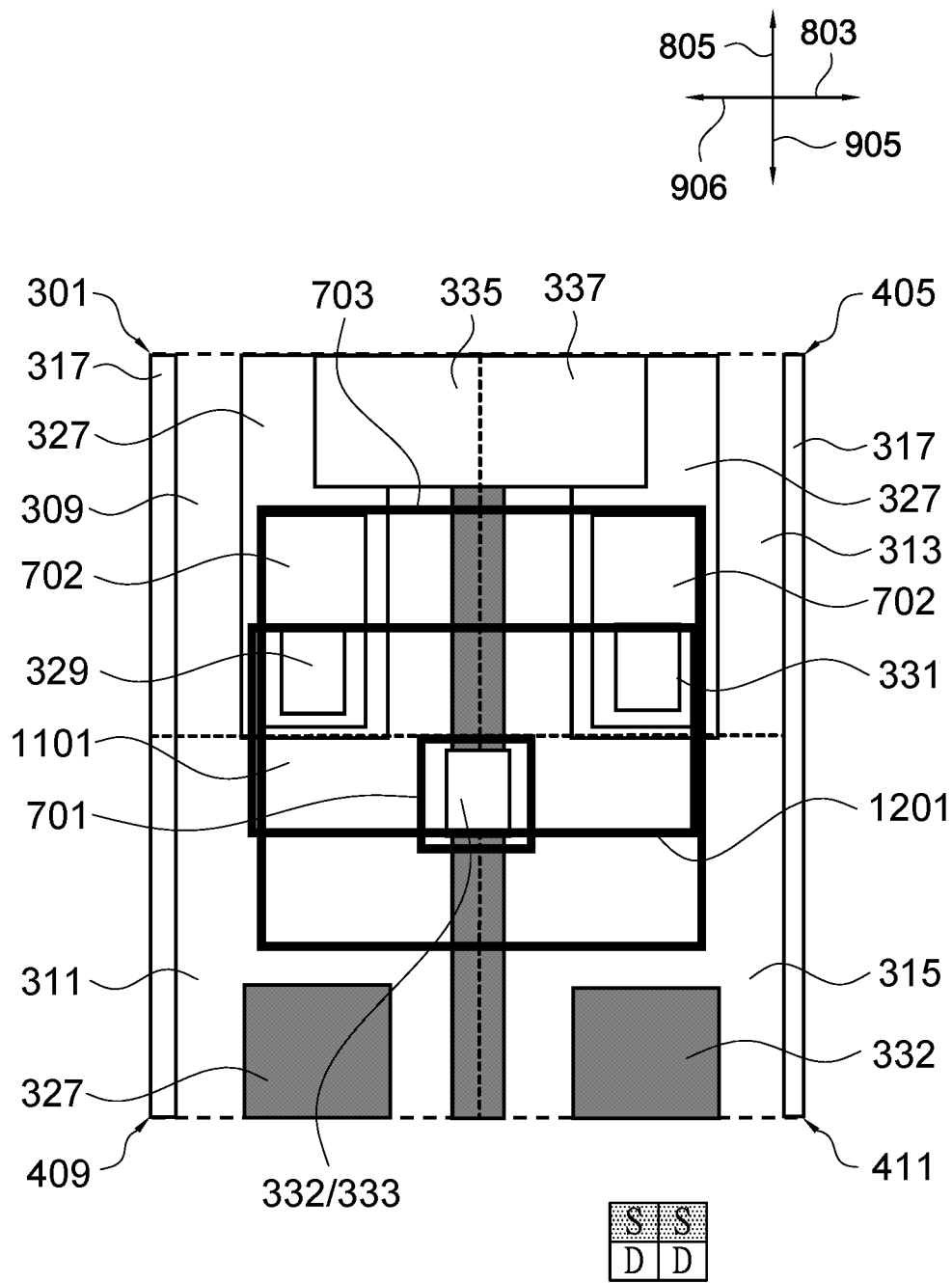
Figure 13F:
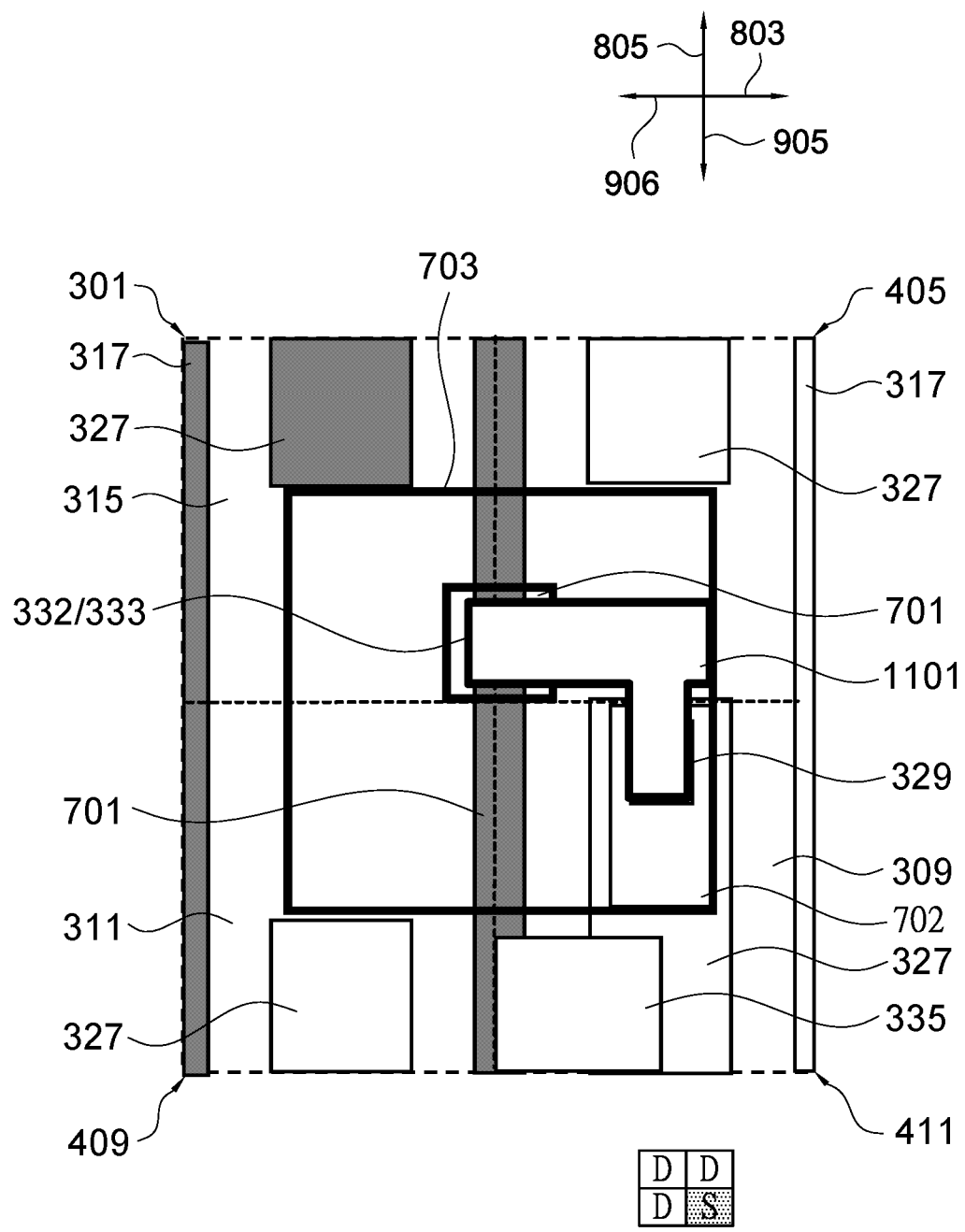
Figure 13G:
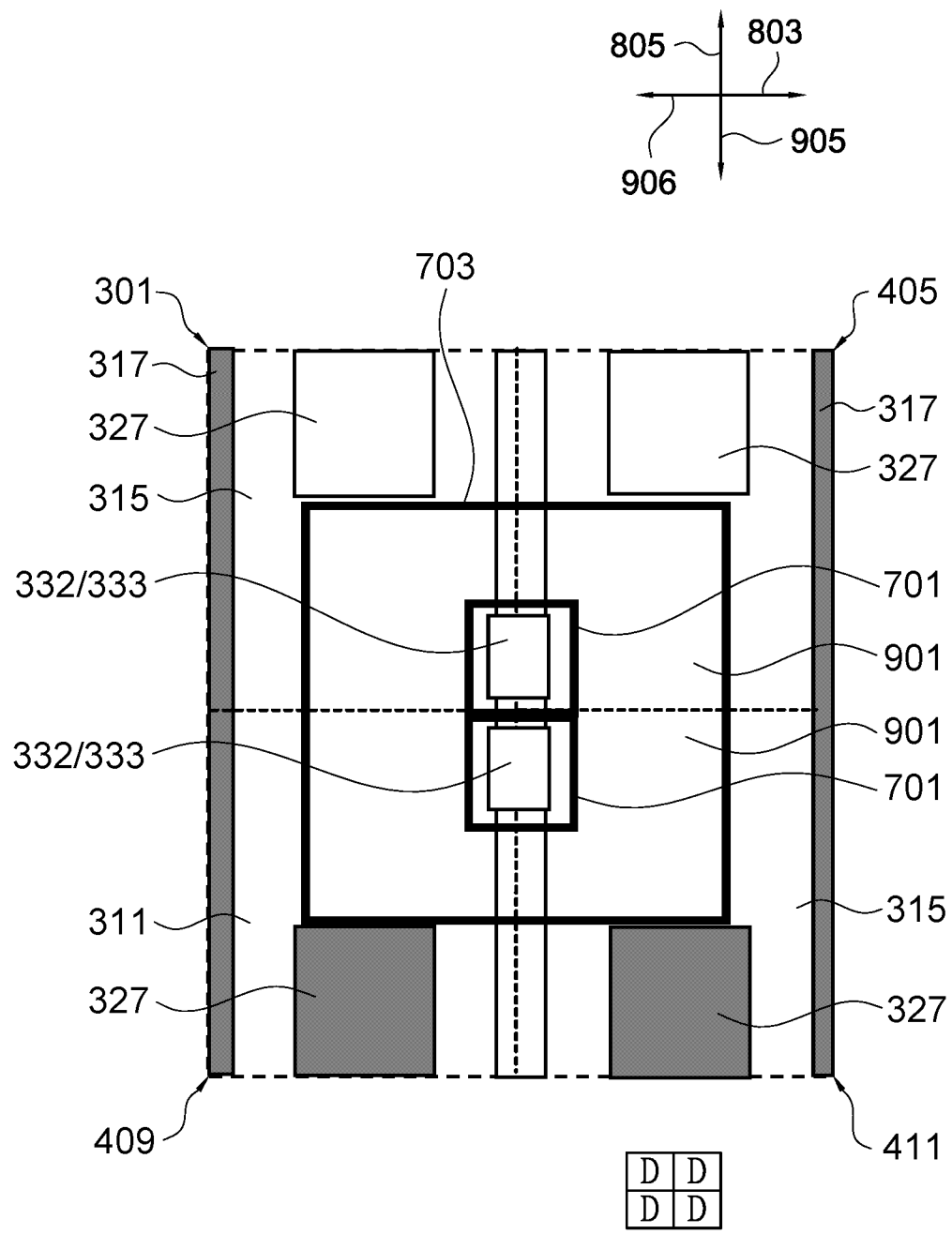

Looking at the embodiment illustrated in FIG. 13D, the second via 331 in the second cell 405 and the first via 329 in the fourth cell 411 are expanded by the eighth distance $D_8$ and the ninth distance $D_9$. As such, the gap located between the second via 331 in the second cell 405 and the first via 329 in the fourth cell 411 is closed, and the second via 441 in the second cell 405 and the first via 329 in the fourth cell 411 are merged into a single via.

FIGS. 13A-13G also illustrate a twelfth step 1512 in which the redundant and unnecessary vias identified by the first marker layer 701 are removed. In an embodiment the removal is performed by shrinking the vias a distance that is greater than the size of the original vias. For example, in an embodiment in which the original vias had a size of 20 nm by 40 nm, the vias may be sized in the second direction 805 or the fourth direction 905 by reducing the size of the vias by 20 nm. As such, any vias that were not merged and remain their original size are effectively removed from the overall design.

Additionally in the twelfth step 1412, after the removal of the vias, the remaining vias (those that were merged and, as such, have a larger size than they originally did), are expanded by the same distance in order to return them to the size prior to the twelfth step 1412. As such, the twelfth step 1412 will remove vias that were not merged and are redundant, but will return the other vias back to their original size.

As an example, in the embodiment illustrated in FIG. 13B, the fourth via 333 in the first cell 301 (see, e.g., FIG. 12B) is reduced in size by its original size. For example, if the fourth via 333 in the first cell 301 has an original size of 20 nm, the fourth via 333 in the first cell 301 is reduced by at least 20 nm, effectively removing the fourth via 333 in the first cell 301 from the design.

However, still looking at the embodiment illustrated in FIG. 13B, the merged second via 331 in the second cell 405 and the first via 329 in the fourth cell 411 will be shrunk by at least 20 nm. However, because these vias have already been merged, the shrinking does not remove the merged second via 331 in the second cell 405 and the first via 329 in the fourth cell 411. Then, when the expansion is performed, the merged second via 331 in the second cell 405 and the first via 329 in the fourth cell 411 will return to its original size.

Similar processing may be performed to remove the second via fourth via 333 in the first cell 301 and the third via 332 in the third cell 409 in the embodiment in FIG. 13D. Additionally, in the embodiment illustrated in FIG. 13C, the twelfth step 1412 may be used to remove the fourth via 333 in the first cell 301 and the fourth via 333 in the fourth cell 411.

FIGS. 14A-14G illustrate a thirteenth step 1513, which will resize the merged vias back to their original size after the closing of the gaps in the twelfth step 1412. In an embodiment the merged vias may be reduced by the same distance as they were expanded during the merge, while still retaining the merged portion of the vias. As such, in an embodiment in which the twelfth step 1512 used an expansion of 1 nm in the third direction 906 and the fourth direction 905, the thirteenth step 1513 reduces the size of the merged vias by 1 nm in the second direction 805 and the fourth direction 905. However, any suitable reduction in size may alternatively be utilized.

Figure 14A:
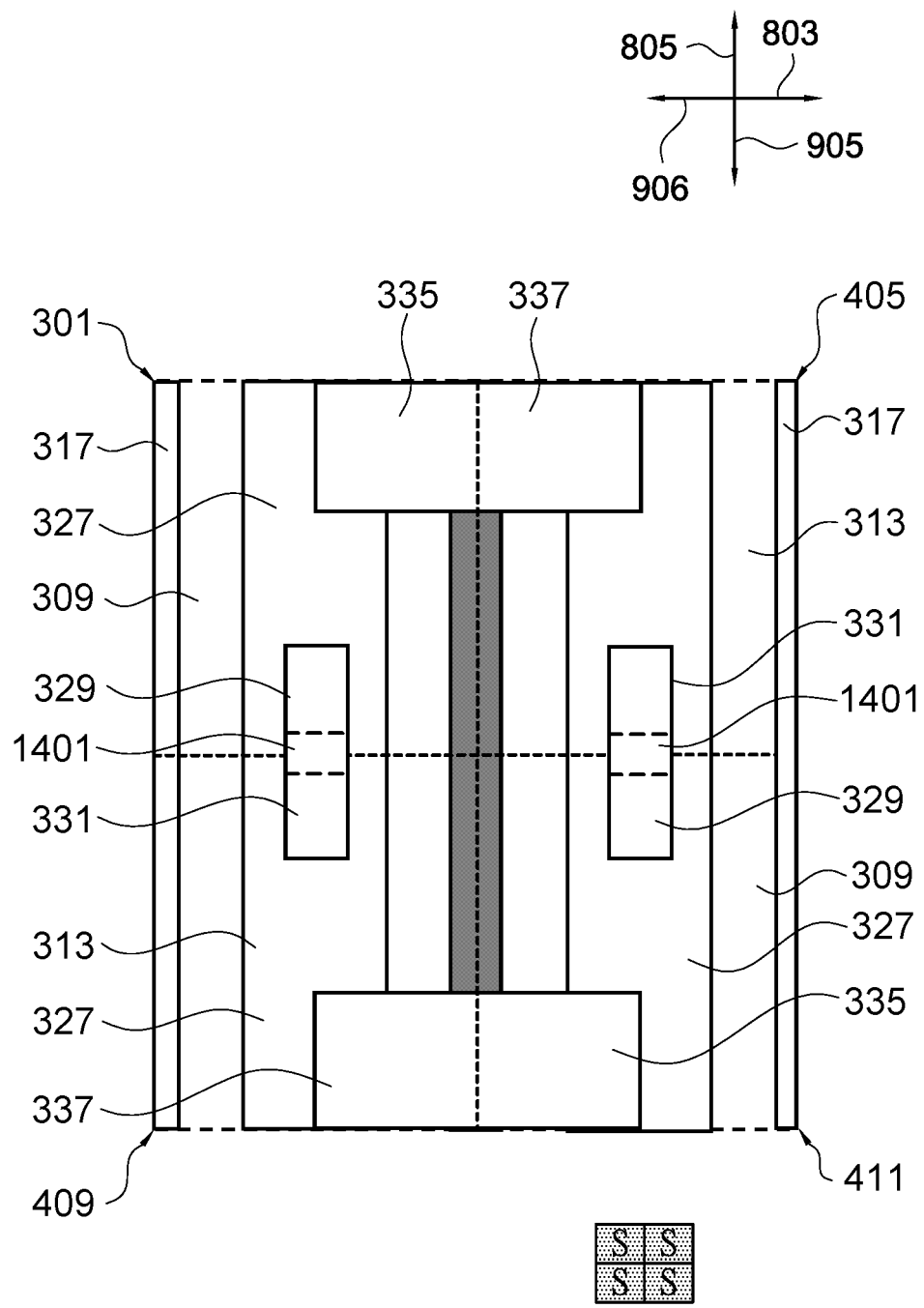
Figure 14B:
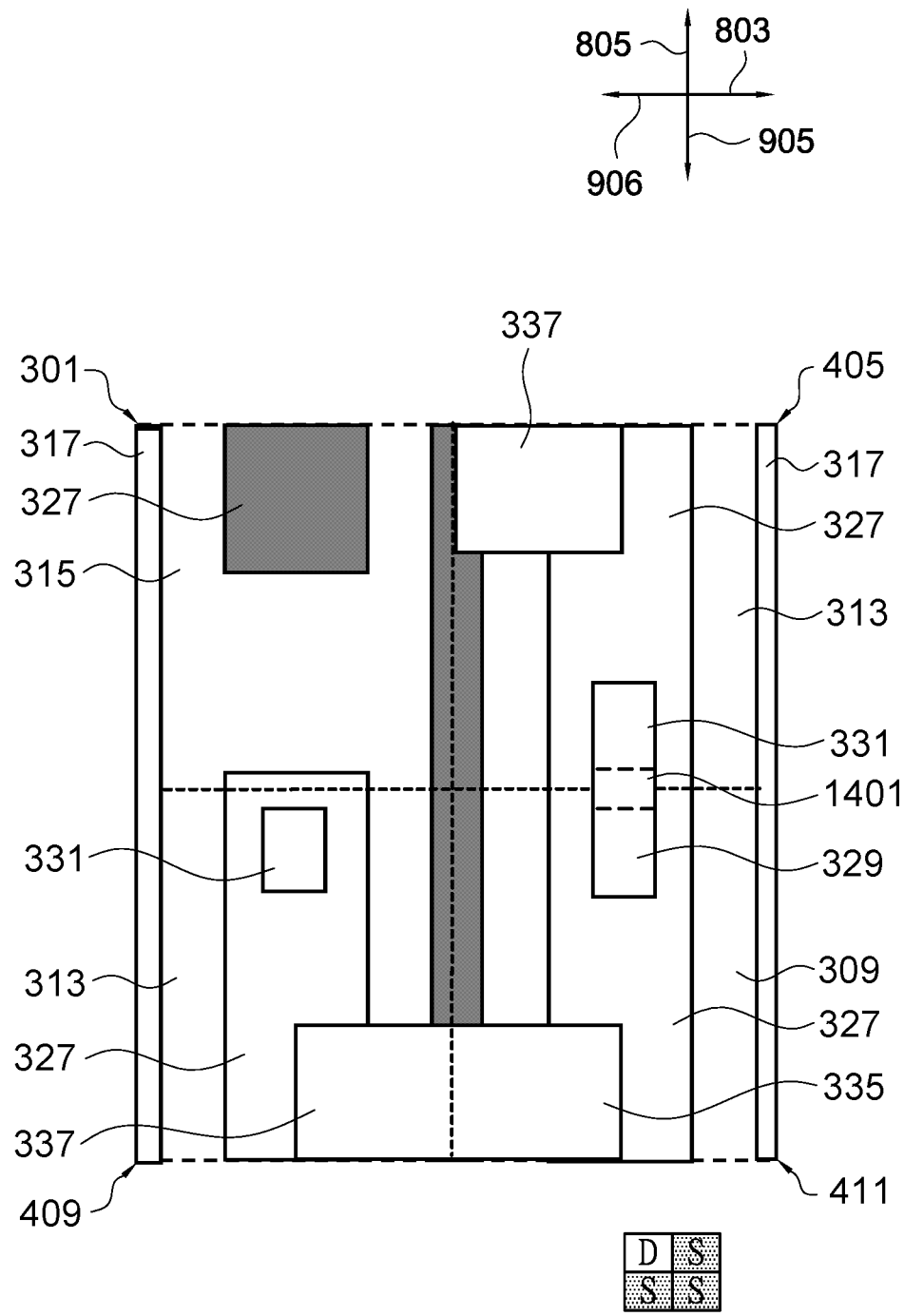
Figure 14C:
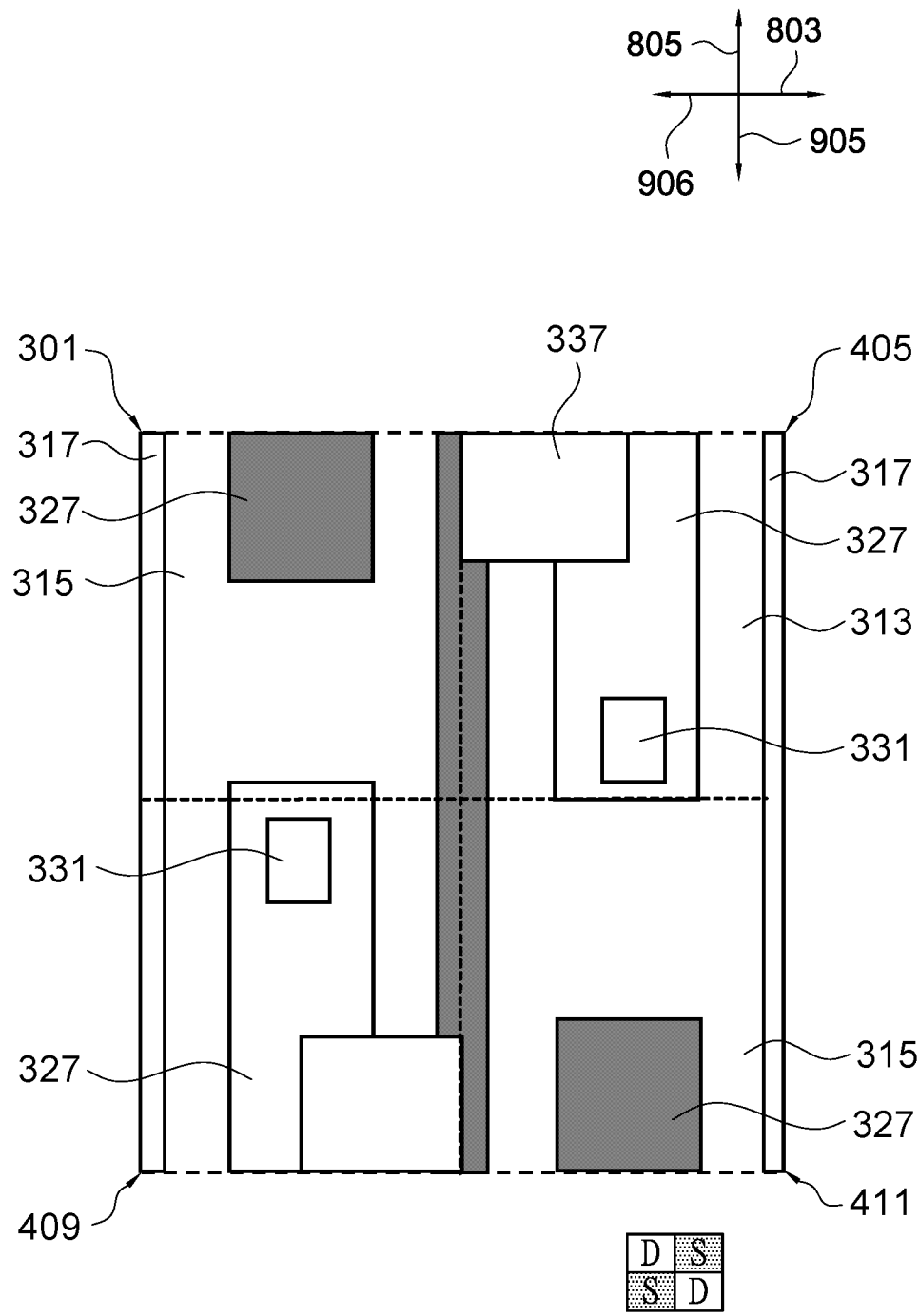
Figure 14D:
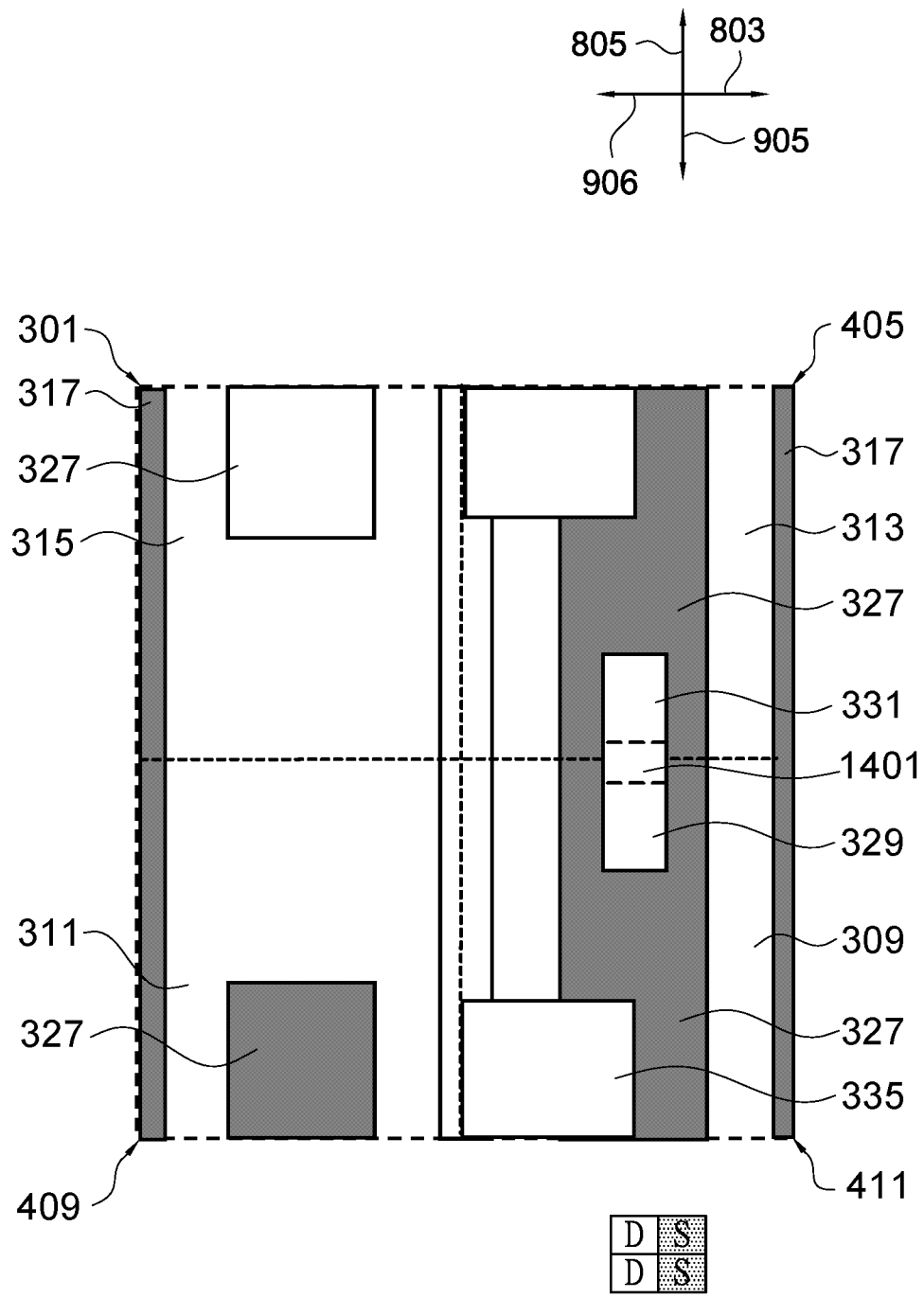
Figure 14E:
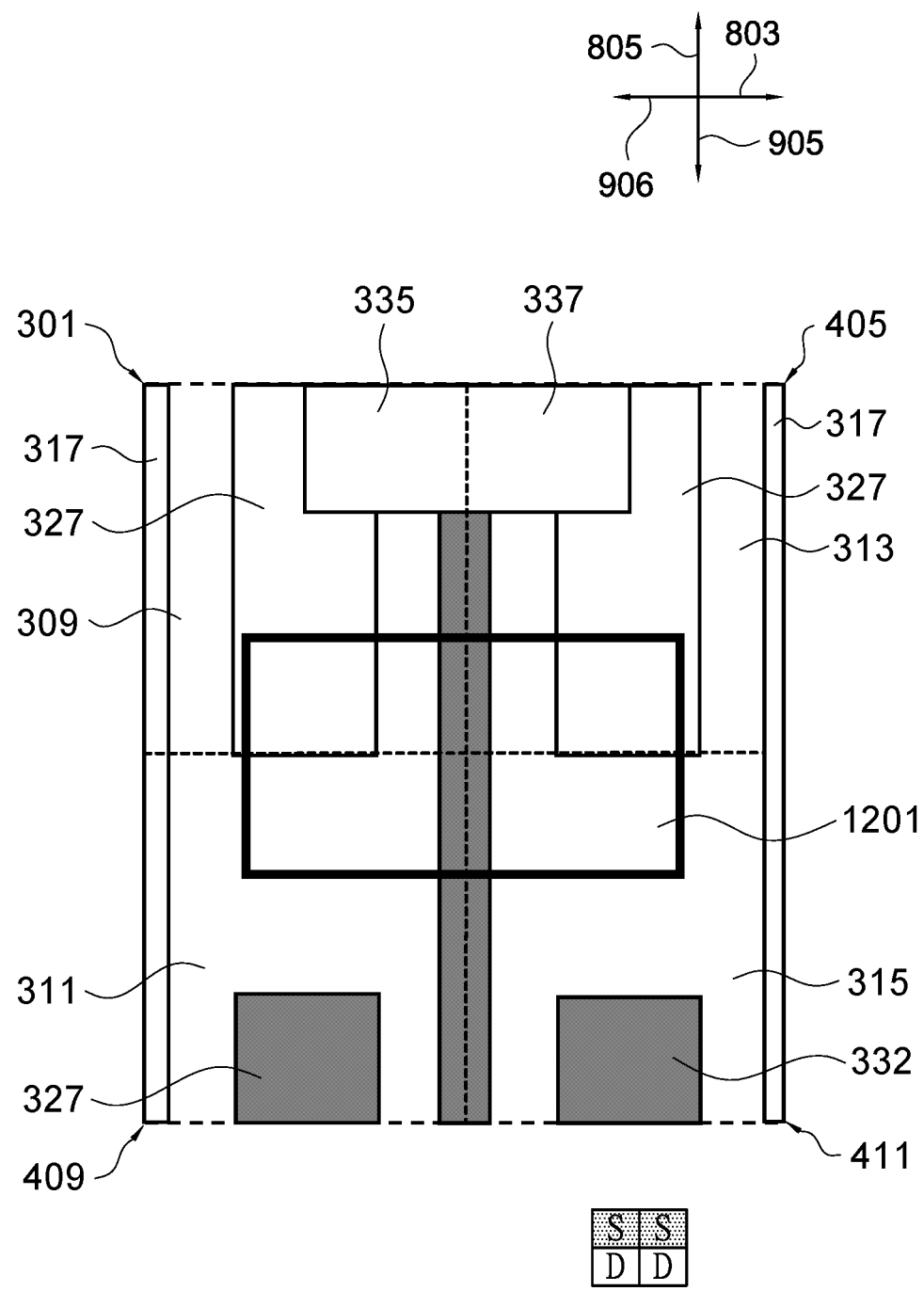
Figure 14F:
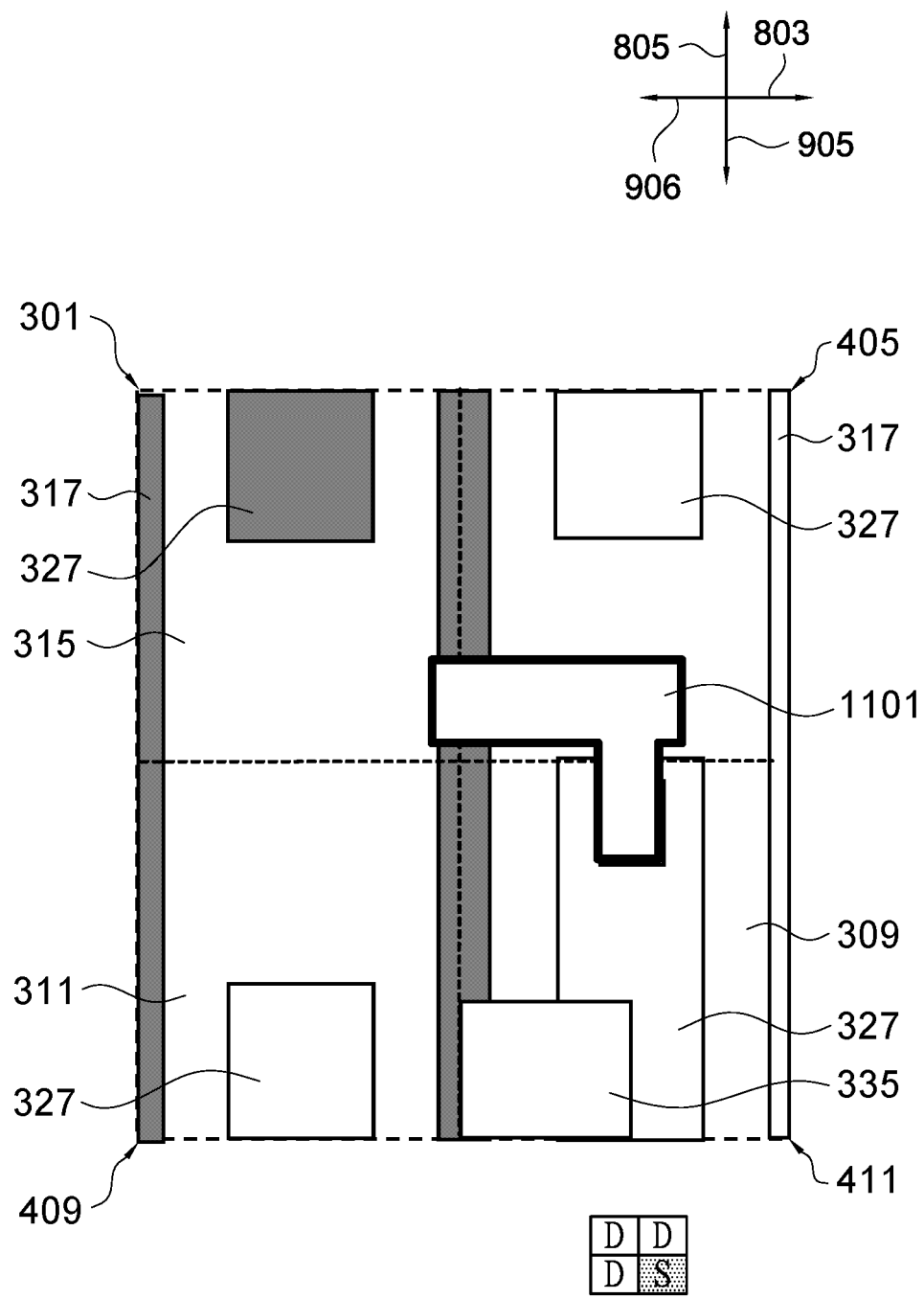
Figure 14G:
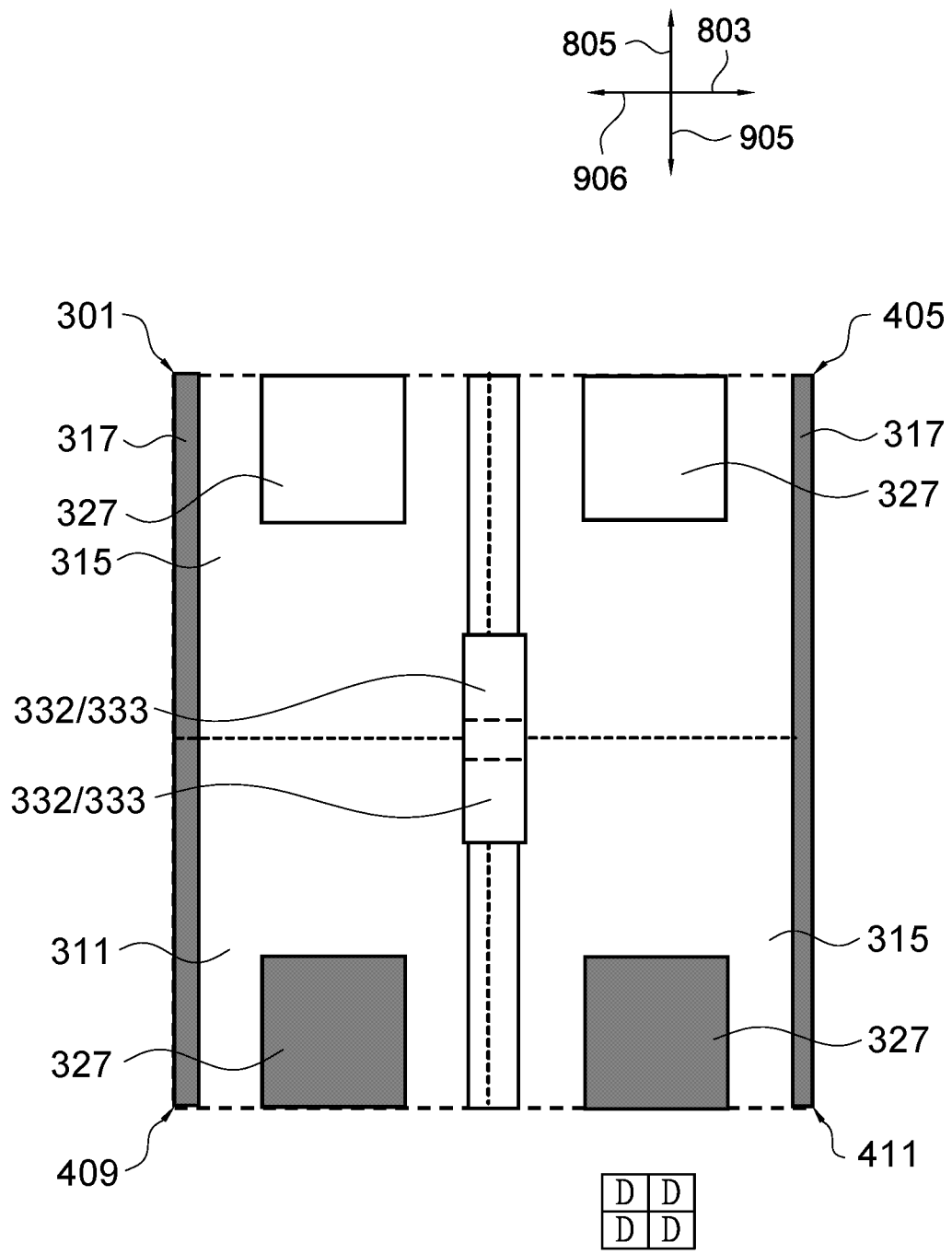

For example, in the embodiment illustrated in FIG. 14A, the merged vias (from the merged via from the first via 329 in the first cell 301 and the second via 331 in the third cell 409 and the merged via from the second via 331 in the second cell 405 and the first via 329 in the fourth cell 411) will be reduced in size back to their original size. In a particular embodiment in which the merged via is 20 nm×82 nm, this reduction will return the via back to 20 nm×80 nm.

Similarly, the merged via in the embodiment illustrated in FIG. 11B (the merged via from the second via 331 in the second cell 405 and the second via 331 in the third cell 409) and the merged via in the embodiment illustrated in FIG. 11D (the merged via from the second via 441 in the second cell 405 and the first via 329 in the fourth cell 411) may also be reduced in size back to their original size. However, the merged portion of the vias are retained (as represented in FIG. 14A by the merged portion 1401 highlighted by the dashed line)

FIGS. 14A-14G also illustrate with the thirteenth step 1513 that the consolidated vias are incorporated into the design of the first cell 301, the second cell 405, the third cell 409, and the fourth cell 411. For example, the consolidated vias that have been merged or otherwise modified by the post layout treatment 215 are fully incorporated back into the overall design.

Additionally, at this stage, once the consolidated vias are incorporated back into the design, the first marker layer 701, the second marker layer 702, and the third marker layer 703 may be removed. By this removal, the first marker layer 701, the second marker layer 702, and the third marker layer 703 are not incorporated into the final design, although they were utilized to help determine the final design.

Figure 15:
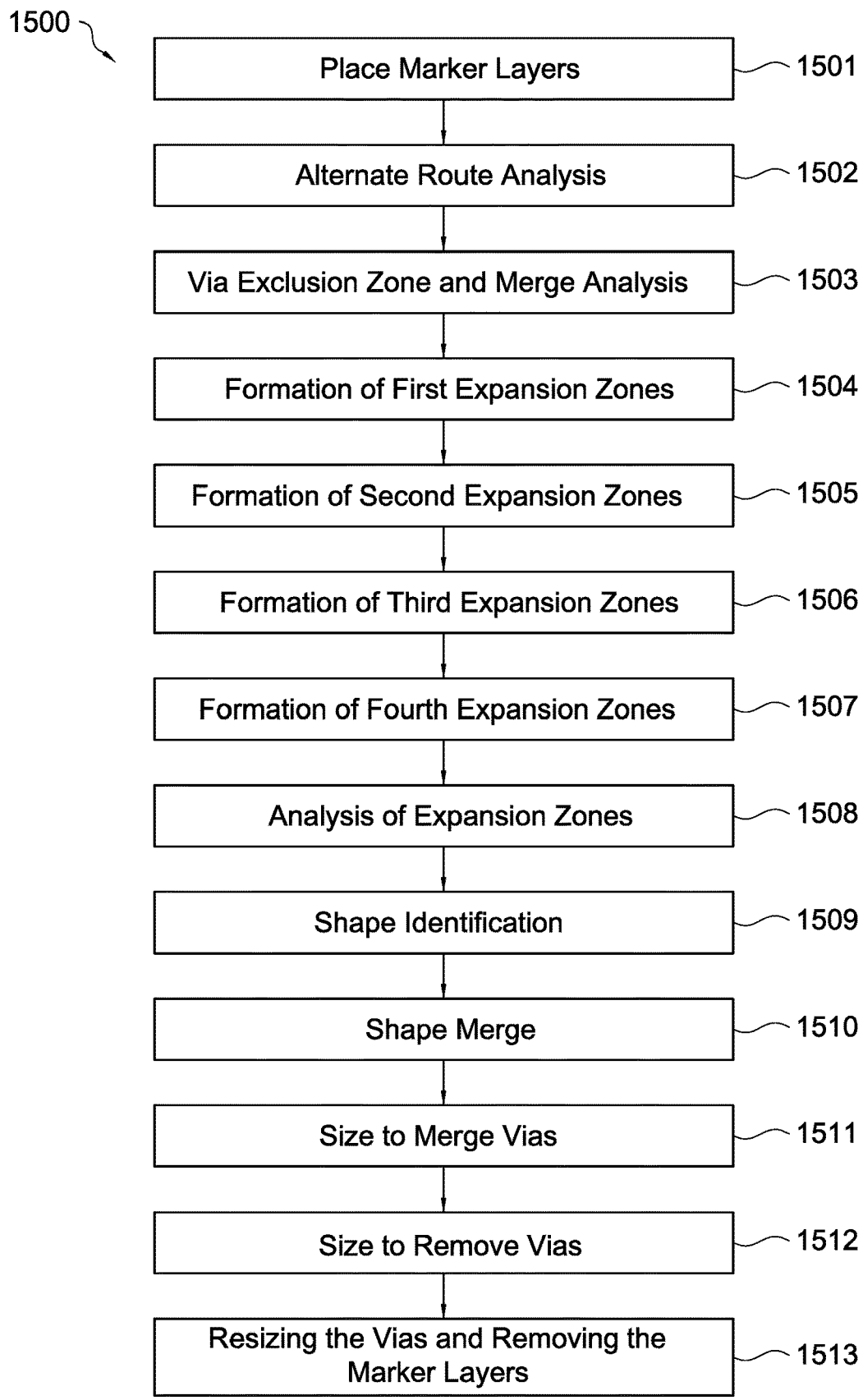
FIG. 15 illustrates a process flow diagram for the post-placement treatment in accordance with some embodiments.
Figure 16C:
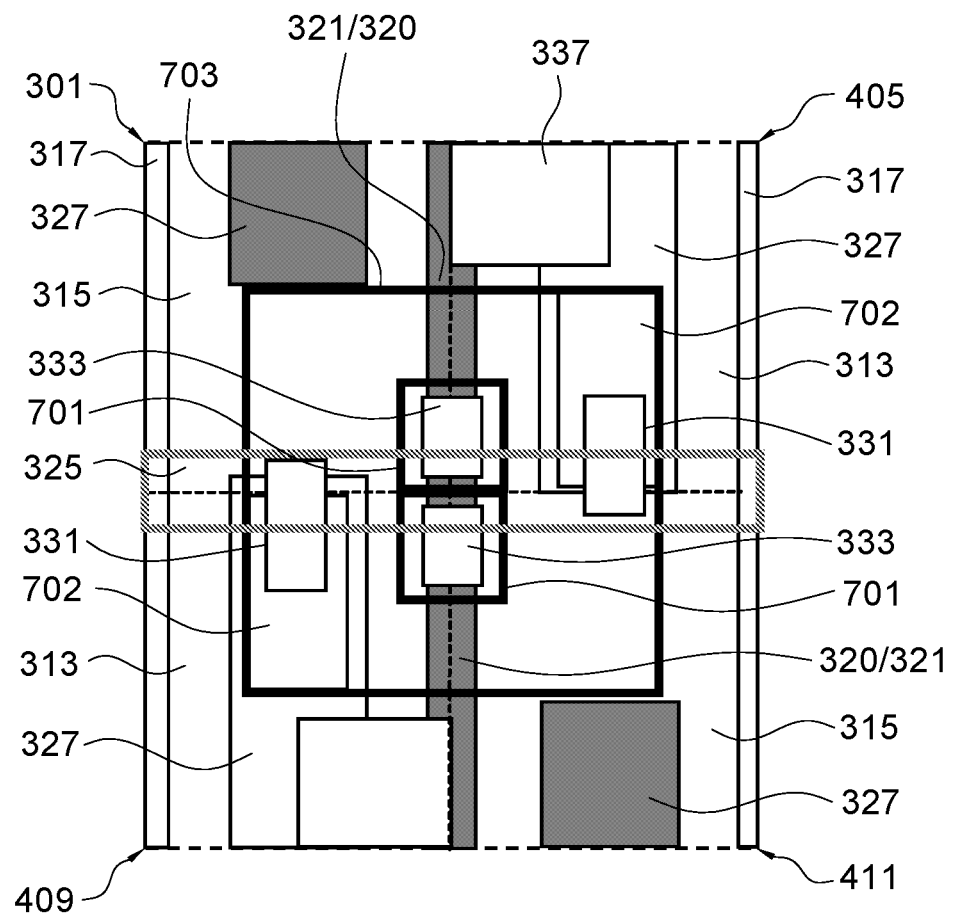
FIGS. 16A-25G illustrate a second process flow for the post-placement treatment in accordance with some embodiments.
Figure 16F:
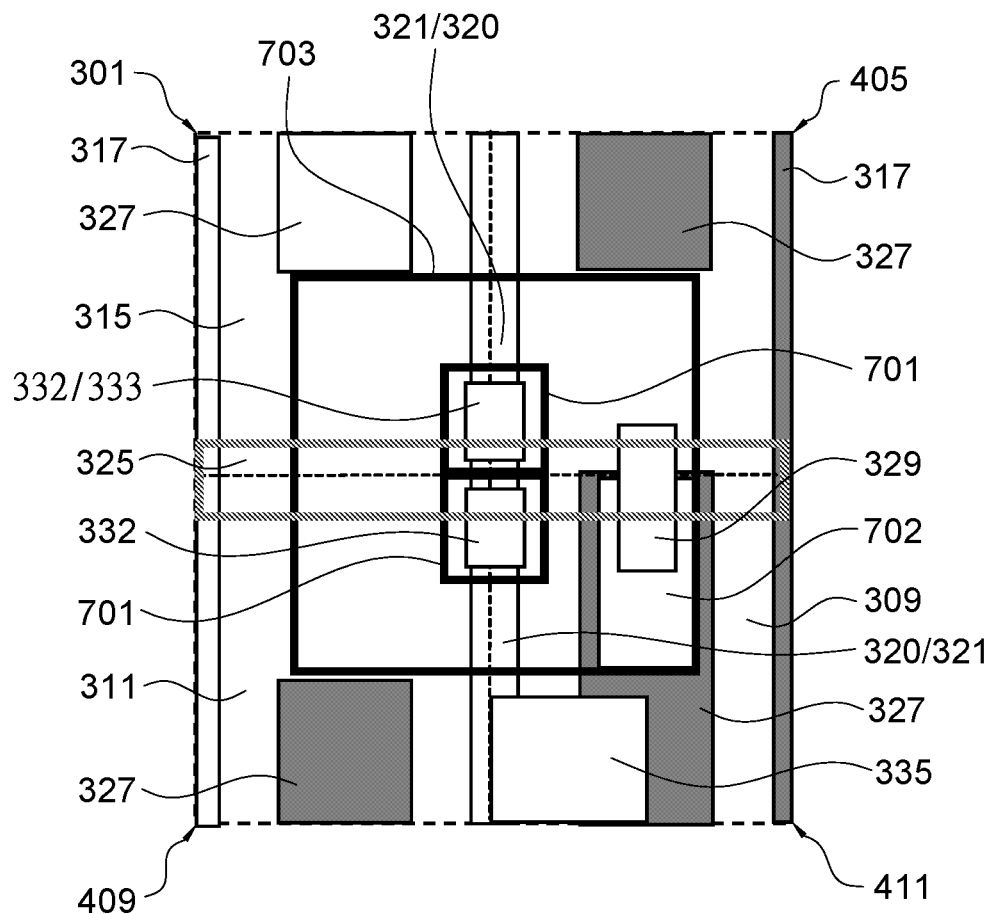
Figure 16G:
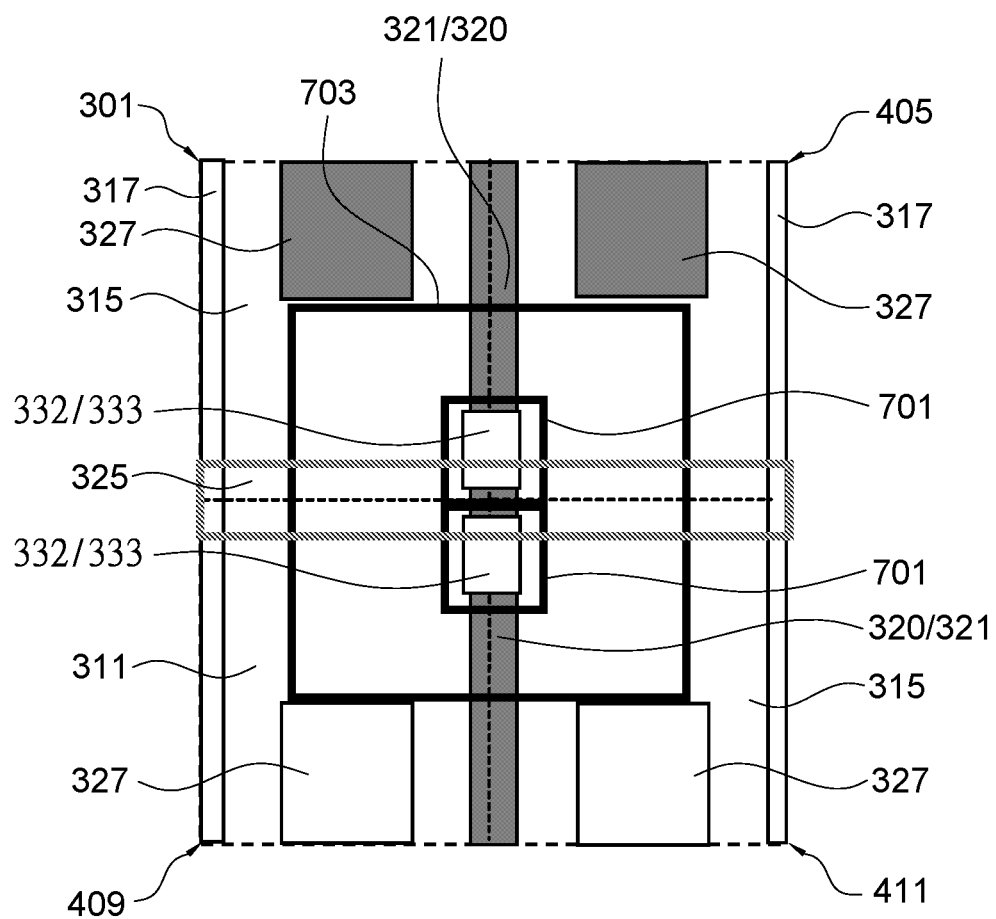

FIG. 15 illustrates a process flow 1500 for one embodiment of the post layout treatment 215 as described above with respect to FIGS. 7A-14G. In the first step 1501, the first marker layer 701, the second marker layer 702, and the third marker layer 703 are placed. In the second step 1502 the vias identified by the second marker layer 702 are analyzed to determine if there is an alternate route to the power rail 323 or the ground rail 325. In the third step 1503 an identification of vias overlaid by the first marker layer 701 that may be merged with vias identified by the second marker layer 72 are identified.

In the fourth step 1504 the first expansion zones 901 are generated, and in the fifth step 1505 the second expansion zones 903 are generated. Additionally, in the sixth step 1506 the third expansion zones 907 are generated and, in the seventh step 1507 the fourth expansion zones 909 are generated. In the eighth step 1508 the expansion zones are analyzed. In the ninth step 1509 shapes are identified from the expansion zones. In the tenth step 1510 the shapes are merged together.

In the eleventh step 1511, the remaining vias are sized to merge the vias. In the twelfth step 1512 the vias are sized in order to remove the vias that are redundant. In the thirteenth step 1513, the vias are resized and incorporated into the design, and the marker layers (e.g., the first marker layer 701, the second marker layer 702, and the third marker layer 703) are removed.

By performing the post layout treatment 215 as described above, congestion around the abutments of the cells may be alleviated such that the congestion does not prevent further shrinking of the overall design, while still maintaining the electrical connections to the cell boundary conductors that help to prevent interference between neighboring cells. As such, the post layout treatment 215 allows an additional poly pitch (that had been introduced) to be avoided, for a more efficient process.

FIGS. 16A-24 illustrate another embodiment of the post layout treatment 215 which performs the treatment on cell layouts in which the vias may actually extend across the power rails 323 and/or ground rails 325, such that, when the individual cells are placed within the cell rows (e.g., the first cell row 401 and the second cell row 403), the vias may extend into the adjoining cell. For example, in looking at the embodiment illustrated in FIG. 16A, the first via 329 in the first cell 301 extends across the ground rail 325 and, as such, actually extends across the cell boundary of the first cell 301 and into the third cell 409. Similarly, the second via 331 in the third cell 409 will also extend across the cell boundary of the third cell 409 such that the second via 331 in the third cell 409 will overlap with the first via 329 in the first cell 301. Additionally, looking at the second cell 405 and the fourth cell 411, the second via 331 in the second cell 405 and the first via 329 in the fourth cell 411 will also overlap when the individual cells are placed in to the cell rows.

In one embodiment, in order to perform the post layout treatment 215 on such a layout, the first step 1501 is performed as discussed above with respect to FIG. 7A-7G by placing portions of the first marker layer 701, portions of the second marker layer 702, and portions of the third marker layer 703 over the design. Additionally, the second step 1502 may also be performed to identify those vias that were previously overlaid by the first marker layer 701 and also has an alternate route to the power rail 323 or the ground rail 325.

FIGS. 17A-17G illustrate a modified third step 1503' that takes into account the vias that extend across the cell boundaries. In particular, with regards to those vias that extend across the cell boundaries, these vias are reduced in size such that they no longer cross the boundary between the cells. In the embodiment illustrated in FIG. 17A, the first via 329 in the first cell 301 is reduced in size by a distance to bring it either back to or back across the boundary of the first cell 301. In a particular embodiment in which the first via 329 has a vertical dimension of 46 nm and extends 9 nm across into the third cell 409, the first via 329 is reduced in size by 9 nm to a vertical dimension of 37 nm, such that the first via 329 is within the first cell 301.

Figure 17A:
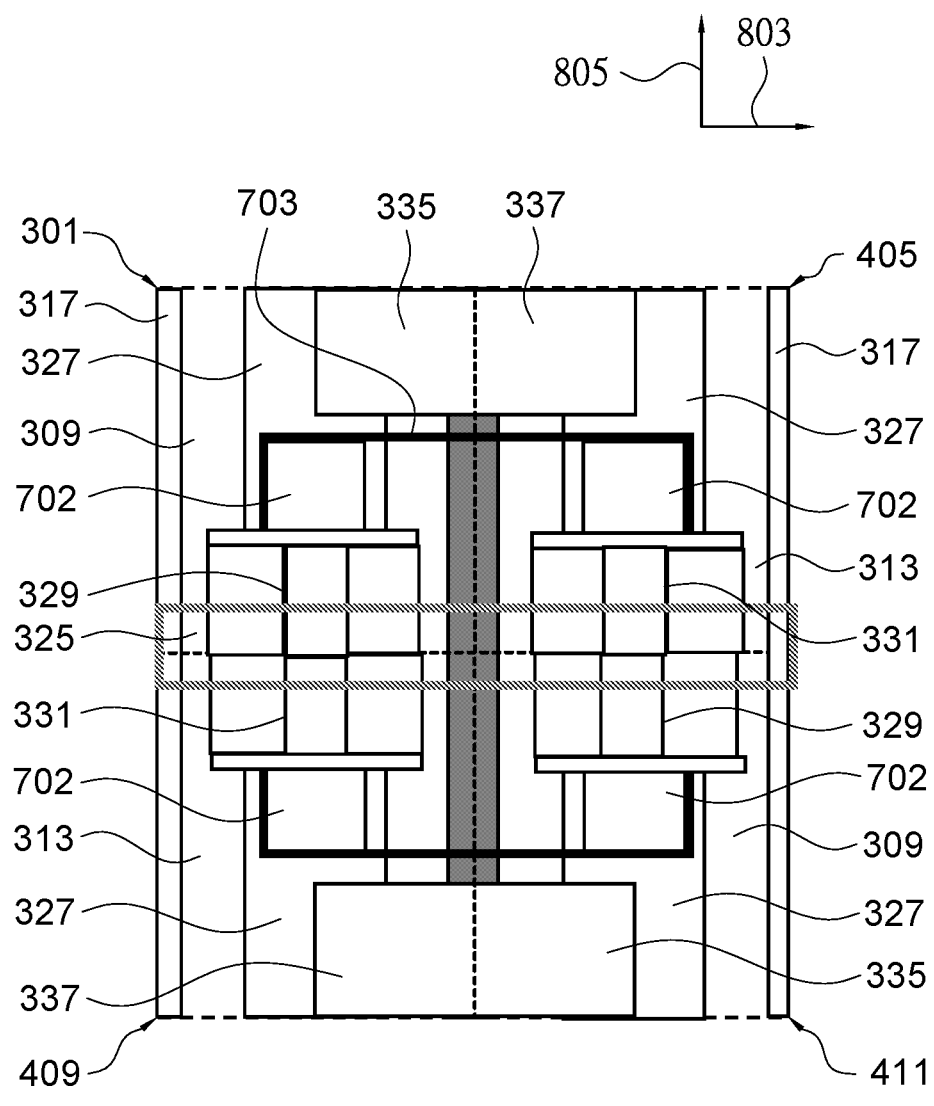
Figure 17B:
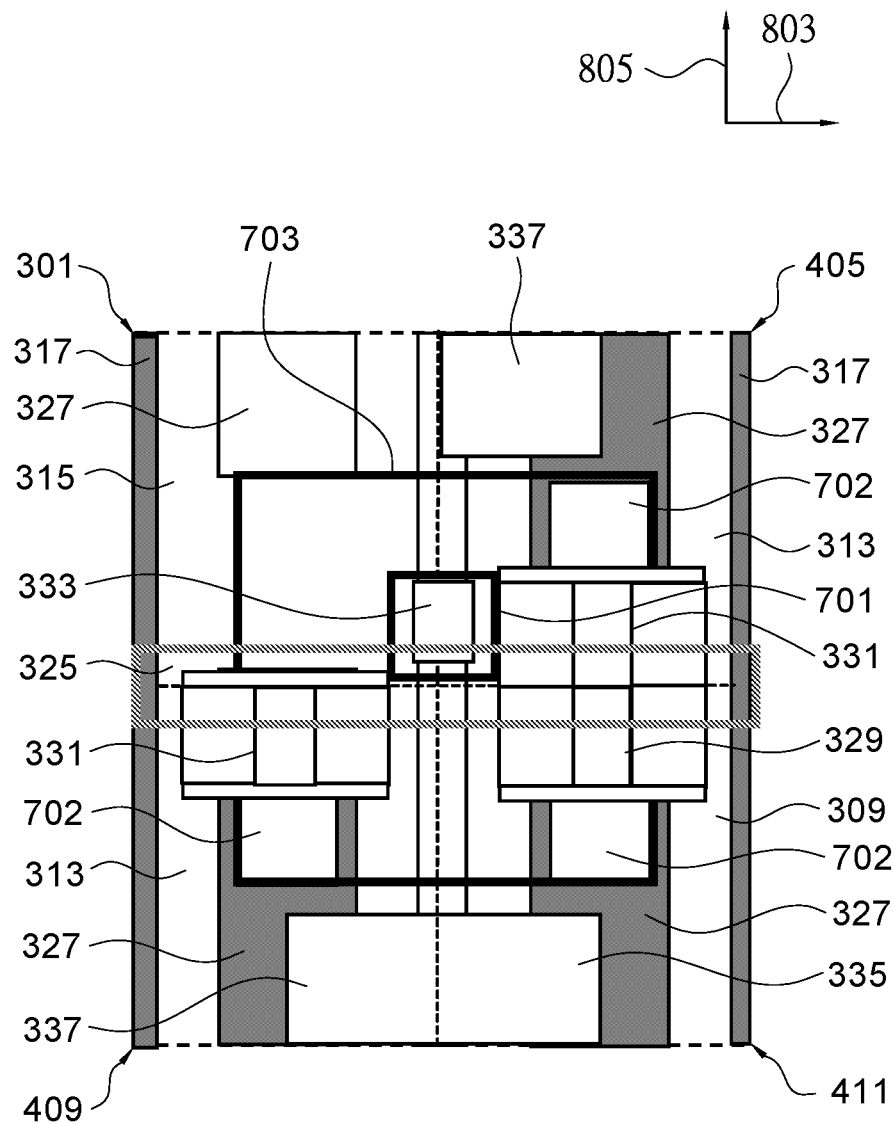
Figure 17C:
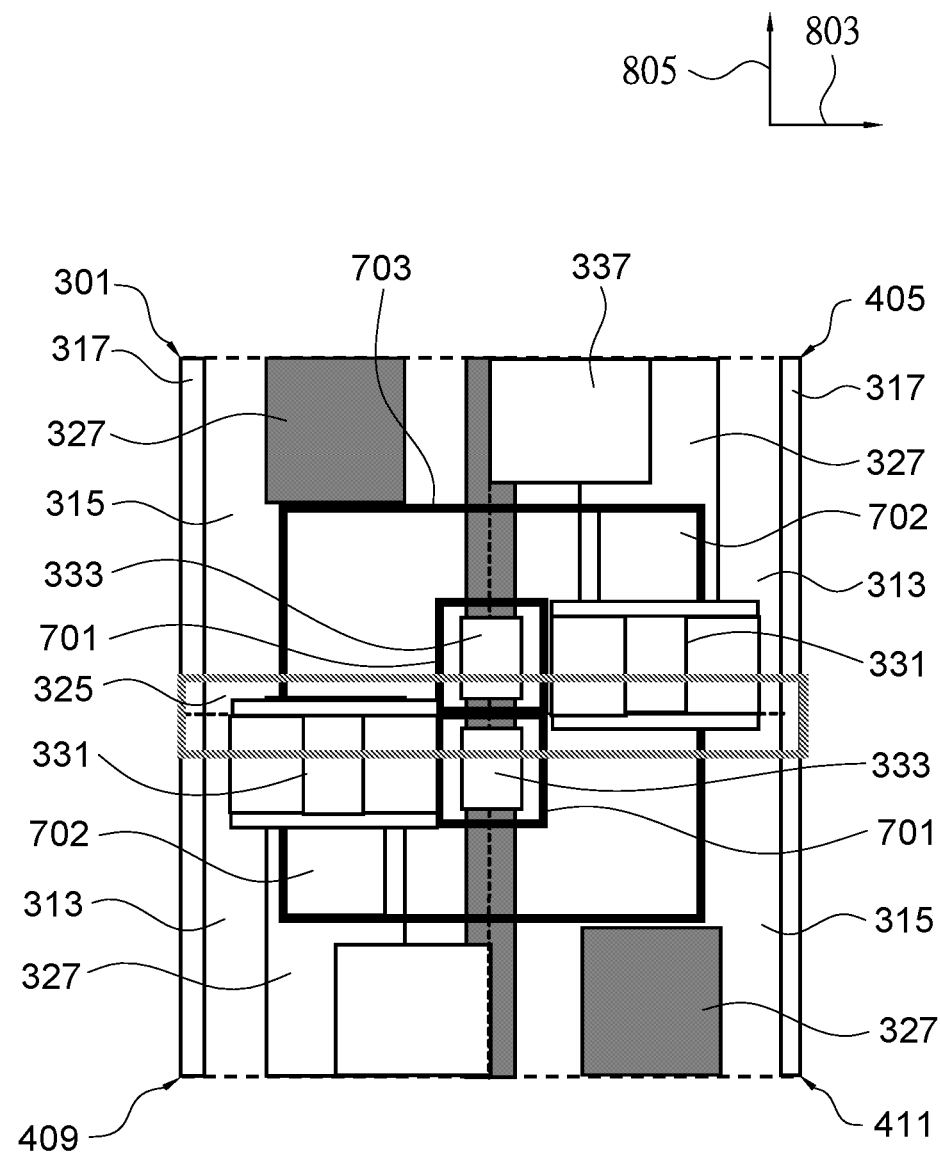
Figure 17D:
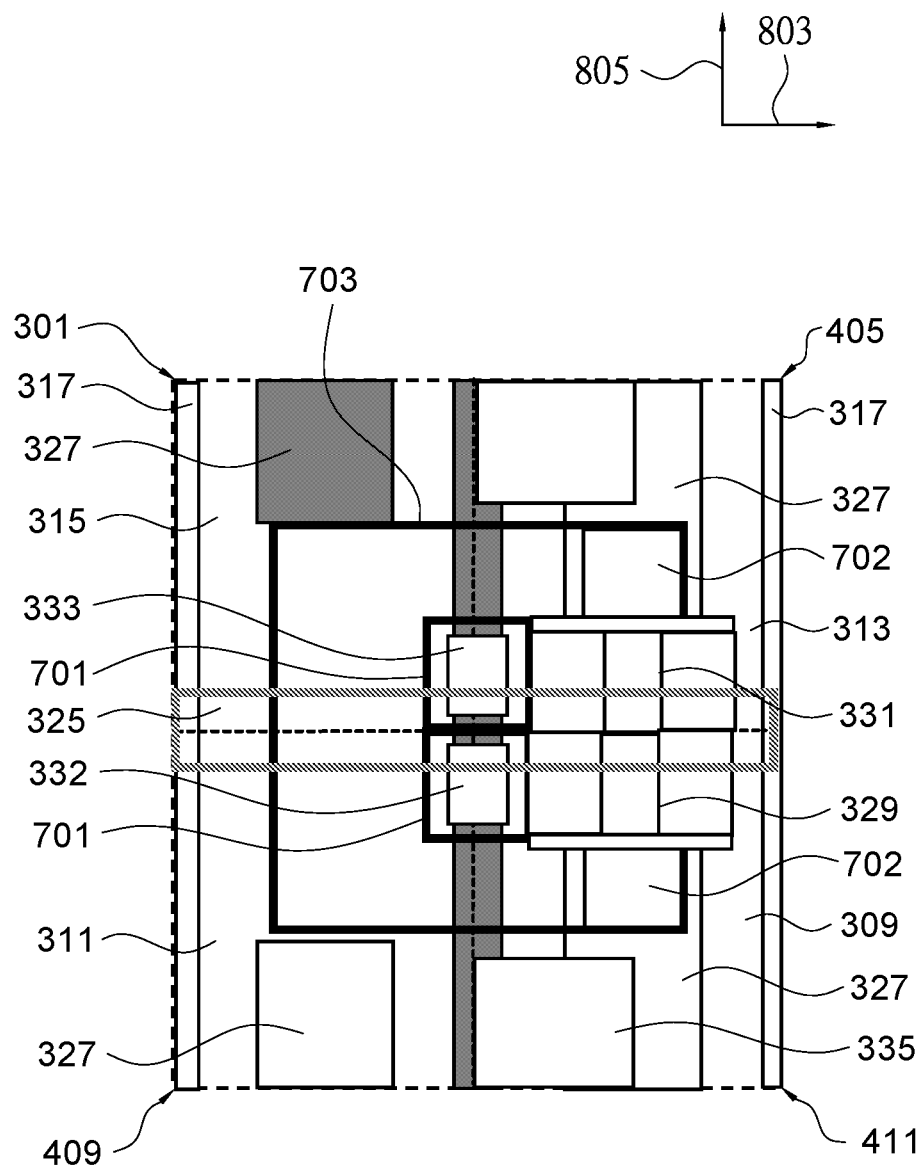
Figure 17F:
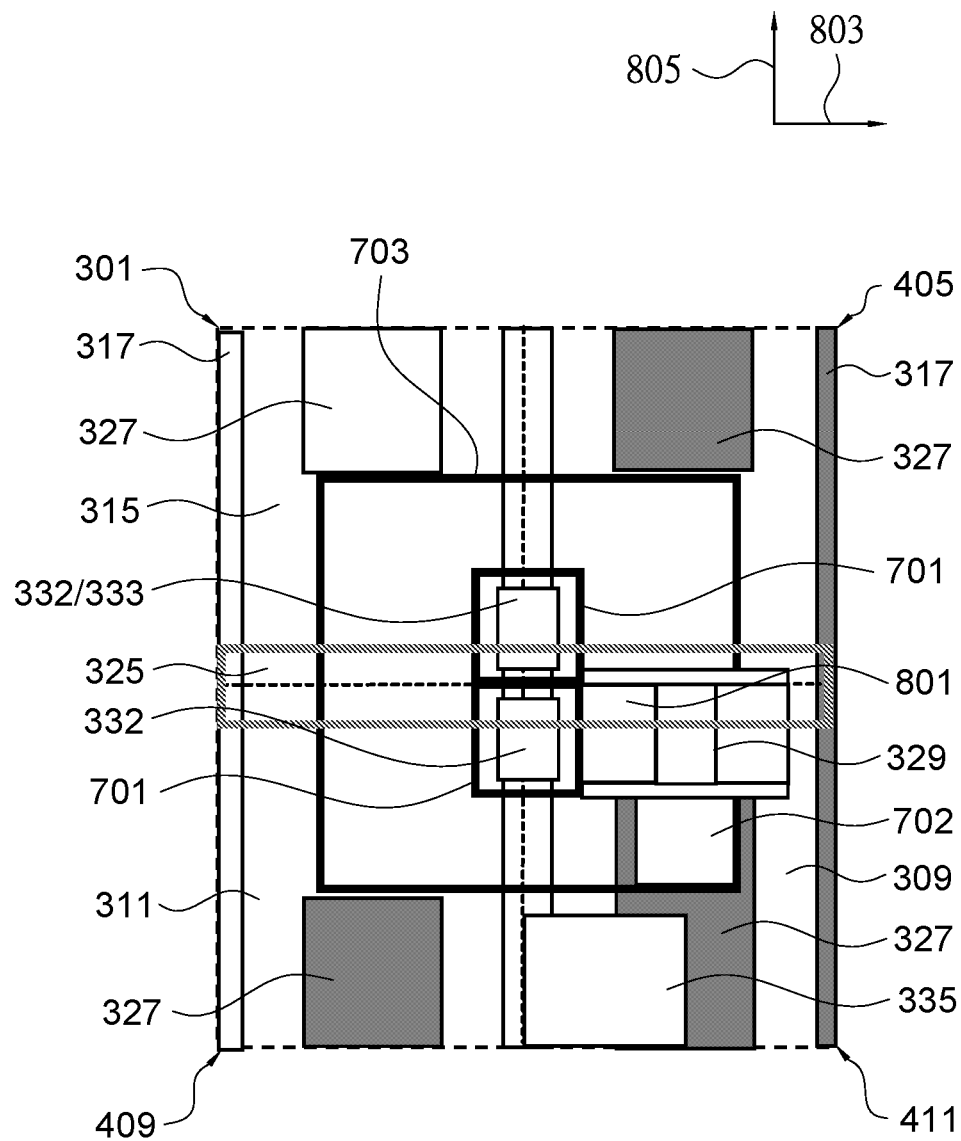
Figure 17G:
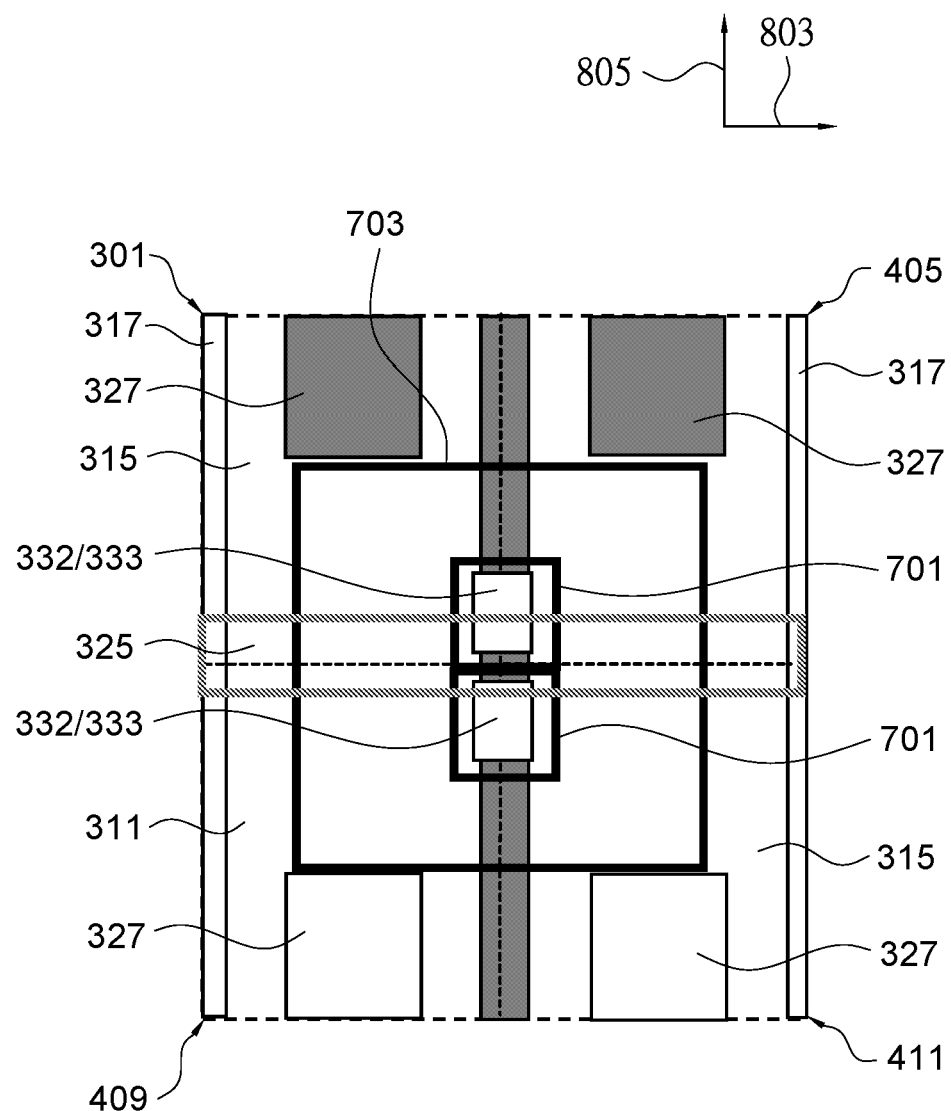
Figure 18A:
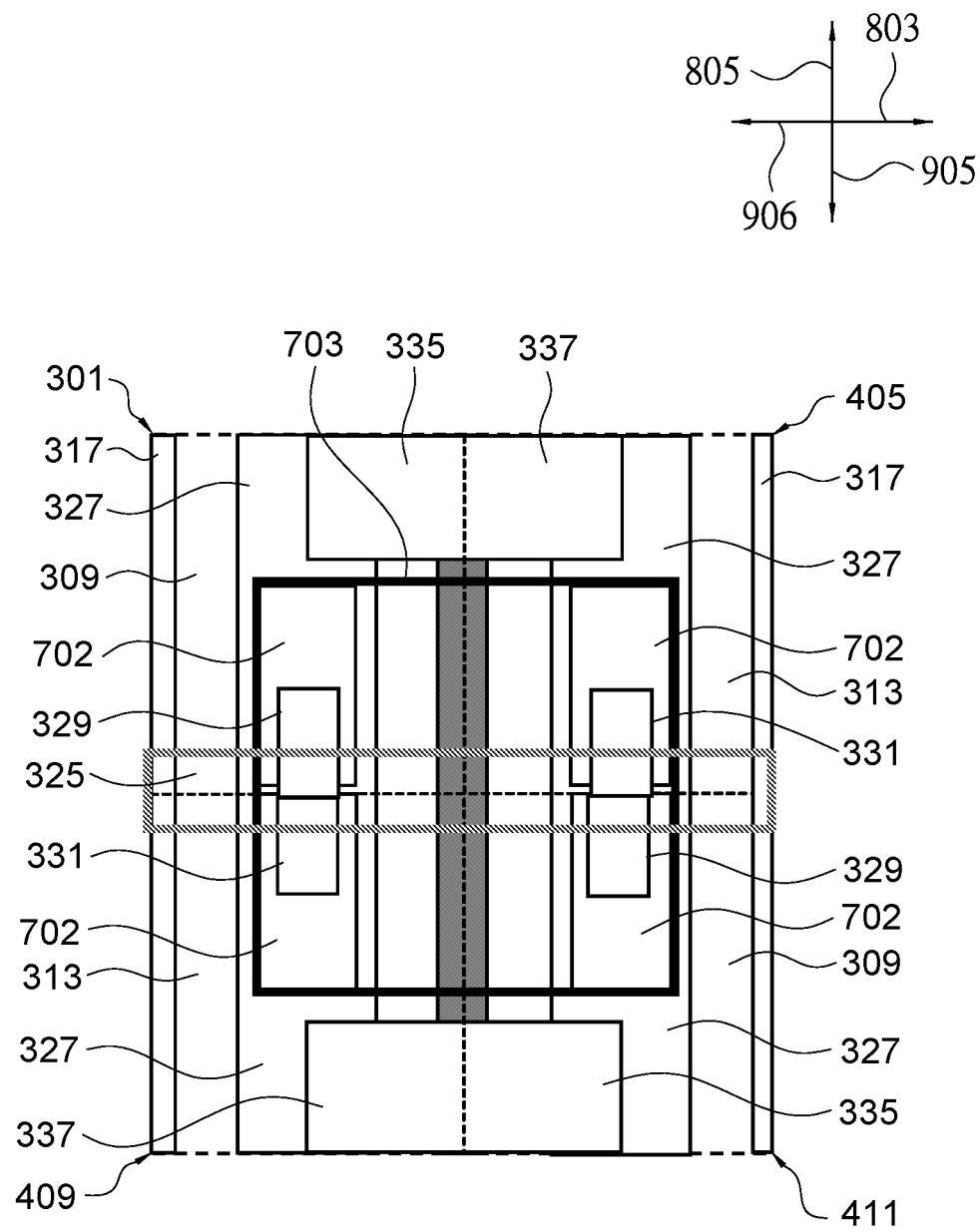
Figure 18B:
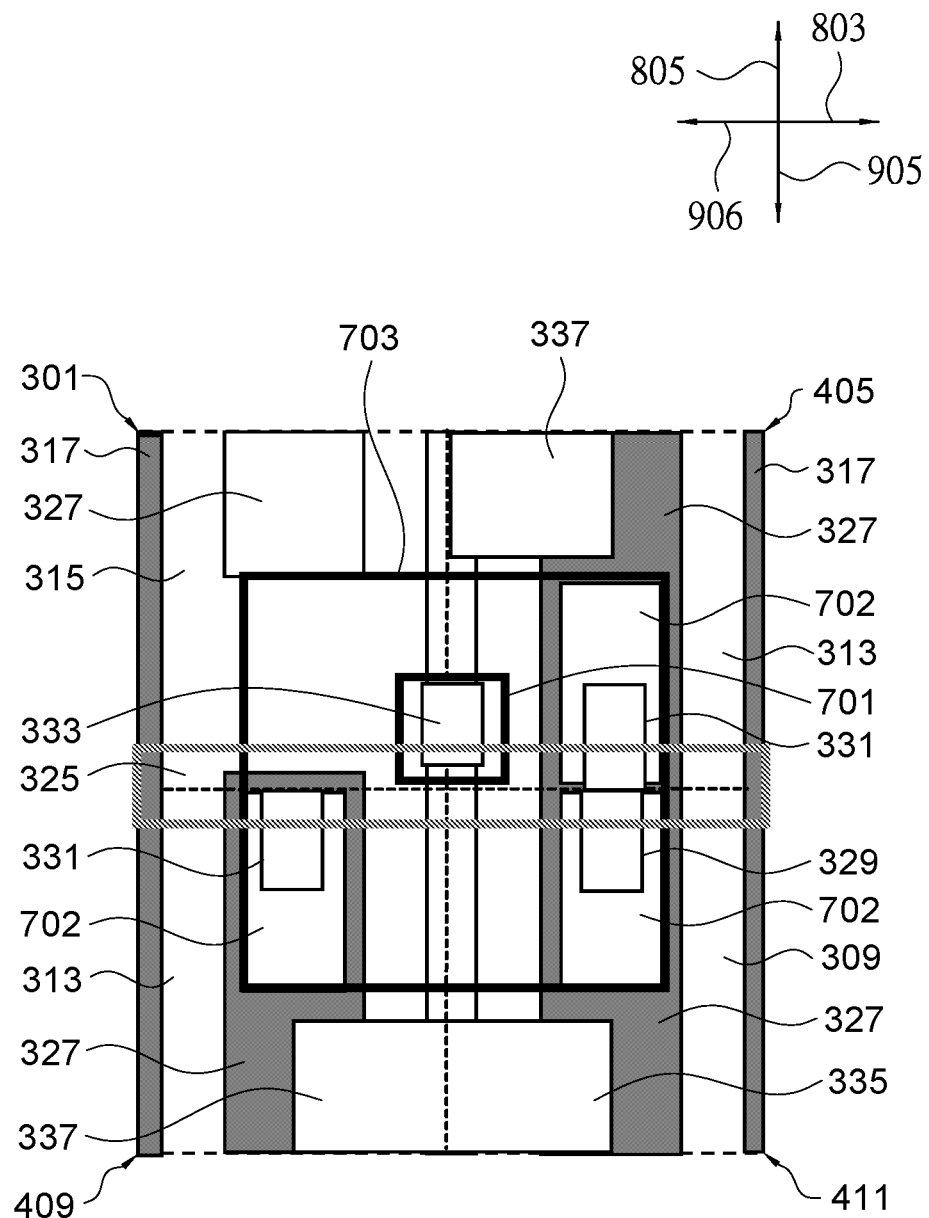
Figure 18C:
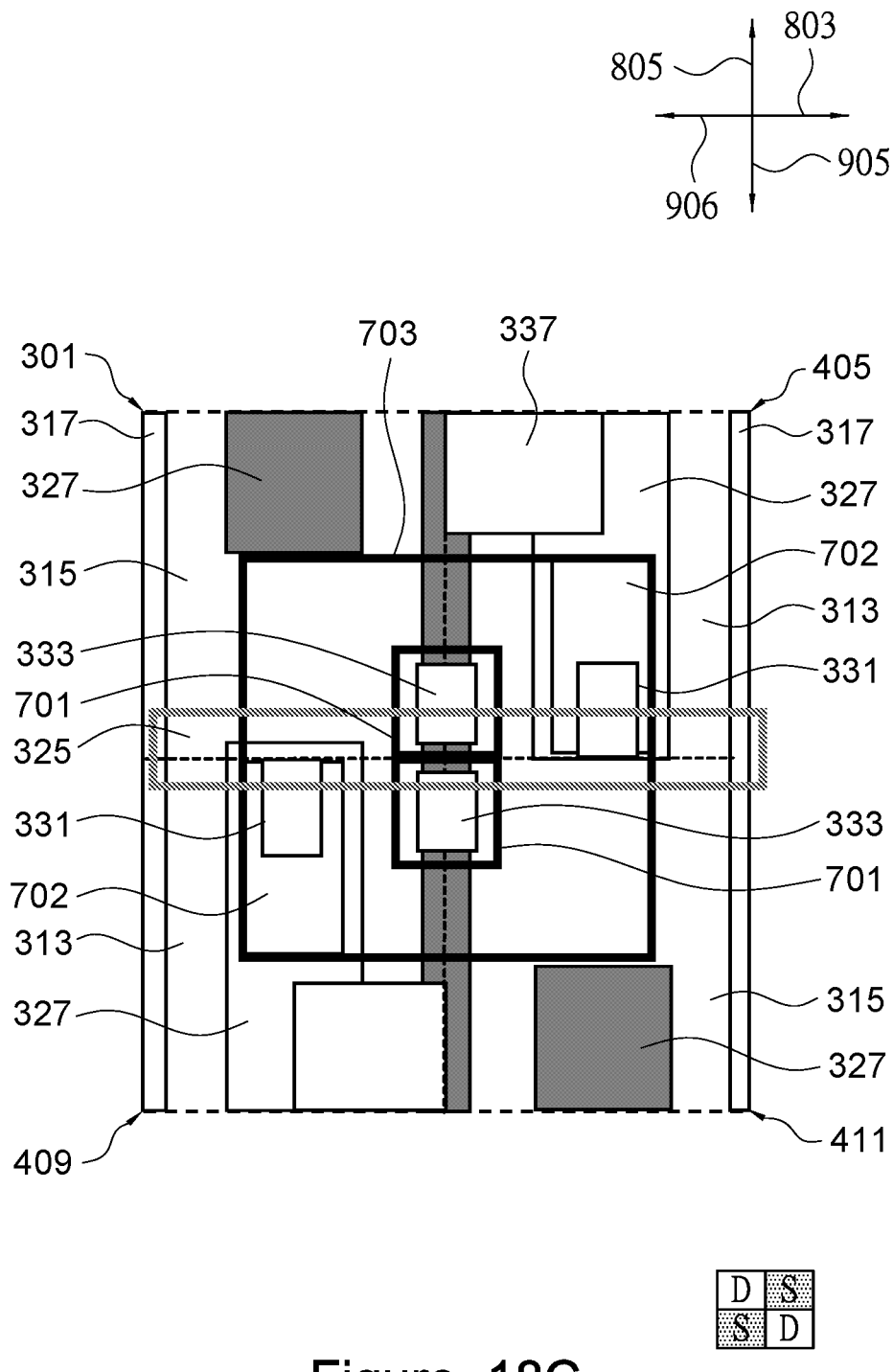
Figure 18D:
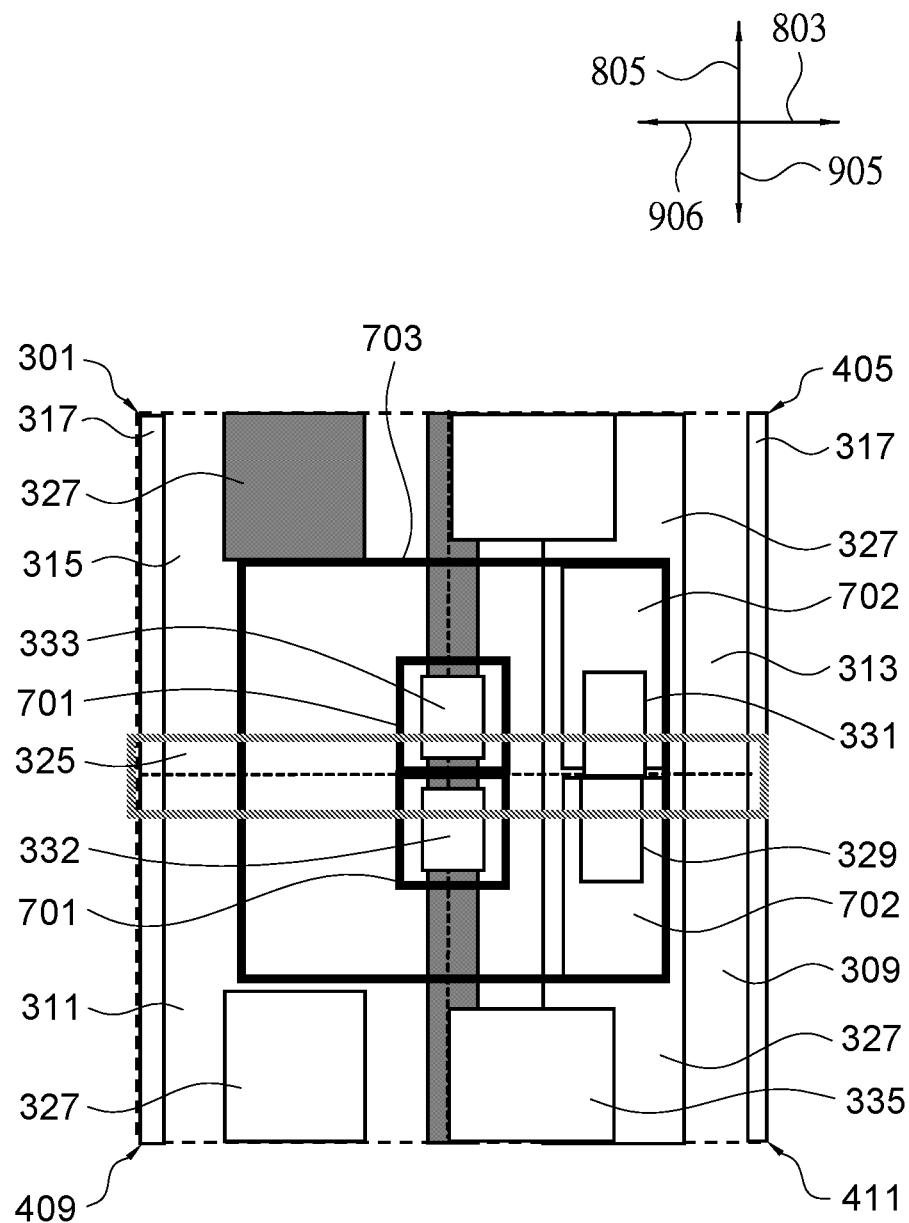
Figure 18E:
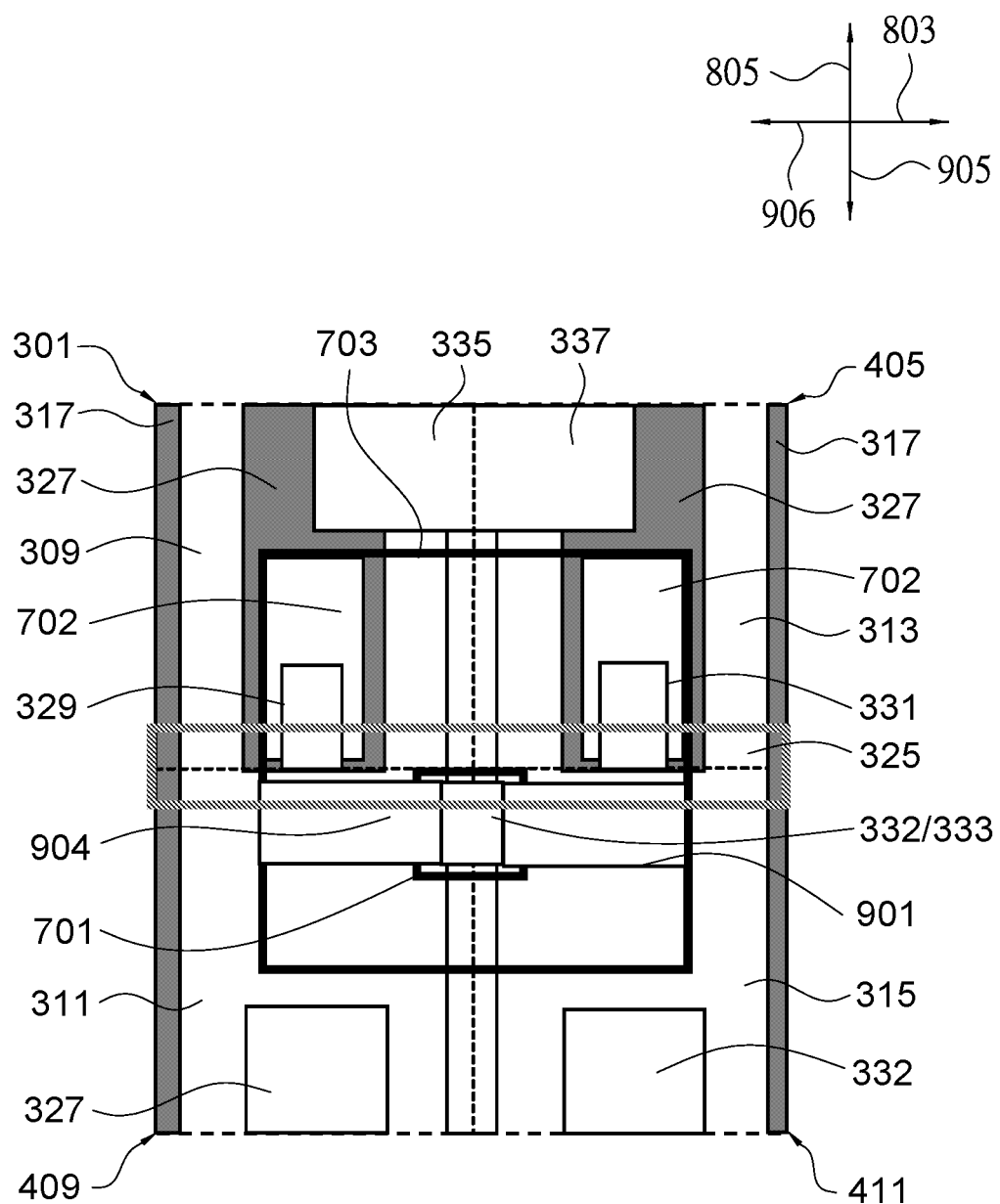
Figure 18F:
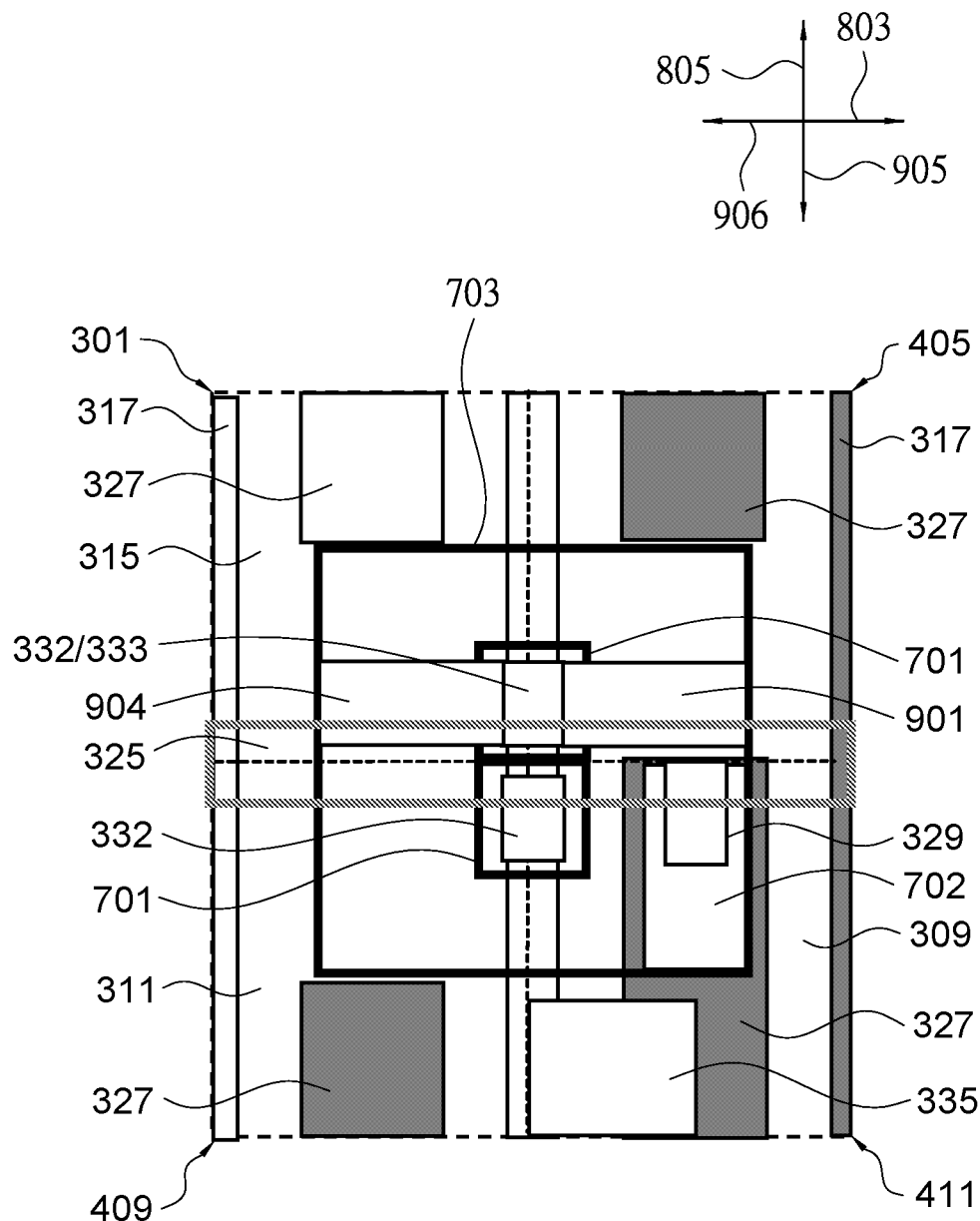
Figure 18G:
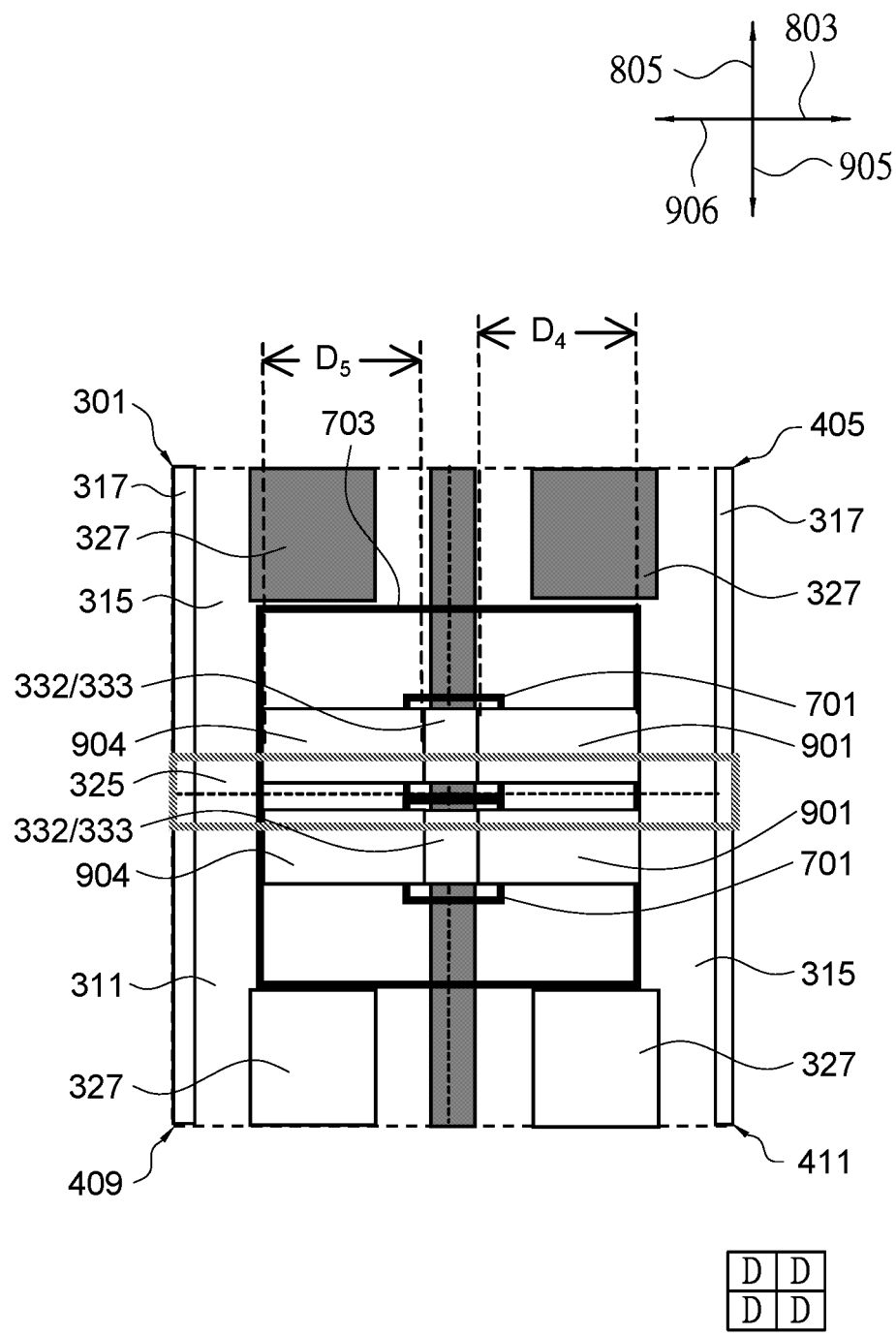

Similarly, looking at the embodiment illustrated in FIG. 17B, the second via 331 in the third cell 409, the second via 331 in the second cell 405, and the first via 329 in the fourth cell 411 are reduced in size such that the vias do not extend across the cell boundary. Looking at the embodiment illustrated in FIG. 17C, the second via 331 in the second cell 405 and the second via 331 in the third cell 409 are reduced in size. Looking at the embodiment illustrated in FIG. 17D, the second via 331 in the second cell 405 and the first via 329 in the fourth cell 411 are reduced in size. Looking next at the embodiment illustrated in FIG. 17E, the first via 329 in the first cell 301 and the second via 331 in the second cell 405 are reduced in size. Finally, looking at the embodiment illustrated in FIG. 17F, the first via 329 in the fourth cell 411 is reduced in size.

Once the various vias have been reduced in size, the remainder of the modified third step 1503 may be performed as described above with respect to FIGS. 8A-8G. In particular, the vias overlaid by the first marker layer 701 that may be merged with the vias overlaid by the second marker layer 702 are identified by forming the exclusion zones 801.

FIGS. 18A-18G illustrate the fourth step 1504 and the fifth step 1505. In particular, those vias identified in the third step 1503 are expanded in the first direction 803 and the third direction 906. In an embodiment the fourth step 1504 and the fifth step 1505 may be performed as described above with respect to FIGS. 9A-9G.

FIGS. 19A-19G illustrate the sixth step 1506 and the seventh step 1507, in which the via lands overlaid by the second marker layer 702 are extended in the second direction 805 and also extended in the fourth direction 905 in order to form the third expansion zones 907 and the fourth expansion zones 909 to determine the interaction between the expanded vias. However, because the vias that originally extended across the cell boundaries have already been reduced, those particular vias are expanded a different amount than the remainder of the vias.

Figure 19A:
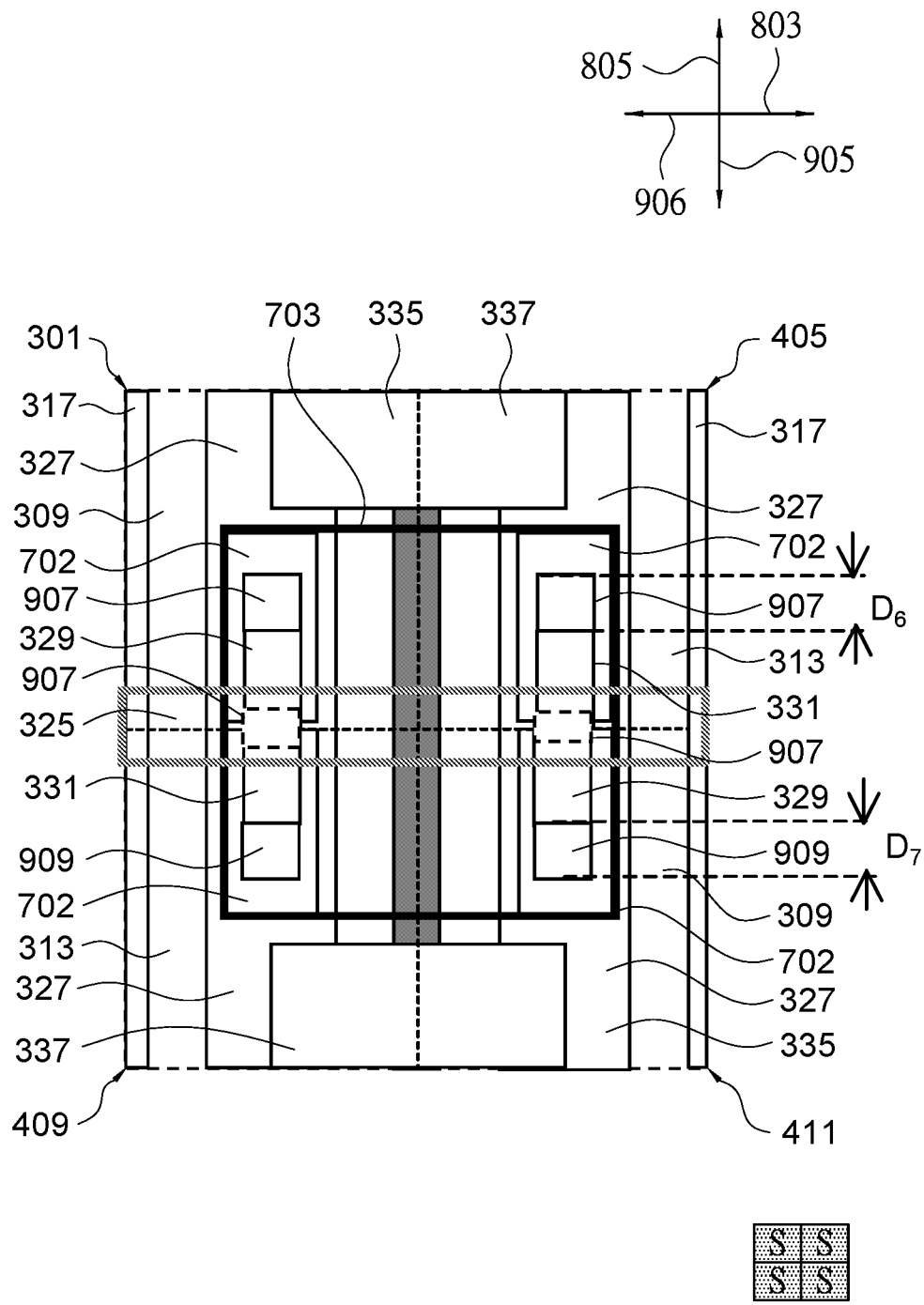
Figure 19B:
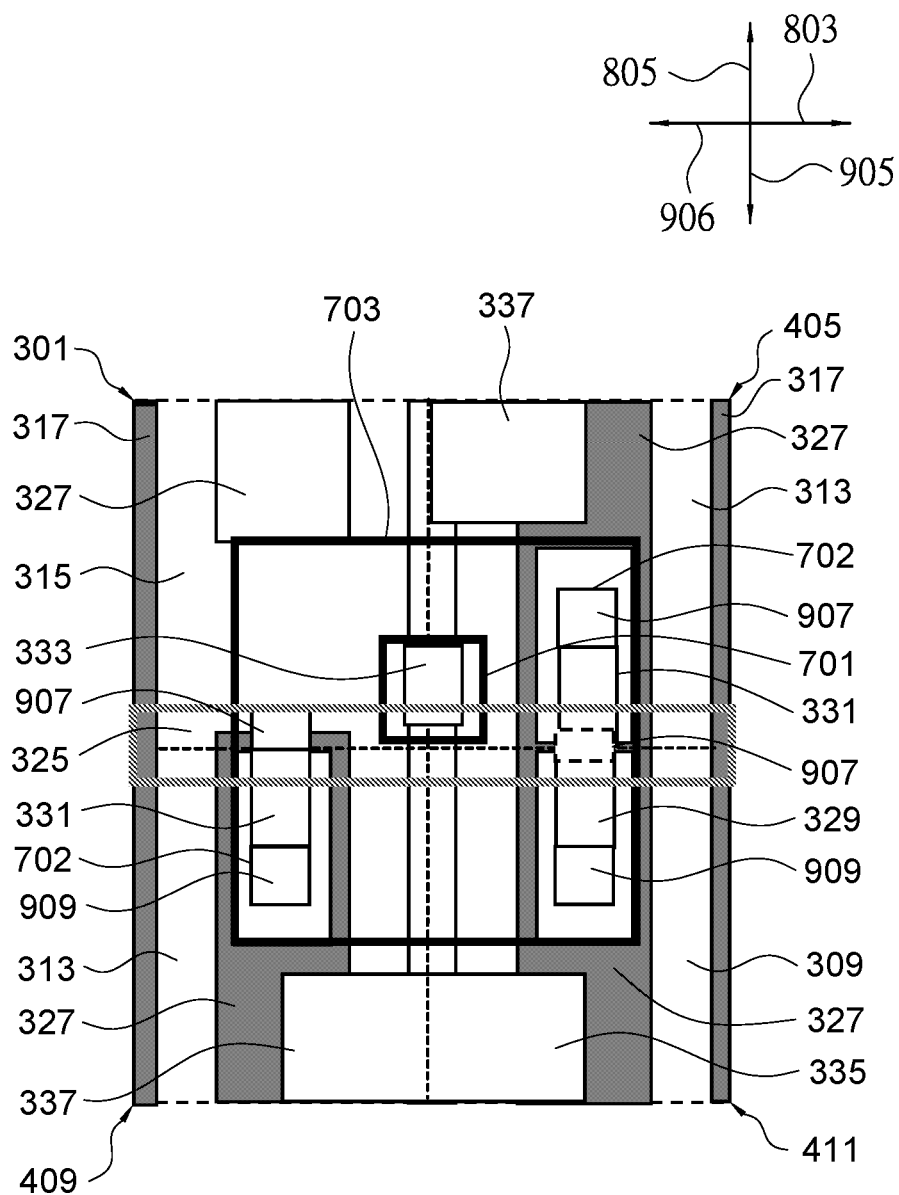
Figure 19C:
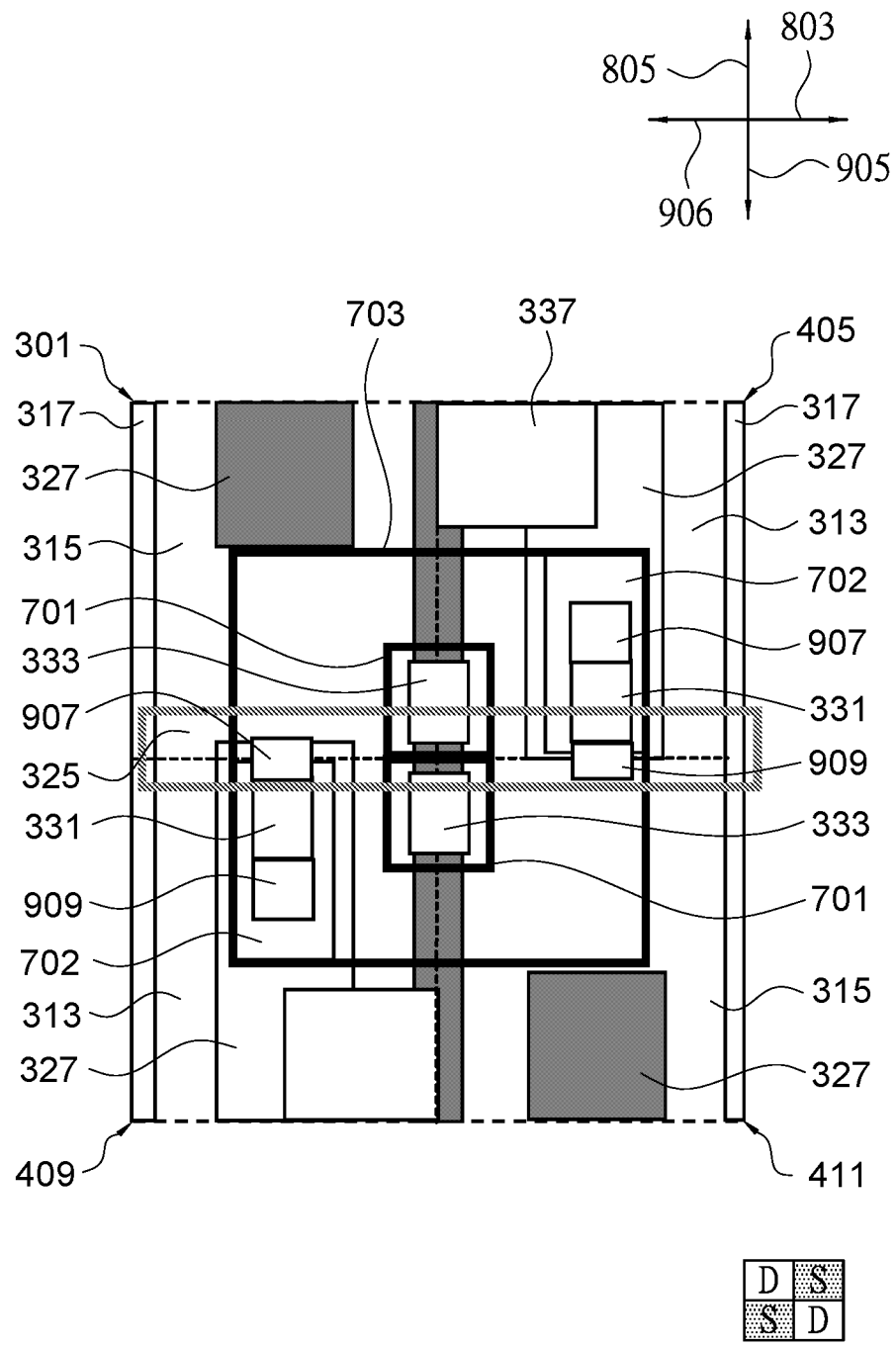
Figure 19D:
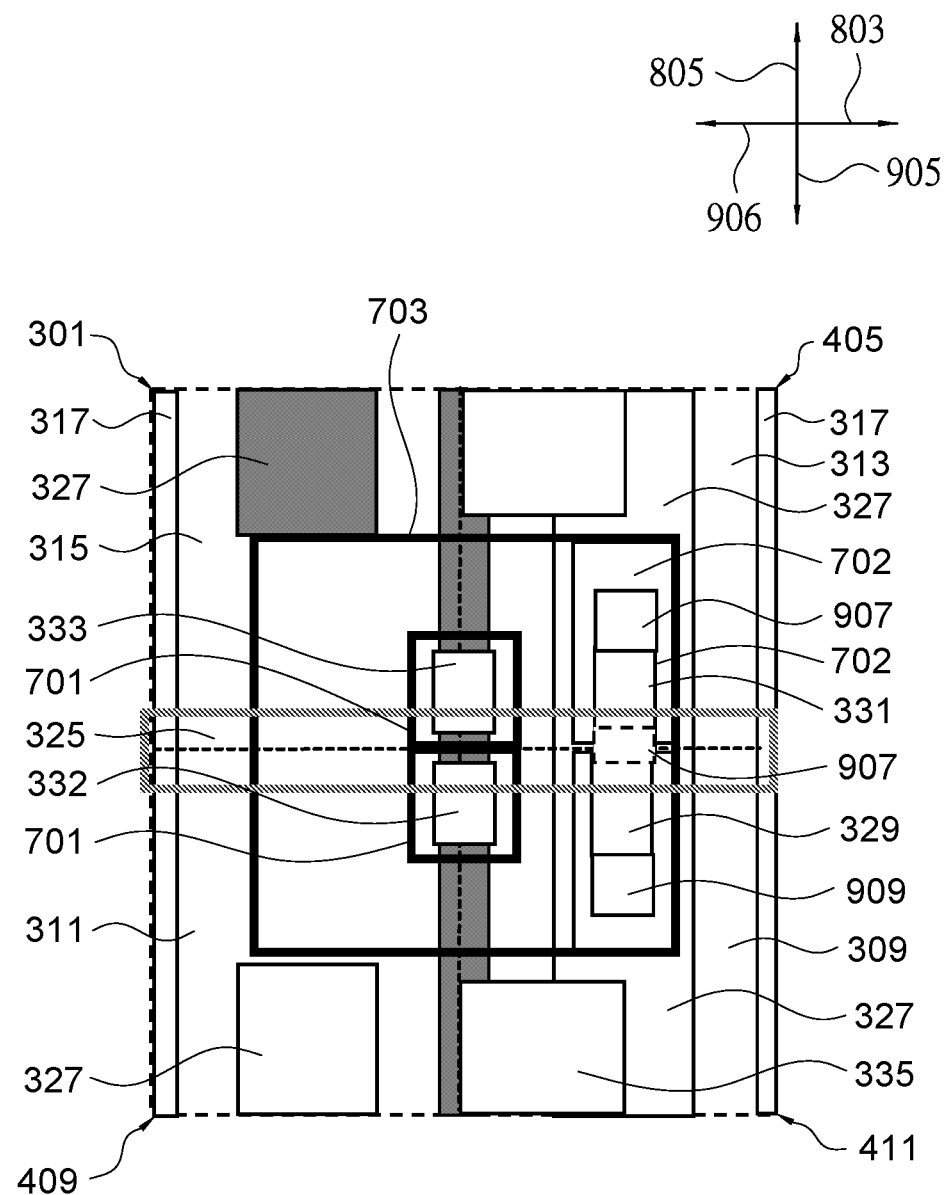
Figure 19F:
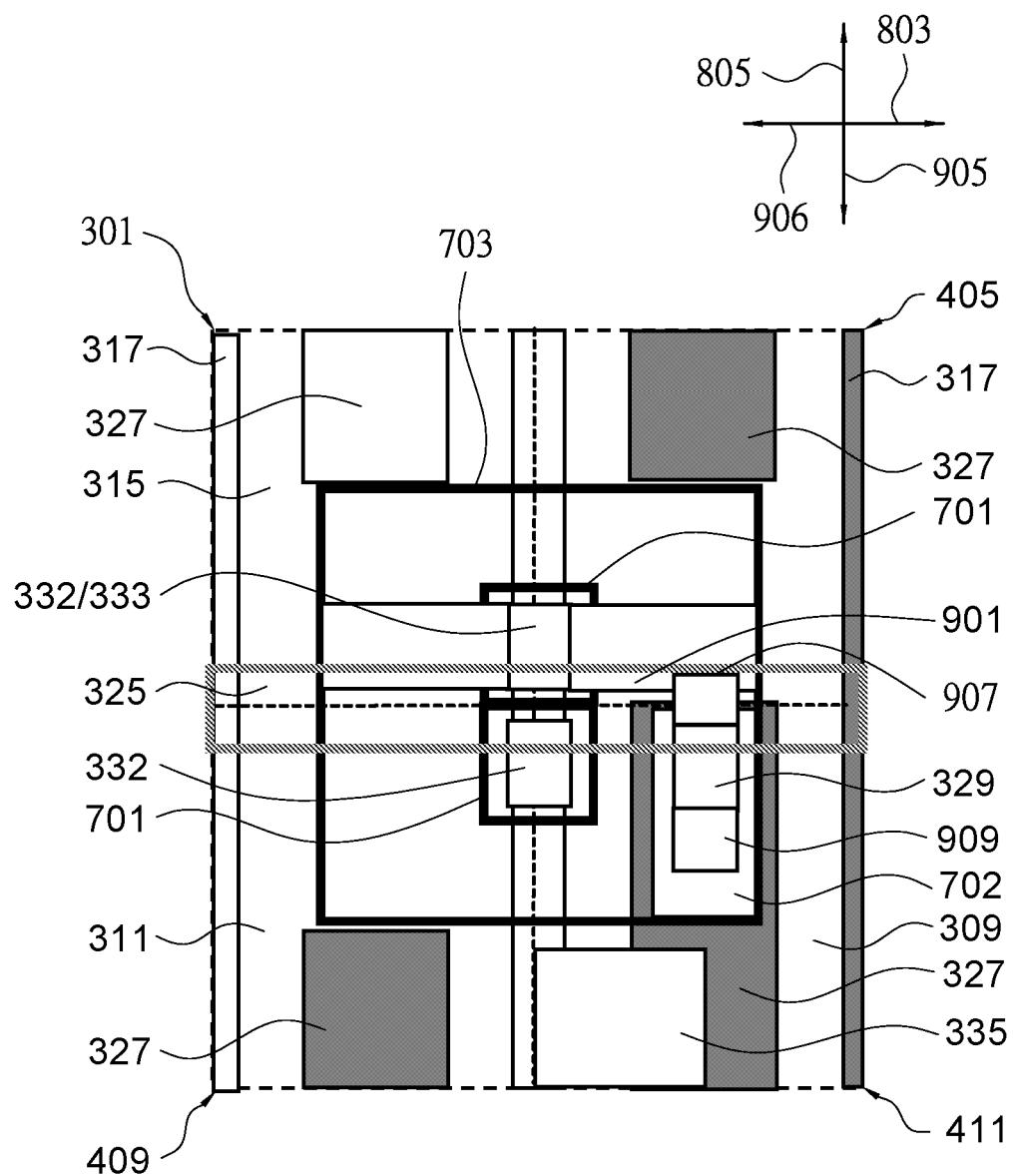
Figure 19G:
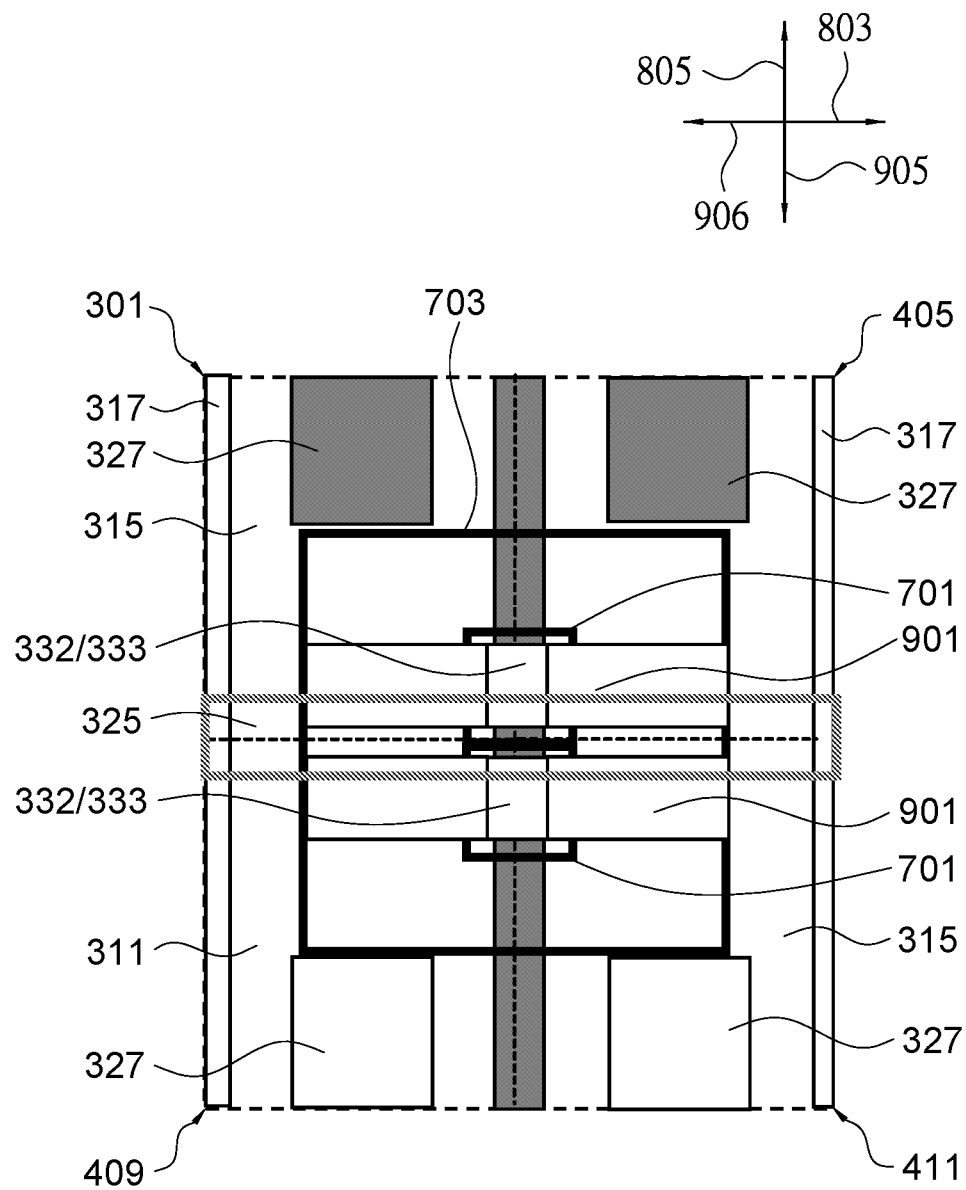
Figure 20C:
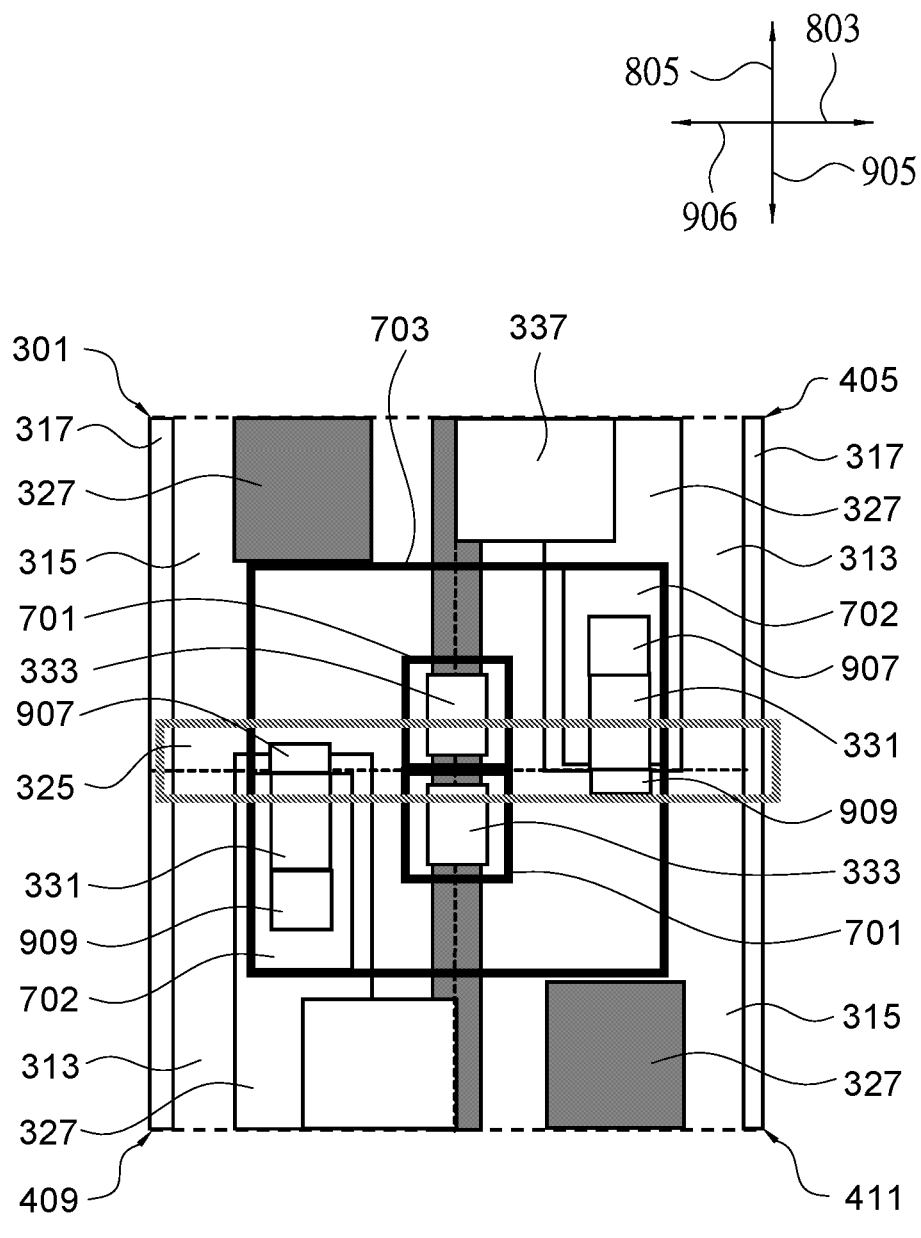
Figure 20D:
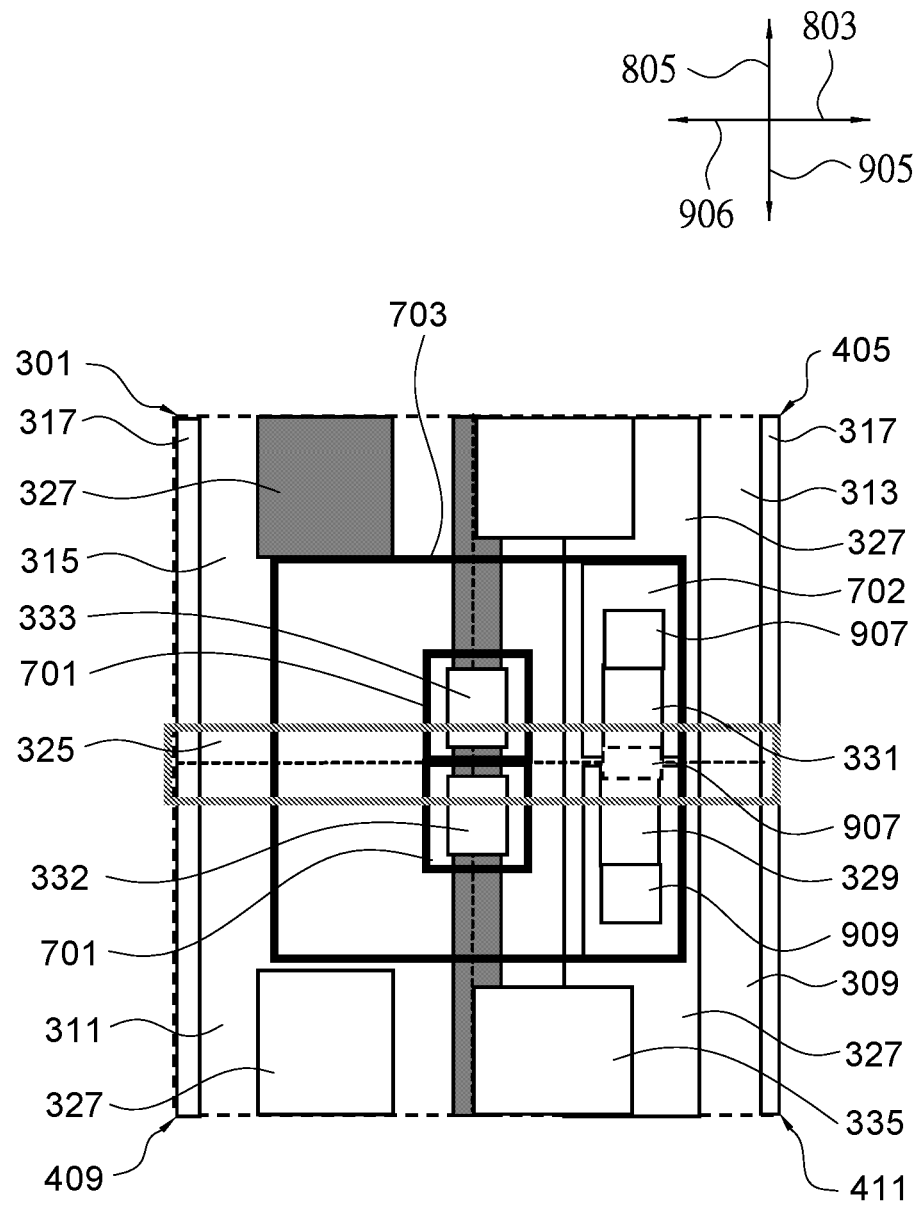
Figure 20E:
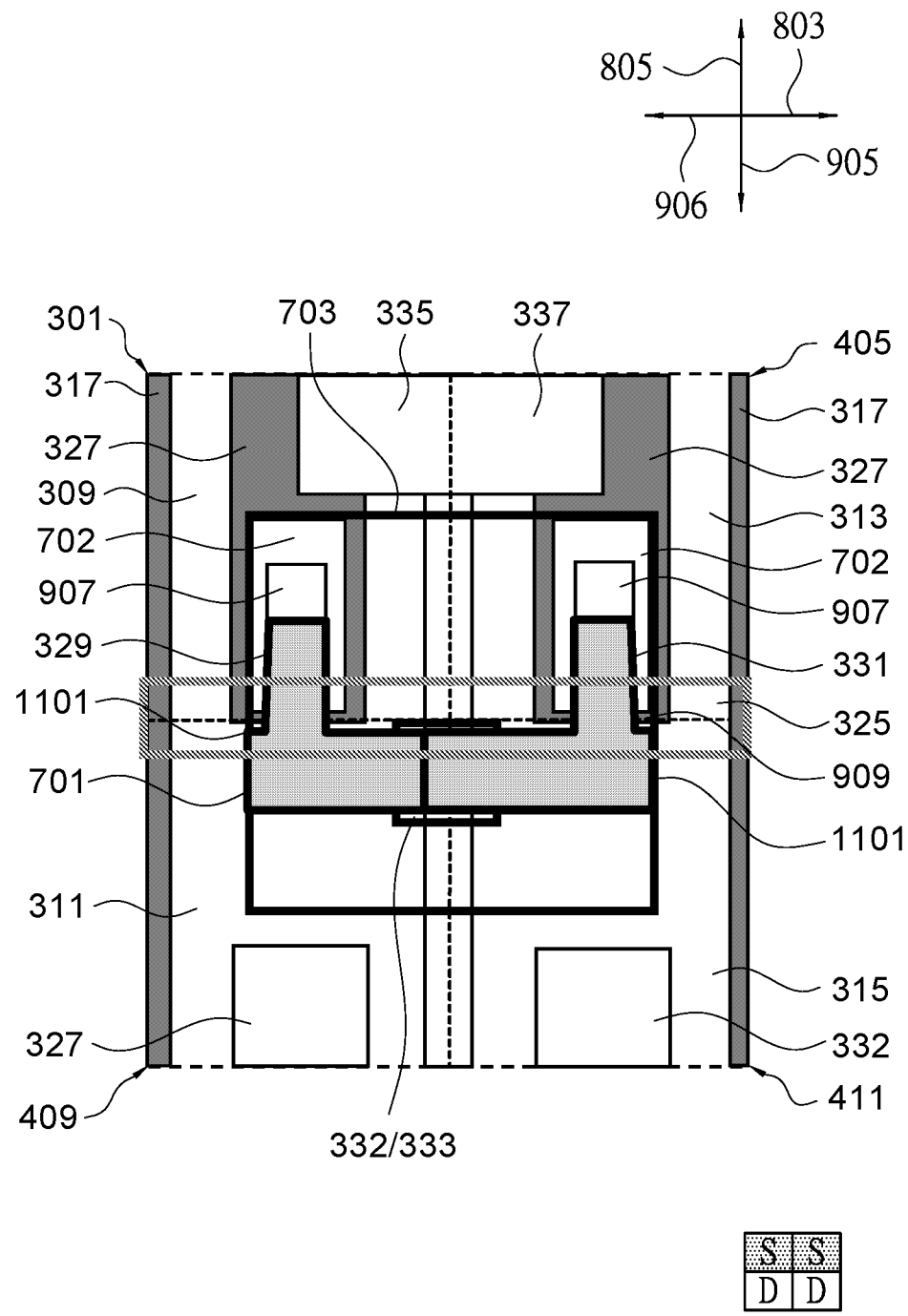
Figure 20G:
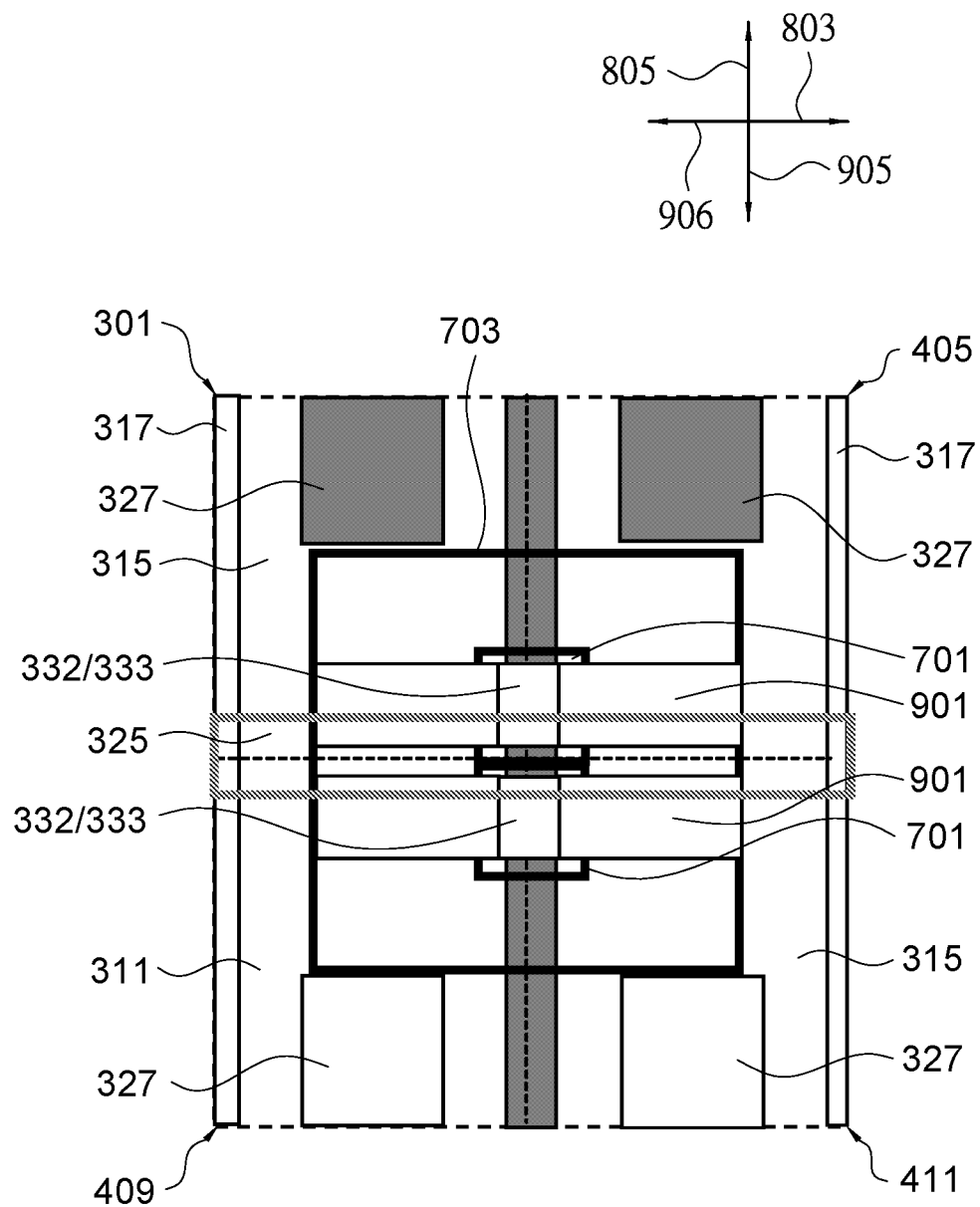
Figure 21A:
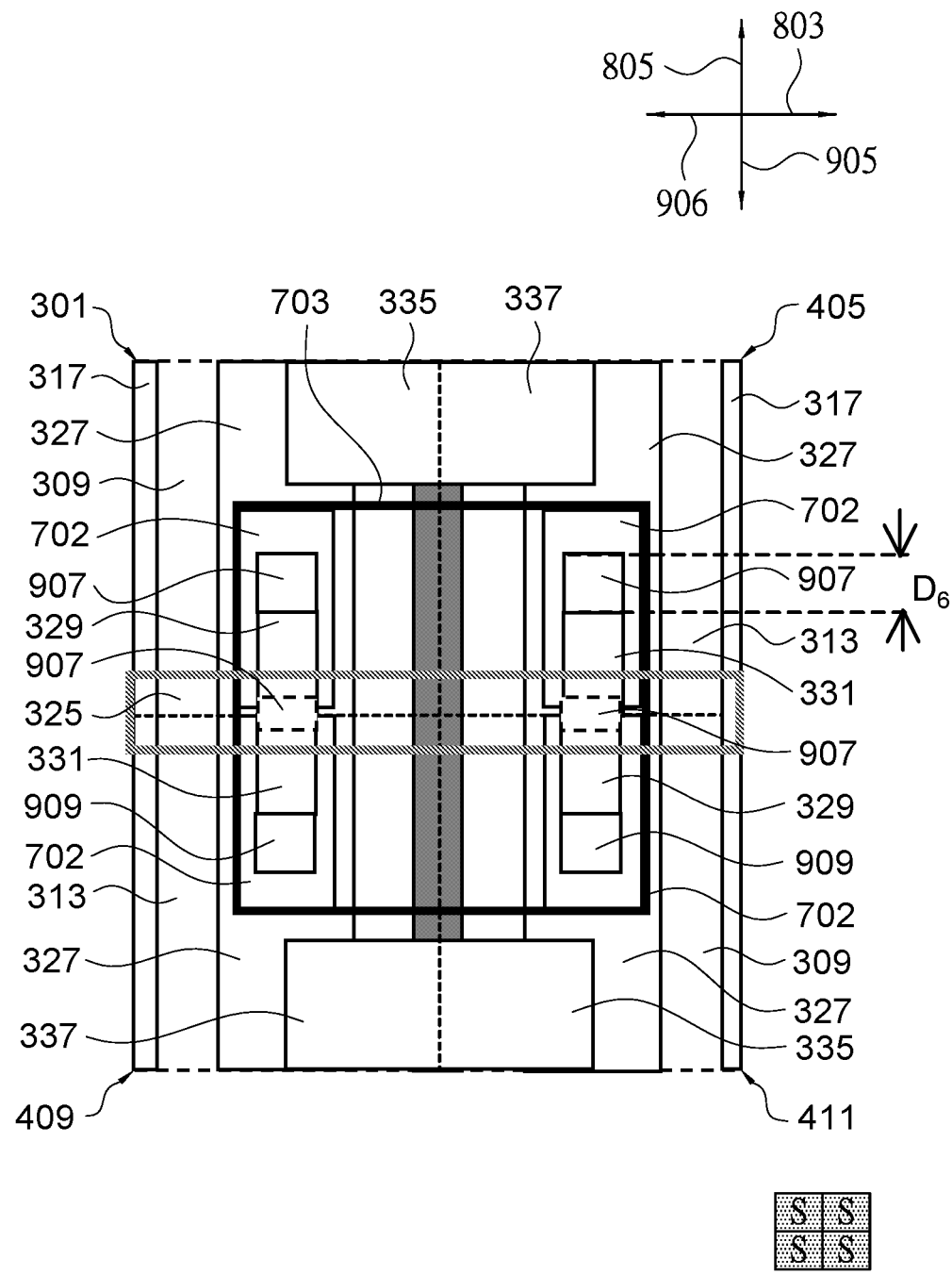
Figure 21C:
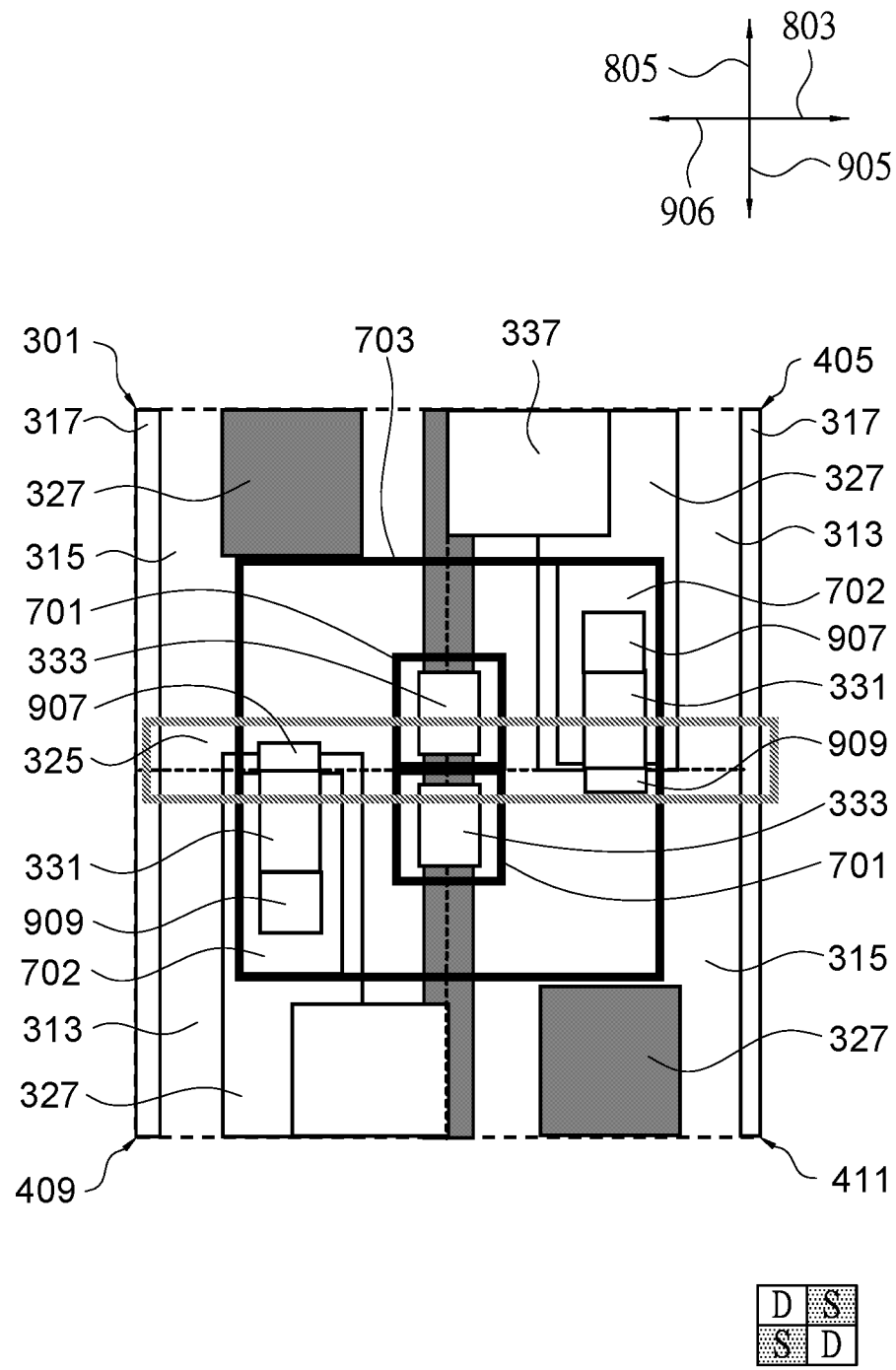
Figure 21D:
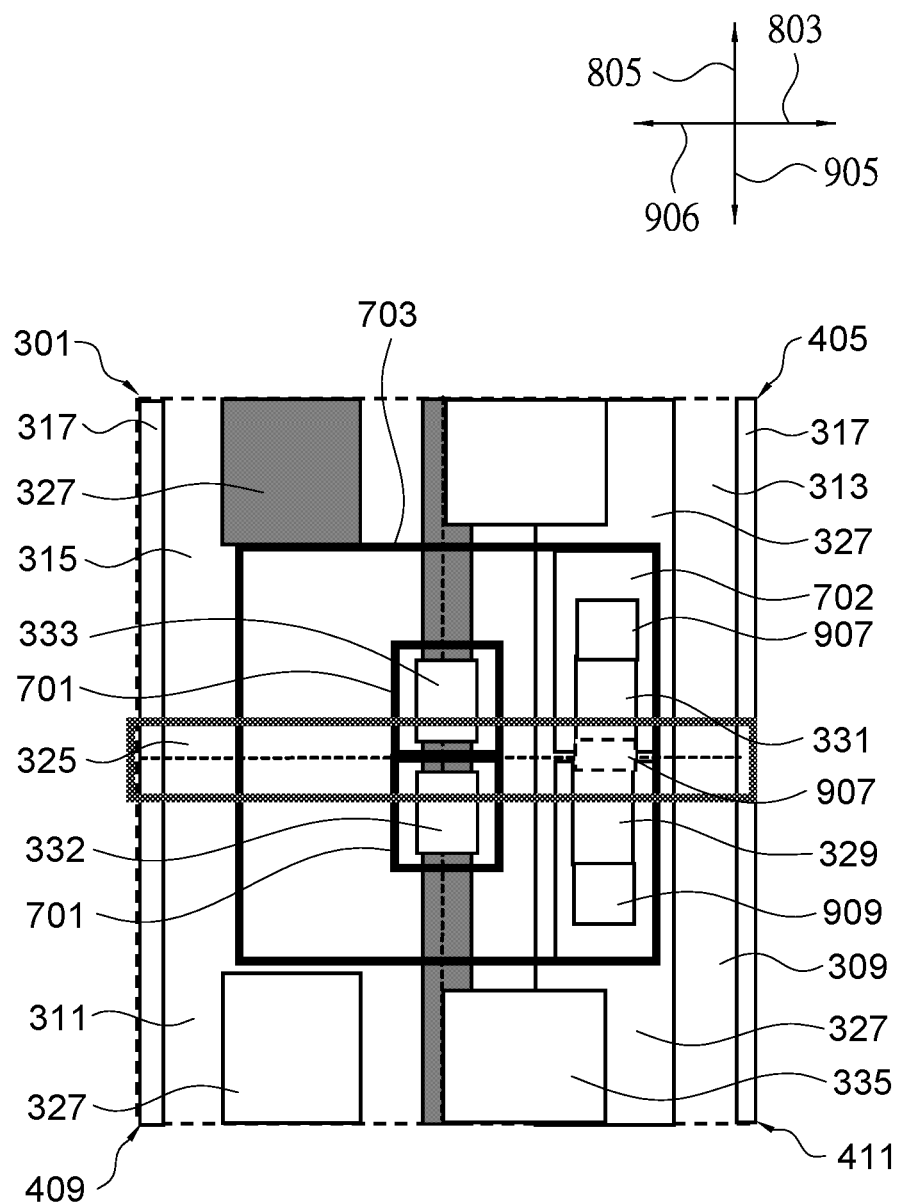
Figure 21E:
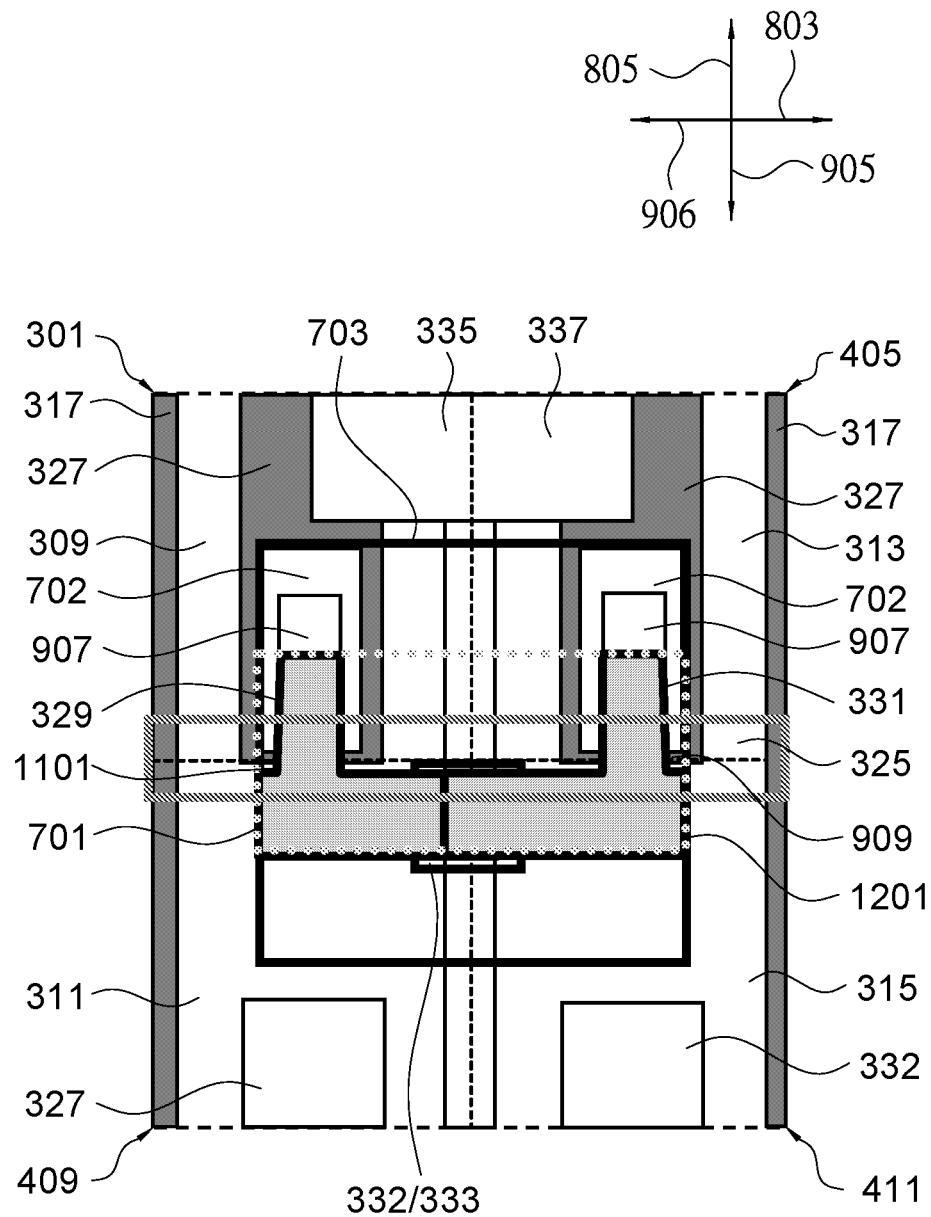
Figure 21F:
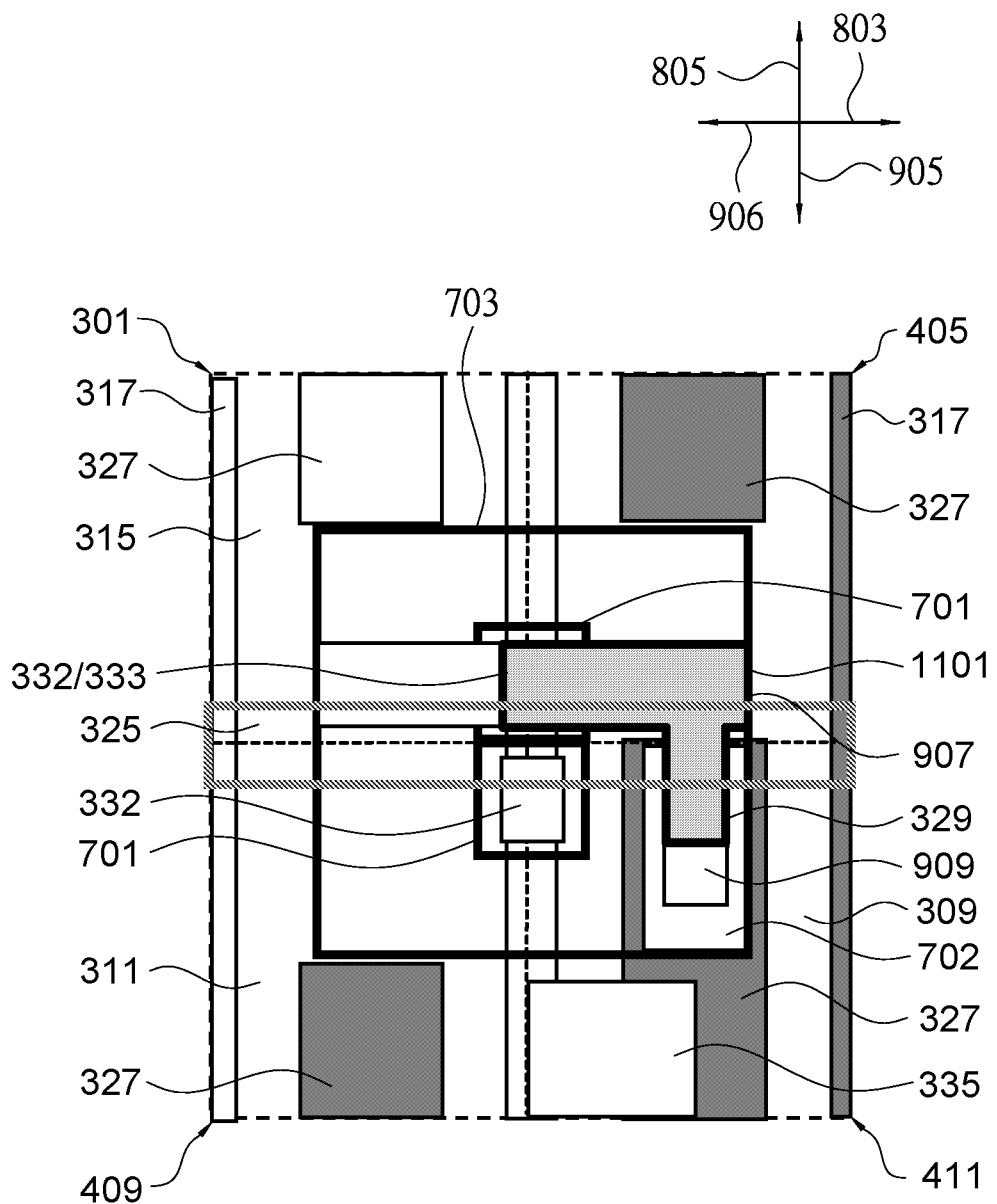
Figure 21G:
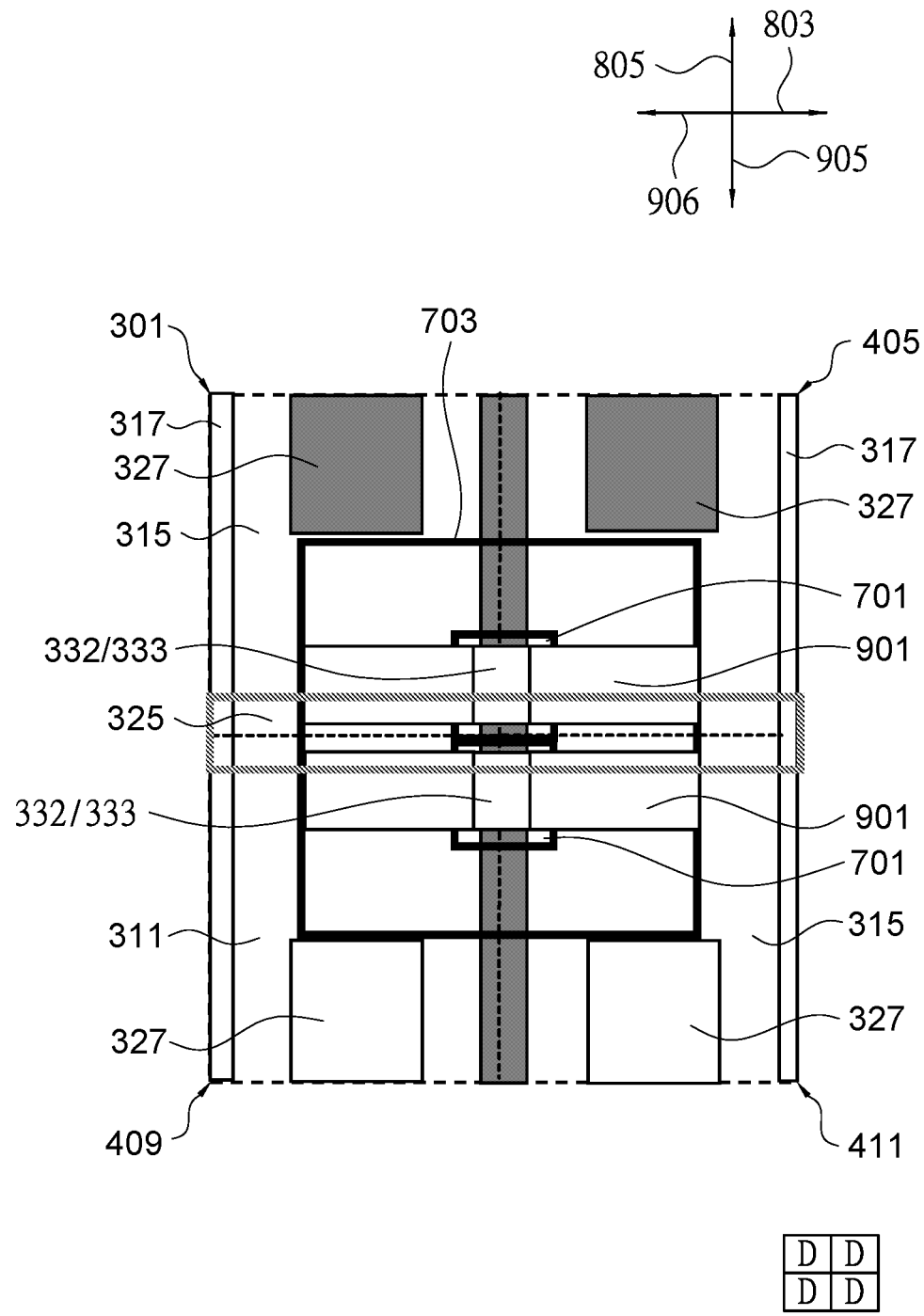
Figure 22A:
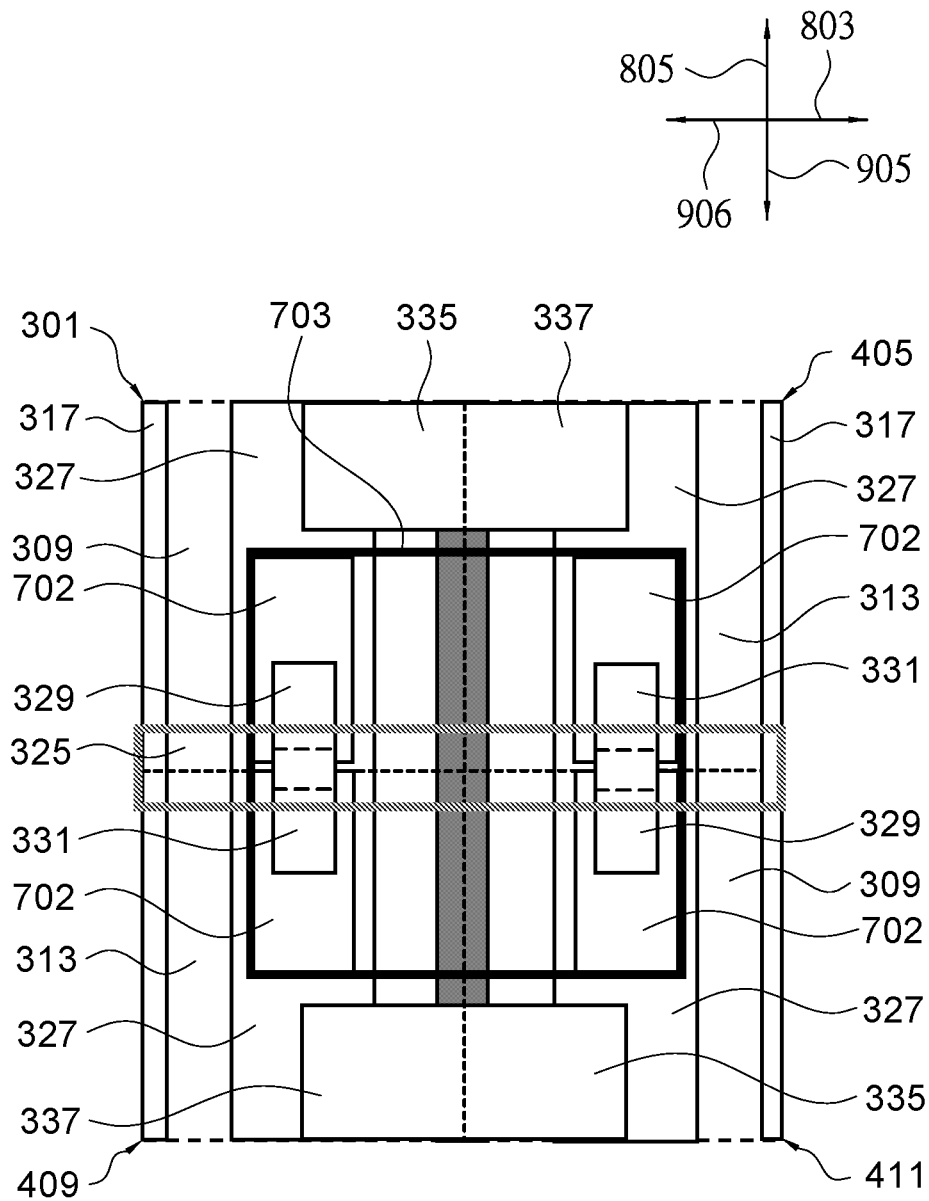
Figure 22B:
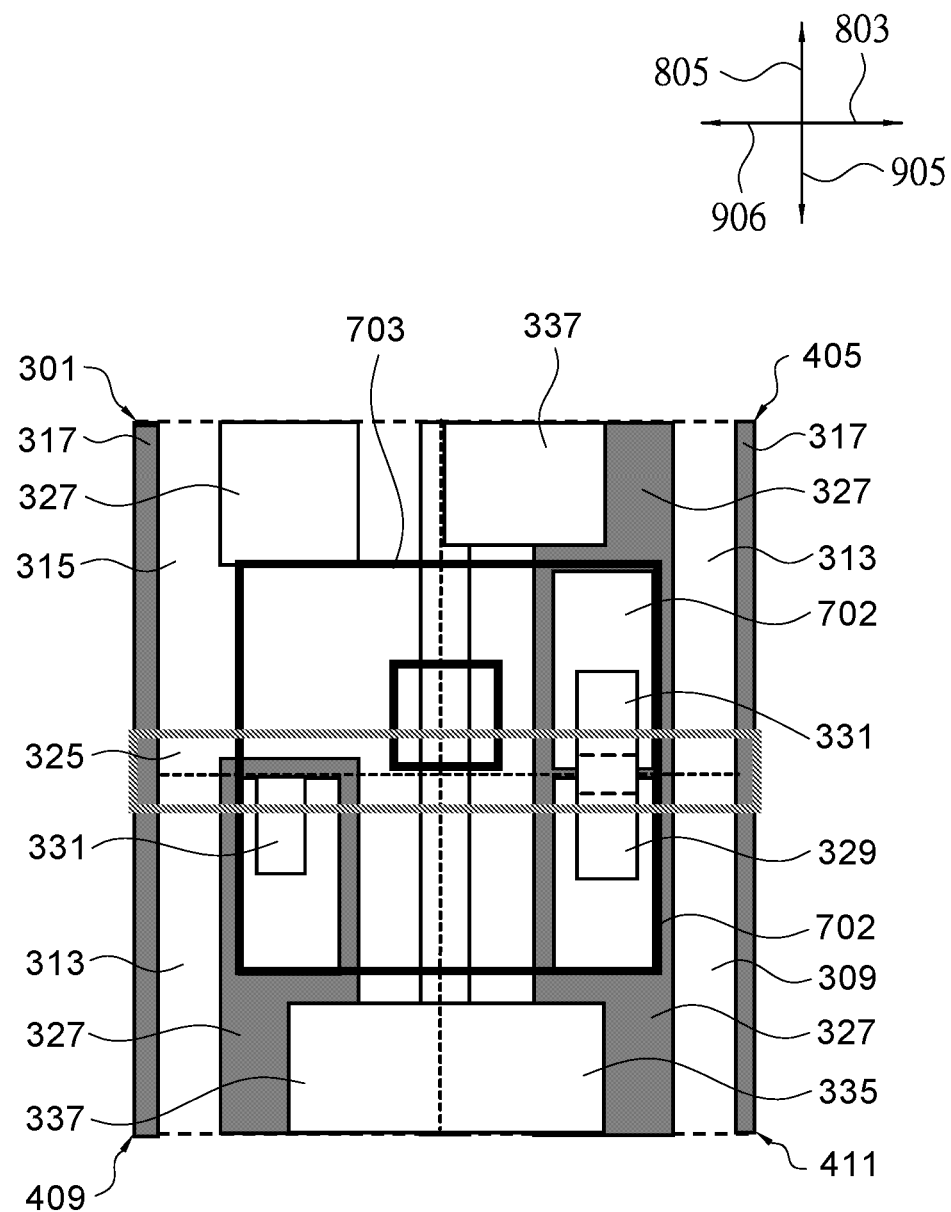
Figure 22C:
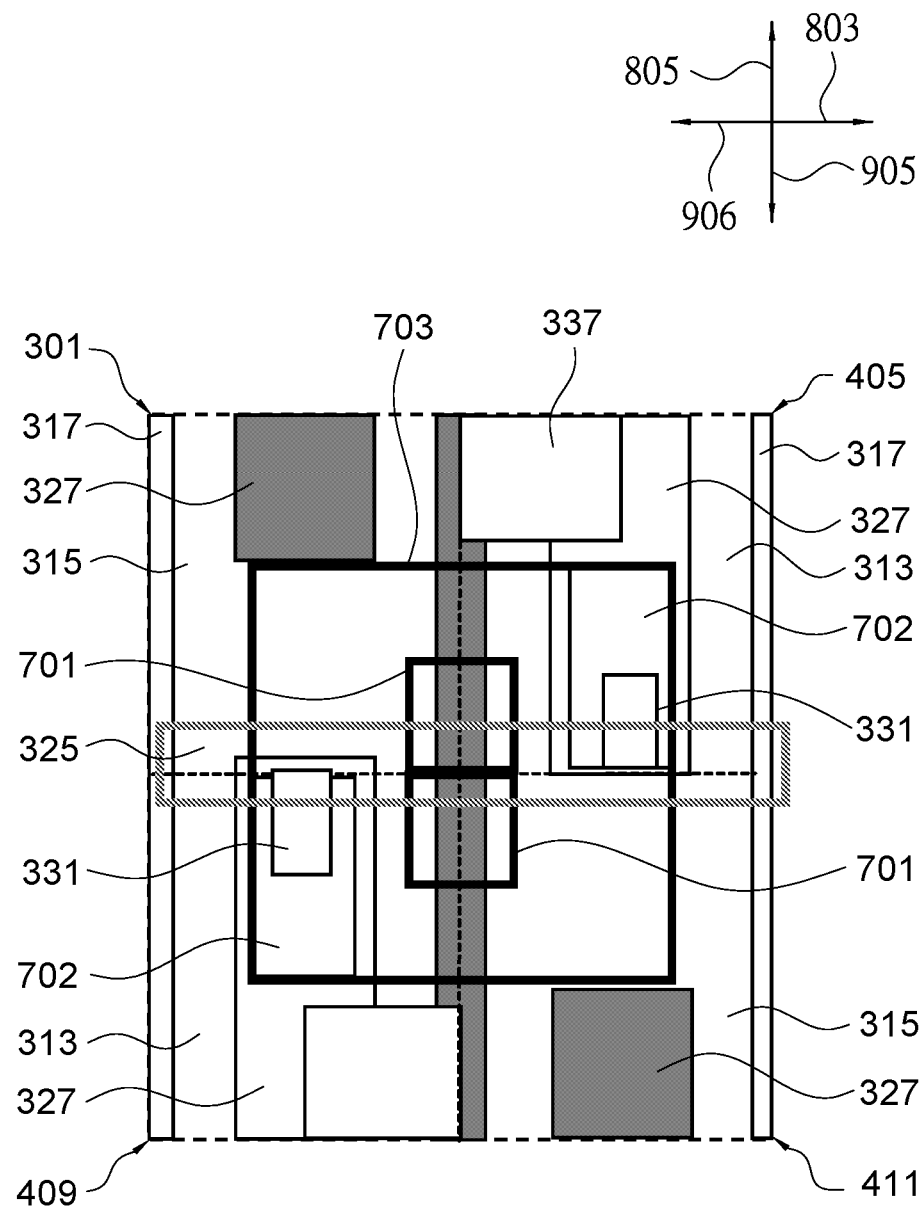
Figure 22D:
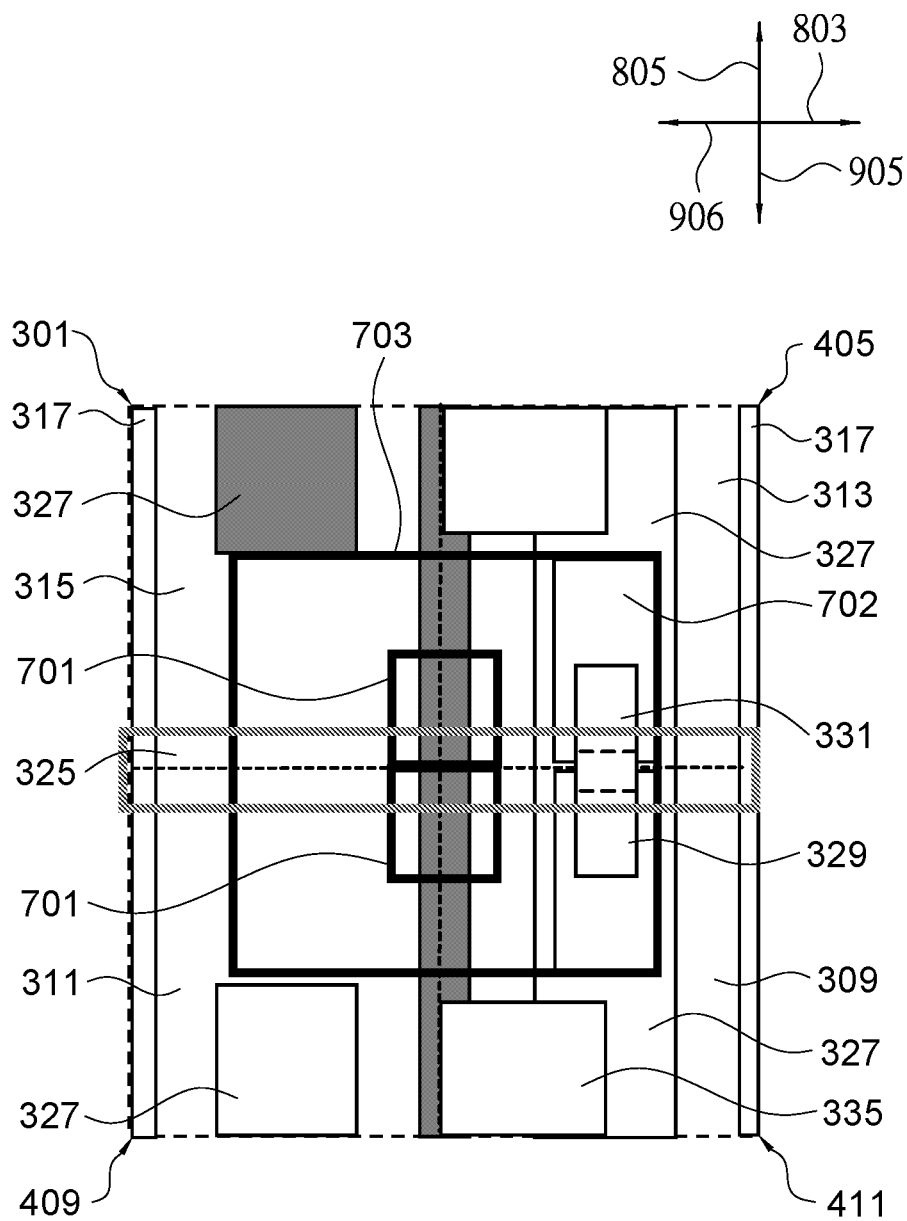
Figure 22E:
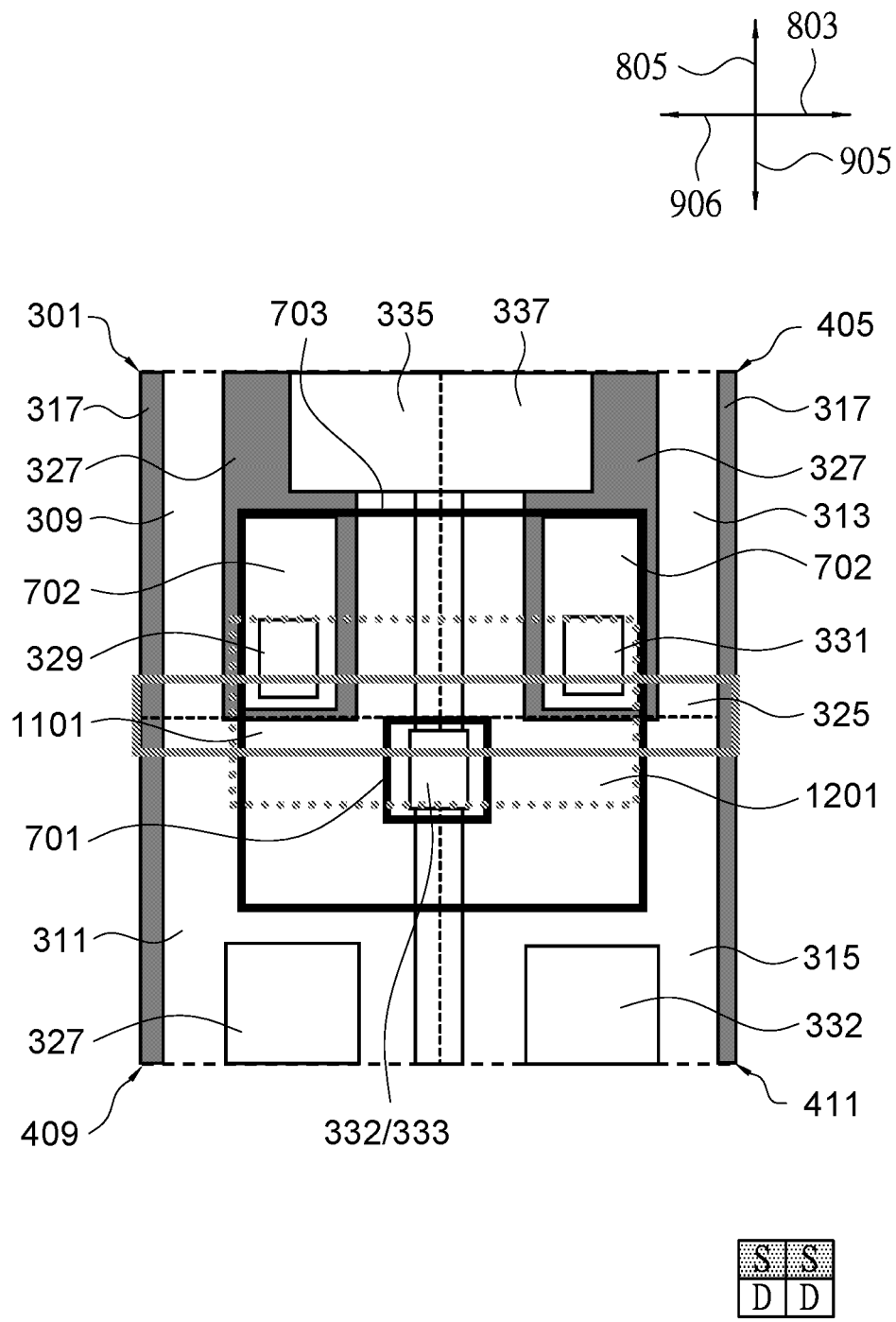
Figure 22F:
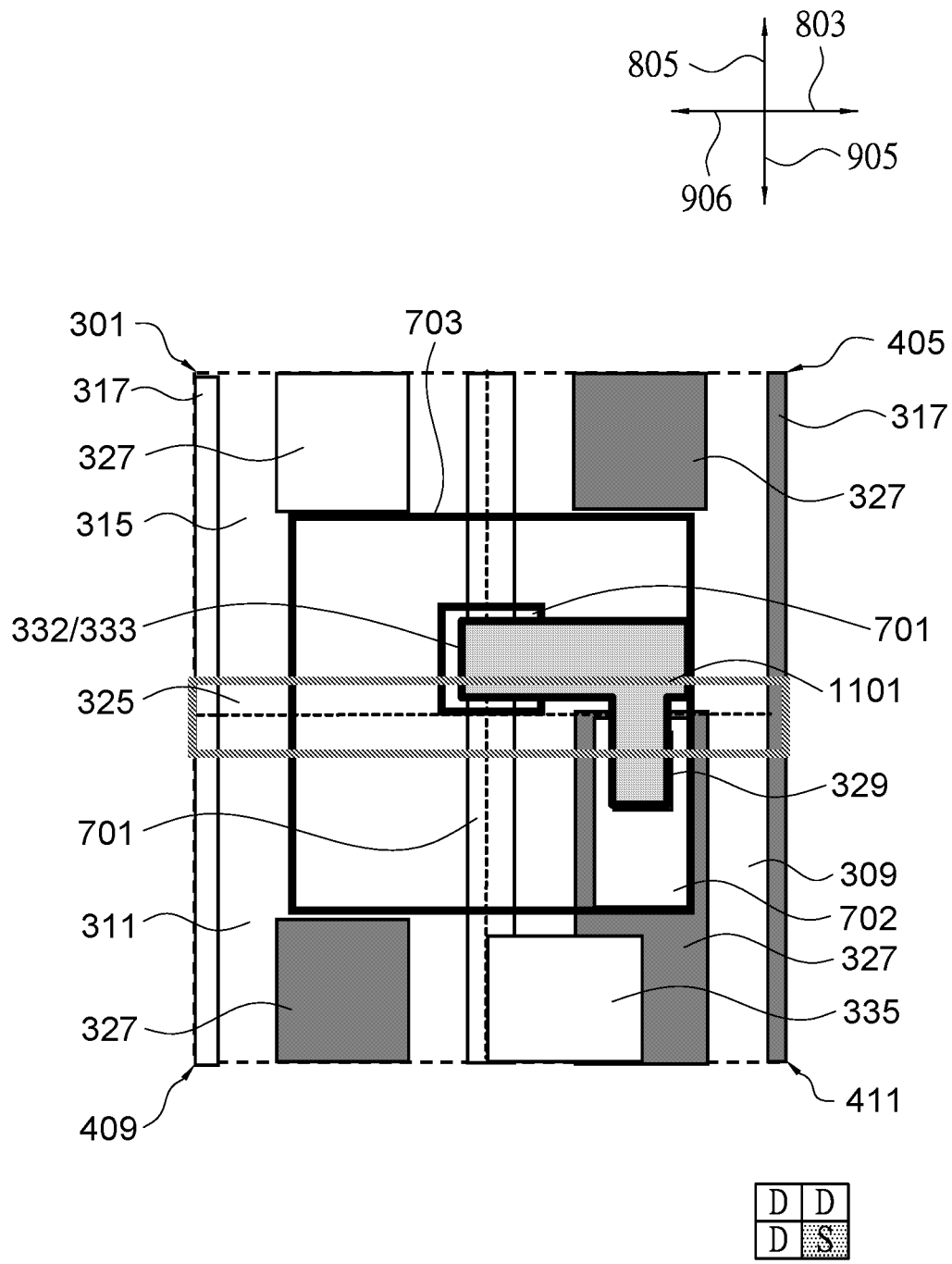
Figure 22G:
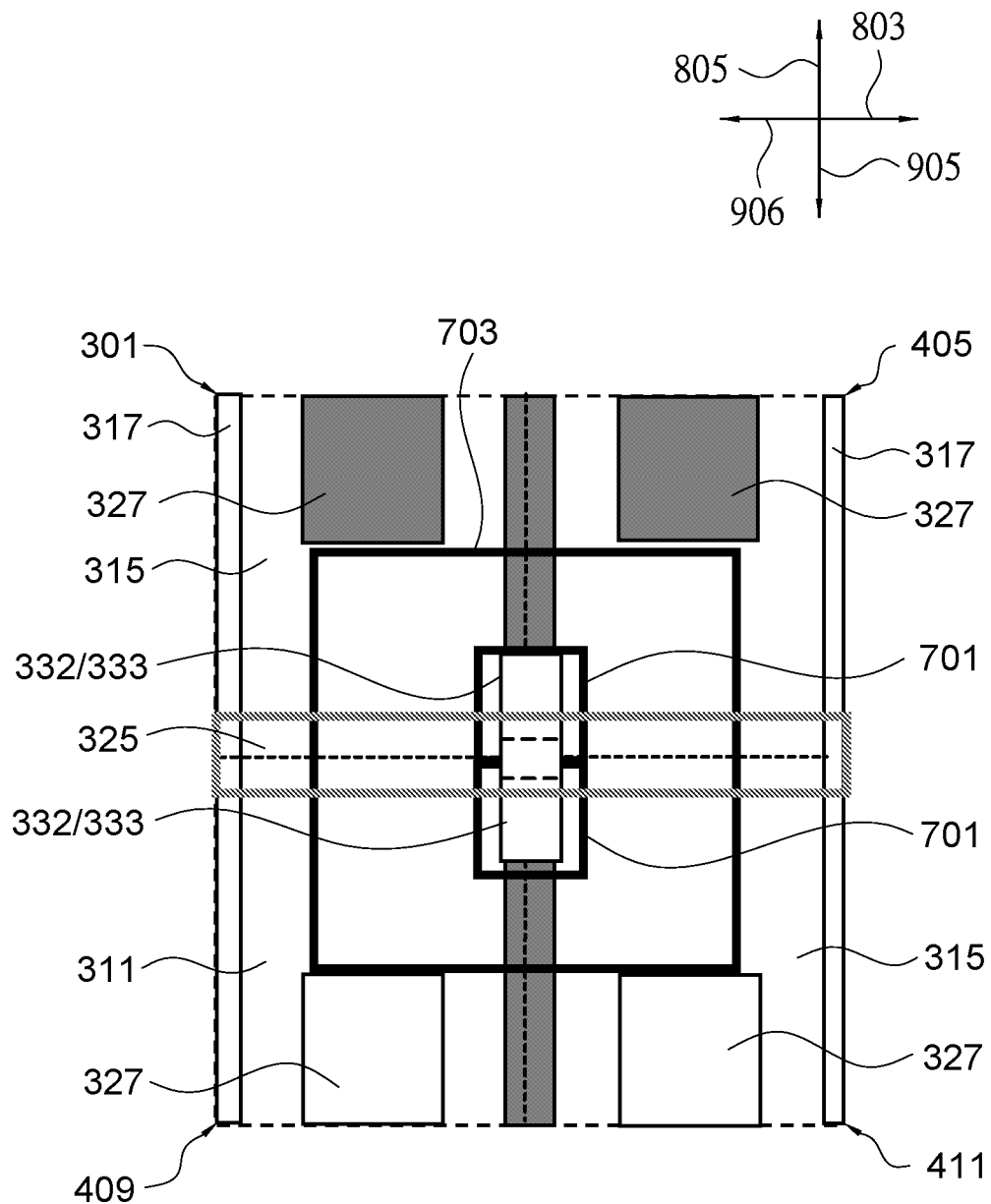
Figure 23A:
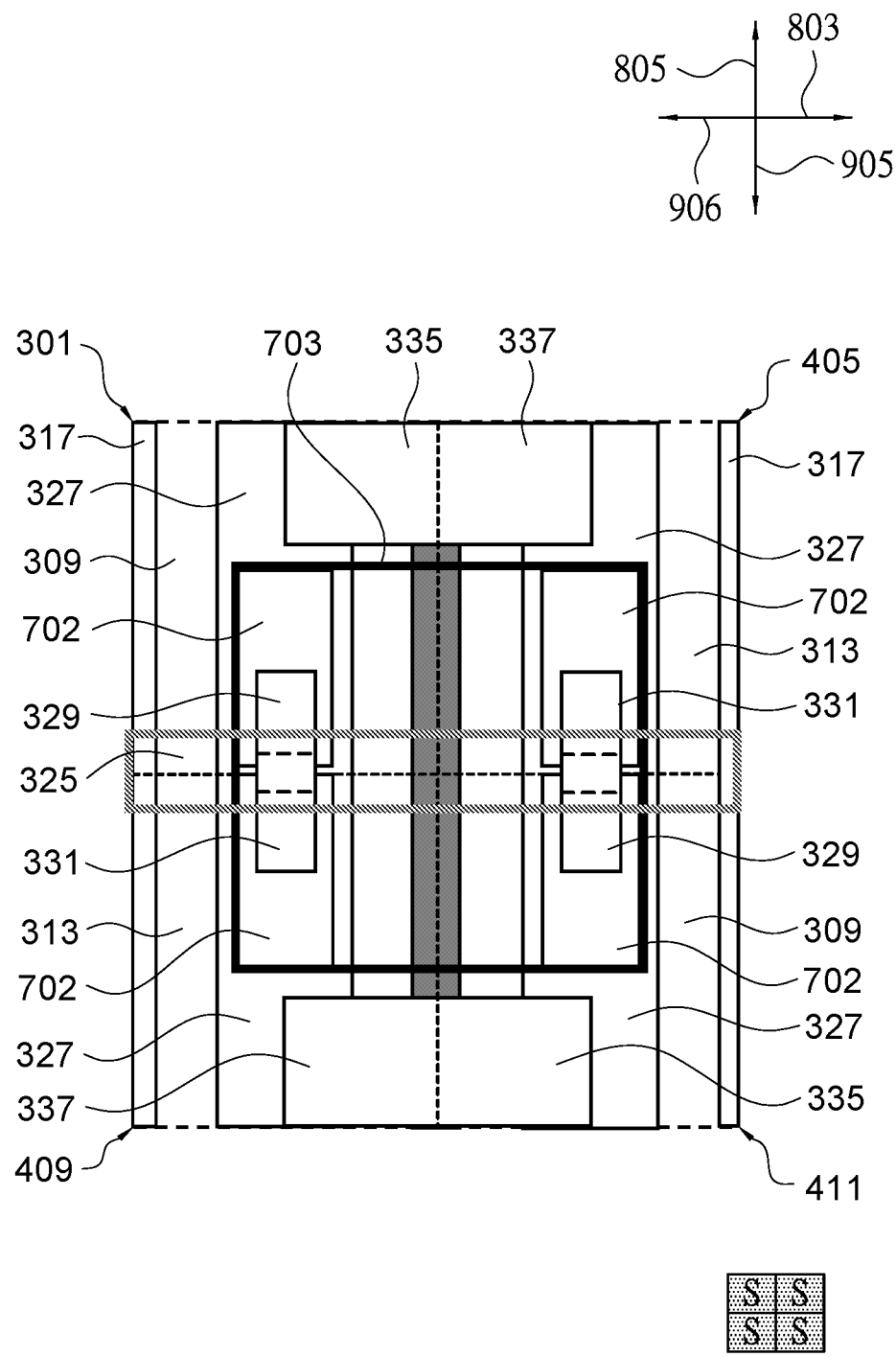
Figure 23B:
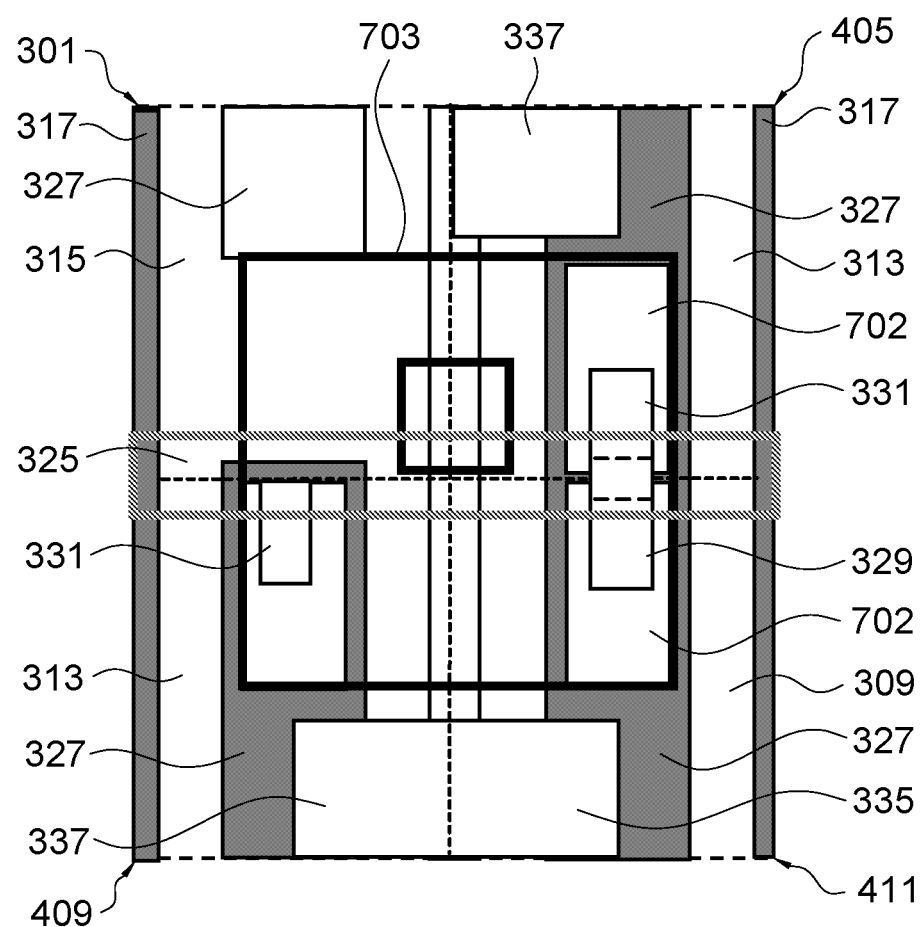
Figure 23D:
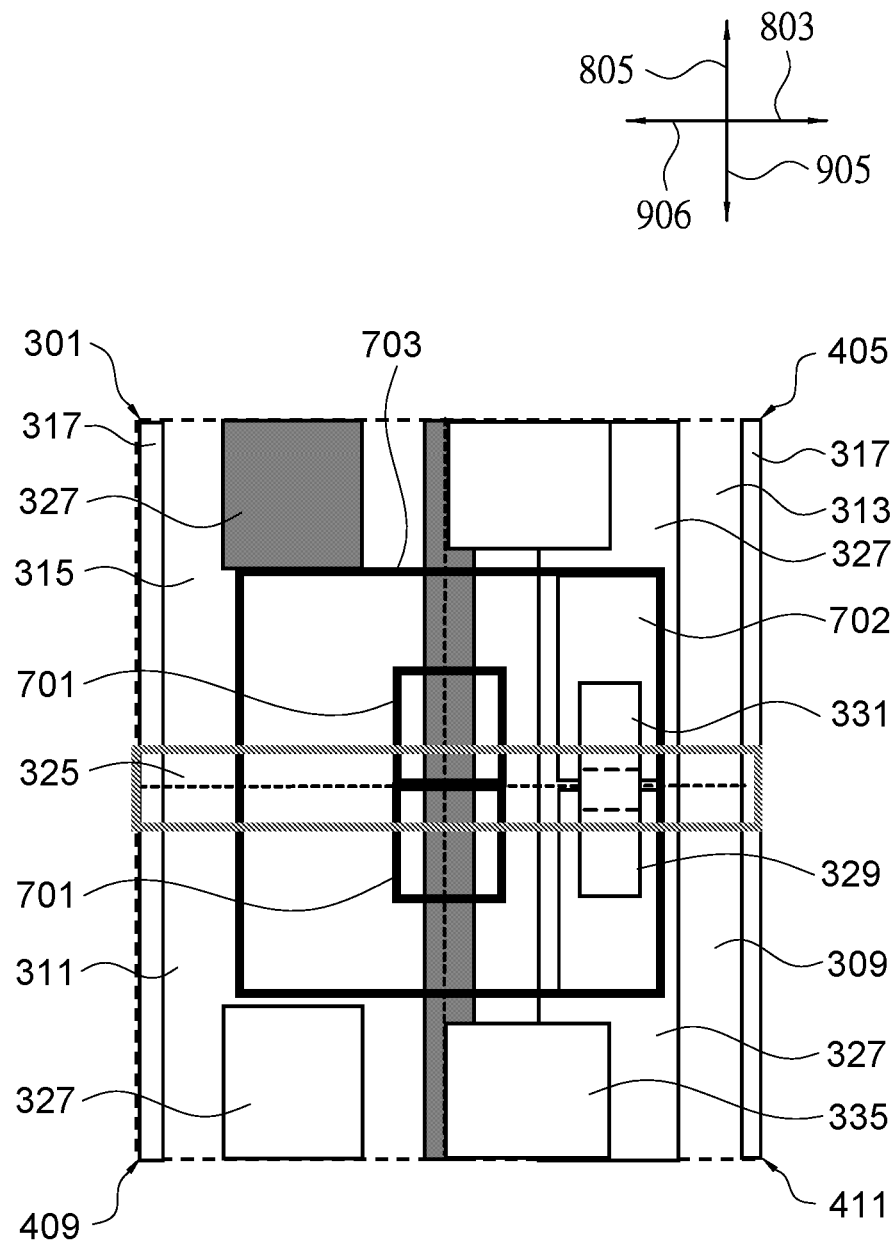
Figure 23E:
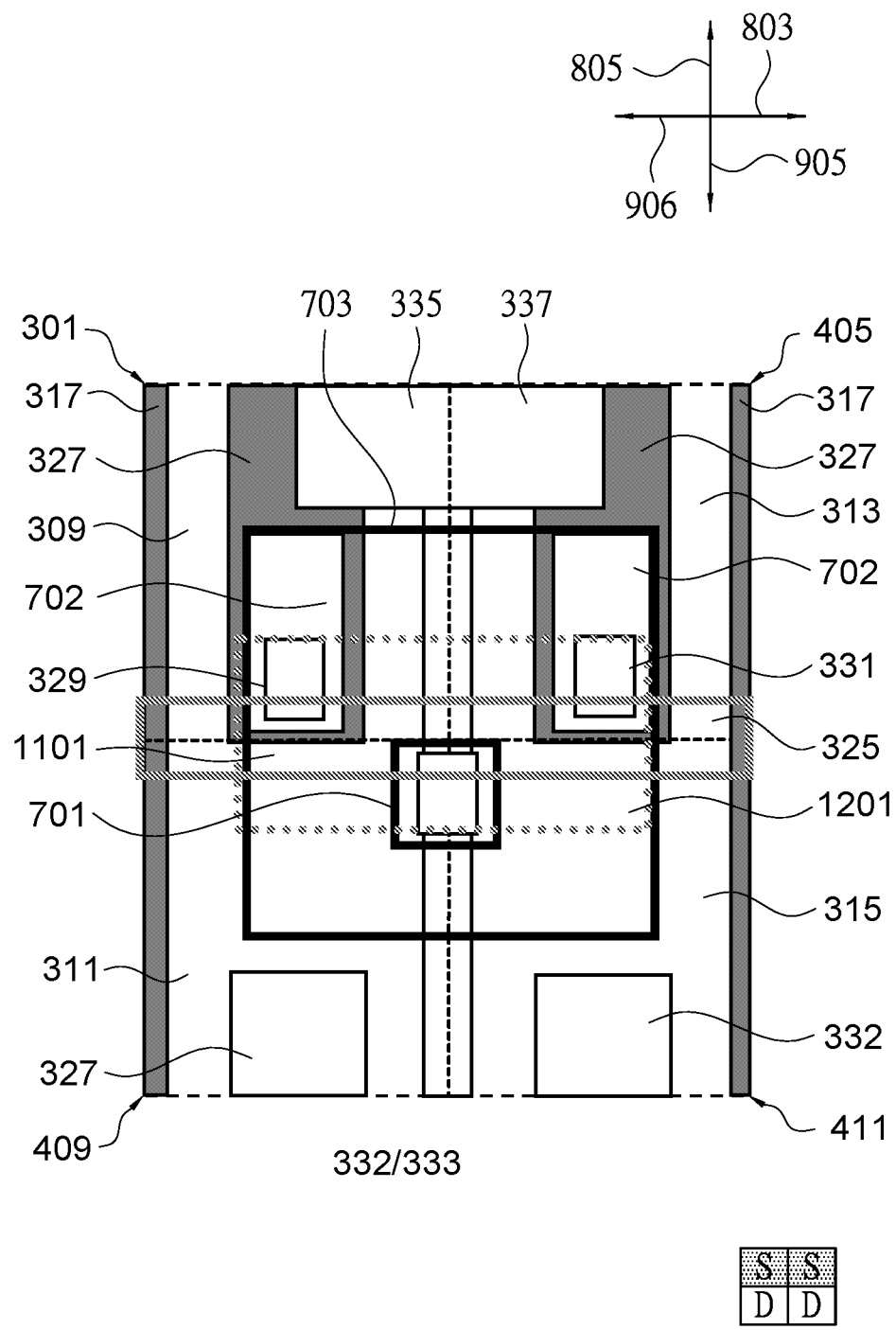
Figure 23F:
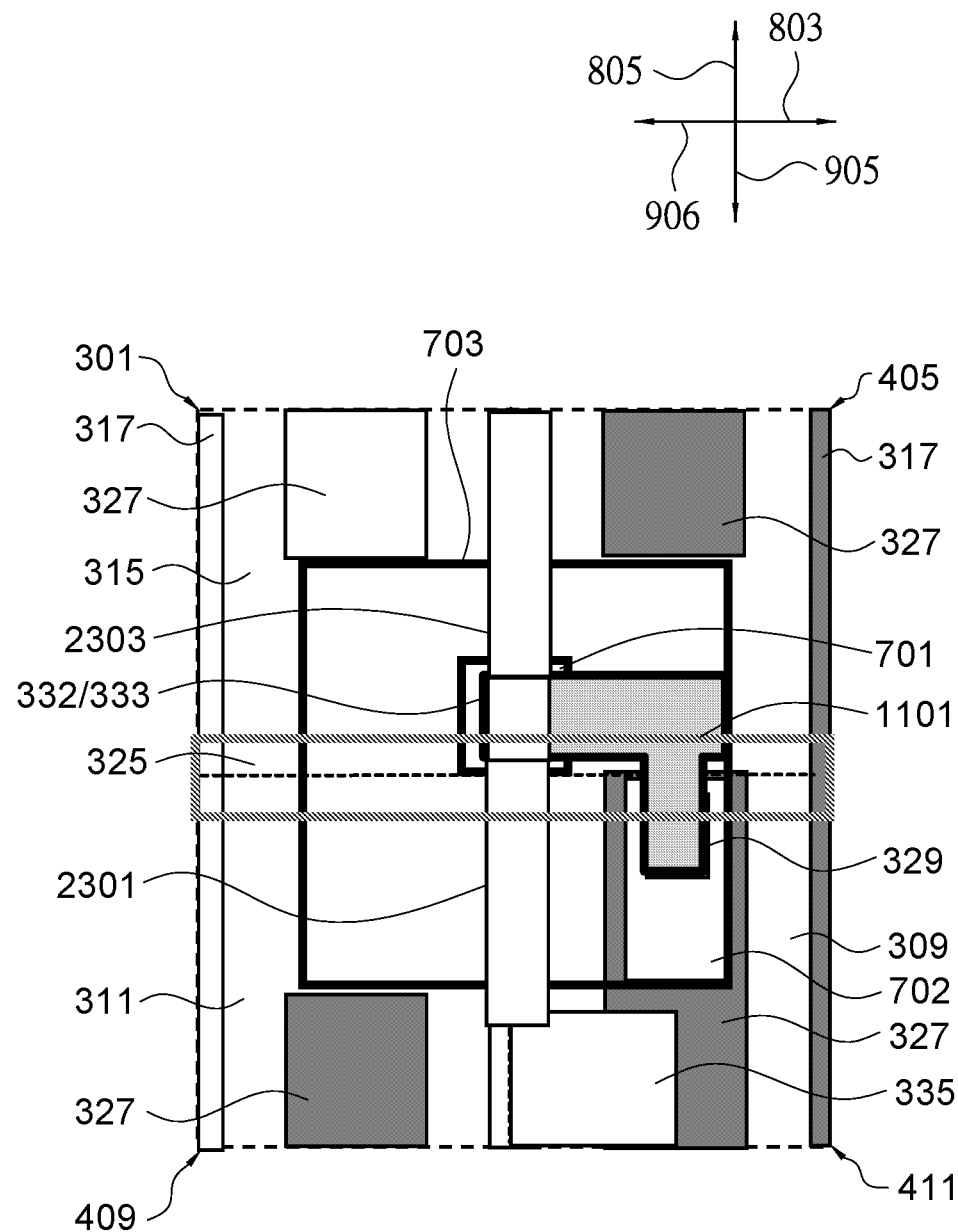
Figure 23G:
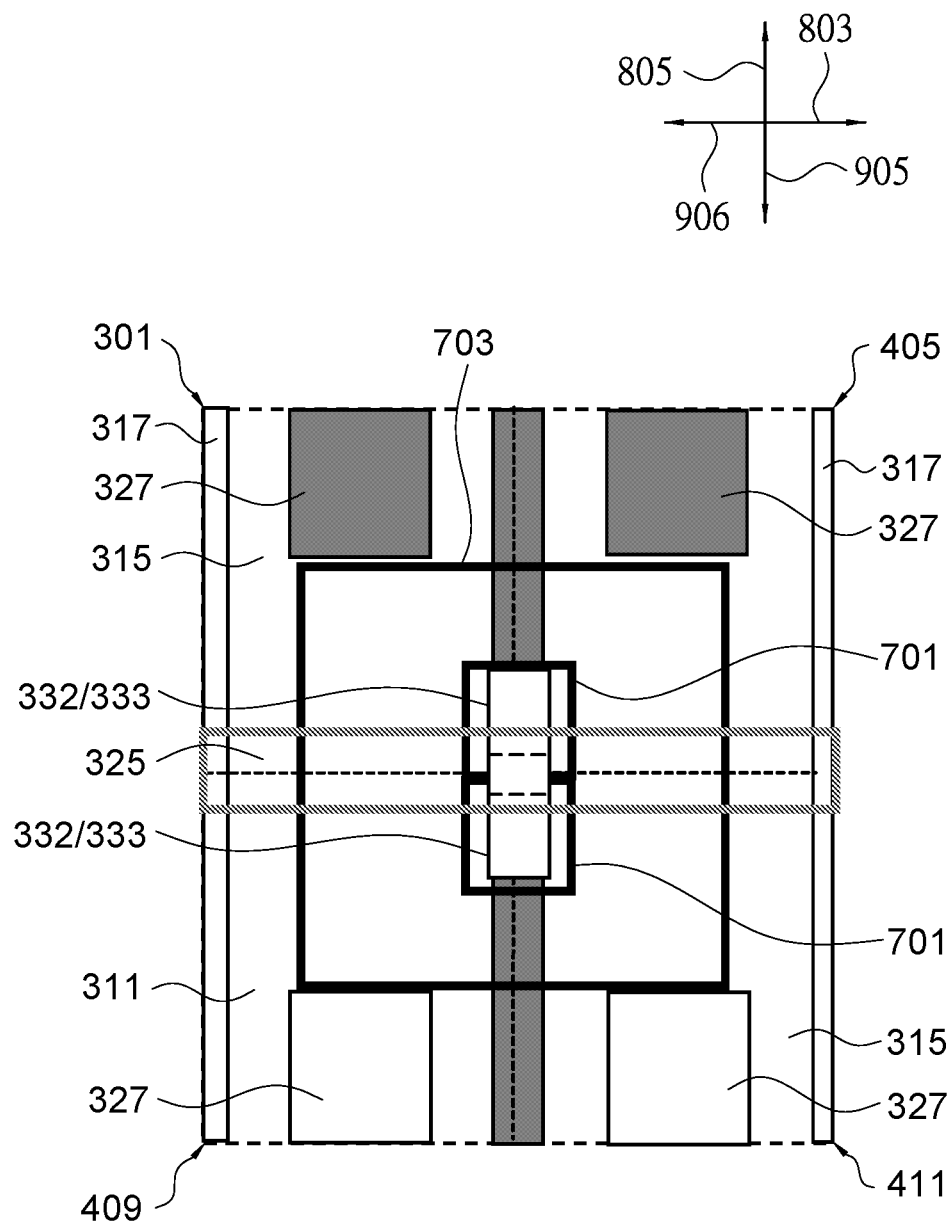
Figure 24A:
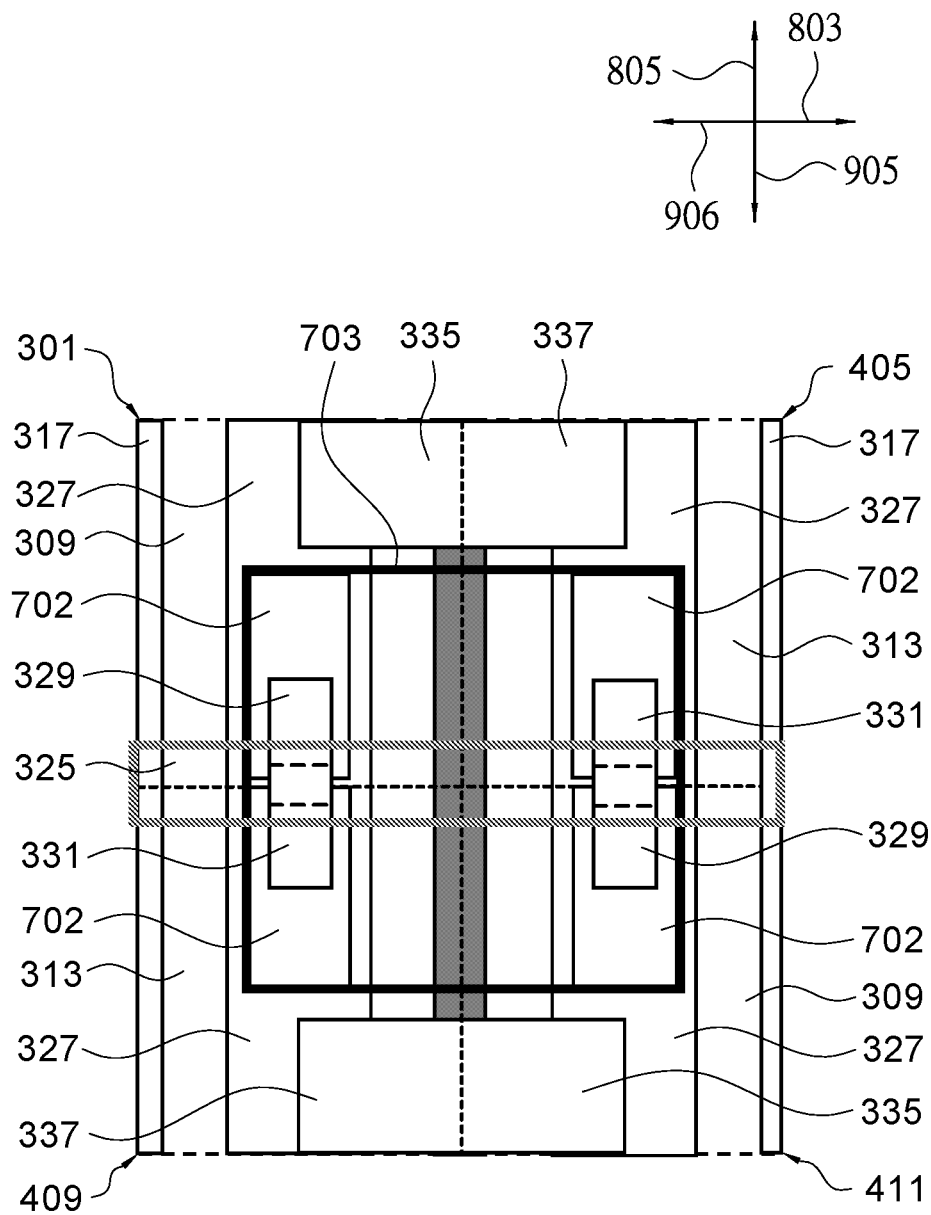
Figure 24B:
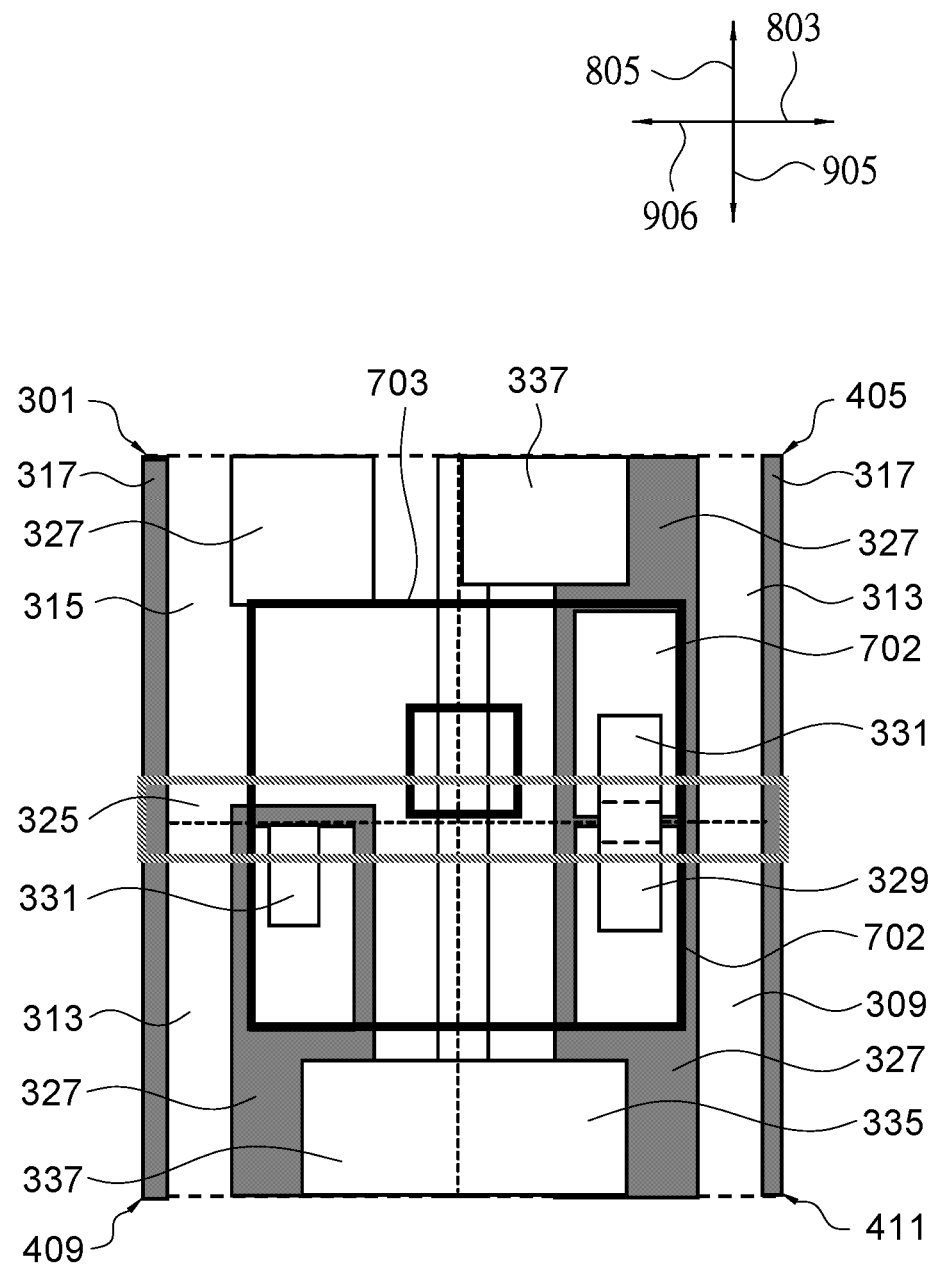
Figure 24C:
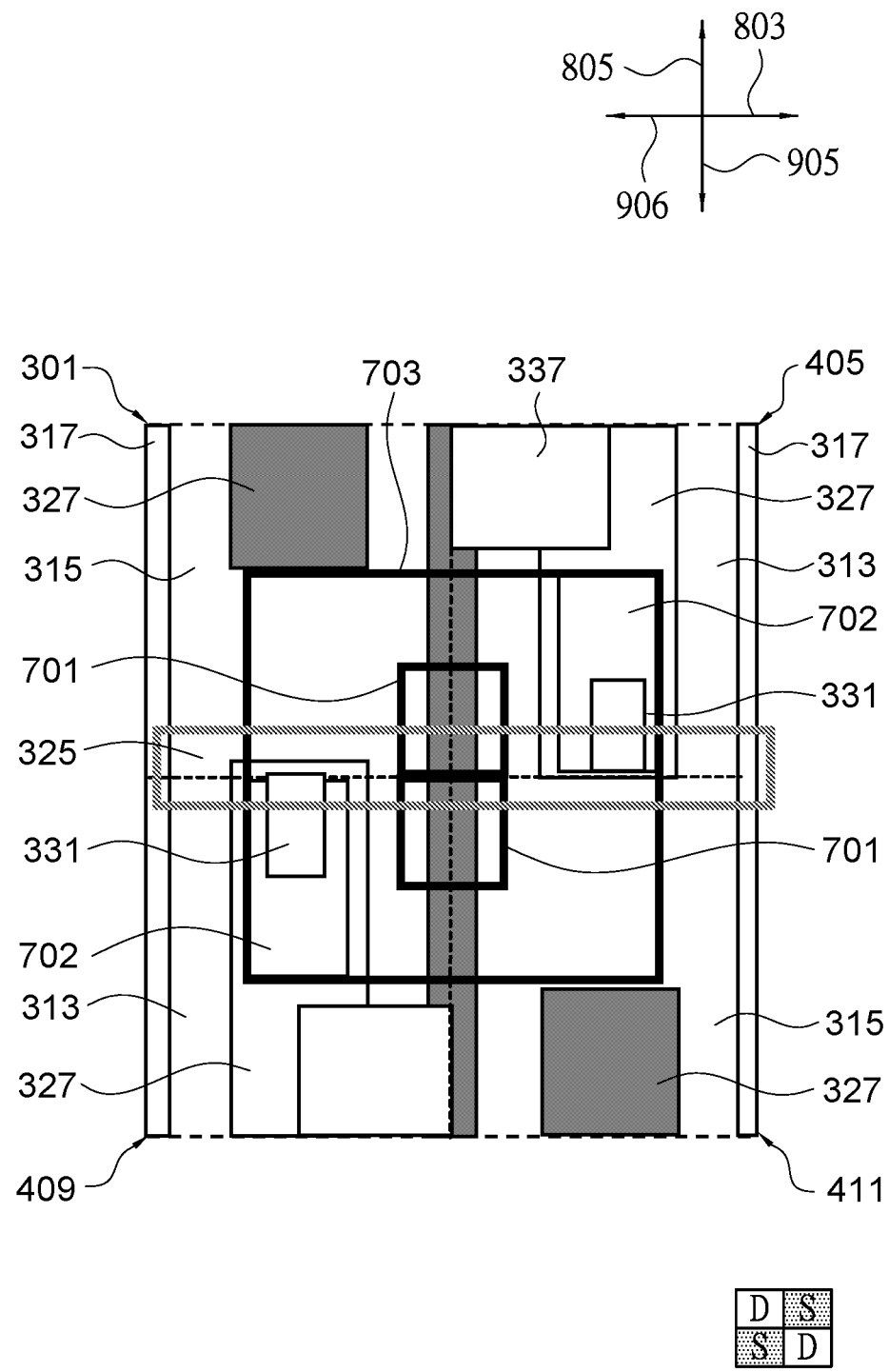
Figure 24D:
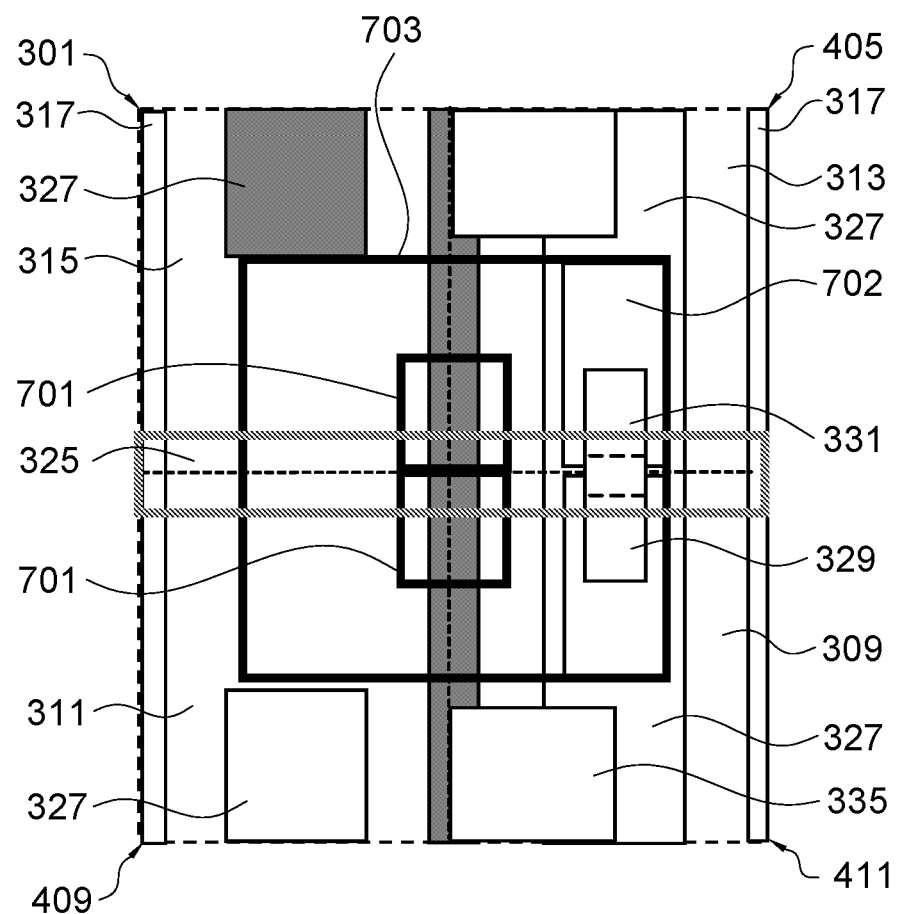
Figure 24E:
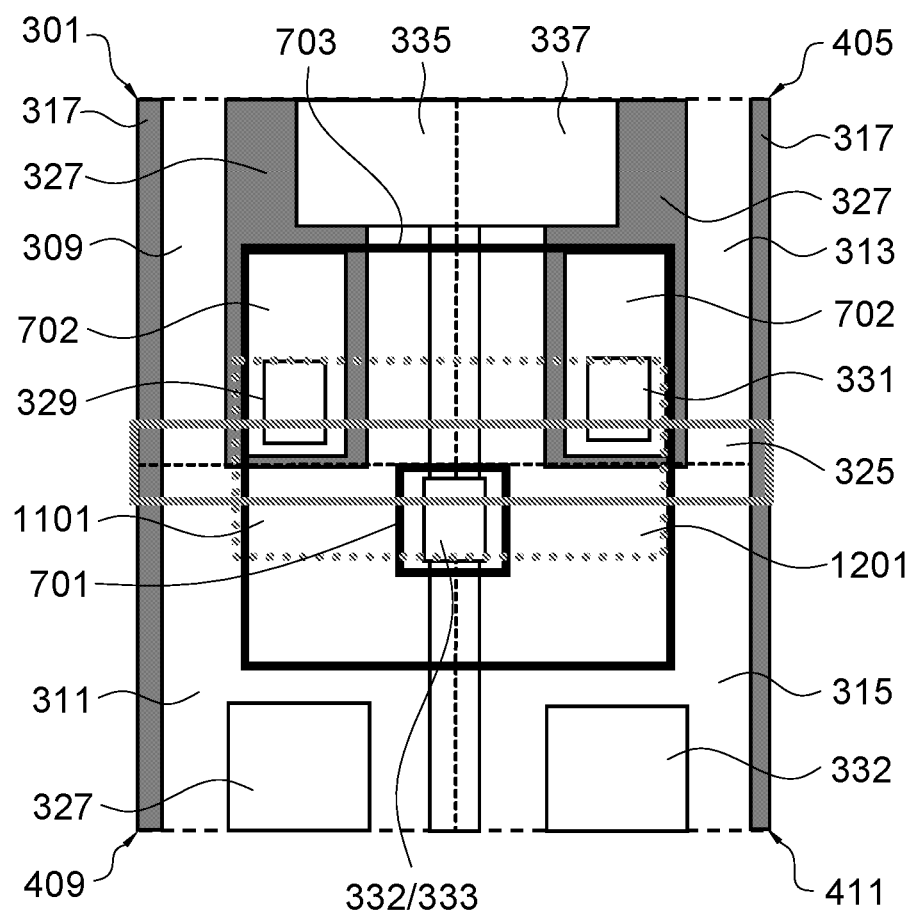
Figure 24F:
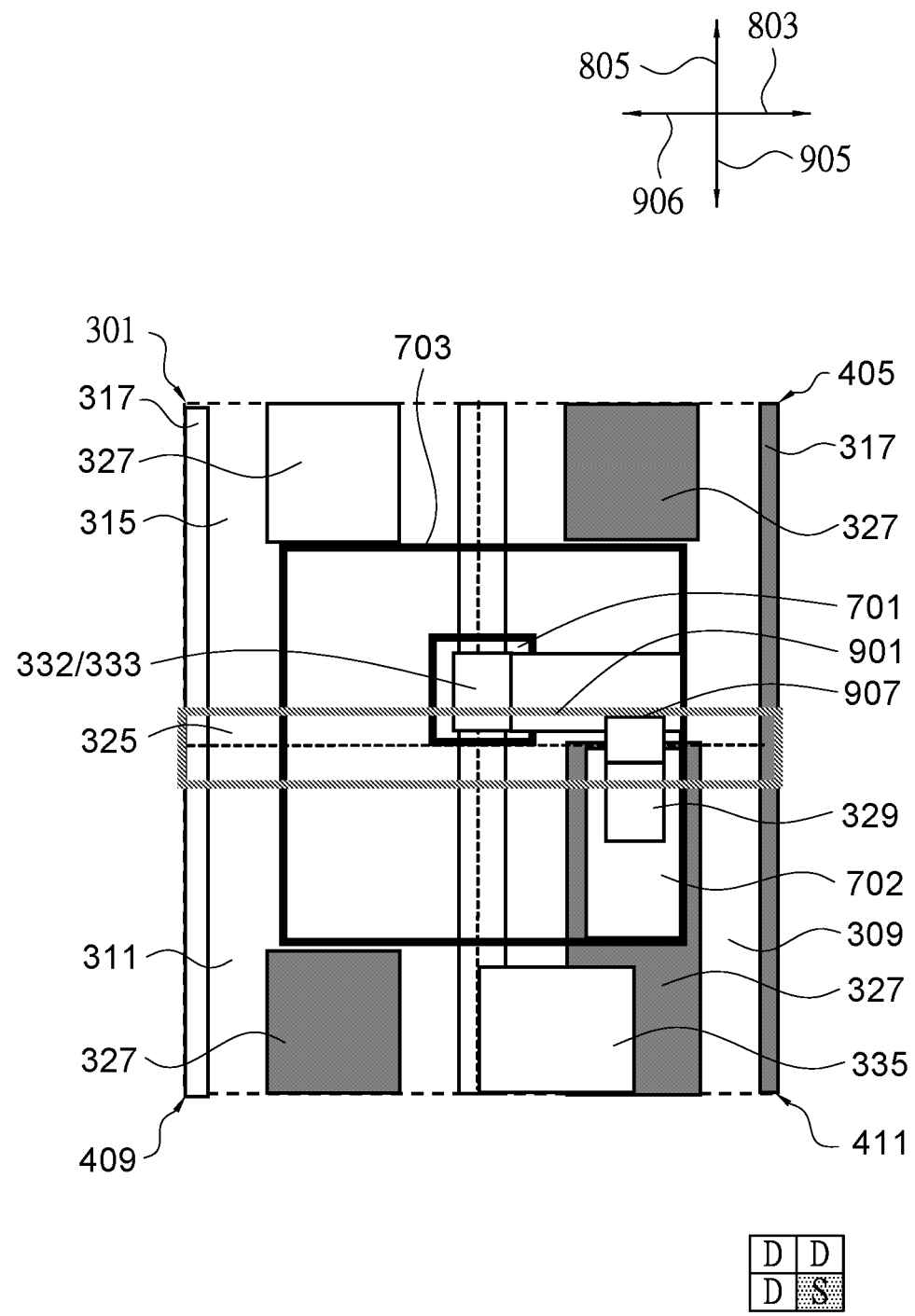
Figure 24G:
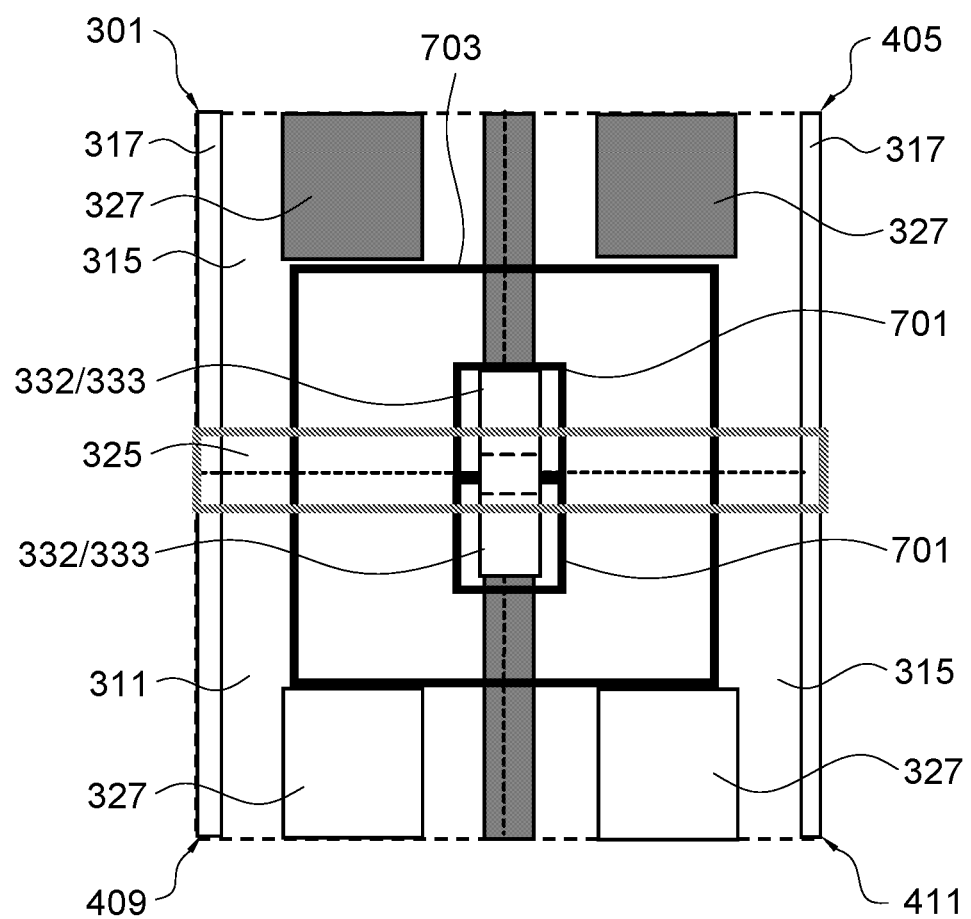
Figure 25A:
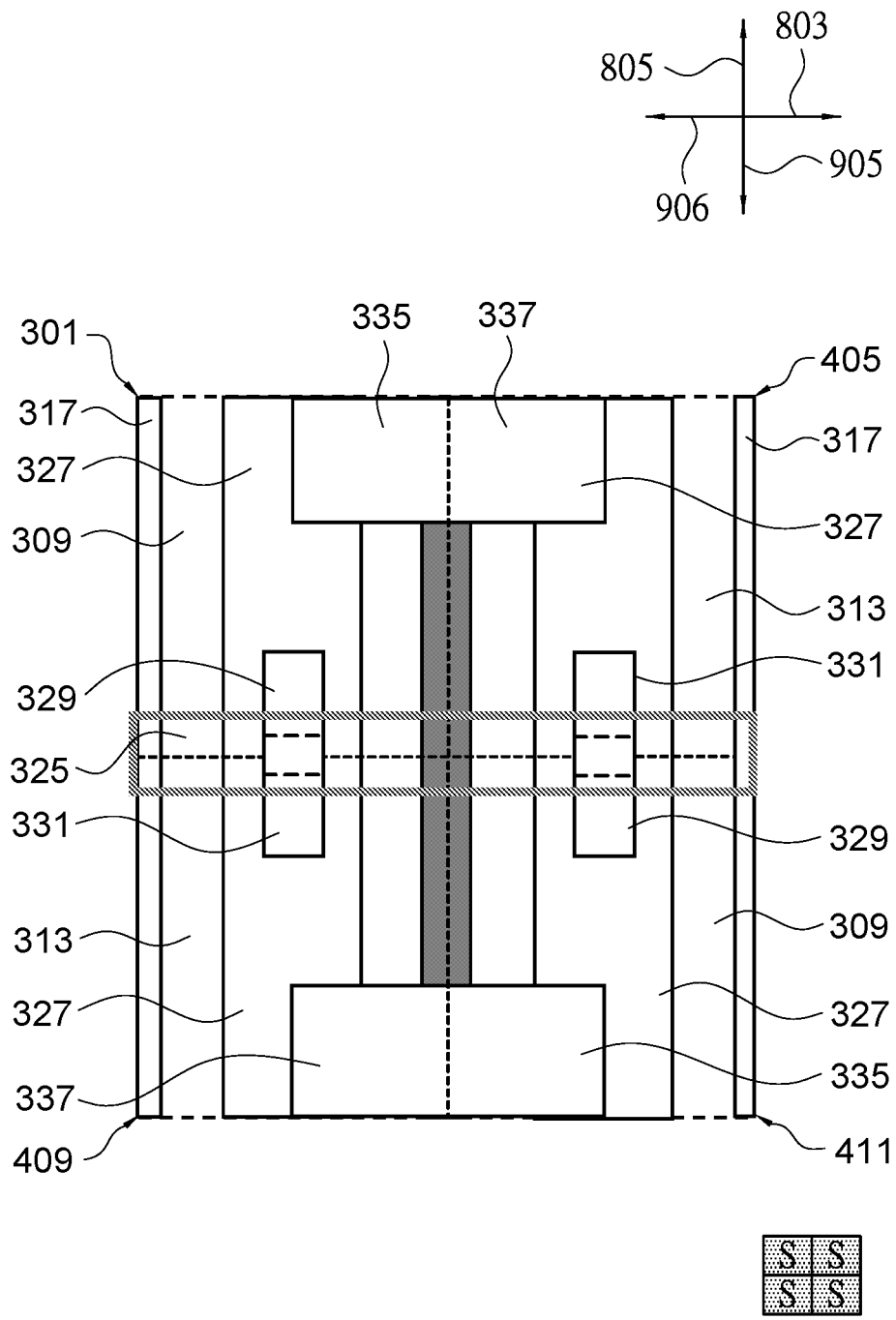
Figure 25B:
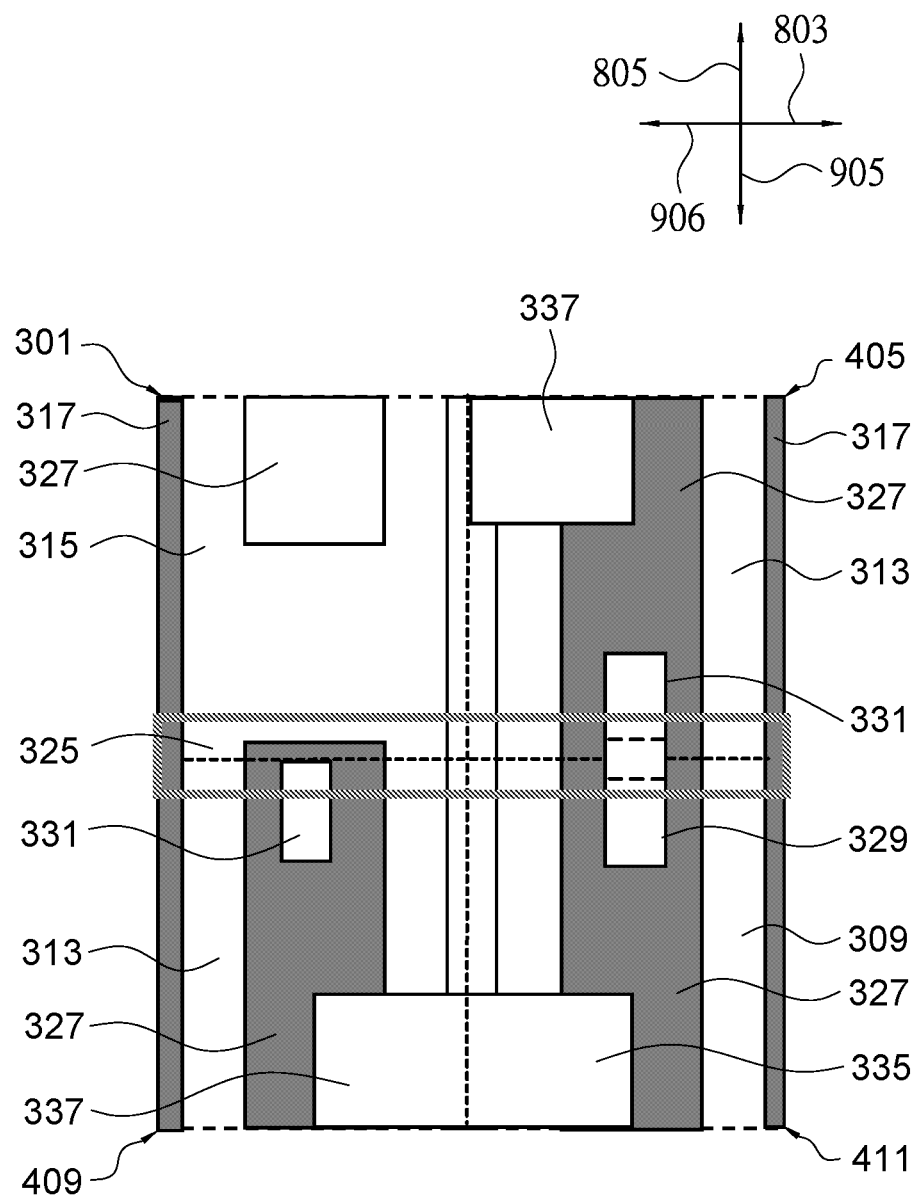
Figure 25C:
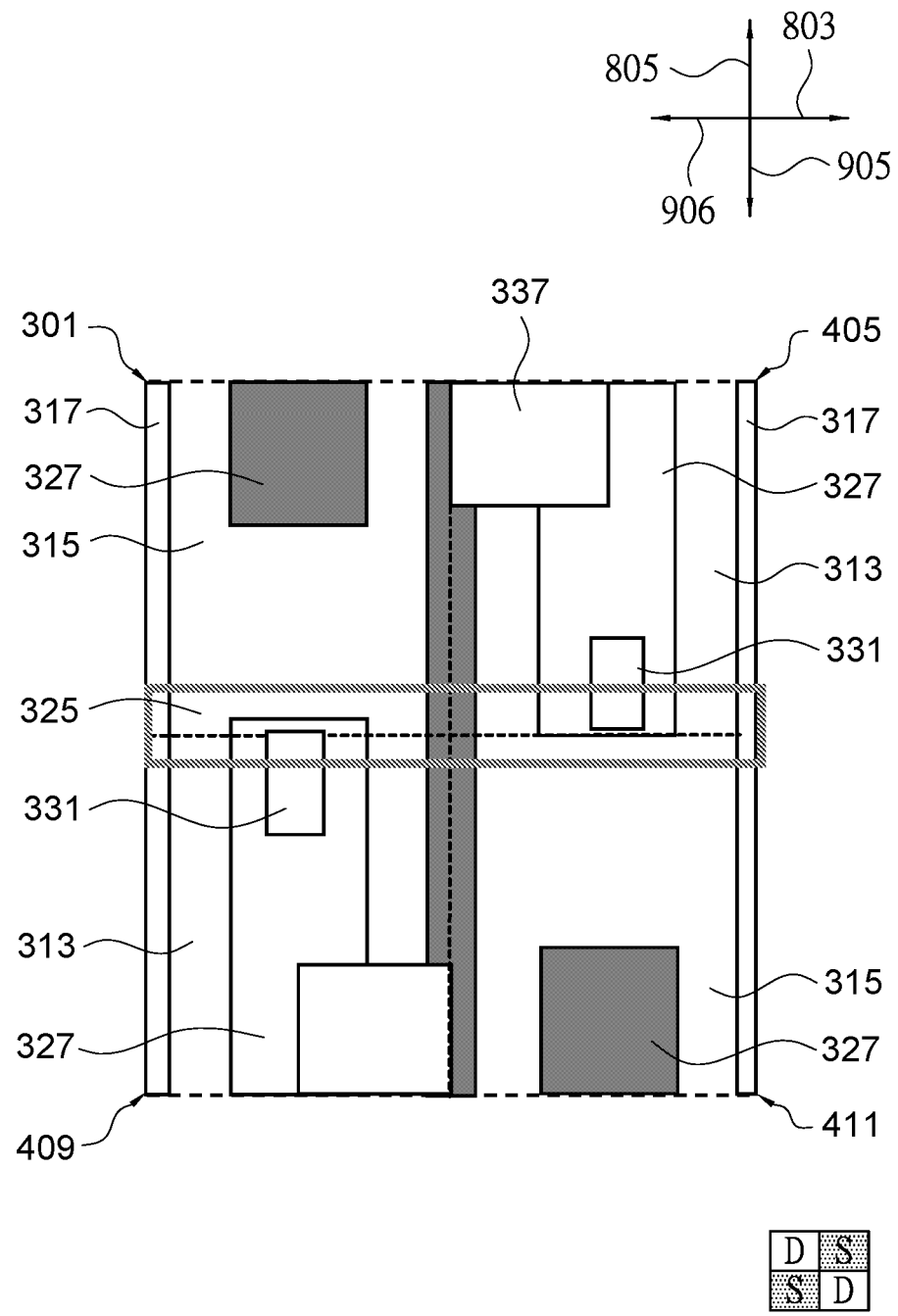
Figure 25D:
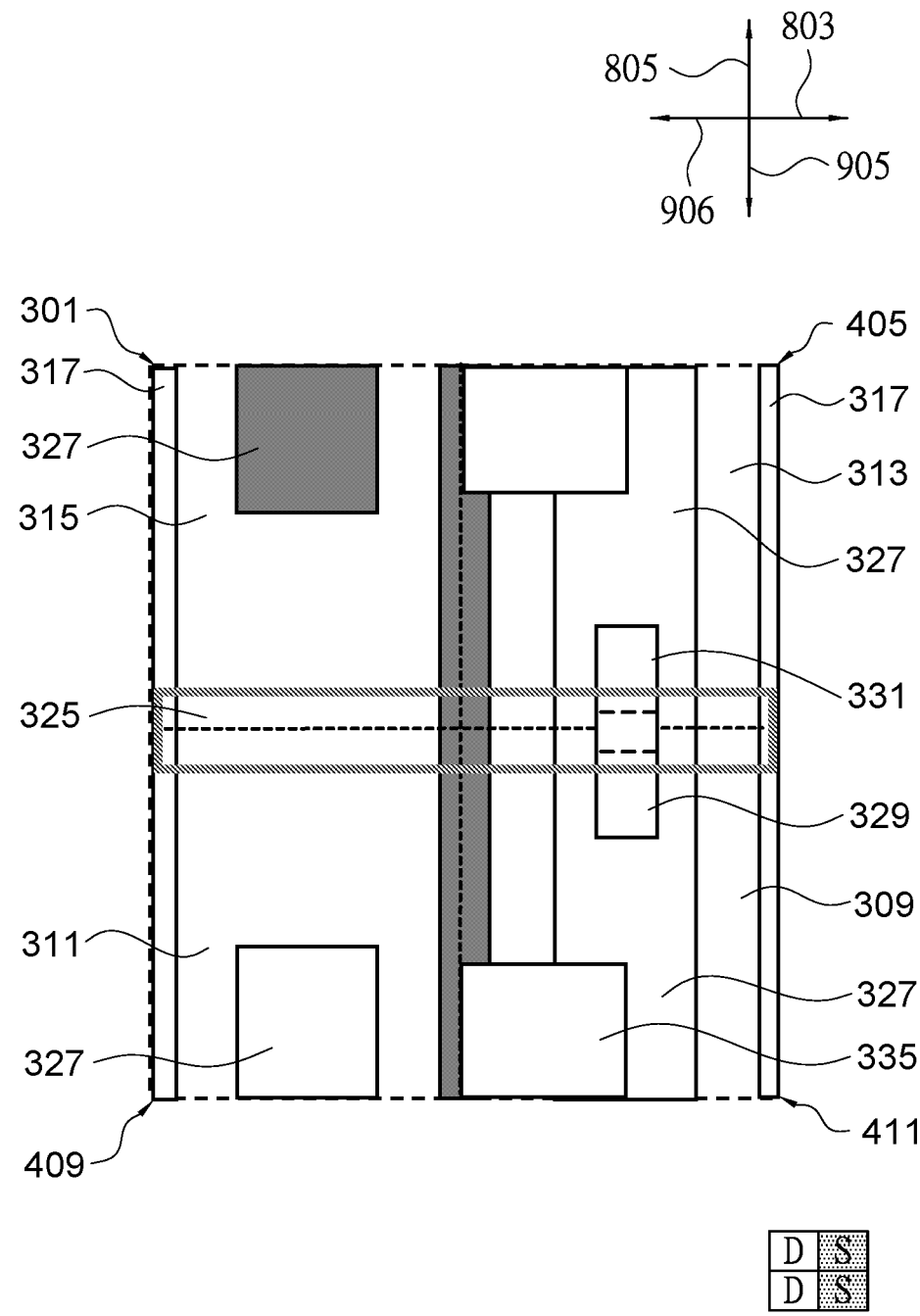
Figure 25E:
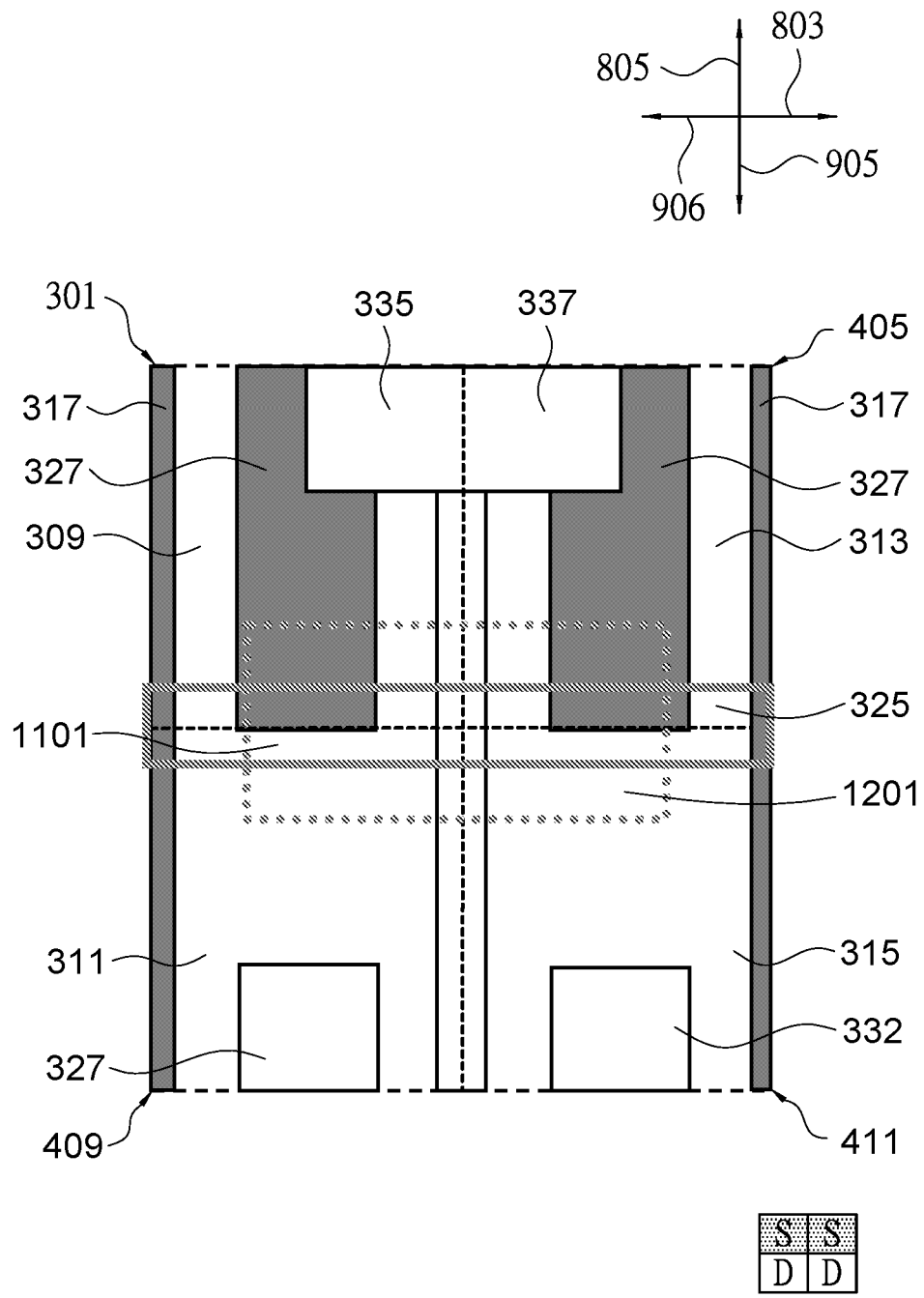
Figure 25F:
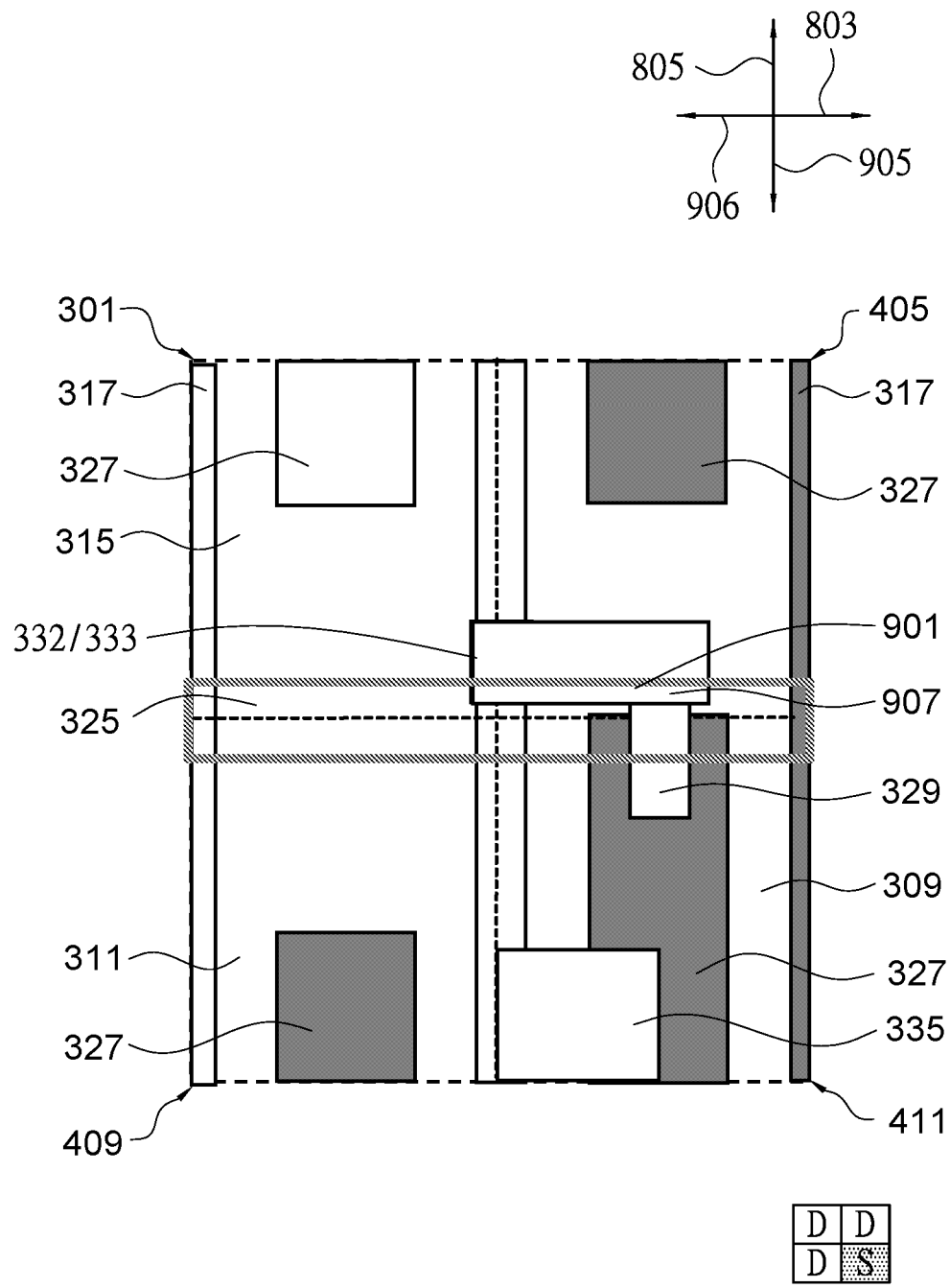
Figure 25G:
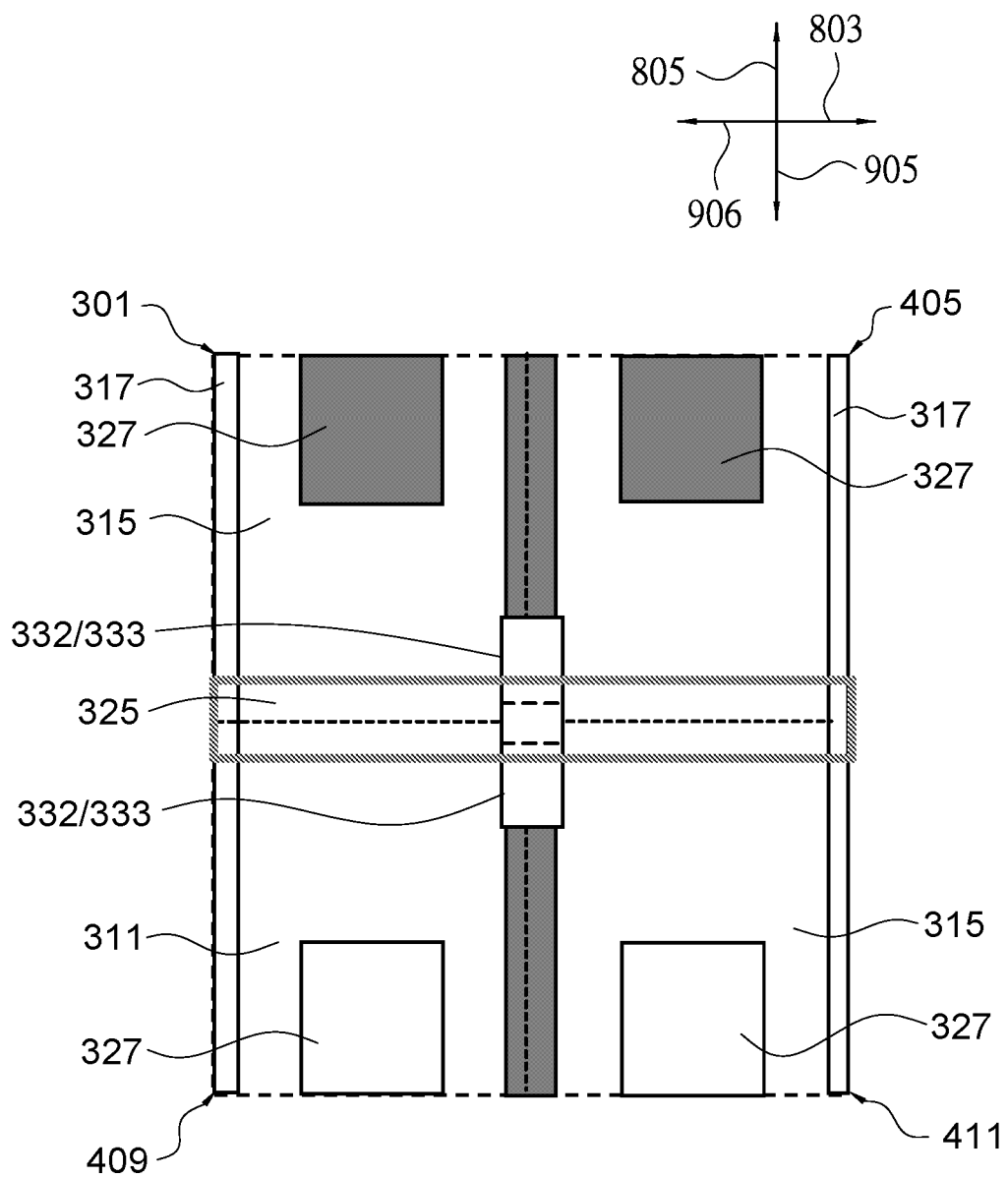

For example, looking at the embodiment illustrated in FIG. 19A, the first via 329 in the first cell 301 may be expanded in both the second direction 805 and the fourth direction 905 a distance that is less than the other vias, such as by being expanded 13 nm in order to form the third expansion zones 907 and the fourth expansion zones 909 (represented in FIGS. 19A-19G by the dashed boxes). Additionally, the remaining vias are expanded by a larger amount, such as by 23 nm.

FIGS. 19A-19G also illustrate the eighth step 1508 in which the interactions between the expanded vias are analyzed. In particular, the interactions are determined by whether the expanded vias overlap each other after their expansions. In an embodiment the eighth step 1508 may be performed as described above with respect to FIGS. 10A-10G, with a few modifications. In particular the first sub-step and the second sub-step may be performed as described above with respect to FIGS. 10A-10G.

The third sub-step and the fourth sub-step, however, are modified in order to accommodate the original vias that needed to be reduced in size. In particular, looking first at the third sub-step, those vias originally expanded in the first direction 803 (within the fourth step 1504) and the third direction 906 (in the fifth step 1505) are reduced in size by an amount such that the vias do not always interact. In an embodiment the vias originally expanded in the first direction may be reduced by an amount such as 8 nm. Once the vias have been reduced, the interactions may be determined as described above.

In the fourth sub-step, those vias originally expanded in the first direction 803 (within the fourth step 1504) and the third direction 906 (in the fifth step 1505) are reduced in size by an amount such that the vias do not always interact. In an embodiment the vias originally expanded in the first direction may be reduced by an amount such as 8 nm. Once the vias have been reduced, the interactions may be determined as described above.

FIGS. 20A-20G illustrate the ninth step 1509 in which merged via shapes are identified based off of the interactions identified in the eighth step 1508. In an embodiment the ninth step 1509 may be performed as described above with respect to FIGS. 11A-11G.

FIGS. 21A-21G illustrate the tenth step 1510 to determine if any of the combined shapes interact with each other and may be merged together. In an embodiment the tenth step 1510 may be performed as described above with respect to FIGS. 12A-12G.

FIGS. 22A-22G illustrate the eleventh step 1511 in which vias identified by the second marker layer 702 are either left alone, merged together, or removed completely using the fifth expansion zones 1301 and the sixth expansion zones 1303. In this embodiment the vias that have already been merged (e.g., the vias with a vertical dimension of between 86 nm and 98 nm, those vias located under the power rail [- - -], and the vias with a vertical width of 36 nm are sized 0.01 in the vertical direction.

However, because of the size constraints, the size of these vias may be limited so that they do not take up too much size and interfere with other structures within the individual cells. As such, the vias identified by the second marker layer 702 that have dimensions such that they extend beyond the cell boundaries are removed and a replacement via that has been resized is put into its place. For example, for vias that may have an original merged dimension of 20 nm×86 nm, these vias may be replaced by a via with a dimension of 20 nm×74 nm. Similarly, vias with dimensions of 20 nm×90 nm may be replaced by vias with a dimension of 20 nm×74 nm. Such a resizing keeps the vias from extending further into their respective cells and interfere with the remainder of the cell design.

Similarly, for vias that are not merged, these vias may be sized upwards in order to ensure that the vias are returned to their original dimensions. For example, for vias that have original dimensions of 20 nm×36 nm, these vias may be expanded 10 nm in the vertical direction, such that they have dimensions of 20 nm×46 nm. Similarly, vias that may have dimensions of 20 nm×72 nm may be expanded by 1 nm in order to have final dimensions of 20 nm×74 nm.

FIGS. 22A-22G illustrate the twelfth step 1512 in which those vias identified by the first marker layer 701 are merged, resized, or removed completely. In the embodiment illustrated in FIG. 22G, the combined fourth via 333 in the first cell 301 and third via 332 in the second cell 405 and the combined third via in the third cell 409 and the fourth via 333 in the fourth cell 411 are expanded in order to merge the vias into a single via. In an embodiment the expansion may be performed by expanding the vias in the vertical direction a distance to merge the cells, such as by being 2 nm in the vertical direction.

Once the vias have been expanded and merged, the single via may then be reduced in the vertical direction by a similar amount in order to bring the vias back to size. For example, in the embodiment illustrated in FIG. 22G in which the combined fourth via 333 in the first cell 301 and third via 332 in the second cell 405 and the combined third via in the third cell 409 and the fourth via 333 in the fourth cell 411 are merged, the combined via may then be reduced in size a similar distance, such as 2 nm. As such, in an embodiment in which the original vias have dimensions such as 20 nm×20 nm, the new combined via has dimensions of 20 nm×44 nm.

FIGS. 23A-23G illustrate a fifteenth step 1515 which may be used to help overcome photolithographic limitations relating to the "L" shape 1101. In particular, due to process conditions, it may be advantageous to separate the photolithographic masks that are used to form the "L" shape 1101 into two separate masks in order to avoid pattern degradation. In the embodiment illustrated in FIG. 23F, the combined fourth via 333 in the first cell 301 and third via 332 in the second cell 405 (which was identified as being part of the L-shape) is expanded vertically by a tenth distance $D_{10}$ to form a seventh expansion zone 2301 and an eighth expansion zone 2303 to see if it will interact (e.g., overlap) with a metal-zero, such as the first metal zero connection 335 in the fourth cell 411.

FIGS. 24A-24G illustrate that, once it has been determined that the L-shape interacts, the L-shape is then removed and replaced by two separate shapes. In an embodiment the first shape may be a first leg of the original L-shape and the second shape may be the second leg of the original L-shape. In a particular example, the first shape may be the original via (e.g., the combined fourth via 333 in the first cell 301 and third via 332 in the second cell 405) along with the first expansion zone 901 from the fourth step 1504. Alternatively, in an embodiment in which the first expansion zone 901 is not desired to be used, the original via (e.g., the combined fourth via 333 in the first cell 301 and third via 332 in the second cell 405) may simply be extended enough to contact the third expansion zone 907, such as by being expanded 24 nm in the first direction 803. Additionally, the second shape may be the original via (the first via 329 in the fourth cell 411) along with the third expansion zone 907 from the sixth step 1506.

FIGS. 25A-25G illustrate the thirteenth step 1513 which performs the removal of the first marker layer 701, the second marker layer 702, and the third marker layer 703. Once removed, the final design is ready to be processed, stored, and used to prepare masks for the eventual manufacture of semiconductor devices that utilize the cells within the cell rows.

Figure 26:
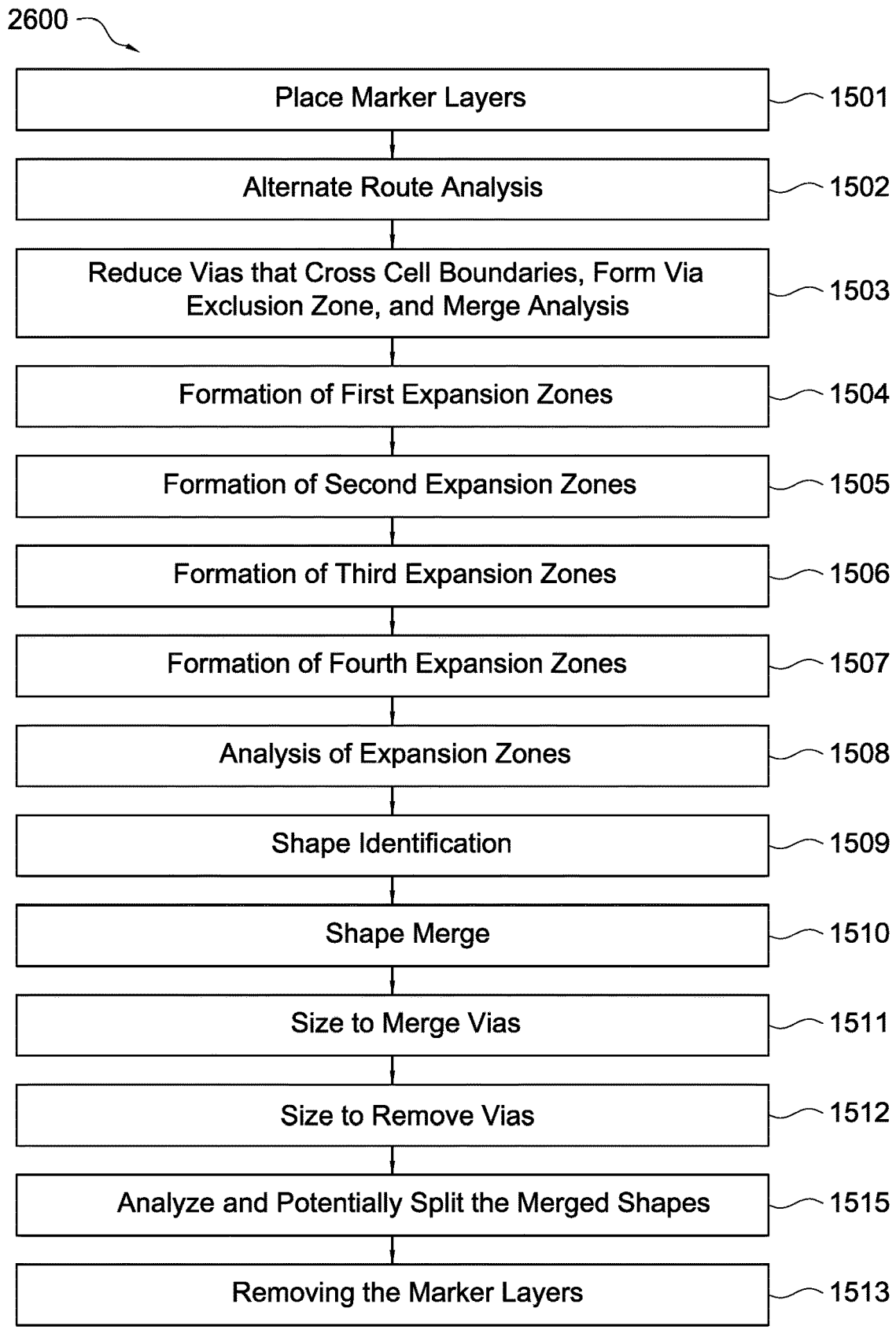
FIG. 26 illustrates a second process flow diagram for the post-placement treatment in accordance with some embodiments.

FIG. 26 illustrates a process flow 2600 of the embodiment illustrated in FIGS. 16A-25G. In particular, it illustrates the reduction of the vias in the modified third step 1503', as well as the analysis and potential splitting of the merged shapes in the fifteenth step 1515.

Once the post layout treatment 215 has been performed, the design may be stored, modified, and eventually sent to be transformed into one or more series of photolithographic masks. Once formed, the photolithographic masks may be utilized in a series of masking and etching processes, among other manufacturing processes to manufacture semiconductor devices from the original design.

In accordance with an embodiment, a method of designing a semiconductor device comprising placing a first cell and a second cell into a first cell row and placing a third cell and a fourth cell into a second cell row adjacent to the first cell row is provided. A post placement treatment is performed using a microprocessor after the placing the first cell and the second cell and after the placing the third cell and the fourth cell, wherein the post placement treatment comprises combining a first via in the first cell and a second via in the third cell into a third via, and removing a fourth via from the first cell without severing an electrical connection.

In accordance with another embodiment, a method of designing a semiconductor device comprising receiving a first cell, a second cell, a third cell, and a fourth cell from a cell library is provided. Using a microprocessor, the first cell and the second cell are placed into a first cell row and the third cell and the fourth cell are placed into a second cell row, wherein an intersection area of the first cell, the second cell, the third cell, and the fourth cell comprises a first via and a second via. Using the microprocessor, a first portion of a first marker layer is placed over the first via. Using the microprocessor, a first portion of a second marker layer is placed over the second via. Using the microprocessor, the first via and the second via are analyzed based on the first marker layer and the second marker layer, wherein the analyzing the first via and the second via further comprises determining if the first via should be merged with the second via or removed.

In accordance with yet another embodiment, a semiconductor device comprising a first cell row with a first cell and a second cell adjacent to the first cell is provided. A second cell row is adjacent to the first cell row, wherein the second cell row comprises a third cell and a fourth cell. A merged via is electrically connected to a power/ground rail to a first source/drain region and a second source/drain region, the first source/drain region being located in the second cell and the second source/drain region being located in the fourth cell, the merged via extending into both the second cell and the fourth cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing a semiconductor device, the method comprising:
   placing a first cell adjacent to a second cell into a first cell row;
   placing a third cell adjacent to a fourth cell into a second cell row adjacent to the first cell row, wherein a region at an intersection of the first cell, the second cell, the third cell, and the fourth cell comprises:
      a first drain region of the first cell;
      a first source region of the second cell;
      a second source region of the third cell; and
      a second drain region of the fourth cell;
   performing a post placement treatment after the placing the first cell and the second cell and after the placing the third cell and the fourth cell, wherein the post placement treatment comprises:
      combining a first via in the first cell and a second via in the third cell into a third via; and
      removing a fourth via from the first cell; and
   manufacturing a semiconductor device with the third via with a semiconductor device manufacturing tool.

2. The method of claim 1, wherein prior to the removing the fourth via the fourth via connects a cell boundary conductor with a ground rail.

3. The method of claim 2, wherein the cell boundary conductor remains electrically connected to the ground rail through a metal zero connection.

4. The method of claim 1, wherein the first cell is an inverter.

5. The method of claim 4, wherein the second cell is an inverter.

6. The method of claim 5, wherein the third cell is an inverter and the fourth cell is an inverter.

7. A method of manufacturing a semiconductor device, the method comprising:
   choosing a first cell and a second cell from a cell library;
   placing the first cell and the second cell adjacent to each other;
   placing a first marker layer around a first via within the first cell and a second via in the second cell;
   determining, based at least in part on a location of the first marker layer, whether to merge the first via and the second via into a third via; and
   manufacturing the third via with a semiconductor manufacturing processing machine, wherein the determining whether to merge the first via and the second via comprises expanding the second via in a first direction perpendicular to a first cell row to form a first expansion zone, the first cell row comprising the first cell and the second cell, and wherein the determining whether to merge the first via and the second via comprises expanding a third via in a second direction perpendicular with the first cell row and different from the first direction to form a second expansion zone.

8. The method of claim 7, wherein the manufacturing the third via manufactures the third via in electrical connection with a first metal zero connection that is in physical contact with a first source/drain region.

9. The method of claim 8, wherein the first metal zero connection has a first portion in physical contact with a first cell boundary conductor in the second cell.

10. The method of claim 7, wherein the first cell is a first inverter.

11. The method of claim 10, wherein the second cell is a second inverter.

12. The method of claim 11, wherein the third cell is a third inverter.

13. The method of claim 12, wherein the fourth cell is a fourth inverter.

14. The method of claim 7, further comprising merging the first via and the second via when the first expansion zone contacts the second expansion zone.

15. The method of claim 7, wherein a region at an intersection of the first cell and the second cell comprises a first drain region of the first cell and a first source region of the second cell.

16. A semiconductor device comprising:
   a first cell row with a first cell and a second cell adjacent to the first cell;
   a second cell row adjacent to the first cell row, wherein the second cell row comprises a third cell and a fourth cell, wherein a region at an intersection of the first cell, the second cell, the third cell, and the fourth cell comprises:
      a first source region of the first cell;
      a first drain region of the second cell;
      a second drain region of the third cell; and
      a third drain region of the fourth cell, wherein a first via and a second via are combined into an "L" shape; and
   a via electrically connecting a power/ground rail to a first source/drain region and a second source/drain region, the first source/drain region being located in the second cell and the second source/drain region being located in the fourth cell, the via extending into both the second cell and the fourth cell.

17. The semiconductor device of claim 16, wherein the via is electrically connected to a first metal zero connection that is in physical contact with the first source/drain region.

18. The semiconductor device of claim 17, wherein the first metal zero connection has a first portion in physical contact with a first cell boundary conductor in the second cell.

19. The semiconductor device of claim 18, wherein the first metal zero connection has a second portion in physical contact with a contact in the fourth cell.

20. The semiconductor device of claim 16, wherein the first cell is a first inverter, the second cell is a second inverter, the third cell is a third inverter, and the fourth cell is a fourth inverter.

* * * * *